(12) United States Patent
Widmer

(10) Patent No.: US 7,592,933 B2
(45) Date of Patent: *Sep. 22, 2009

(54) TECHNIQUES FOR 9B10B AND 7B8B CODING AND DECODING

(75) Inventor: Albert X. Widmer, Katonah, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/143,481

(22) Filed: Jun. 20, 2008

(65) Prior Publication Data

US 2008/0252497 A1    Oct. 16, 2008

Related U.S. Application Data

(63) Continuation of application No. 11/668,549, filed on Jan. 30, 2007, now Pat. No. 7,405,679.

(51) Int. Cl.
*H03M 7/00*    (2006.01)
(52) U.S. Cl. ............................. 341/61; 341/58; 341/59; 341/60; 341/102; 341/103
(58) Field of Classification Search ................... 341/58, 341/59, 61, 102, 103
See application file for complete search history.

(56) References Cited

U.S. PATENT DOCUMENTS

| | | | |
|---|---|---|---|
| 4,486,739 A * | 12/1984 | Franaszek et al. ............. 341/59 |
| 4,517,552 A | 5/1985 | Shirota et al. | |
| 4,598,326 A | 7/1986 | Leiner | |
| 4,910,608 A * | 3/1990 | Whiteman et al. ........... 382/239 |
| 5,245,339 A | 9/1993 | Cideciyan | |
| 5,387,911 A | 2/1995 | Gleichert et al. | |
| 5,699,062 A | 12/1997 | Widmer | |
| 5,740,186 A | 4/1998 | Widmer | |
| 5,784,387 A | 7/1998 | Widmer | |
| 5,825,824 A | 10/1998 | Lee et al. | |
| 5,974,464 A | 10/1999 | Shin et al. | |
| 6,046,691 A * | 4/2000 | Aziz et al. ..................... 341/58 |
| 6,081,210 A * | 6/2000 | Nikolic et al. .................. 341/59 |

(Continued)

FOREIGN PATENT DOCUMENTS

GB    1 540 617    2/1979

OTHER PUBLICATIONS

U.S. Appl. No. 12/143,347. Albert Widmer. "Techniques for 9B/10B and 7B/8B coding and decoding", Jun. 20, 2008.*

(Continued)

*Primary Examiner*—Linh V Nguyen
(74) *Attorney, Agent, or Firm*—Ryan, Mason & Lewis, LLP

(57) ABSTRACT

A technique for encoding 9-binary symbol (9B) source vectors into 10-binary symbol (10B) encoded vectors include the steps of obtaining a plurality of 9B source vectors, and encoding the 9B source vectors into a plurality of 10B encoded vectors according to an encoding scheme. A fraction of the 10B encoded data vectors have binary symbol changes, other than whole-vector complementation, compared to corresponding ones of the 9B source vectors, the fraction not including any disparity dependent encoded representations. Techniques for encoding 7B source vectors to 8B encoded vectors, and decoding techniques, are also provided.

24 Claims, 92 Drawing Sheets

U.S. PATENT DOCUMENTS

| | | | |
|---|---|---|---|
| 6,198,413 B1* | 3/2001 | Widmer | 341/59 |
| 6,225,924 B1 | 5/2001 | Epshtein et al. | |
| 6,304,196 B1 | 10/2001 | Copeland et al. | |
| 6,351,501 B1 | 2/2002 | Murdock | |
| 6,362,757 B1 | 3/2002 | Lee et al. | |
| 6,400,763 B1* | 6/2002 | Wee | 375/240.16 |
| 6,429,794 B1 | 8/2002 | Widmer et al. | |
| 6,469,645 B2 | 10/2002 | Coene | |
| 6,496,540 B1 | 12/2002 | Widmer | |
| 6,501,396 B1 | 12/2002 | Kryzak et al. | |
| 6,574,731 B1 | 6/2003 | Coles et al. | |
| 6,614,369 B1 | 9/2003 | Widmer | |
| 6,617,984 B1* | 9/2003 | Kryzak et al. | 341/59 |
| 6,876,315 B1 | 4/2005 | Widmer | |
| 6,911,921 B2 | 6/2005 | Widmer | |
| 6,914,545 B1* | 7/2005 | Zaidi | 341/59 |
| 6,917,314 B1* | 7/2005 | Oberg | 341/58 |
| 6,977,599 B2 | 12/2005 | Widmer | |
| 6,978,416 B2 | 12/2005 | Widmer | |
| 7,064,683 B1* | 6/2006 | Westby | 341/50 |
| 7,081,838 B2* | 7/2006 | Hoyer | 341/58 |
| 7,286,065 B1* | 10/2007 | Oberg | 341/58 |
| 7,290,202 B2* | 10/2007 | Kang et al. | 714/799 |
| 7,292,161 B2* | 11/2007 | Widmer | 341/59 |
| 7,405,679 B1* | 7/2008 | Widmer | 341/61 |
| 7,471,217 B2* | 12/2008 | Sontag et al. | 341/58 |
| 2004/0123222 A1 | 6/2004 | Widmer | |
| 2005/0062621 A1 | 3/2005 | Widmer | |
| 2006/0267810 A1 | 11/2006 | Widmer | |

OTHER PUBLICATIONS

Cochrane, P , Brooks, R., and Dawes, R : 'A High-Reliability 565 Mbit/s Trunk Transmission System', IEEE J on Selected Areas in Communications, vol. SAC-4, No. 9, Dec. 1986, pp. 1396-1403.

Sharland et al., "A simple in-service error detection scheme based on the statistical properties of line codes for optical fibre Systems," Int. J Electronics, vol. 55, No. 1.

Cideciyan, Attractive Line Codes for High-Speed LANs and MANs and Their Realization, IBM (all pages), (date unknown).

Widmer, "ANSI Fibre Channel Transmission Code," IBM, Apr. 23, 1993, pp. 1-40.

Anonymous, "A laser driver circuit for high speed switching applications", Research Disclosure 431162, XP-002231278, IBM, Mar. 2000, pp. 575-577.

Martin, "A Rate 8/10 DC Balanced Code wiht Local Parity," IBM Technical Disclosure Bulletin, Feb. 1985, pp. 5272-5279, vol. 27, No. 9.

OIF-99.120, "Proposal for a Very Short Reach (VSR) OC-192/STM-64 Interface Based on Parallel Optics," Version 2.1, Optical Internetworking Forum, Oct. 1999, pp. 1-12.

* cited by examiner

FIG. 1
TRELLIS NODE NOTATION AND NUMBER OF VECTORS TO NODES FOR UP TO 10 BITS
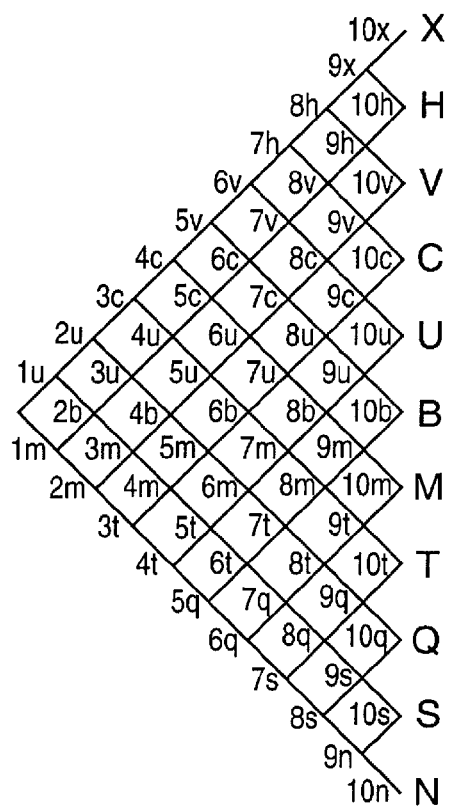
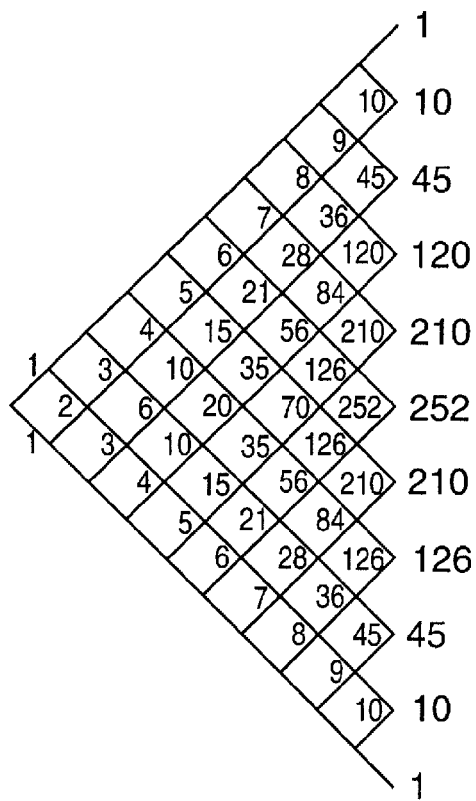

CONCEPTUAL VIEW OF 9B10B ENCODING

CIRCUIT VIEW OF 9B10B ENCODING

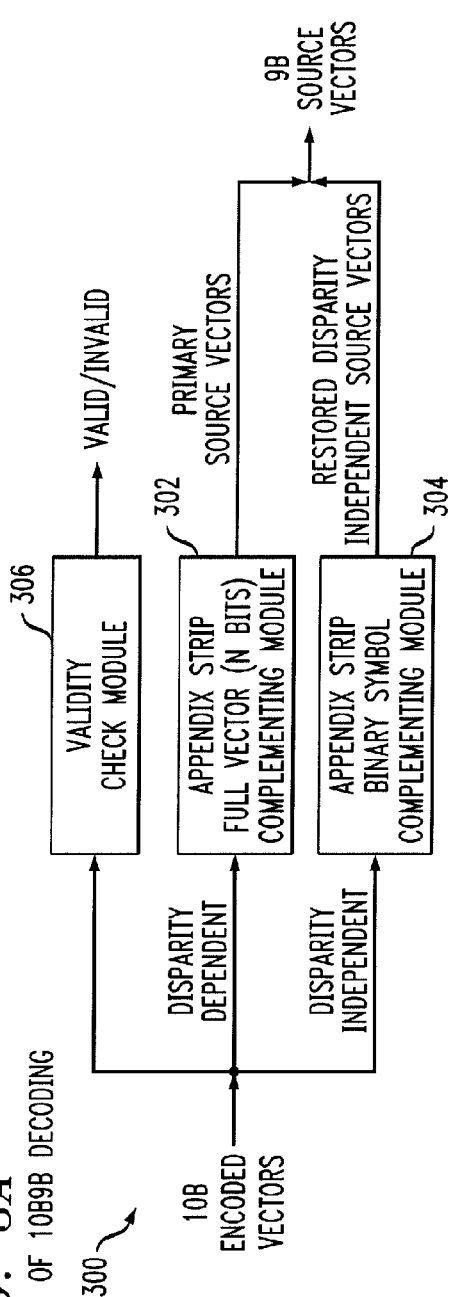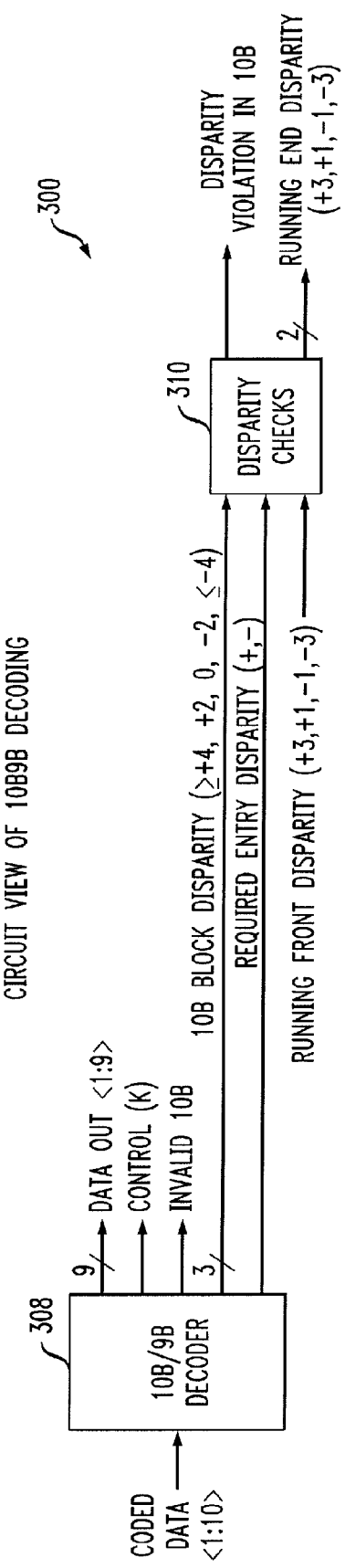
FIG. 3A
CONCEPTUAL VIEW OF 10B9B DECODING
FIG. 3B
CIRCUIT VIEW OF 10B9B DECODING FIG. 4A.1
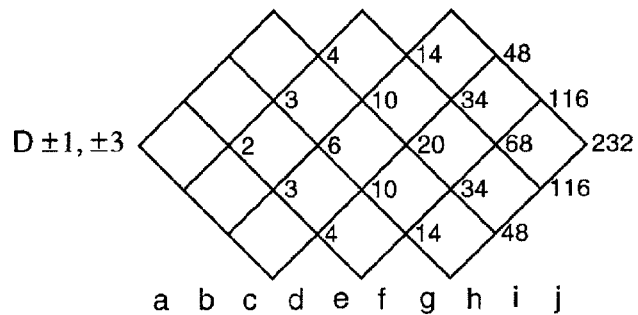
FIG. 4A.2
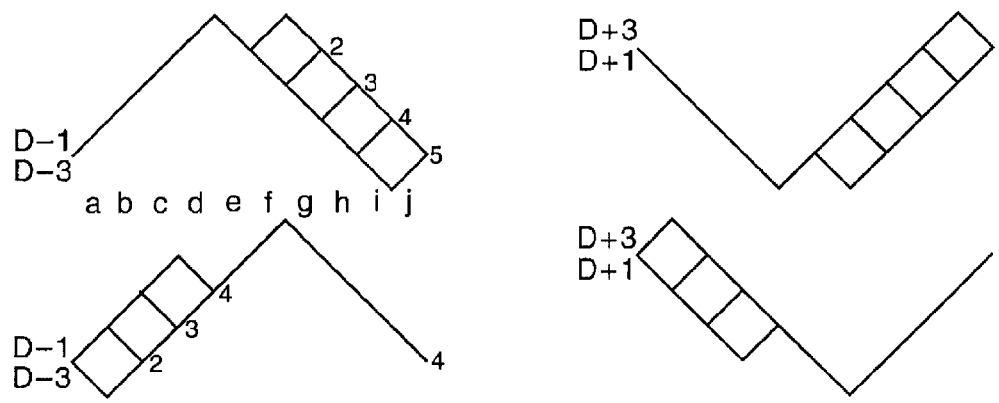
FIG. 4B
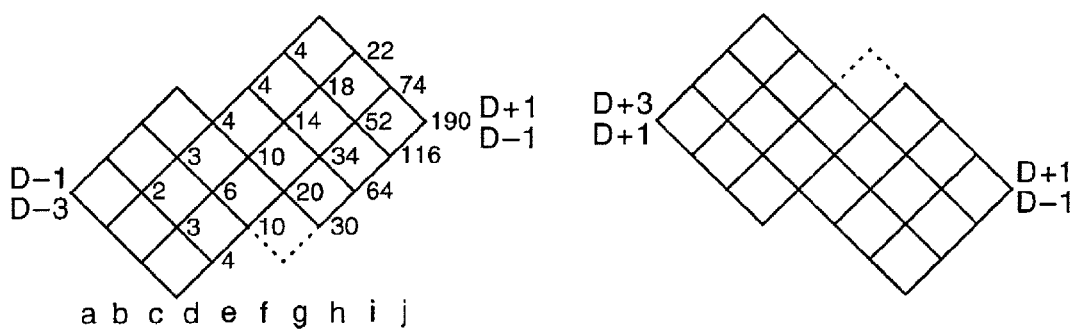

*FIG. 4C.1*
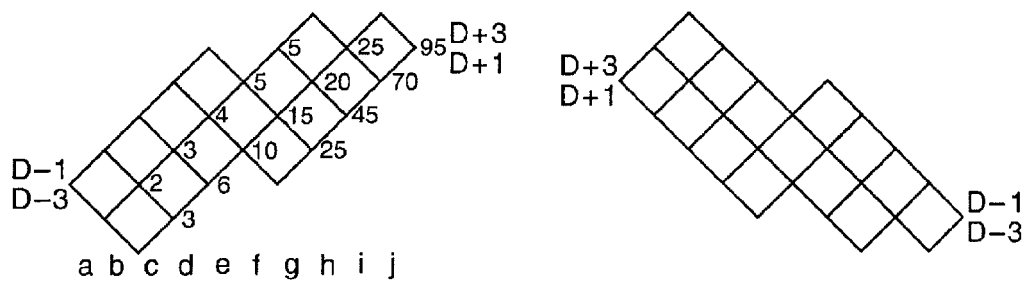
*FIG. 4C.2*
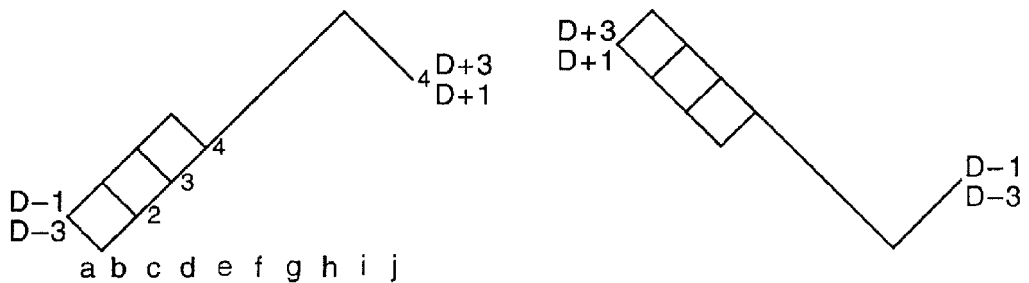
*FIG. 5*
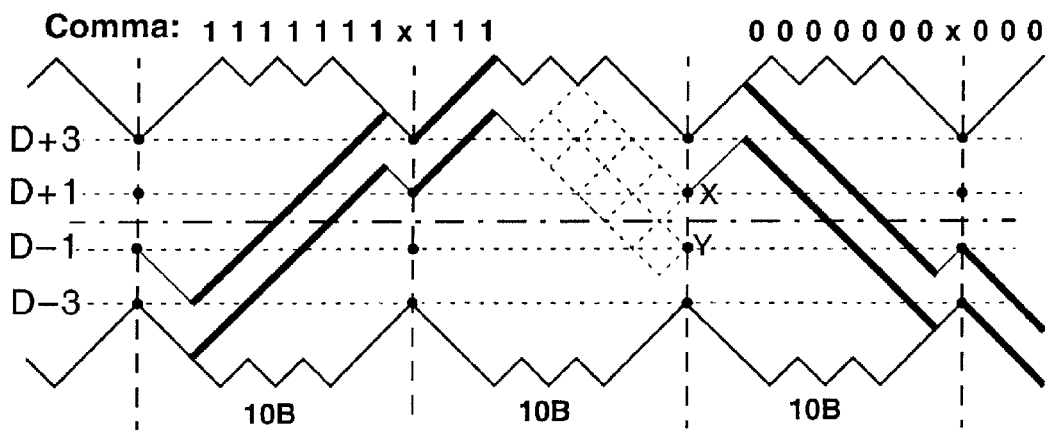

FIG. 6A  9B10B ENCODING

| Name | ABCDEFGHIK | Coding Class | Primary abcdefghij | Pri DR | Pri DB |
|---|---|---|---|---|---|
| D0 | 000000000 x | BNABCGJ | 1110001001 | ± | 0 |
| D1 | 100000000 x | BS1uEGIJ | 1000101011 | ± | 0 |
| D2 | 010000000 x | BS1m2bEGIJ | 0100101011 | ± | 0 |
| D3 | 110000000 x | BQ4t'6mEGJ | 1100101001 | ± | 0 |
| D4 | 001000000 x | BS2m3mEGIJ | 0010101011 | ± | 0 |
| D5 | 101000000 x | BQ4t'6mEGJ | 1010101001 | ± | 0 |
| D6 | 011000000 x | BQ4t'6mEGJ | 0110101001 | ± | 0 |
| D7 | 111000000 x | BT1u5uIJ | 1110000011 | ± | 0 |
| D8 | 000100000 x | BS3t4mEGIJ | 0001101011 | ± | 0 |
| D9 | 100100000 x | BQ4t'6mEGJ | 1001101001 | ± | 0 |
| D10 | 010100000 x | BQ4t'6mEGJ | 0101101001 | ± | 0 |
| D11 | 110100000 x | BT1u5uIJ | 1101000011 | ± | 0 |
| D12 | 001100000 x | BQ4t'6mEGJ | 0011101001 | ± | 0 |
| D13 | 101100000 x | BT1u5uIJ | 1011000011 | ± | 0 |
| D14 | 011100000 x | BT1m4uIJ | 0111000011 | ± | 0 |
| D15 | 111100000 x | BM4cABFGJ | 0011011001 | ± | 0 |
| D16 | 000010000 x | BS4t5tADIJ | 1001100011 | ± | 0 |
| D17 | 100010000 x | BQ4t'6mHIJ | 1000100111 | ± | 0 |
| D18 | 010010000 x | BQ4t'6mHIJ | 0100100111 | ± | 0 |
| D19 | 110010000 x | BT1u5uHJ | 1100100101 | ± | 0 |
| D20 | 001010000 x | BQ4t'6mHIJ | 0010100111 | ± | 0 |
| D21 | 101010000 x | BT1u5uHJ | 1010100101 | ± | 0 |
| D22 | 011010000 x | BT1m3u4b5uHJ | 0110100101 | ± | 0 |
| D23 | 111010000 x | BM4c'4t'6t'J | 1110100001 | ± | 0 |
| D24 | 000110000 x | BQ4t'6mHIJ | 0001100111 | ± | 0 |
| D25 | 100110000 x | BT1u5uHJ | 1001100101 | ± | 0 |
| D26 | 010110000 x | BT1m2b3m5uHJ | 0101100101 | ± | 0 |
| D27 | 110110000 x | BM4c'4t'6t'J | 1101100001 | ± | 0 |
| D28 | 001110000 x | BT2m5uHJ | 0011100101 | ± | 0 |
| D29 | 101110000 x | BM4c'4t'6t'J | 1011100001 | ± | 0 |
| D30 | 011110000 x | BM4c'4t'6t'J | 0111100001 | ± | 0 |
| D31 | 111110000 x | BU5vABIJ | 0011100011 | ± | 0 |
| D32 | 000001000 x | BS5q6tADIJ | 1001010011 | ± | 0 |
| D33 | 100001000 x | BQ4t'6mHIJ | 1000010111 | ± | 0 |
| D34 | 010001000 x | BQ4t'6mHIJ | 0100010111 | ± | 0 |
| D35 | 110001000 x | FT5u'5q' | 1100010000 | + | −4 |
| D36 | 001001000 x | BQ4t'6mHIJ | 0010010111 | ± | 0 |
| D37 | 101001000 x | FT5u'5q' | 1010010000 | + | −4 |
| D38 | 011001000 x | FT5u'5q' | 0110010000 | + | −4 |
| D39 | 111001000 0 | BMK'4c'4t'6t'J | 1110010001 | ± | 0 |
| D40 | 000101000 x | BQ4t'6mHIJ | 0001010111 | ± | 0 |

TABLE 1A

FIG. 6B  9B10B ENCODING

| Name | ABCDEFGHI K | Coding Class | Primary abcdefghij | Pri DR | Pri DB |
|---|---|---|---|---|---|
| D41 | 100101000 x | FT5u'5q' | 1001010000 | + | −4 |
| D42 | 010101000 x | FT5u'5q' | 0101010000 | + | −4 |
| D43 | 110101000 0 | BMK'4c'4t'6t'J | 110101000<u>1</u> | ± | 0 |
| D44 | 001101000 x | FT5u'5q' | 0011010000 | + | −4 |
| D45 | 101101000 0 | BMK'4c'4t'6t'J | 101101000<u>1</u> | ± | 0 |
| D46 | 011101000 0 | BMK'4c'4t'6t'J | 011101000<u>1</u> | ± | 0 |
| D47 | 111101000 x | PU4c5c | 1111010000 | − | 0 |
| D48 | 000011000 x | BQ4t6mBIJ | 0<u>1</u>01<u>1</u>000<u>11</u> | ± | 0 |
| D49 | 100011000 x | FT5u'5q' | 1000110000 | + | −4 |
| D50 | 010011000 x | FT5u'5q' | 0100110000 | + | −4 |
| D51 | 110011000 0 | BMK'4c'4t'6t'J | 110011000<u>1</u> | ± | 0 |
| D52 | 001011000 x | FT5u'5q' | 0010110000 | + | −4 |
| D53 | 101011000 0 | BMK'4c'4t'6t'J | 101011000<u>1</u> | ± | 0 |
| D54 | 011011000 0 | BMK'4c'4t'6t'J | 011011000<u>1</u> | ± | 0 |
| D55 | 111011000 x | PU4u6c | 1110110000 | − | 0 |
| D56 | 000111000 x | FT5u'5q' | 0001110000 | + | −4 |
| D57 | 100111000 0 | BMK'4c'4t'6t'J | 100111000<u>1</u> | ± | 0 |
| D58 | 010111000 0 | BMK'4c'4t'6t'J | 010111000<u>1</u> | ± | 0 |
| D59 | 110111000 x | PU4u6c | 1101110000 | − | 0 |
| D60 | 001111000 0 | BMK'4c'4t'6t'J | 001111000<u>1</u> | ± | 0 |
| D61 | 101111000 x | PU4u6c | 1011110000 | − | 0 |
| D62 | 011111000 x | PU4u6c | 0111110000 | − | 0 |
| D63 | 111111000 x | BC6vABEIJ | 00<u>11</u>0<u>1</u>00<u>11</u> | ± | 0 |
| D64 | 000000100 x | BS6q8qADIJ | <u>1</u>00<u>1</u>00<u>1</u>0<u>11</u> | ± | 0 |
| D65 | 100000100 x | BQ3m6t7tEFJ | 1000<u>111</u>00<u>1</u> | ± | 0 |
| D66 | 010000100 x | BQ3m6t7tEFJ | 0100<u>111</u>00<u>1</u> | ± | 0 |
| D67 | 110000100 x | FT5u'5q' | 1100001000 | + | −4 |
| D68 | 001000100 x | BQ3m6t7tEFJ | 0001<u>111</u>00<u>1</u> | ± | 0 |
| D69 | 101000100 x | FT5u'5q' | 1010001000 | + | −4 |
| D70 | 011000100 x | FT5u'5q' | 0110001000 | + | −4 |
| D71 | 111000100 x | DM4t'6u' | 1110001000 | + | −2 |
| D72 | 000100100 x | BQ3t4m6t7tEFJ | 0001<u>111</u>00<u>1</u> | ± | 0 |
| D73 | 100100100 x | FT5u'5q' | 1001001000 | + | −4 |
| D74 | 010100100 x | FT5u'5q' | 0101001000 | + | −4 |
| D75 | 110100100 x | DM4t'6u' | 1101001000 | + | −2 |
| D76 | 001100100 x | FT5u'5q' | 0011001000 | + | −4 |
| D77 | 101100100 0 | DMK'4t'6u' | 1011001000 | + | −2 |
| D78 | 011100100 x | DM4t'6u' | 0111001000 | + | −2 |
| D79 | 111100100 x | PU4c5c | 1111001000 | − | 0 |
| D80 | 000010100 x | BQ4t6m'8tBCDEJ | 0<u>111</u>00<u>1</u>00<u>1</u> | ± | 0 |
| D81 | 100010100 x | FT5u'5q' | 1000101000 | + | −4 |

TABLE 1B

FIG. 6C  9B10B ENCODING

| Name | ABCDEFGHI K | Coding Class | Primary abcdefghij | Pri DR | Pri DB |
|---|---|---|---|---|---|
| D82 | 010010100 x | FT5u'5q' | 0100101000 | + | −4 |
| D83 | 110010100 x | DM4t'6u' | 1100101000 | + | −2 |
| D84 | 001010100 x | FT5u'5q' | 0010101000 | + | −4 |
| D85 | 101010100 x | DM4t'6u' | 1010101000 | + | −2 |
| D86 | 011010100 x | DM4t'6u' | 0110101000 | + | −2 |
| D87 | 111010100 x | BU4c'6c'4t' | 1110101000 | ± | 0 |
| D88 | 000110100 x | FT5u'5q' | 0001101000 | + | −4 |
| D89 | 100110100 x | DM4t'6u' | 1001101000 | + | −2 |
| D90 | 010110100 x | DM4t'6u' | 0101101000 | + | −2 |
| D91 | 110110100 x | BU4c'6c'4t' | 1101101000 | ± | 0 |
| D92 | 001110100 x | DM4t'6u' | 0011101000 | + | −2 |
| D93 | 101110100 x | BU4c'6c'4t' | 1011101000 | ± | 0 |
| D94 | 011110100 x | BU4c'6c'4t' | 0111101000 | ± | 0 |
| D95 | 111110100 x | BC5v6cCEJ | 11<u>0</u>1001001 | ± | 0 |
| D96 | 000001100 x | BQ4t6m'8tACJ | <u>1010</u>011001 | ± | 0 |
| D97 | 100001100 x | FT5u'5q' | 1000011000 | + | −4 |
| D98 | 010001100 x | FT5u'5q' | 0100011000 | + | −4 |
| D99 | 110001100 x | DM4t'6u' | 1100011000 | + | −2 |
| D100 | 001001100 x | FT5u'5q' | 0010011000 | + | −4 |
| D101 | 101001100 x | DM4t'6u' | 1010011000 | + | −2 |
| D102 | 011001100 x | DM4t'6u' | 0110011000 | + | −2 |
| D103 | 111001100 x | BU4c'6c'4t' | 1110011000 | ± | 0 |
| D104 | 000101100 x | FT5u'5q' | 0001011000 | + | −4 |
| D105 | 100101100 0 | DMK'4t'6u' | 1001011000 | + | −2 |
| D106 | 010101100 x | DM4t'6u' | 0101011000 | + | −2 |
| D107 | 110101100 x | BU4c'6c'4t' | 1101011000 | ± | 0 |
| D108 | 001101100 x | DM4t'6u' | 0011011000 | + | −2 |
| D109 | 101101100 x | BU4c'6c'4t' | 1011011000 | ± | 0 |
| D110 | 011101100 x | BU4c'6c'4t' | 0111011000 | ± | 0 |
| D111 | 111101100 x | BC4c5c7u'CDJ | 11<u>00</u>011001 | ± | 0 |
| D112 | 000011100 x | FT5u'5q' | 0000111000 | + | −4 |
| D113 | 100011100 x | DM4t'6u' | 1000111000 | + | −2 |
| D114 | 010011100 x | DM4t'6u' | 0100111000 | + | −2 |
| D115 | 110011100 x | BU4c'6c'4t' | 1100111000 | ± | 0 |
| D116 | 001011100 x | DM4t'6u' | 0010111000 | + | −2 |
| D117 | 101011100 x | BU4c'6c'4t' | 1010111000 | ± | 0 |
| D118 | 011011100 x | BU4c'6c'4t' | 0110111000 | ± | 0 |
| D119 | 111011100 x | DC4c' | 1110111000 | − | +2 |
| D120 | 000111100 x | DM4t'6u' | 0001111000 | + | −2 |
| D121 | 100111100 x | BU4c'6c'4t' | 1001111000 | ± | 0 |
| D122 | 010111100 x | BU4c'6c'4t' | 0101111000 | ± | 0 |

TABLE 1C

FIG. 6D

9B10B ENCODING

| Name | ABCDEFGHIK | Coding Class | Primary abcdefghij | Pri DR | Pri DB |
|---|---|---|---|---|---|
| D123 | 110111100 x | DC4c' | 1101111000 | − | +2 |
| D124 | 001111100 x | BU4c'6c'4t' | 0011111000 | ± | 0 |
| D125 | 101111100 x | DC4c' | 1011111000 | − | +2 |
| D126 | 011111100 x | DC4c' | 0111111000 | − | +2 |
| D127 | 111111100 x | BV6v8vACEJ | 0101011001 | ± | 0 |
| D128 | 000000010 x | BS6q8qADIJ | 1001000111 | ± | 0 |
| D129 | 100000010 x | BQ4m7q8tEFJ | 1000110101 | ± | 0 |
| D130 | 010000010 x | BQ4m7q8tEFJ | 0100110101 | ± | 0 |
| D131 | 110000010 x | FT5u'5q' | 1100000100 | + | −4 |
| D132 | 001000010 x | BQ4m7q8tEFJ | 0010110101 | ± | 0 |
| D133 | 101000010 x | FT5u'5q' | 1010000100 | + | −4 |
| D134 | 011000010 x | FT5u'5q' | 0110000100 | + | −4 |
| D135 | 111000010 x | DM4t'6u' | 1110000100 | + | −2 |
| D136 | 000100010 x | BQ4m7q8tEFJ | 0001110101 | ± | 0 |
| D137 | 100100010 x | FT5u'5q' | 1001000100 | + | −4 |
| D138 | 010100010 x | FT5u'5q' | 0101000100 | + | −4 |
| D139 | 110100010 x | DM4t'6u' | 1101000100 | + | −2 |
| D140 | 001100010 x | FT5u'5q' | 0011000100 | + | −4 |
| D141 | 101100010 x | DM4t'6u' | 1011000100 | + | −2 |
| D142 | 011100010 x | DM4t'6u' | 0111000100 | + | −2 |
| D143 | 111100010 x | PU4c5c | 1111000100 | − | 0 |
| D144 | 000010010 x | BQ4t6m'8tCGJ | 0010101101 | ± | 0 |
| D145 | 100010010 x | FT5u'5q' | 1000100100 | + | −4 |
| D146 | 010010010 x | FT5u'5q' | 0100100100 | + | −4 |
| D147 | 110010010 x | DM4t'6u' | 1100100100 | + | −2 |
| D148 | 001010010 x | FT5u'5q' | 0010100100 | + | −4 |
| D149 | 101010010 x | DM4t'6u' | 1010100100 | + | −2 |
| D150 | 011010010 x | DM4t'6u' | 0110100100 | + | −2 |
| D151 | 111010010 x | BU4c'6c'4t' | 1110100100 | ± | 0 |
| D152 | 000110010 x | FT5u'5q' | 0001100100 | + | −4 |
| D153 | 100110010 x | DM4t'6u' | 1001100100 | + | −2 |
| D154 | 010110010 x | DM4t'6u' | 0101100100 | + | −2 |
| D155 | 110110010 x | BU4c'6c'4t' | 1101100100 | ± | 0 |
| D156 | 001110010 x | DM4t'6u' | 0011100100 | + | −2 |
| D157 | 101110010 x | BU4c'6c'4t' | 1011100100 | ± | 0 |
| D158 | 011110010 x | BU4c'6c'4t' | 0111100100 | ± | 0 |
| D159 | 111110010 x | BC5v6cABEGJ | 0011001101 | ± | 0 |
| D160 | 000001010 x | BQ4t6m'8tACJ | 1010010101 | ± | 0 |
| D161 | 100001010 x | FT5u'5q' | 1000010100 | + | −4 |
| D162 | 010001010 x | FT5u'5q' | 0100010100 | + | −4 |
| D163 | 110001010 x | DM4t'6u' | 1100010100 | + | −2 |

TABLE 1D

FIG. 6E   9B10B ENCODING

| Name | ABCDEFGHI K | Coding Class | Primary abcdefghij | Pri DR | Pri DB |
|---|---|---|---|---|---|
| D164 | 001001010 x | FT5u'5q' | 0010010100 | + | −4 |
| D165 | 101001010 x | DM4t'6u' | 1010010100 | + | −2 |
| D166 | 011001010 x | DM4t'6u' | 0110010100 | + | −2 |
| D167 | 111001010 x | BU4c'6c'4t' | 1110010100 | ± | 0 |
| D168 | 000101010 x | FT5u'5q' | 0001010100 | + | −4 |
| D169 | 100101010 x | DM4t'6u' | 1001010100 | + | −2 |
| D170 | 010101010 0 | DMK'4t'6u' | 0101010100 | + | −2 |
| D171 | 110101010 x | BU4c'6c'4t' | 1101010100 | ± | 0 |
| D172 | 001101010 x | DM4t'6u' | 0011010100 | + | −2 |
| D173 | 101101010 x | BU4c'6c'4t' | 1011010100 | ± | 0 |
| D174 | 011101010 x | BU4c'6c'4t' | 0111010100 | ± | 0 |
| D175 | 111101010 x | BC4c5c7u'CDJ | 1100010101 | ± | 0 |
| D176 | 000011010 x | FT5u'5q' | 0000110100 | + | −4 |
| D177 | 100011010 x | DM4t'6u' | 1000110100 | + | −2 |
| D178 | 010011010 x | DM4t'6u' | 0100110100 | + | −2 |
| D179 | 110011010 x | BU4c'6c'4t' | 1100110100 | ± | 0 |
| D180 | 001011010 x | DM4t'6u' | 0010110100 | + | −2 |
| D181 | 101011010 x | BU4c'6c'4t' | 1010110100 | ± | 0 |
| D182 | 011011010 x | BU4c'6c'4t' | 0110110100 | ± | 0 |
| D183 | 111011010 x | DC4c' | 1110110100 | − | +2 |
| D184 | 000111010 x | DM4t'6u' | 0001110100 | + | −2 |
| D185 | 100111010 x | BU4c'6c'4t' | 1001110100 | ± | 0 |
| D186 | 010111010 x | BU4c'6c'4t' | 0101110100 | ± | 0 |
| D187 | 110111010 x | DC4c' | 1101110100 | − | +2 |
| D188 | 001111010 x | BU4c'6c'4t' | 0011110100 | ± | 0 |
| D189 | 101111010 x | DC4c' | 1011110100 | − | +2 |
| D190 | 011111010 x | DC4c' | 0111110100 | − | +2 |
| D191 | 111111010 x | BV6v8vADEJ | 0110010101 | ± | 0 |
| D192 | 000000110 x | BQ4t6m'8tACJ | 1010001101 | ± | 0 |
| D193 | 100000110 x | FT5u'5q' | 1000001100 | + | −4 |
| D194 | 010000110 x | FT5u'5q' | 0100001100 | + | −4 |
| D195 | 110000110 x | DM4t'6u' | 1100001100 | + | −2 |
| D196 | 001000110 x | FT5u'5q' | 0010001100 | + | −4 |
| D197 | 101000110 x | DM4t'6u' | 1010001100 | + | −2 |
| D198 | 011000110 x | DM4t'6u' | 0110001100 | + | −2 |
| D199 | 111000110 x | BU4c'6c'4t' | 1110001100 | ± | 0 |
| D200 | 000100110 x | FT5u'5q' | 0001001100 | + | −4 |
| D201 | 100100110 0 | DMK'4t'6u' | 1001001100 | + | −2 |
| D202 | 010100110 x | DM4t'6u' | 0101001100 | + | −2 |
| D203 | 110100110 x | BU4c'6c'4t' | 1101001100 | ± | 0 |
| D204 | 001100110 x | DM4t'6u' | 0011001100 | + | −2 |

TABLE 1E

FIG. 6F

9B10B ENCODING

| Name | ABCDEFGHI K | Coding Class | Primary abcdefghij | Pri DR | Pri DB |
|------|-------------|--------------|--------------------|--------|--------|
| D205 | 101100110 x | BU4c'6c'4t' | 1011001100 | ± | 0 |
| D206 | 011100110 x | BU4c'6c'4t' | 0111001100 | ± | 0 |
| D207 | 111100110 x | DC4c5c7u'CDJ | 1100001101 | ± | 0 |
| D208 | 000010110 x | FT5u'5q' | 0000101100 | + | −4 |
| D209 | 100010110 0 | DMK'4t'6u' | 1000101100 | + | −2 |
| D210 | 010010110 x | DM4t'6u' | 0100101100 | + | −2 |
| D211 | 110010110 x | BU4c'6c'4t' | 1100101100 | ± | 0 |
| D212 | 001010110 x | DM4t'6u' | 0010101100 | + | −2 |
| D213 | 101010110 x | BU4c'6c'4t' | 1010101100 | ± | 0 |
| D214 | 011010110 x | BU4c'6c'4t' | 0110101100 | ± | 0 |
| D215 | 111010110 x | DC4c' | 1110101100 | − | +2 |
| D216 | 000110110 0 | DMK'4t'6u' | 0001101100 | + | −2 |
| D217 | 100110110 x | BU4c'6c'4t' | 1001101100 | ± | 0 |
| D218 | 010110110 x | BU4c'6c'4t' | 0101101100 | ± | 0 |
| D219 | 110110110 x | DC4c' | 1101101100 | − | +2 |
| D220 | 001110110 x | BU4c'6c'4t' | 0011101100 | ± | 0 |
| D221 | 101110110 x | DC4c' | 1011101100 | − | +2 |
| D222 | 011110110 x | DC4c' | 0111101100 | − | +2 |
| D223 | 111110110 x | BV5v6c7vACEJ | 0101001101 | ± | 0 |
| D224 | 000001110 x | BT5q8mAJ | 1000011101 | ± | 0 |
| D225 | 100001110 x | DM4t'6u' | 1000011100 | + | −2 |
| D226 | 010001110 x | DM4t'6u' | 0100011100 | + | −2 |
| D227 | 110001110 x | BU4c'6c'4t' | 1100011100 | ± | 0 |
| D228 | 001001110 x | DM4t'6u' | 0010011100 | + | −2 |
| D229 | 101001110 x | BU4c'6c'4t' | 1010011100 | ± | 0 |
| D230 | 011001110 x | BU4c'6c'4t' | 0110011100 | ± | 0 |
| D231 | 111001110 x | DC4c' | 1110011100 | − | +2 |
| D232 | 000101110 x | DM4t'6u' | 0001011100 | + | −2 |
| D233 | 100101110 x | BU4c'6c'4t' | 1001011100 | ± | 0 |
| D234 | 010101110 x | BU4c'6c'4t' | 0101011100 | ± | 0 |
| D235 | 110101110 x | DC4c' | 1101011100 | − | +2 |
| D236 | 001101110 x | BU4c'6c'4t' | 0011011100 | ± | 0 |
| D237 | 101101110 x | DC4c' | 1011011100 | − | +2 |
| D238 | 011101110 x | DC4c' | 0111011100 | − | +2 |
| D239 | 111101110 x | BV4c5c8vABCJ | 0001011101 | ± | 0 |
| D240 | 000011110 x | BM4t8bCEJ | 0010011101 | ± | 0 |
| D241 | 100011110 x | BU4c'6c'4t' | 1000111100 | ± | 0 |
| D242 | 010011110 x | BU4c'6c'4t' | 0100111100 | ± | 0 |
| D243 | 110011110 x | DC4c' | 1100111100 | − | +2 |
| D244 | 001011110 x | BU4c'6c'4t' | 0010111100 | ± | 0 |
| D245 | 101011110 x | DC4c' | 1010111100 | − | +2 |

TABLE 1F

FIG. 6G

9B10B ENCODING

| Name | ABCDEFGHIK | Coding Class | Primary abcdefghij | Pri DR | Pri DB |
|---|---|---|---|---|---|
| D246 | 011011110 x | DC4c' | 0110111100 | − | +2 |
| D247 | 111011110 x | FV4u8v | 1110111100 | − | +4 |
| D248 | 000111110 x | BU4c'6c'4t' | 0001111100 | ± | 0 |
| D249 | 100111110 x | DC4c' | 1001111100 | − | +2 |
| D250 | 010111110 x | DC4c' | 0101111100 | − | +2 |
| D251 | 110111110 x | FV4u8v | 1101111100 | − | +4 |
| D252 | 001111110 x | DC4c' | 0011111100 | − | +2 |
| D253 | 101111110 x | FV4u8v | 1011111100 | − | +4 |
| D254 | 011111110 x | FV4u8v | 0111111100 | − | +4 |
| D255 | 111111110 x | BH8hADEHJ | 0110011001 | ± | 0 |
| D256 | 000000001 x | BS8sCDHJ | 0011000111 | ± | 0 |
| D257 | 100000001 x | BQ4m8qEFJ | 1000110011 | ± | 0 |
| D258 | 010000001 x | BQ4m8qEFJ | 0100110011 | ± | 0 |
| D259 | 110000001 x | FT5u'5q' | 1100000010 | + | −4 |
| D260 | 001000001 x | BQ4m8qEFJ | 0010110011 | ± | 0 |
| D261 | 101000001 x | FT5u'5q' | 1010000010 | + | −4 |
| D262 | 011000001 x | FT5u'5q' | 0110000010 | + | −4 |
| D263 | 111000001 x | DM4t'6u' | 1110000010 | + | −2 |
| D264 | 000100001 x | BQ4m8qEFJ | 0001110011 | ± | 0 |
| D265 | 100100001 x | FT5u'5q' | 1001000010 | + | −4 |
| D266 | 010100001 x | FT5u'5q' | 0101000010 | + | −4 |
| D267 | 110100001 x | DM4t'6u' | 1101000010 | + | −2 |
| D268 | 001100001 x | FT5u'5q' | 0011000010 | + | −4 |
| D269 | 101100001 x | DM4t'6u' | 1011000010 | + | −2 |
| D270 | 011100001 x | DM4t'6u' | 0111000010 | + | −2 |
| D271 | 111100001 x | PU4c5c | 1111000010 | − | 0 |
| D272 | 000010001 x | BQ4t5t8qACJ | 1010100011 | ± | 0 |
| D273 | 100010001 x | FT5u'5q' | 1000100010 | + | −4 |
| D274 | 010010001 x | FT5u'5q' | 0100100010 | + | −4 |
| D275 | 110010001 x | DM4t'6u' | 1100100010 | + | −2 |
| D276 | 001010001 x | FT5u'5q' | 0010100010 | + | −4 |
| D277 | 101010001 x | DM4t'6u' | 1010100010 | + | −2 |
| D278 | 011010001 x | DM4t'6u' | 0110100010 | + | −2 |
| D279 | 111010001 x | BU4c'6c'4t' | 1110100010 | ± | 0 |
| D280 | 000110001 x | FT5u'5q' | 0001100010 | + | −4 |
| D281 | 100110001 x | DM4t'6u' | 1001100010 | + | −2 |
| D282 | 010110001 x | DM4t'6u' | 0101100010 | + | −2 |
| D283 | 110110001 x | BU4c'6c'4t' | 1101100010 | ± | 0 |
| D284 | 001110001 x | DM4t'6u' | 0011100010 | + | −2 |
| D285 | 101110001 x | BU4c'6c'4t' | 1011100010 | ± | 0 |
| D286 | 011110001 x | BU4c'6c'4t' | 0111100010 | ± | 0 |

TABLE 1G

FIG. 6H
9B10B ENCODING

| Name | ABCDEFGHI K | Coding Class | Primary abcdefghij | Pri DR | Pri DB |
|---|---|---|---|---|---|
| D287 | 111110001 x | BC5v6cCDJ | 11<u>00</u>10001<u>1</u> | ± | 0 |
| D288 | 000001001 x | BQ5q7q8qACJ | <u>1</u>0<u>1</u>0010011 | ± | 0 |
| D289 | 100001001 x | FT5u'5q' | 1000010010 | + | −4 |
| D290 | 010001001 x | FT5u'5q' | 0100010010 | + | −4 |
| D291 | 110001001 x | DM4t'6u' | 1100010010 | + | −2 |
| D292 | 001001001 x | FT5u'5q' | 0010010010 | + | −4 |
| D293 | 101001001 x | DM4t'6u' | 1010010010 | + | −2 |
| D294 | 011001001 x | DM4t'6u' | 0110010010 | + | −2 |
| D295 | 111001001 x | BU4c'6c'4t' | 1110010010 | ± | 0 |
| D296 | 000101001 x | FT5u'5q' | 0001010010 | + | −4 |
| D297 | 100101001 x | DM4t'6u' | 1001010010 | + | −2 |
| D298 | 010101001 x | DM4t'6u' | 0101010010 | + | −2 |
| D299 | 110101001 x | BU4c'6c'4t' | 1101010010 | ± | 0 |
| D300 | 001101001 x | DM4t'6u' | 0011010010 | + | −2 |
| D301 | 101101001 x | BU4c'6c'4t' | 1011010010 | ± | 0 |
| D302 | 011101001 x | BU4c'6c'4t' | 0111010010 | ± | 0 |
| D303 | 111101001 x | BC4c5c7u'CDJ | 11<u>00</u>10100<u>1</u> | ± | 0 |
| D304 | 000011001 x | FT5u'5q' | 0000110010 | + | −4 |
| D305 | 100011001 x | DM4t'6u' | 1000110010 | + | −2 |
| D306 | 010011001 x | DM4t'6u' | 0100110010 | + | −2 |
| D307 | 110011001 x | BU4c'6c'4t' | 1100110010 | ± | 0 |
| D308 | 001011001 x | DM4t'6u' | 0010110010 | + | −2 |
| D309 | 101011001 x | BU4c'6c'4t' | 1010110010 | ± | 0 |
| D310 | 011011001 x | BU4c'6c'4t' | 0110110010 | ± | 0 |
| D311 | 111011001 x | DC4c' | 1110110010 | − | +2 |
| D312 | 000111001 x | DM4t'6u' | 0001110010 | + | −2 |
| D313 | 100111001 x | BU4c'6c'4t' | 1001110010 | ± | 0 |
| D314 | 010111001 x | BU4c'6c'4t' | 0101110010 | ± | 0 |
| D315 | 110111001 x | DC4c' | 1101110010 | − | +2 |
| D316 | 001111001 x | BU4c'6c'4t' | 0011110010 | ± | 0 |
| D317 | 101111001 x | DC4c' | 1011110010 | − | +2 |
| D318 | 011111001 x | DC4c' | 0111110010 | − | +2 |
| D319 | 111111001 x | BV6v8cACEJ | <u>0</u>1<u>0</u>101001<u>1</u> | ± | 0 |
| D320 | 000000101 x | BQ5q7q8qACJ | <u>1</u>0<u>1</u>0001011 | ± | 0 |
| D321 | 100000101 x | FT5u'5q' | 1000001010 | + | −4 |
| D322 | 010000101 x | FT5u'5q' | 0100001010 | + | −4 |
| D323 | 110000101 x | DM4t'6u' | 1100001010 | + | −2 |
| D324 | 001000101 x | FT5u'5q' | 0010001010 | + | −4 |
| D325 | 101000101 x | DM4t'6u' | 1010001010 | + | −2 |
| D326 | 011000101 x | DM4t'6u' | 0110001010 | + | −2 |
| D327 | 111000101 x | BU4c'6c'4t' | 1110001010 | ± | 0 |

TABLE 1H

FIG. 6I

9B10B ENCODING

| Name | ABCDEFGHI K | Coding Class | Primary abcdefghij | Pri DR | Pri DB |
|---|---|---|---|---|---|
| D328 | 000100101 x | FT5u'5q' | 0001001010 | + | −4 |
| D329 | 100100101 x | DM4t'6u' | 1001001010 | + | −2 |
| D330 | 010100101 x | DM4t'6u' | 0101001010 | + | −2 |
| D331 | 110100101 x | BU4c'6c'4t' | 1101001010 | ± | 0 |
| D332 | 001100101 x | DM4t'6u' | 0011001010 | + | −2 |
| D333 | 101100101 x | BU4c'6c'4t' | 1011001010 | ± | 0 |
| D334 | 011100101 x | BU4c'6c'4t' | 0111001010 | ± | 0 |
| D335 | 111100101 x | BC4c6u8uCDJ | 1100100101 | ± | 0 |
| D336 | 000010101 x | FT5u'5q' | 0000101010 | + | −4 |
| D337 | 100010101 x | DM4t'6u' | 1000101010 | + | −2 |
| D338 | 010010101 x | DM4t'6u' | 0100101010 | + | −2 |
| D339 | 110010101 x | BU4c'6c'4t' | 1100101010 | ± | 0 |
| D340 | 001010101 x | DM4t'6u' | 0010101010 | + | −2 |
| D341 | 101010101 0 | BUK'4c'6c'4t'ADEJ | 0011001011 | ± | 0 |
| D342 | 011010101 x | BU4c'6c'4t' | 0110101010 | ± | 0 |
| D343 | 111010101 x | DC4c' | 1110101010 | − | +2 |
| D344 | 000110101 x | DM4t'6u' | 0001101010 | + | −2 |
| D345 | 100110101 x | BU4c'6c'4t' | 1001101010 | ± | 0 |
| D346 | 010110101 x | BU4c'6c'4t' | 0101101010 | ± | 0 |
| D347 | 110110101 x | DC4c' | 1101101010 | − | +2 |
| D348 | 001110101 x | BU4c'6c'4t' | 0011101010 | ± | 0 |
| D349 | 101110101 x | DC4c' | 1011101010 | − | +2 |
| D350 | 011110101 x | DC4c' | 0111101010 | − | +2 |
| D351 | 111110101 x | BV5v6c7vACEJ | 0101001011 | ± | 0 |
| D352 | 000001101 x | BT5q7t8tAJ | 1000011011 | ± | 0 |
| D353 | 100001101 x | DM4t'6u' | 1000011010 | + | −2 |
| D354 | 010001101 x | DM4t'6u' | 0100011010 | + | −2 |
| D355 | 110001101 x | BU4c'6c'4t' | 1100011010 | ± | 0 |
| D356 | 001001101 x | DM4t'6u' | 0010011010 | + | −2 |
| D357 | 101001101 x | BU4c'6c'4t' | 1010011010 | ± | 0 |
| D358 | 011001101 x | BU4c'6c'4t' | 0110011010 | ± | 0 |
| D359 | 111001101 x | DC4c' | 1110011010 | − | +2 |
| D360 | 000101101 x | DM4t'6u' | 0001011010 | + | −2 |
| D361 | 100101101 x | BU4c'6c'4t' | 1001011010 | ± | 0 |
| D362 | 010101101 x | BU4c'6c'4t' | 0101011010 | ± | 0 |
| D363 | 110101101 x | DC4c' | 1101011010 | − | +2 |
| D364 | 001101101 x | BU4c'6c'4t' | 0011011010 | ± | 0 |
| D365 | 101101101 x | DC4c' | 1011011010 | − | +2 |
| D366 | 011101101 x | DC4c' | 0111011010 | − | +2 |
| D367 | 111101101 x | FV5v'8v' | 1111011010 | − | +4 |
| D368 | 000011101 x | BM4t5t8mCEJ | 0010011011 | ± | 0 |

TABLE 1I

FIG. 6J  9B10B ENCODING

| Name | ABCDEFGHIK | Coding Class | Primary abcdefghij | Pri DR | Pri DB |
|---|---|---|---|---|---|
| D369 | 100011101 x | BU4c'6c'4t' | 1000111010 | ± | 0 |
| D370 | 010011101 x | BU4c'6c'4t' | 0100111010 | ± | 0 |
| D371 | 110011101 x | DC4c' | 1100111010 | − | +2 |
| D372 | 001011101 x | BU4c'6c'4t' | 0010111010 | ± | 0 |
| D373 | 101011101 x | DC4c' | 1010111010 | − | +2 |
| D374 | 011011101 x | DC4c' | 0110111010 | − | +2 |
| D375 | 111011101 x | FV5v'8v' | 1110111010 | − | +4 |
| D376 | 000111101 x | BU4c'6c'4t' | 0001111010 | ± | 0 |
| D377 | 100111101 x | DC4c' | 1001111010 | − | +2 |
| D378 | 010111101 x | DC4c' | 0101111010 | − | +2 |
| D379 | 110111101 x | FV5v'8v' | 1101111010 | − | +4 |
| D380 | 001111101 x | DC4c' | 0011111010 | − | +2 |
| D381 | 101111101 x | FV5v'8v' | 1011111010 | − | +4 |
| D382 | 011111101 x | FV5v'8v' | 0111111010 | − | +4 |
| D383 | 111111101 x | BH7h8vADEFJ | 0110001011 | ± | 0 |
| D384 | 000000011 x | BQ7sACJ | 1010000111 | ± | 0 |
| D385 | 100000011 x | FT5u'5q' | 1000000110 | + | −4 |
| D386 | 010000011 x | FT5u'5q' | 0100000110 | + | −4 |
| D387 | 110000011 x | DM4t'6u' | 1100000110 | + | −2 |
| D388 | 001000011 x | FT5u'5q' | 0010000110 | + | −4 |
| D389 | 101000011 x | DM4t'6u' | 1010000110 | + | −2 |
| D390 | 011000011 x | DM4t'6u' | 0110000110 | + | −2 |
| D391 | 111000011 x | BU4c'6c'4t' | 1110000110 | ± | 0 |
| D392 | 000100011 x | FT5u'5q' | 0001000110 | + | −4 |
| D393 | 100100011 x | DM4t'6u' | 1001000110 | + | −2 |
| D394 | 010100011 x | DM4t'6u' | 0101000110 | + | −2 |
| D395 | 110100011 x | BU4c'6c'4t' | 1101000110 | ± | 0 |
| D396 | 001100011 x | DM4t'6u' | 0011000110 | + | −2 |
| D397 | 101100011 x | BU4c'6c'4t' | 1011000110 | ± | 0 |
| D398 | 011100011 x | BU4c'6c'4t' | 0111000110 | ± | 0 |
| D399 | 111100011 x | BC4c6u8uCDJ | 1100000111 | ± | 0 |
| D400 | 000010011 x | FT5u'5q' | 0000100110 | + | −4 |
| D401 | 100010011 x | DM4t'6u' | 1000100110 | + | −2 |
| D402 | 010010011 x | DM4t'6u' | 0100100110 | + | −2 |
| D403 | 110010011 x | BU4c'6c'4t' | 1100100110 | ± | 0 |
| D404 | 001010011 x | DM4t'6u' | 0010100110 | + | −2 |
| D405 | 101010011 x | BU4c'6c'4t' | 1010100110 | ± | 0 |
| D406 | 011010011 x | BU4c'6c'4t' | 0110100110 | ± | 0 |
| D407 | 111010011 x | DC4c' | 1110100110 | − | +2 |
| D408 | 000110011 x | DM4t'6u' | 0001100110 | + | −2 |
| D409 | 100110011 x | BU4c'6c'4t' | 1001100110 | ± | 0 |

TABLE 1J

FIG. 6K

9B10B ENCODING

| Name | ABCDEFGHI K | Coding Class | Primary abcdefghij | Pri DR | Pri DB |
|---|---|---|---|---|---|
| D410 | 010110011 x | BU4c'6c'4t' | 0101100110 | ± | 0 |
| D411 | 110110011 x | DC4c' | 1101100110 | − | +2 |
| D412 | 001110011 x | BU4c'6c'4t' | 0011100110 | ± | 0 |
| D413 | 101110011 x | DC4c' | 1011100110 | − | +2 |
| D414 | 011110011 x | DC4c' | 0111100110 | − | +2 |
| D415 | 111110011 x | BV5v7cACEJ | 0101000111 | ± | 0 |
| D416 | 000001011 x | BT5q6t7qBGIJ | 0100011101 | ± | 0 |
| D417 | 100001011 x | DM4t'6u' | 1000010110 | + | −2 |
| D418 | 010001011 x | DM4t'6u' | 0100010110 | + | −2 |
| D419 | 110001011 x | BU4c'6c'4t' | 1100010110 | ± | 0 |
| D420 | 001001011 x | DM4t'6u' | 0010010110 | + | −2 |
| D421 | 101001011 x | BU4c'6c'4t' | 1010010110 | ± | 0 |
| D422 | 011001011 x | BU4c'6c'4t' | 0110010110 | ± | 0 |
| D423 | 111001011 x | DC4c' | 1110010110 | − | +2 |
| D424 | 000101011 x | DM4t'6u' | 0001010110 | + | −2 |
| D425 | 100101011 x | BU4c'6c'4t' | 1001010110 | ± | 0 |
| D426 | 010101011 x | BU4c'6c'4t' | 0101010110 | ± | 0 |
| D427 | 110101011 x | DC4c' | 1101010110 | − | +2 |
| D428 | 001101011 x | BU4c'6c'4t' | 0011010110 | ± | 0 |
| D429 | 101101011 x | DC4c' | 1011010110 | − | +2 |
| D430 | 011101011 x | DC4c' | 0111010110 | − | +2 |
| D431 | 111101011 x | FV5v'8v' | 1111010110 | − | +4 |
| D432 | 000011011 x | BM4t5t8mBCFHJ | 0110100011 | ± | 0 |
| D433 | 100011011 x | BU4c'6c'4t' | 1000110110 | ± | 0 |
| D434 | 010011011 x | BU4c'6c'4t' | 0100110110 | ± | 0 |
| D435 | 110011011 x | DC4c' | 1100110110 | − | +2 |
| D436 | 001011011 x | BU4c'6c'4t' | 0010110110 | ± | 0 |
| D437 | 101011011 x | DC4c' | 1010110110 | − | +2 |
| D438 | 011011011 x | DC4c' | 0110110110 | − | +2 |
| D439 | 111011011 x | FV5v'8v' | 1110110110 | − | +4 |
| D440 | 000111011 x | BU4c'6c'4t' | 0001110110 | ± | 0 |
| D441 | 100111011 x | DC4c' | 1001110110 | − | +2 |
| D442 | 010111011 x | DC4c' | 0101110110 | − | +2 |
| D443 | 110111011 x | FV5v'8v' | 1101110110 | − | +4 |
| D444 | 001111011 x | DC4c' | 0011110110 | − | +2 |
| D445 | 101111011 x | FV5v'8v' | 1011110110 | − | +4 |
| D446 | 011111011 x | FV5v'8v' | 0111110110 | − | +4 |
| D447 | 111111011 x | BH6v7vADEHJ | 0110010011 | ± | 0 |
| D448 | 000000111 x | BT6qBCIJ | 0110001101 | ± | 0 |
| D449 | 100000111 x | DM4t'6u' | 1000001110 | + | −2 |
| D450 | 010000111 x | DM4t'6u' | 0100001110 | + | −2 |

TABLE 1K

FIG. 6L   9B10B ENCODING

| Name | ABCDEFGHI K | Coding Class | Primary abcdefghij | Pri DR | Pri DB |
|---|---|---|---|---|---|
| D451 | 110000111 x | BU4c'6c'4t' | 1100001110 | ± | 0 |
| D452 | 001000111 x | DM4t'6u' | 0010001110 | + | −2 |
| D453 | 101000111 x | BU4c'6c'4t' | 1010001110 | ± | 0 |
| D454 | 011000111 x | BU4c'6c'4t' | 0110001110 | ± | 0 |
| D455 | 111000111 x | DC4c' | 1110001110 | − | +2 |
| D456 | 000100111 x | DM4t'6u' | 0001001110 | + | −2 |
| D457 | 100100111 x | BU4c'6c'4t' | 1001001110 | ± | 0 |
| D458 | 010100111 x | BU4c'6c'4t' | 0101001110 | ± | 0 |
| D459 | 110100111 x | DC4c' | 1101001110 | − | +2 |
| D460 | 001100111 x | BU4c'6c'4t' | 0011001110 | ± | 0 |
| D461 | 101100111 x | DC4c' | 1011001110 | − | +2 |
| D462 | 011100111 x | DC4c' | 0111001110 | − | +2 |
| D463 | 111100111 x | FV5v'8v' | 1111001110 | − | +4 |
| D464 | 000010111 x | BM4t5t8mBIJ | 0100101101 | ± | 0 |
| D465 | 100010111 x | BU4c'6c'4t' | 1000101110 | ± | 0 |
| D466 | 010010111 x | BU4c'6c'4t' | 0100101110 | ± | 0 |
| D467 | 110010111 x | DC4c' | 1100101110 | − | +2 |
| D468 | 001010111 x | BU4c'6c'4t' | 0010101110 | ± | 0 |
| D469 | 101010111 x | DC4c' | 1010101110 | − | +2 |
| D470 | 011010111 x | DC4c' | 0110101110 | − | +2 |
| D471 | 111010111 x | FV5v'8v' | 1110101110 | − | +4 |
| D472 | 000110111 x | BU4c'6c'4t' | 0001101110 | ± | 0 |
| D473 | 100110111 x | DC4c' | 1001101110 | − | +2 |
| D474 | 010110111 x | DC4c' | 0101101110 | − | +2 |
| D475 | 110110111 x | FV5v'8v' | 1101101110 | − | +4 |
| D476 | 001110111 x | DC4c' | 0011101110 | − | +2 |
| D477 | 101110111 x | FV5v'8v' | 1011101110 | − | +4 |
| D478 | 011110111 x | FV5v'8v' | 0111101110 | − | +4 |
| D479 | 111110111 x | BH5v6cADEGJ | 0110000111 | ± | 0 |
| D480 | 000001111 x | BM5qBHJ | 0100011011 | ± | 0 |
| D481 | 100001111 x | BU4c'6c'4t' | 1000011110 | ± | 0 |
| D482 | 010001111 x | BU4c'6c'4t' | 0100011110 | ± | 0 |
| D483 | 110001111 x | DC4c' | 1100011110 | − | +2 |
| D484 | 001001111 x | BU4c'6c'4t' | 0010011110 | ± | 0 |
| D485 | 101001111 x | DC4c' | 1010011110 | − | +2 |
| D486 | 011001111 x | DC4c' | 0110011110 | − | +2 |
| D487 | 111001111 x | FV5v'8v' | 1110011110 | − | +4 |
| D488 | 000101111 x | BU4c'6c'4t' | 0001011110 | ± | 0 |
| D489 | 100101111 x | DC4c' | 1001011110 | − | +2 |
| D490 | 010101111 x | DC4c' | 0101011110 | − | +2 |
| D491 | 110101111 x | FV5v'8v' | 1101011110 | − | +4 |

TABLE 1L

FIG. 6M

9B10B ENCODING

| Name | ABCDEFGHIK | Coding Class | Primary abcdefghij | Pri DR | Pri DB |
|---|---|---|---|---|---|
| D492 | 001101111 x | DC4c' | 0011011110 | − | +2 |
| D493 | 101101111 x | FV5v'8v' | 1011011110 | − | +4 |
| D494 | 011101111 x | FV5v'8v' | 0111011110 | − | +4 |
| D495 | 111101111 x | BH4c5cABCH | 0001011011 | ± | 0 |
| D496 | 000011111 x | PU4t | 0000111110 | + | 0 |
| D497 | 100011111 x | DC4c' | 1000111110 | − | +2 |
| D498 | 010011111 x | DC4c' | 0100111110 | − | +2 |
| D499 | 110011111 x | FV5v'8v' | 1100111110 | − | +4 |
| D500 | 001011111 x | DC4c' | 0010111110 | − | +2 |
| D501 | 101011111 x | FV5v'8v' | 1010111110 | − | +4 |
| D502 | 011011111 x | FV5v'8v' | 0110111110 | − | +4 |
| D503 | 111011111 x | BH3c4uEFGIJ | 1110000101 | ± | 0 |
| D504 | 000111111 x | DC4c' | 0001111110 | − | +2 |
| D505 | 100111111 x | FV5v'8v' | 1001111110 | − | +4 |
| D506 | 010111111 x | FV5v'8v' | 0101111110 | − | +4 |
| D507 | 110111111 x | BH1u3uEFGIJ | 1101000101 | ± | 0 |
| D508 | 001111111 0 | BVK'2mEGIJ | 0011010101 | ± | 0 |
| D509 | 101111111 x | BH1u3uEFGIJ | 1011000101 | ± | 0 |
| D510 | 011111111 x | BH1mEFGIJ | 0111000101 | ± | 0 |
| D511 | 111111111 x | BXBCEGIJ | 1001010101 | ± | 0 |
| C508 | 001111111 1 | FVK | 0011111110 | − | +4 |
| K39* | 111001000 1 | DMK | 1110010000 | + | −2 |
| K43* | 110101000 1 | DMK | 1101010000 | + | −2 |
| K45* | 101101000 1 | DMK | 1011010000 | + | −2 |
| K46* | 011101000 1 | DMK | 0111010000 | + | −2 |
| K51* | 110011000 1 | DMK | 1100110000 | + | −2 |
| K53* | 101011000 1 | DMK | 1010110000 | + | −2 |
| K54* | 011011000 1 | DMK | 0110110000 | + | −2 |
| K57* | 100111000 1 | DMK | 1001110000 | + | −2 |
| K58* | 010111000 1 | DMK | 0101110000 | + | −2 |
| K60* | 001111000 1 | DMK | 0011110000 | + | −2 |
| K77 | 101100100 1 | BMKJ | 1011001001 | ± | 0 |
| K105 | 100101100 1 | BMKJ | 1001011001 | ± | 0 |
| K170 | 010101010 1 | BMKJ | 0101010101 | ± | 0 |
| K201 | 100100110 1 | BMKJ | 1001001101 | ± | 0 |
| K209 | 100010110 1 | BMKJ | 1000101101 | ± | 0 |
| K216 | 000110110 1 | BMKJ | 0001101101 | ± | 0 |
| K341 | 101010101 1 | BUK | 1010101010 | ± | 0 |

TABLE 1M
*OPTIONAL CONTROL VECTORS FOR 16B18B CODE, NOT VALID FOR CONTIGUOUS 9B10B VECTORS.

116 CODED VECTORS OF FIG. 10 WITH ASSIGNED SOURCE VECTORS

| NAME | ABCDEFGHI K | abcdefghij | S | NAME | ABCDEFGHI K | abcdefghij |
|---|---|---|---|---|---|---|
| D23 | 111010000 x | 1110100001 | 0 | D17 | 100010000 x | 1000100111 |
| D27 | 110110000 x | 1101100001 | 0 | D18 | 010010000 x | 0100100111 |
| D29 | 101110000 x | 1011100001 | 0 | D20 | 001010000 x | 0010100111 |
| D30 | 011110000 x | 0111100001 | 0 | D24 | 000110000 x | 0001100111 |
| D39 | 111001000 x | 1110010001 | 0 | D33 | 100001000 x | 1000010111 |
| D43 | 110101000 x | 1101010001 | 0 | D34 | 010001000 x | 0100010111 |
| D45 | 101101000 x | 1011010001 | 0 | D36 | 001001000 x | 0010010111 |
| D46 | 011101000 x | 0111010001 | 0 | D40 | 000101000 x | 0001010111 |
| D51 | 110011000 x | 1100110001 | 0 | D65 | 100000100 x | 1000111001 |
| D53 | 101011000 x | 1010110001 | 0 | D66 | 010000100 x | 0100111001 |
| D54 | 011011000 x | 0110110001 | 0 | D68 | 001000100 x | 0010111001 |
| D57 | 100111000 x | 1001110001 | 0 | D72 | 000100100 x | 0001111001 |
| D58 | 010111000 x | 0101110001 | 0 | D129 | 100000010 x | 1000110101 |
| D60 | 001111000 x | 0011110001 | 0 | D130 | 010000010 x | 0100110101 |
| D19 | 110010000 x | 1100100101 | 0 | D132 | 001000010 x | 0010110101 |
| D21 | 101010000 x | 1010100101 | 0 | D136 | 000100010 x | 0001110101 |
| D22 | 011010000 x | 0110100101 | 0 | D257 | 100000001 x | 1000110011 |
| D25 | 100110000 x | 1001100101 | 0 | D258 | 010000001 x | 0100110011 |
| D26 | 010110000 x | 0101100101 | 0 | D260 | 001000001 x | 0010110011 |
| D28 | 001110000 x | 0011100101 | 0 | D264 | 000100001 x | 0001110011 |
| D224 | 000001110 x | 1000011101 | 0 | D240 | 000011110 x | 0010011101 |
| D352 | 000001101 x | 1000011011 | 0 | D368 | 000011101 x | 0010011011 |
| D96 | 000001100 x | 1010011001 | 1 | D415 | 111110011 x | 0101000111 |
| D384 | 000000011 x | 1010000111 | 1 | D127 | 111111100 x | 0101011001 |
| D160 | 000001010 x | 1010010101 | 1 | D351 | 111110101 x | 0101001011 |
| D192 | 000000110 x | 1010001101 | 1 | D319 | 111111001 x | 0101010011 |
| D288 | 000001001 x | 1010010011 | 1 | D223 | 111110110 x | 0101001101 |
| D320 | 000000101 x | 1010001011 | 1 | D191 | 111111010 x | 0110010101 |

TABLE 2A

FIG. 14B

116 CODED VECTORS OF FIG. 10 WITH ASSIGNED SOURCE VECTORS

| NAME | ABCDEFGHI K | abcdefghij | S | NAME | ABCDEFGHI K | abcdefghij |
|---|---|---|---|---|---|---|
| D1   | 100000000 x | 1000101011 | 1 | D510 | 011111111 x | 0111000101 |
| D2   | 010000000 x | 0100101011 | 1 | D509 | 101111111 x | 1011000101 |
| D4   | 001000000 x | 0010101011 | 1 | D507 | 110111111 x | 1101000101 |
| D8   | 000100000 x | 0001101011 | 1 | D503 | 111011111 x | 1110000101 |
| D16  | 000010000 x | 1001100011 | 1 | D495 | 111101111 x | 0001011011 |
| D32  | 000001000 x | 1001010011 | 1 | D479 | 111110111 x | 0110000111 |
| D64  | 000000100 x | 1001001011 | 1 | D447 | 111111011 x | 0110010011 |
| D128 | 000000010 x | 1001000111 | 1 | D383 | 111111101 x | 0110001011 |
| D256 | 000000001 x | 0011000111 | 1 | D255 | 111111110 x | 0110011001 |
| D3   | 110000000 x | 1100101001 | 0 | D7   | 111000000 x | 1110000011 |
| D12  | 001100000 x | 0011101001 | 0 | D11  | 110100000 x | 1101000011 |
| D5   | 101000000 x | 1010101001 | 0 | D13  | 101100000 x | 1011000011 |
| D6   | 011000000 x | 0110101001 | 0 | D14  | 011100000 x | 0111000011 |
| D9   | 100100000 x | 1001101001 | 0 | D416 | 000001011 x | 0100011101 |
| D10  | 010100000 x | 0101101001 | 0 | D448 | 000000111 x | 0110001101 |
| D111 | 111101100 x | 1100011001 | 0 | D480 | 000001111 x | 0100011011 |
| D399 | 111100011 x | 1100000111 | 0 | D48  | 000011000 x | 0101100011 |
| D175 | 111101010 x | 1100010101 | 0 | D80  | 000010100 x | 0111001001 |
| D207 | 111100110 x | 1100001101 | 0 | D432 | 000011011 x | 0110100011 |
| D303 | 111101001 x | 1100010011 | 0 | D464 | 000010111 x | 0100101101 |
| D335 | 111100101 x | 1100001011 | 0 | D0   | 000000000 x | 1110001001 |
| D287 | 111110001 x | 1100100011 | 0 | D508 | 001111111 x | 0011010101 |
| D95  | 111110100 x | 1101001001 | 0 | D511 | 111111111 x | 1001010101 |
| D15  | 111100000 x | 0011011001 | 0 | D341 | 101010101 0 | 0011001011 |
| D239 | 111101110 x | 0001011101 | 0 | K77  | 101100100 1 | 1011001001 |
| D31  | 111110000 x | 0011100011 | 0 | K105 | 100101100 1 | 1001011001 |
| D63  | 111111000 x | 0011010011 | 0 | K170 | 010101010 1 | 0101010101 |
| D159 | 111110010 x | 0011001101 | 0 | K201 | 100100110 1 | 1001001101 |
| D144 | 000010010 x | 0010101101 | 0 | K209 | 100010110 1 | 1000101101 |
| D272 | 000010001 x | 1010100011 | 0 | K216 | 000110110 1 | 0001101101 |

TABLE 2B

FIG. 15 a-BIT ENCODING

| Name | ABCDEFGHI K | a | S | Name | ABCDEFGHI K | a | Coding Label |
|------|-------------|---|---|------|-------------|---|--------------|
| D128 | 000000010 x | 1 | 1 | D383 | 111111101 x | 0 | |
| *D384 | 000000011 x | 1 | 1 | *D127 | 111111100 x | 0 | |
| D32 | 000001000 x | 1 | 1 | D479 | 111110111 x | 0 | |
| D64 | 000000100 x | 1 | 1 | D447 | 111111011 x | 0 | $(E \oplus F' \cdot F \oplus G' \cdot G \oplus H +$ |
| D96 | 000001100 x | 1 | 1 | D415 | 111110011 x | 0 | $E \oplus I' \cdot F \oplus G \cdot H \oplus I' +$ |
| D384 | 000000011 x | 1 | 1 | D127 | 111111100 x | 0 | $F \oplus H \cdot G \oplus I + F \oplus G \cdot H \oplus I) \cdot$ |
| D160 | 000001010 x | 1 | 1 | D351 | 111110101 x | 0 | $A \oplus B' \cdot B \oplus C' \cdot C \oplus D' \cdot D \oplus E'$ |
| D192 | 000000110 x | 1 | 1 | D319 | 111111001 x | 0 | |
| D288 | 000001001 x | 1 | 1 | D223 | 111110110 x | 0 | |
| D320 | 000000101 x | 1 | 1 | D191 | 111111010 x | 0 | |
| D16 | 000010000 x | 1 | 1 | D495 | 111101111 x | 0 | $A \oplus B' \cdot B \oplus C' \cdot C \oplus D' \cdot D \oplus E \cdot$ $E \oplus F \cdot F \oplus G' \cdot G \oplus H' \cdot H \oplus I'$ |
| D0 | 000000000 x | 1 | 1 | D255 | 111111110 x | 0 | $A \oplus B' \cdot B \oplus C' \cdot C \oplus D' \cdot D \oplus E' \cdot$ |
| D224 | 000001110 x | 1 | 1 | D31 | 111110000 x | 0 | $F \oplus G' \cdot G \oplus H' \cdot I'$ |
| D352 | 000001101 x | 1 | 1 | D159 | 111110010 x | 0 | $A \oplus B' \cdot B \oplus C' \cdot C \oplus D' \cdot D \oplus H' \cdot$ |
| D272 | 000010001 x | 1 | 1 | D239 | 111101110 x | 0 | $H \oplus I \cdot E \oplus F \cdot F \oplus G'$ |
| D15 | 111100000 x | 0 | 1 | D63 | 111111000 x | 0 | $E \oplus F' \cdot A \cdot B \cdot C \cdot D \cdot G' \cdot H' \cdot I'$ |
| | | | | D341 | 101010101 0 | 0 | $A \cdot B' \cdot C \cdot D' \cdot E \cdot F' \cdot G \cdot H' \cdot I \cdot K'$ |

TABLE 3a $a = A \oplus \{(E \oplus F' \cdot F \oplus G' \cdot G \oplus H + E \oplus I' \cdot F \oplus G \cdot H \oplus I' + F \oplus H \cdot G \oplus I + F \oplus G \cdot H \oplus I) \cdot$    (n0)
$A \oplus B' \cdot B \oplus C' \cdot C \oplus D' \cdot D \oplus E' +$    (Pn1*)
$A \oplus B' \cdot B \oplus C' \cdot C \oplus D' \cdot D \oplus E \cdot E \oplus F \cdot F \oplus G' \cdot G \oplus H' \cdot H \oplus I' +$    (n2)
$A \oplus B' \cdot B \oplus C' \cdot C \oplus D' \cdot D \oplus H' \cdot H \oplus I \cdot E \oplus F \cdot F \oplus G' +$    (n3)
$A \oplus B' \cdot B \oplus C' \cdot C \oplus D' \cdot D \oplus E' \cdot F \oplus G' \cdot G \oplus H' \cdot I' +$    (n4)
$E \oplus F' \cdot A \cdot B \cdot C \cdot D \cdot G' \cdot H' \cdot I' + A \cdot B' \cdot C \cdot D' \cdot E \cdot F' \cdot G \cdot H' \cdot I \cdot K'\}$    (Pn5*)

FIG. 16 b-BIT ENCODING

| Name | ABCDEFGHI K | b | S | Name | ABCDEFGHI K | b | Coding Label |
|---|---|---|---|---|---|---|---|
| D0 | 000000000 x | 1 | 1 | D511 | 111111111 x | 0 | A⊕B'•B⊕C'•C⊕D'•D⊕E' • G⊕H'•H⊕I' • (E⊕F'+F⊕G') |
| D480 | 000001111 x | 1 | 1 | D31 | 111110000 x | 0 | |
| *D0 | 000000000 x | 1 | 1 | *D511 | 111111111 x | 0 | |
| D448 | 000000111 x | 1 | 1 | D63 | 111111000 x | 0 | |
| D48 | 000011000 x | 1 | 1 | D239 | 111101110 x | 0 | (E⊕G•G⊕H'•F•I'+E⊕G'•F'•H'• I')•A⊕B'•B⊕C'•C⊕D'•D⊕E |
| D80 | 000010100 x | 1 | 1 | D15 | 111100000 x | 0 | |
| D416 | 000001011 x | 1 | 1 | D159 | 111110010 x | 0 | A⊕B'•B⊕C'•C⊕D'•D⊕E' • B⊕I•E⊕F•G'•H |
| D432 | 000011011 x | 1 | 1 | D464 | 000010111 x | 1 | F⊕G•A'•B'•C'•D'•E•H•I |
|  |  |  |  | D495 | 111101111 x | 0 | A•B•C•D•E'•F•G•H•I |

TABLE 3b $b = B \oplus \{A \oplus B' \cdot B \oplus C' \cdot C \oplus D' \cdot D \oplus E' \cdot G \oplus H' \cdot H \oplus I' \cdot (E \oplus F' + F \oplus G') +$    (n6)
$(E \oplus G \cdot G \oplus H' \cdot F \cdot I' + E \oplus G' \cdot F' \cdot H' \cdot I') \cdot A \oplus B' \cdot B \oplus C' \cdot C \oplus D' \cdot D \oplus E +$    (Pn8*;Pn9*)
$A \oplus B' \cdot B \oplus C' \cdot C \oplus D' \cdot D \oplus E' \cdot B \oplus I \cdot E \oplus F \cdot G' \cdot H +$    (Pn9*)
$F \oplus G \cdot A' \cdot B' \cdot C' \cdot D' \cdot E \cdot H \cdot I + A \cdot B \cdot C \cdot D \cdot E' \cdot F \cdot G \cdot H \cdot I\}$    (Pn9*;Pn8*)

FIG. 17 c-BIT ENCODING

| Name | ABCDEFGHI K | c | S | Name | ABCDEFGHI K | c | Coding Label |
|---|---|---|---|---|---|---|---|
| D96 | 000001100 x | 1 | 1 | D415 | 111110011 x | 0 | (F⊕H•G⊕I + F⊕G•H⊕I) • (E⊕G•G⊕I')' • A⊕B'•B⊕C'•C⊕D'•D⊕E' |
| D384 | 000000011 x | 1 | 1 | D127 | 111111100 x | 0 | |
| D160 | 000001010 x | 1 | 1 | D351 | 111110101 x | 0 | |
| D192 | 000000110 x | 1 | 1 | D319 | 111111001 x | 0 | |
| D288 | 000001001 x | 1 | 1 | D223 | 111110110 x | 0 | |
| D272 | 000010001 x | 1 | 1 | D207 | 111100110 x | 0 | (E⊕G•G⊕H'•H⊕I•F'+ E⊕F•G⊕H•I'+E⊕F'•G'•H•I+ E⊕G'•F•H'•I+F•G•H•I') • A⊕B'•B⊕C'•C⊕D'•D⊕E |
| D80 | 000010100 x | 1 | 1 | D111 | 111101100 x | 0 | |
| D144 | 000010010 x | 1 | 1 | D175 | 111101010 x | 0 | |
| D432 | 000011011 x | 1 | 1 | D399 | 111100011 x | 0 | |
| D368 | 000011101 x | 1 | 1 | D303 | 111101001 x | 0 | |
| D240 | 000011110 x | 1 | 1 | D239 | 111101110 x | 0 | |
| D95 | 111110100 x | 0 | 1 | D287 | 111110001 x | 0 | G⊕I•E•F'•H' • A•B•C•D |
| D0 | 000000000 x | 1 | 1 | D256 | 000000001 x | 1 | (G'•H'+ G•I) • A'•B'•C'•D' • E'•F' |
| D320 | 000000101 x | 1 | 1 | D448 | 000000111 x | 1 | |
| | | | | D495 | 111101111 x | 0 | (E'•F'•H' + F•H) • A•B•C•D • G•I |
| | | | | D511 | 111111111 x | 0 | |
| | | | | D335 | 111100101 x | 0 | |

TABLE 3c $c = C \oplus \{(F \oplus H \cdot G \oplus I + F \oplus G \cdot H \oplus I) \cdot (E \oplus G \cdot G \oplus I')' \cdot A \oplus B' \cdot B \oplus C' \cdot C \oplus D' \cdot D \oplus E' +$ (Pn12*)
$(E \oplus G \cdot G \oplus H' \cdot H \oplus I \cdot F' + E \oplus F \cdot G \oplus H \cdot I' + E \oplus F' \cdot G' \cdot H \cdot I + E \oplus G' \cdot F \cdot H' \cdot I +$ (n10)
$F \cdot G \cdot H \cdot I') \cdot A \oplus B' \cdot B \oplus C' \cdot C \oplus D' \cdot D \oplus E +$ (Pn12*;Pn11*)
$G \oplus I \cdot E \cdot F' \cdot H' \cdot A \cdot B \cdot C \cdot D +$ (Pn13*)
$(E' \cdot F' \cdot H' + F \cdot H) \cdot A \cdot B \cdot C \cdot D \cdot G \cdot I + (G' \cdot H' + G \cdot I) \cdot A' \cdot B' \cdot C' \cdot D' \cdot E' \cdot F'\}$ (Pn13*)

FIG. 18 d-BIT ENCODING

| Name | ABCDEFGHIK | d | S | Name | ABCDEFGHIK | d | Coding Label |
|---|---|---|---|---|---|---|---|
| D64 | 000000100 x | 1 | 1 | D447 | 111111011 x | 0 | A⊕B'•B⊕C'•C⊕D'•D⊕E' • |
| D128 | 000000010 x | 1 | 1 | D383 | 111111101 x | 0 | E⊕F' • (F⊕G'•G⊕H'•H⊕I + |
| D256 | 000000001 x | 1 | 1 | D255 | 111111110 x | 0 | B⊕I'•G⊕H) |
| D80 | 000010100 x | 1 | 1 | D287 | 111110001 x | 0 | A⊕B'•B⊕C'•C⊕D'•D⊕G • |
|  |  |  |  |  |  |  | G⊕I•E•F'•H' |
| D16 | 000010000 x | 1 | 1 | D32 | 000001000 x | 1 | E⊕F•A'•B'•C'•D'•G'•H'•I' |
| D341 | 101010101 0 | 1 |  |  |  |  | A•B'•C•D'•E•F'•G•H'•I•K' |
| D191 | 111111010 x | 0 | 1 | D479 | 111110111 x | 0 | F⊕G•G⊕I' • A•B•C•D • E•H |
|  |  |  |  | D111 | 111101100 x | 0 |  |
|  |  |  |  | D399 | 111100011 x | 0 |  |
|  |  |  |  | D175 | 111101010 x | 0 | (F⊕H•G⊕I+F⊕G•H⊕I)• |
|  |  |  |  | D207 | 111100110 x | 0 | A•B•C•D • E' |
|  |  |  |  | D303 | 111101001 x | 0 |  |
|  |  |  |  | D335 | 111100101 x | 0 |  |

TABLE 3d $d = D \oplus \{(F \oplus H \cdot G \oplus I + F \oplus G \cdot H \oplus I) \cdot A \cdot B \cdot C \cdot D \cdot E' +$     (Pn17*)
$(F \oplus G' \cdot G \oplus H' \cdot H \oplus I + B \oplus I' \cdot G \oplus H) \cdot A \oplus B' \cdot B \oplus C' \cdot C \oplus D' \cdot D \oplus E' \cdot E \oplus F' +$   (n14;n15)
$A \oplus B' \cdot B \oplus C' \cdot C \oplus D' \cdot D \oplus G \cdot G \oplus I \cdot E \cdot F' \cdot H' + A \cdot B' \cdot C \cdot D' \cdot E \cdot F' \cdot G \cdot H' \cdot I \cdot K' +$   (Pn17*)
$F \oplus G \cdot G \oplus I' \cdot A \cdot B \cdot C \cdot D \cdot E \cdot H + E \oplus F \cdot A' \cdot B' \cdot C' \cdot D' \cdot G' \cdot H' \cdot I'\}$   (Pn16*)

FIG. 19 e-BIT ENCODING

| Name | ABCDEFGHI K | e | S | Name | ABCDEFGHI K | e | Coding Label |
|---|---|---|---|---|---|---|---|
| | | | | D63 | 111111000 x | 0 | |
| | | | | D95 | 111110100 x | 0 | |
| | | | | D127 | 111111100 x | 0 | |
| | | | | D159 | 111110010 x | 0 | |
| | | | | D191 | 111111010 x | 0 | |
| | | | | D223 | 111110110 x | 0 | |
| | | | | D255 | 111111110 x | 0 | (F+G+H) • A•B•C•D • E |
| | | | | D319 | 111111001 x | 0 | |
| | | | | D351 | 111110101 x | 0 | |
| | | | | D383 | 111111101 x | 0 | |
| | | | | D415 | 111110011 x | 0 | |
| | | | | D447 | 111111011 x | 0 | |
| | | | | D479 | 111110111 x | 0 | |
| | | | | D511 | 111111111 x | 0 | |
| | | | | D80 | 000010100 x | 0 | (H⊕I•F + F'•H'•I') • |
| | | | | D240 | 000011110 x | 0 | A'•B'•C'•D' • E•G |
| | | | | D368 | 000011101 x | 0 | |
| D1 | 100000000 x | 1 | 1 | D510 | 011111111 x | 0 | (A⊕B'•B⊕C•C⊕D'•D⊕E' + |
| D2 | 010000000 x | 1 | 1 | D509 | 101111111 x | 0 | A⊕B'•B⊕I'•C⊕D + |
| D4 | 001000000 x | 1 | 1 | D507 | 110111111 x | 0 | A⊕B•C⊕D'•D⊕E') • |
| D8 | 000100000 x | 1 | 1 | D503 | 111011111 x | 0 | E⊕F'•F⊕G'•G⊕H'•H⊕I'•K' |
| D3 | 110000000 x | 1 | 1 | D508 | 001111111 0 | 0 | |
| D5 | 101000000 x | 1 | | | | | |
| D6 | 011000000 x | 1 | | | | | (A⊕B•C⊕D + A'•B'•C•D) • |
| D9 | 100100000 x | 1 | | | | | E'•F'•G'•H'•I' |
| D10 | 010100000 x | 1 | | | | | |
| D12 | 001100000 x | 1 | | | | | |
| D65 | 100000100 x | 1 | | | | | |
| D66 | 010000100 x | 1 | | | | | (A⊕B•G⊕H•I'+A⊕B•G'•H'•I) • |
| D129 | 100000010 x | 1 | 0 | D257 | 100000001 x | 1 | C'•D'•E'•F' |
| D130 | 010000010 x | 1 | 0 | D258 | 010000001 x | 1 | |
| D68 | 001000100 x | 1 | | | | | |
| D72 | 000100100 x | 1 | | | | | (G⊕H • I' + G'•H'•I) • |
| D132 | 001000010 x | 1 | 0 | D260 | 001000001 x | 1 | C⊕D • A'•B'•E'•F' |
| D136 | 000100010 x | 1 | 0 | D264 | 000100001 x | 1 | |
| | | | | D341 | 1010101010 | 0 | A•B'•C•D'•E•F'•G•H'•I•K' |

TABLE 3e

FIG. 20

$e = E \oplus \{(A \oplus B' \cdot B \oplus C \cdot C \oplus D' \cdot D \oplus E' + A \oplus B' \cdot B \oplus I' \cdot C \oplus D + A \oplus B \cdot C \oplus D' \cdot D \oplus E') \cdot$     (n18)
    $E \oplus F' \cdot F \oplus G' \cdot G \oplus H' \cdot H \oplus I' \cdot K' +$     (Pn19)
    $(A \oplus B \cdot G \oplus H \cdot I' + A \oplus B \cdot G' \cdot H' \cdot I) \cdot C' \cdot D' \cdot E' \cdot F' +$     (n22;n23)
    $(A \oplus B \cdot C \oplus D + A' \cdot B' \cdot C \cdot D) \cdot E' \cdot F' \cdot G' \cdot H' \cdot I +$     (Pn24*)
    $(H \oplus I \cdot F + F' \cdot H' \cdot I') \cdot A' \cdot B' \cdot C' \cdot D' \cdot E \cdot G +$     (n20;Pn21)
    $(G \oplus H \cdot I' + G' \cdot H' \cdot I) \cdot C \oplus D \cdot A' \cdot B' \cdot E' \cdot F' + (F + G + H) \cdot A \cdot B \cdot C \cdot D \cdot E +$     (Pn25*)
    $A \cdot B' \cdot C \cdot D' \cdot E \cdot F' \cdot G \cdot H' \cdot I \cdot K'\}$     (Pn25*)

FIG. 21 f-BIT ENCODING

| Name | ABCDEFGHI K | f | S | Name | ABCDEFGHI K | f | Coding Label |
|---|---|---|---|---|---|---|---|
| D15 | 111100000 x | 1 | 1 | D432 | 000011011 x | 0 | $A \oplus B' \cdot B \oplus C' \cdot C \oplus D' \cdot D \oplus E \cdot$ $E \oplus F' \cdot B \oplus I \cdot H \oplus I' \cdot G'$ |
| D65 | 100000100 x | 1 | | | | | |
| D66 | 010000100 x | 1 | | | | | |
| D68 | 001000100 x | 1 | | | | | |
| D72 | 000100100 x | 1 | | | | | |
| D129 | 100000010 x | 1 | | | | | $(A \oplus B \cdot C' \cdot D' + C \oplus D \cdot A' \cdot B') \cdot$ $(G \cdot H' \cdot I' + G' \cdot H \cdot I' + G' \cdot H' \cdot I) \cdot$ $E' \cdot F'$ |
| D130 | 010000010 x | 1 | | | | | |
| D132 | 001000010 x | 1 | | | | | |
| D136 | 000100010 x | 1 | | | | | |
| D257 | 100000001 x | 1 | | | | | |
| D258 | 010000001 x | 1 | | | | | |
| D260 | 001000001 x | 1 | | | | | |
| D264 | 000100001 x | 1 | | | | | |
| | | | | D383 | 111111101 x | 0 | $A \cdot B \cdot C \cdot D \cdot E \cdot F \cdot G \cdot H' \cdot I$ |
| | | | | D503 | 111011111 x | 0 | $(A \oplus B \cdot C \cdot D + C \oplus D \cdot A \cdot B) \cdot$ $E \cdot F \cdot G \cdot H \cdot I$ |
| | | | | D507 | 110111111 x | 0 | |
| | | | | D509 | 101111111 x | 0 | |
| | | | | D510 | 011111111 x | 0 | |

TABLE 3f $f = F \oplus \{(A \oplus B \cdot C' \cdot D' + C \oplus D \cdot A' \cdot B') \cdot (G \cdot H' \cdot I' + G' \cdot H \cdot I' + G' \cdot H' \cdot I) \cdot E' \cdot F' +$     (Pn31)
    $(A \oplus B \cdot C \cdot D + C \oplus D \cdot A \cdot B) \cdot E \cdot F \cdot G \cdot H \cdot I +$     (Pn32*)
    $A \oplus B' \cdot B \oplus C' \cdot C \oplus D' \cdot D \oplus E \cdot E \oplus F' \cdot B \oplus I \cdot H \oplus I' \cdot G' +$     (Pn32*)
    $A \cdot B \cdot C \cdot D \cdot E \cdot F \cdot G \cdot H' \cdot I\}$     (Pn32*)

FIG. 22 g-BIT ENCODING

| Name | ABCDEFGHI K | g | S | Name | ABCDEFGHI K | g | Coding Label |
|------|-------------|---|---|------|-------------|---|--------------|
| D1   | 100000000 x | 1 | 1 | D510 | 011111111 x | 0 | (A⊕B'•B⊕I'•C⊕D + C⊕D'•D⊕E'•K') • E⊕F'•F⊕G'•G⊕H'•H⊕I' |
| D2   | 010000000 x | 1 | 1 | D509 | 101111111 x | 0 | |
| D0   | 000000000 x | 1 | 1 | D511 | 111111111 x | 0 | |
| D3   | 110000000 x | 1 | 1 | D508 | 001111111 0 | 0 | |
| D4   | 001000000 x | 1 | 1 | D507 | 110111111 x | 0 | |
| D8   | 000100000 x | 1 | 1 | D503 | 111011111 x | 0 | |
| D144 | 000010010 x | 1 | 1 | D479 | 111110111 x | 0 | A⊕B'•B⊕C'•C⊕D' • D⊕G'•G⊕I' •E•F'•H |
| D159 | 111110010 x | 1 |   | D416 | 000001011 x | 1 | A⊕B'•B⊕C'•C⊕D'•D⊕E' • B⊕I•E⊕F•G'•H |
| D5   | 101000000 x | 1 |   |      |             |   | (A⊕B•C⊕D + A⊕B'•C•D) • E'•F'•G'•H'•I' |
| D6   | 011000000 x | 1 |   |      |             |   | |
| D9   | 100100000 x | 1 | 0 | D12  | 001100000 x | 1 | |
| D10  | 010100000 x | 1 | 0 | D15  | 111100000 x | 1 | |

TABLE 3g g = G ⊕ {(A⊕B'•B⊕I'•C⊕D + C⊕D'•D⊕E'•K') •        (Pn33*)
   E⊕F'•F⊕G'•G⊕H'•H⊕I' +                  (Pn33*)
   A⊕B'•B⊕C'•C⊕D'•D⊕G'•G⊕I'•E•F'•H +       (Pn34*)
   A⊕B'•B⊕C'•C⊕D'•D⊕E' • B⊕I•E⊕F•G'•H +    (Pn34*)
   (A⊕B•C⊕D + A⊕B'•C•D • K̲') • E'•F'•G'•H'•I'}   (Pn34*;Pn33*)

FIG. 23 h-BIT ENCODING

| Name | ABCDEFGHI K | h | S | Name | ABCDEFGHI K | h | Coding Label |
|---|---|---|---|---|---|---|---|
| D19 | 110010000 x | 1 | | | | | |
| D28 | 001110000 x | 1 | | | | | |
| D21 | 101010000 x | 1 | | | | | |
| D22 | 011010000 x | 1 | | | | | (A⊕B'•B⊕C•C⊕D' + |
| D25 | 100110000 x | 1 | | | | | A⊕B•C⊕D + A⊕B•C'•D' + |
| D26 | 010110000 x | 1 | | | | | C⊕D•A'•B') • E•F'•G'•H'•I' |
| D17 | 100010000 x | 1 | | | | | |
| D18 | 010010000 x | 1 | | | | | |
| D20 | 001010000 x | 1 | | | | | |
| D24 | 000110000 x | 1 | | | | | |
| D33 | 100001000 x | 1 | 1 | D34 | 010001000 x | 1 | (A⊕B•C'•D'+C⊕D•A'•B') • |
| D36 | 001001000 x | 1 | 1 | D40 | 000101000 x | 1 | E'•F•G'•H'•I' |
| D256 | 000000001 x | 1 | 1 | D255 | 111111110 x | 0 | (D⊕E'•E⊕F'•F⊕G'•G⊕H' • |
| D432 | 000011011 x | 0 | 1 | D495 | 111101111 x | 0 | H⊕I + E⊕G • F•H•I) • |
| D480 | 000001111 x | 0 | 1 | D447 | 111111011 x | 0 | A⊕B'•B⊕C'•C⊕D' |

TABLE 3h h = H⊕ {(A⊕B'•B⊕C•C⊕D' + A⊕B•C⊕D + A⊕B•C'•D' + C⊕D•A'•B') •    (n35)
    E•F'•G'•H'•I' + (A⊕B•C'•D' + C⊕D•A'•B') • E'•F•G'•H'•I' +    (Pn36*;Pn37)
    D⊕E'•E⊕F'•F⊕G'•G⊕H'•H⊕I + E⊕G•F•H•I) • A⊕B'•B⊕C'•C⊕D'}    (n14;Pn38)

FIG. 24 i-BIT ENCODING

| Name | ABCDEFGHI K | i | S | Name | ABCDEFGHI K | i | Coding Label |
|---|---|---|---|---|---|---|---|
| D1 | 100000000 x | 1 | 1 | D510 | 011111111 x | 0 | (A⊕B•C⊕D'•D⊕E' + |
| D2 | 010000000 x | 1 | 1 | D509 | 101111111 x | 0 | A⊕B'•B⊕I'•C⊕D) • |
| D4 | 001000000 x | 1 | 1 | D507 | 110111111 x | 0 | E⊕F'•F⊕G'•G⊕H'•H⊕I' |
| D8 | 000100000 x | 1 | 1 | D503 | 111011111 x | 0 | |
| D7 | 111000000 x | 1 | | | | | |
| D11 | 110100000 x | 1 | | | | | (A⊕B•C•D+C⊕D•A•B) • |
| D13 | 101100000 x | 1 | | | | | E'•F'•G'•H'•I' |
| D14 | 011100000 x | 1 | | | | | |
| D16 | 000010000 x | 1 | | | | | |
| D17 | 100010000 x | 1 | | | | | |
| D18 | 010010000 x | 1 | | | | | |
| D20 | 001010000 x | 1 | | | | | |
| D24 | 000110000 x | 1 | | | | | (B'•C'•D'+A'•C'•D'+A'•B'•D'+ |
| D32 | 000001000 x | 1 | | | | | A'•B'•C') • E⊕F • G'•H'•I' |
| D33 | 100001000 x | 1 | | | | | |
| D34 | 010001000 x | 1 | | | | | |
| D36 | 001001000 x | 1 | | | | | |
| D40 | 000101000 x | 1 | | | | | |
| D63 | 111111000 x | 1 | 1 | D448 | 000000111 x | 0 | (F⊕G•G⊕H'•H⊕I' + |
| D128 | 000000010 x | 1 | 1 | D511 | 111111111 x | 0 | F⊕G'•G•⊕I'•H) • E⊕F'• |
| | | | | | | | A⊕B'•B⊕C'•C⊕D'•D⊕E' |
| D31 | 111110000 x | 1 | 1 | D464 | 000010111 x | 0 | A⊕B'•B⊕C'•C⊕D' • |
| | | | | 1 | | | | B⊕I•G⊕H'•H⊕I'•E•F' |
| D48 | 000011000 x | 1 | 1 | D416 | 000001011 x | 0 | E⊕I•H⊕I'•A'•B'•C'•D'•F•G' |
| D64 | 000000100 x | 1 | 1 | D508 | 001111110 | 0 | C⊕D'•D⊕E'•E⊕F'• |
| | | | | | | | D⊕H'•H⊕I' • A'•B'•G•K' |

TABLE 3i i= I⊕ {(A⊕B•C⊕D'•D⊕E'+A⊕B'•B⊕I'•C⊕D) • E⊕F'•F⊕G'•G⊕H'•H⊕I') +     (Pn41*)
(A⊕B•C•D + C⊕D•A•B) • E'•F'•G'•H'•I' +                              (Pn42*;Pn43*)
(B'•C'•D' + A'•C'•D' + A'•B'•D' + A'•B'•C') • E⊕F • G'•H'•I' +       (Pn39;n40)
A⊕B'•B⊕C'•C⊕D'•B⊕I • G⊕H'•H⊕I' • E•F' +                             (Pn41*)
C⊕D'•D⊕E'•E⊕F' • D⊕H'•H⊕I' • A'•B'•G +                              (Pn42*)
(F⊕G•G⊕H'•H⊕I' + F⊕G'•G•⊕I'•H)• A⊕B'•B⊕C'•C⊕D'•D⊕E'•E⊕F' +         (Pn43*)
E⊕I•H⊕I'•A'•B'•C'•D'•F•G'•K'}                                       (Pn42*)

FIG. 25A j-BIT ENCODING

| Name | ABCDEFGHI K | S | Name | ABCDEFGHI K | Coding Label |
|---|---|---|---|---|---|
| D33 | 100001000 x | 1 | D46 | 011101000 0 | (A⊕B•C⊕D'•E' + A⊕B'•C⊕D•E' + A⊕B•C⊕D•E + A⊕B'•C⊕D'•E) • F•G'•H'•I' • K' |
| D34 | 010001000 x | 1 | D45 | 101101000 0 | |
| D36 | 001001000 x | 1 | D43 | 110101000 0 | |
| D39 | 111001000 0 | 1 | D40 | 000101000 x | |
| D57 | 100111000 0 | 1 | D54 | 011011000 0 | |
| D58 | 010111000 0 | 1 | D53 | 101011000 0 | |
| D60 | 001111000 0 | 1 | D51 | 110011000 0 | |
| *D63 | 111111000 x | 1 | *D48 | 000011000 x | |
| D80 | 000010100 x | 1 | D432 | 000011011 x | (F⊕G•H⊕I'+F⊕G'•H⊕I) • A'•B'•C•D' • E |
| D48 | 000011000 x | 1 | D464 | 000010111 x | |
| D144 | 000010010 x | 1 | D368 | 000011101 x | |
| D240 | 000011110 x | 1 | D272 | 000010001 x | |
| D0 | 000000000 x | 0 | D16 | 000010000 x | F'•G'•H'•I' |
| D1 | 100000000 x | 0 | D17 | 100010000 x | |
| D2 | 010000000 x | 0 | D18 | 010010000 x | |
| D3 | 110000000 x | 0 | D19 | 110010000 x | |
| D4 | 001000000 x | 0 | D20 | 001010000 x | |
| D5 | 101000000 x | 0 | D21 | 101010000 x | |
| D6 | 011000000 x | 0 | D22 | 011010000 x | |
| D7 | 111000000 x | 0 | D23 | 111010000 x | |
| D8 | 000100000 x | 0 | D24 | 000110000 x | |
| D9 | 100100000 x | 0 | D25 | 100110000 x | |
| D10 | 010100000 x | 0 | D26 | 010110000 x | |
| D11 | 110100000 x | 0 | D27 | 110110000 x | |
| D12 | 001100000 x | 0 | D28 | 001110000 x | |
| D13 | 101100000 x | 0 | D29 | 101110000 x | |
| D14 | 011100000 x | 0 | D30 | 011110000 x | |
| D15 | 111100000 x | 0 | D31 | 111110000 x | |
| D175 | 111101010 x | 0 | *D15 | 111100000 x | (F⊕G•H⊕I + F⊕G'•H⊕I' + F•G•H•I') • A•B•C•D • E' |
| D303 | 111101001 x | 0 | D111 | 111101100 x | |
| D207 | 111100110 x | 0 | D399 | 111100011 x | |
| D335 | 111100101 x | 0 | D495 | 111101111 x | |
| D239 | 111101110 x | | | | |
| D341 | 101010101 0 | | | | A•B'•C•D'•E•F'•G•H'•I•K' |

TABLE 3j.1

FIG. 25B j-BIT ENCODING

| Name | ABCDEFGHI K | S | Name | ABCDEFGHI K | Coding Label |
|---|---|---|---|---|---|
| D129 | 100000010 x | 0 | D257 | 100000001 x | (A⊕B•C'•D'+C⊕D•A'•B') • (H⊕I•G'+G•H'•I') • E'•F' |
| D130 | 010000010 x | 0 | D258 | 010000001 x | |
| D132 | 001000010 x | 0 | D260 | 001000001 x | |
| D136 | 000100010 x | 0 | D264 | 000100001 x | |
| D65 | 100000100 x | | | | |
| D66 | 010000100 x | | | | |
| D68 | 001000100 x | | | | |
| D72 | 000100100 x | | | | |
| *D31 | 111110000 x | 1 | *D0 | 000000000 x | A⊕B'•B⊕C'•C⊕D'•D⊕E' |
| D63 | 111111000 x | 1 | D32 | 000001000 x | |
| D95 | 111110100 x | 1 | D64 | 000000100 x | |
| D127 | 111111100 x | 1 | D96 | 000001100 x | |
| D159 | 111110010 x | 1 | D128 | 000000010 x | |
| D191 | 111111010 x | 1 | D160 | 000001010 x | |
| D223 | 111110110 x | 1 | D192 | 000000110 x | |
| D255 | 111111110 x | 1 | D224 | 000001110 x | |
| D287 | 111110001 x | 1 | D256 | 000000001 x | |
| D319 | 111111001 x | 1 | D288 | 000001001 x | |
| D351 | 111110101 x | 1 | D320 | 000000101 x | |
| D383 | 111111101 x | 1 | D352 | 000001101 x | |
| D415 | 111110011 x | 1 | D384 | 000000011 x | |
| D447 | 111111011 x | 1 | D416 | 000001011 x | |
| D479 | 111110111 x | 1 | D448 | 000000111 x | |
| D511 | 111111111 x | 1 | D480 | 000001111 x | |
| D503 | 111011111 x | 1 | D507 | 110111111 x | (C⊕D•A•B+C•D•K') • E•F•G•H•I |
| D508 | 001111111 0 | | | | |
| D509 | 101111111 x | | | | |
| D510 | 011111111 x | | | | |
| *D511 | 111111111 x | | | | |
| K77 | 101100100 1 | | | | (G+H)•I'•K |
| K105 | 100101100 1 | | | | |
| K170 | 010101010 1 | | | | |
| K201 | 100100110 1 | | | | |
| K209 | 100010110 1 | | | | |
| K216 | 000110110 1 | | | | |

TABLE 3j.2

FIG. 26

$j = (A \oplus B \cdot C \oplus D' \cdot E' + A \oplus B' \cdot C \oplus D \cdot E' + A \oplus B \cdot C \oplus D \cdot E + A \oplus B' \cdot C \oplus D' \cdot E) \cdot$    (n44)
   $F \cdot G' \cdot H' \cdot I' \cdot K' + (C \oplus D \cdot A \cdot B + C \cdot D \cdot K') \cdot E \cdot F \cdot G \cdot H \cdot I +$    (Pn45*;Pn50)
   $(A \oplus B \cdot C' \cdot D' + C \oplus D \cdot A' \cdot B') \cdot (H \oplus I \cdot G' + G \cdot H' \cdot I') \cdot E' \cdot F' +$    (Pn46)
   $(F \oplus G \cdot H \oplus I + F \oplus G' \cdot H \oplus I' + F \cdot G \cdot H \cdot I') \cdot A \cdot B \cdot C \cdot D \cdot E' +$    (Pn47)
   $(F \oplus G \cdot H \oplus I' + F \oplus G' \cdot H \oplus I) \cdot A' \cdot B' \cdot C' \cdot D' \cdot E + A \oplus B' \cdot B \cdot C' \cdot C \oplus D' \cdot D \oplus E' +$    (Pn49;Pn51*)
   $A \cdot B' \cdot C \cdot D' \cdot E \cdot F' \cdot G \cdot H' \cdot I \cdot K' + (G + H) \cdot I' \cdot K + F' \cdot G' \cdot H' \cdot I'$    (Pn51*)

FIG. 27A

POSITIVE REQUIRED DISPARITY PDR

| Name | ABCDEFGHI K | DB | Name | ABCDEFGHI K | DB | Coding Label |
|---|---|---|---|---|---|---|
| K39* | 111001000 1 | 2 | K53* | 101011000 1 | 2 | G'•H'•K |
| K43* | 110101000 1 | 2 | K54* | 011011000 1 | 2 | |
| K45* | 101101000 1 | 2 | K57* | 100111000 1 | 2 | |
| K46* | 011101000 1 | 2 | K58* | 010111000 1 | 2 | |
| K51* | 110011000 1 | 2 | K60* | 001111000 1 | 2 | |
| D496 | 000011111 x | 0 | | | | {F⊕G'•H⊕I'•(F+H)+F⊕G•H⊕I} • A'•B'•C'•D'•E |
| D112 | 000011100 x | 4 | | | | |
| D400 | 000010011 x | 4 | | | | |
| D176 | 000011010 x | 4 | | | | |
| D208 | 000010110 x | 4 | | | | |
| D304 | 000011001 x | 4 | | | | |
| D336 | 000010101 x | 4 | | | | |
| D78  | 011100100 x | 2 | | | | (A⊕B•C•D+C⊕D•A•B) • (G•H'•I'+G'•H•I'+G'•H'•I) • E'•F'•K' |
| D77  | 101100100 0 | 2 | | | | |
| D75  | 110100100 x | 2 | | | | |
| D71  | 111000100 x | 2 | | | | |
| D142 | 011100010 x | 2 | | | | |
| D141 | 101100010 x | 2 | | | | |
| D139 | 110100010 x | 2 | | | | |
| D135 | 111000010 x | 2 | | | | |
| D270 | 011100001 x | 2 | | | | |
| D269 | 101100001 x | 2 | | | | |
| D267 | 110100001 x | 2 | | | | |
| D263 | 111000001 x | 2 | | | | |

TABLE 4A
*OPTIONAL CONTROL VECTORS FOR 16B18B CODE,
NOT VALID FOR CONTIGUOUS 9B10B VECTORS.

FIG. 27B

POSITIVE REQUIRED DISPARITY PDR

| Name | ABCDEFGHI K | DB | Name | ABCDEFGHI K | DB | Coding Label |
|---|---|---|---|---|---|---|
| D49  | 100011000 x | 4 | D449 | 100000111 x | 2 | |
| D50  | 010011000 x | 4 | D450 | 010000111 x | 2 | |
| D52  | 001011000 x | 4 | D452 | 001000111 x | 2 | |
| D56  | 000111000 x | 4 | D456 | 000100111 x | 2 | |
| D81  | 100010100 x | 4 | D417 | 100001011 x | 2 | |
| D82  | 010010100 x | 4 | D418 | 010001011 x | 2 | |
| D84  | 001010100 x | 4 | D420 | 001001011 x | 2 | |
| D88  | 000110100 x | 4 | D424 | 000101011 x | 2 | |
| D145 | 100010010 x | 4 | D353 | 100001101 x | 2 | |
| D146 | 010010010 x | 4 | D354 | 010001101 x | 2 | |
| D148 | 001010010 x | 4 | D356 | 001001101 x | 2 | |
| D152 | 000110010 x | 4 | D360 | 000101101 x | 2 | |
| D273 | 100010001 x | 4 | D225 | 100001110 x | 2 | |
| D274 | 010010001 x | 4 | D226 | 010001110 x | 2 | |
| D276 | 001010001 x | 4 | D228 | 001001110 x | 2 | |
| D280 | 000110001 x | 4 | D232 | 000101110 x | 2 | |
| D97  | 100001100 x | 4 | D401 | 100010011 x | 2 | |
| D98  | 010001100 x | 4 | D402 | 010010011 x | 2 | |
| D100 | 001001100 x | 4 | D404 | 001010011 x | 2 | (A⊕B•C'•D'+C⊕D•A'•B') • |
| D104 | 000101100 x | 4 | D408 | 000110011 x | 2 | (G⊕H•H⊕I'+E⊕F+F⊕G) • |
| D385 | 100000011 x | 4 | D113 | 100011100 x | 2 | (E⊕F'+G⊕H+H⊕I) • |
| D386 | 010000011 x | 4 | D114 | 010011100 x | 2 | (E⊕F+F⊕H+H⊕I) • K' |
| D388 | 001000011 x | 4 | D116 | 001011100 x | 2 | |
| D392 | 000100011 x | 4 | D120 | 000111100 x | 2 | |
| D161 | 100001010 x | 4 | D337 | 100010101 x | 2 | |
| D162 | 010001010 x | 4 | D338 | 010010101 x | 2 | |
| D164 | 001001010 x | 4 | D340 | 001010101 x | 2 | |
| D168 | 000101010 x | 4 | D344 | 000110101 x | 2 | |
| D193 | 100000110 x | 4 | D305 | 100011001 x | 2 | |
| D194 | 010000110 x | 4 | D306 | 010011001 x | 2 | |
| D196 | 001000110 x | 4 | D308 | 001011001 x | 2 | |
| D200 | 000100110 x | 4 | D312 | 000111001 x | 2 | |
| D289 | 100001001 x | 4 | D209 | 100010110 0 | 2 | |
| D290 | 010001001 x | 4 | D210 | 010010110 x | 2 | |
| D292 | 001001001 x | 4 | D212 | 001010110 x | 2 | |
| D296 | 000101001 x | 4 | D216 | 000110110 0 | 2 | |
| D321 | 100000101 x | 4 | D177 | 100011010 x | 2 | |
| D322 | 010000101 x | 4 | D178 | 010011010 x | 2 | |
| D324 | 001000101 x | 4 | D180 | 001011010 x | 2 | |
| D328 | 000100101 x | 4 | D184 | 000111010 x | 2 | |

TABLE 4B

FIG. 27C

POSITIVE REQUIRED DISPARITY PDR

| Name | ABCDEFGHI K | DB | Name | ABCDEFGHI K | DB | Coding Label |
|------|-------------|----|------|-------------|----|--------------|
| D85  | 101010100 x | 2  | D69  | 101000100 x | 4  | |
| D86  | 011010100 x | 2  | D70  | 011000100 x | 4  | |
| D89  | 100110100 x | 2  | D73  | 100100100 x | 4  | |
| D90  | 010110100 x | 2  | D74  | 010100100 x | 4  | |
| D83  | 110010100 x | 2  | D67  | 110000100 x | 4  | |
| D92  | 001110100 x | 2  | D76  | 001100100 x | 4  | |
| D101 | 101001100 x | 2  | D197 | 101000110 x | 2  | |
| D102 | 011001100 x | 2  | D198 | 011000110 x | 2  | |
| D105 | 100101100 0 | 2  | D201 | 100100110 0 | 2  | |
| D106 | 010101100 x | 2  | D202 | 010100110 x | 2  | |
| D99  | 110001100 x | 2  | D195 | 110000110 x | 2  | |
| D108 | 001101100 x | 2  | D204 | 001100110 x | 2  | |
| D149 | 101010010 x | 2  | D325 | 101000101 x | 2  | |
| D150 | 011010010 x | 2  | D326 | 011000101 x | 2  | |
| D153 | 100110010 x | 2  | D329 | 100100101 x | 2  | |
| D154 | 010110010 x | 2  | D330 | 010100101 x | 2  | |
| D147 | 110010010 x | 2  | D323 | 110000101 x | 2  | |
| D156 | 001110010 x | 2  | D332 | 001100101 x | 2  | {F⊕G•(H'+I')•E'•K' + |
| D277 | 101010001 x | 2  | D37  | 101001000 x | 4  | E⊕F•G•H'•I'•K' + |
| D278 | 011010001 x | 2  | D38  | 011001000 x | 4  | H⊕I•E•F'•G' + |
| D281 | 100110001 x | 2  | D41  | 100101000 x | 4  | (H+I)•E'•F'•G'} • |
| D282 | 010110001 x | 2  | D42  | 010101000 x | 4  | (A⊕B'•B⊕C•C⊕D'+A⊕B•C⊕D) |
| D275 | 110010001 x | 2  | D35  | 110001000 x | 4  | |
| D284 | 001110001 x | 2  | D44  | 001101000 x | 4  | |
| D133 | 101000010 x | 4  | D165 | 101001010 x | 2  | |
| D134 | 011000010 x | 4  | D166 | 011001010 x | 2  | |
| D137 | 100100010 x | 4  | D169 | 100101010 x | 2  | |
| D138 | 010100010 x | 4  | D170 | 010101010 0 | 2  | |
| D131 | 110000010 x | 4  | D163 | 110001010 x | 2  | |
| D140 | 001100010 x | 4  | D172 | 001101010 x | 2  | |
| D261 | 101000001 x | 4  | D293 | 101001001 x | 2  | |
| D262 | 011000001 x | 4  | D294 | 011001001 x | 2  | |
| D265 | 100100001 x | 4  | D297 | 100101001 x | 2  | |
| D266 | 010100001 x | 4  | D298 | 010101001 x | 2  | |
| D259 | 110000001 x | 4  | D291 | 110001001 x | 2  | |
| D268 | 001100001 x | 4  | D300 | 001101001 x | 2  | |
| D389 | 101000011 x | 2  |      |             |    | |
| D390 | 011000011 x | 2  |      |             |    | |
| D393 | 100100011 x | 2  |      |             |    | |
| D394 | 010100011 x | 2  |      |             |    | |
| D387 | 110000011 x | 2  |      |             |    | |
| D396 | 001100011 x | 2  |      |             |    | |

TABLE 4C

FIG. 28

| EFGHI | Coding Label |
|---|---|
| 00000 | |
| 00001 | |
| 00010 | (G⊕H'+H⊕I)• |
| 11111 | E⊕F'•F⊕G' |
| 11110 | |
| 11101 | |
| 01000 | |
| 10000 | E⊕F•G⊕H'•H⊕I' |
| 01111 | |
| 10111 | |
| 00100 | E⊕F'•F⊕H'•H⊕I' |
| 11011 | |

TABLE 5

| EFGHI K | Coding Label |
|---|---|
| 00010 x | |
| 00001 x | (H+I)•E'•F'•G' |
| 00011 x | |
| 00110 0 | |
| 00101 x | |
| 00100 x | F⊕G•(H'+I')•E'•K' |
| 01000 x | |
| 01001 x | |
| 01010 0 | |
| 10010 x | H⊕I•E•F'•G' |
| 10001 x | |
| 10100 x | E⊕F•G•H'•I'•K' |
| 01100 0 | |

TABLE 6

$PDR = (A⊕B•C'•D'+C⊕D•A'•B') • (G⊕H•H⊕I'+E⊕F+F⊕G) •$  (Pn67*)
$(E⊕F'+G⊕H+H⊕I) • (E⊕F+F⊕H+H⊕I) •K' +$  (n66;Pn67*)
$\{F⊕G•(H'+I')•E'+E⊕F•G•H'•I'+H⊕I•E•F'•G'+(H+I)•E'•F'•G'\} •$  (n68)
$(A⊕B'•B⊕C•C⊕D'+A⊕B•C⊕D) • K' +$  (Pn69*)
$(A⊕B•C•D+C⊕D•A•B) • (G•H'•I'+G'•H•I'+G'•H'•I) • E'•F'•K' +$  (Pn70*)
$\{F⊕G'•H⊕I'•(F+H) + F⊕G•H⊕I\} • A'•B'•C'•D'•E + G'•H'•K$  (n71;n72;Pn73*)

FIG. 29A

NEGATIVE REQUIRED DISPARITY NDR

| Name | ABCDEFGHI K | DB | Name | ABCDEFGHI K | DB | Coding Label |
|---|---|---|---|---|---|---|
| D437 | 101011011 x | 2 | D501 | 101011111 x | 4 | |
| D438 | 011011011 x | 2 | D502 | 011011111 x | 4 | |
| D441 | 100111011 x | 2 | D505 | 100111111 x | 4 | |
| D442 | 010111011 x | 2 | D506 | 010111111 x | 4 | |
| D435 | 110011011 x | 2 | D499 | 110011111 x | 4 | |
| D444 | 001111011 x | 2 | C508 | 001111111 1 | 4 | |
| D245 | 101011110 x | 2 | D469 | 101010111 x | 2 | |
| D246 | 011011110 x | 2 | D470 | 011010111 x | 2 | (A⊕B'•B⊕C•C⊕D'+A⊕B•C⊕D) • |
| D249 | 100111110 x | 2 | D473 | 100110111 x | 2 | (E⊕F•G•H•I+H⊕I•E•F•G+ |
| D250 | 010111110 x | 2 | D474 | 010110111 x | 2 | E•F•H•I) • |
| D243 | 110011110 x | 2 | D467 | 110010111 x | 2 | (A'•B'•C•D•E•F•G•H•I•K')' |
| D252 | 001111110 x | 2 | D476 | 001110111 x | 2 | |
| D373 | 101011101 x | 2 | D485 | 101001111 x | 2 | |
| D374 | 011011101 x | 2 | D486 | 011001111 x | 2 | |
| D377 | 100111101 x | 2 | D489 | 100101111 x | 2 | |
| D378 | 010111101 x | 2 | D490 | 010101111 x | 2 | |
| D371 | 110011101 x | 2 | D483 | 110001111 x | 2 | |
| D380 | 001111101 x | 2 | D492 | 001101111 x | 2 | |
| D497 | 100011111 x | 2 | | | | |
| D498 | 010011111 x | 2 | | | | (A⊕B•C'•D'+C⊕D•A'•B') • |
| D500 | 001011111 x | 2 | | | | E•F•G•H•I |
| D504 | 000111111 x | 2 | | | | |
| D47 | 111101000 x | 0 | | | | |
| D79 | 111100100 x | 0 | | | | |
| D431 | 111101011 x | 4 | | | | (F⊕G•H⊕I'+H⊕I•F'•G'+F•G•H'•I) |
| D463 | 111100111 x | 4 | | | | • A•B•C•D•E' |
| D143 | 111100010 x | 0 | | | | |
| D271 | 111100001 x | 0 | | | | |
| D367 | 111101101 x | 4 | | | | |

TABLE 7A

FIG. 29B

NEGATIVE REQUIRED DISPARITY NDR

| Name | ABCDEFGHI K | DB | Name | ABCDEFGHI K | DB | Coding Label |
|---|---|---|---|---|---|---|
| D55 | 111011000 x | 0 | D119 | 111011100 x | 2 | |
| D59 | 110111000 x | 0 | D123 | 110111100 x | 2 | |
| D61 | 101111000 x | 0 | D125 | 101111100 x | 2 | |
| D62 | 011111000 x | 0 | D126 | 011111100 x | 2 | |
| D311 | 111011001 x | 2 | D375 | 111011101 x | 4 | |
| D315 | 110111001 x | 2 | D379 | 110111101 x | 4 | |
| D317 | 101111001 x | 2 | D381 | 101111101 x | 4 | |
| D318 | 011111001 x | 2 | D382 | 011111101 x | 4 | |
| D183 | 111011010 x | 2 | D247 | 111011110 x | 4 | |
| D187 | 110111010 x | 2 | D251 | 110111110 x | 4 | |
| D189 | 101111010 x | 2 | D253 | 101111110 x | 4 | |
| D190 | 011111010 x | 2 | D254 | 011111110 x | 4 | |
| D439 | 111011011 x | 4 | | | | |
| D443 | 110111011 x | 4 | | | | |
| D445 | 101111011 x | 4 | | | | {(E+F+G•E'+F'+G')•H•I + |
| D446 | 011111011 x | 4 | | | | E⊕F•H⊕I•G + |
| D455 | 111000111 x | 2 | D407 | 111010011 x | 2 | (G'+H'+I')•E•F} • |
| D459 | 110100111 x | 2 | D411 | 110110011 x | 2 | (A⊕B•C•D+C⊕D•A•B) |
| D461 | 101100111 x | 2 | D413 | 101110011 x | 2 | |
| D462 | 011100111 x | 2 | D414 | 011110011 x | 2 | |
| D423 | 111001011 x | 2 | D471 | 111010111 x | 4 | |
| D427 | 110101011 x | 2 | D475 | 110110111 x | 4 | |
| D429 | 101101011 x | 2 | D477 | 101110111 x | 4 | |
| D430 | 011101011 x | 2 | D478 | 011110111 x | 4 | |
| D487 | 111001111 x | 4 | *D439 | 111011011 x | 4 | |
| D491 | 110101111 x | 4 | *D443 | 110111011 x | 4 | |
| D493 | 101101111 x | 4 | *D445 | 101111011 x | 4 | |
| D494 | 011101111 x | 4 | *D446 | 011111011 x | 4 | |
| D215 | 111010110 x | 2 | D343 | 111010101 x | 2 | |
| D219 | 110110110 x | 2 | D347 | 110110101 x | 2 | |
| D221 | 101110110 x | 2 | D349 | 101110101 x | 2 | |
| D222 | 011110110 x | 2 | D350 | 011110101 x | 2 | |
| D231 | 111001110 x | 2 | D359 | 111001101 x | 2 | |
| D235 | 110101110 x | 2 | D363 | 110101101 x | 2 | |
| D237 | 101101110 x | 2 | D365 | 101101101 x | 2 | |
| D238 | 011101110 x | 2 | D366 | 011101101 x | 2 | |

TABLE 7B

FIG. 30

| EFGHI | Coding Label |
|---|---|
| 11000 | |
| 11001 | |
| 11010 | |
| 11011 | (G'+H'+I')•E•F |
| 11100 | |
| 11101 | |
| 11110 | |
| 00111 | |
| 01011 | |
| 01111 | (E+F+G • E'+F'+G')•H•I |
| 10011 | |
| 10111 | |
| 11011* | |
| 10101 | |
| 01101 | E⊕F•H⊕I•G |
| 10110 | |
| 01110 | |

TABLE 8

$NDR = \{(E+F+G) \cdot (E'+F'+G') \cdot H \cdot I + E \oplus F \cdot H \oplus I \cdot G + (G'+H'+I') \cdot E \cdot F\} \cdot$ (Pn74;n75)
$(A \oplus B \cdot C \cdot D + C \oplus D \cdot A \cdot B) +$ (Pn76*)
$(F \oplus G \cdot H \oplus I + H \oplus I \cdot F' \cdot G' + F \cdot G \cdot H' \cdot I) \cdot A \cdot B \cdot C \cdot D \cdot E' +$ (n77;Pn78*)
$(E \oplus F \cdot G \cdot H \cdot I + H \oplus I \cdot E \cdot F \cdot G + E \cdot F \cdot H \cdot I) \cdot$
$(A \oplus B' \cdot B \oplus C \cdot C \oplus D' + A \oplus B \cdot C \oplus D) \cdot (A' \cdot B' \cdot C \cdot D \cdot E \cdot F \cdot G \cdot H \cdot I \cdot K')' +$ (Pn79*)
$(A \oplus B \cdot C' \cdot D' + C \oplus D \cdot A' \cdot B') \cdot E \cdot F \cdot G \cdot H \cdot I$ (Pn80*)

FIG. 31

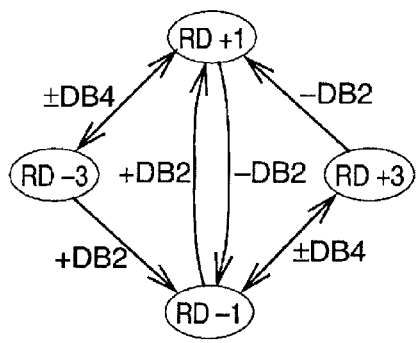

FIG. 32

TABLE 9A

| EFGHI | Coding Label |
|-------|--------------|
| 11000 | E⊕F'•F⊕H• |
| 00011 | H⊕I'•G' |
| 10010 | E⊕F•H⊕I•G' |
| 01010 | |
| 10001 | |
| 01001 | |
| 10100 | E⊕F•G•H'•I' |
| 01100 | |
| 00110 | H⊕I•E'•F'•G |
| 00101 | |

TABLE 9B

| EFGHI K | Coding Label |
|---------|--------------|
| 00010 x | H⊕I•E'•F'•G' |
| 00001 x | |
| 00100 x | F⊕G•E'•H'•I' |
| 01000 x | |
| 11111 y | E•F•G•H•I |

TABLE 9C

| EFGHI | Coding Label |
|-------|--------------|
| 11101 | H⊕I•E•F•G |
| 11110 | |
| 10111 | F⊕G•E•H•I |
| 11011 | |
| 01111 | E'•F•G•H•I |

TABLE 10A

| EFGHI K | Coding Label |
|---|---|
| 10110 0 | E⊕F•H⊕I•G•K' |
| 01110 x | |
| 10101 x | |
| 01101 x | |
| 01011 x | E⊕F•G'•H•I |
| 10011 x | |
| 11001 x | H⊕I•E•F•G' |
| 11010 x | |
| 00111 x | E⊕F'•H⊕I'• |
| 11100 x | (F+H)•G |
| 11111 x | |

TABLE 10B

| EFGHI K | Coding Label |
|---|---|
| 10100 x | E⊕F•G⊕H•I'•K' |
| 01100 0 | |
| 10010 x | |
| 01010 0 | |
| 00110 0 | E⊕F'•H⊕I•G•K' |
| 00101 x | |
| 11110 x | |
| 11101 x | |
| 10001 x | E⊕F•G⊕H'•I |
| 01001 x | |
| 10111 x | |
| 01111 x | |
| 11011 x | E⊕F'•G'•H•I |
| 00011 x | |

TABLE 10C

| EFGHI K | Coding Label |
|---|---|
| 11001 x | E⊕F'•H⊕I•G' |
| 11010 x | |
| 00001 x | |
| 00010 x | |
| 10110 x | E⊕F•H⊕I•G |
| 01110 x | |
| 10101 x | |
| 01101 x | |
| 01011 x | E⊕F•G'•H•I |
| 10011 x | |
| 00100 0 | E⊕F'•G•H'•I'•K' |
| 11100 x | |
| 00111 x | E'•F'•G•H•I |

$DB2 = (E \oplus F' \cdot H \oplus I \cdot G' + E \oplus F \cdot H \oplus I \cdot G + E \oplus F' \cdot G \cdot H' \cdot I' \cdot K' + E \oplus F \cdot G' \cdot H \cdot I +$ (n92)
$E' \cdot F' \cdot G \cdot H \cdot I) \cdot (A \oplus B \cdot C \cdot D + C \oplus D \cdot A \cdot B) +$ (n94*; Pn93*;Pn97)
$\{E \oplus F' \cdot H \oplus I' \cdot (F+H) \cdot G + E \oplus F \cdot H \oplus I \cdot G + E \oplus F \cdot G' \cdot H \cdot I + H \oplus I \cdot E \cdot F \cdot G'\} \cdot$ (n88)
$(A \oplus B \cdot C' \cdot D' + C \oplus D \cdot A' \cdot B') \cdot K' +$ (n65*;Pn89*;Pn95*)
$(E \oplus F' \cdot H \oplus I \cdot G + E \oplus F \cdot G \oplus H \cdot I' + E \oplus F \cdot G \oplus H' \cdot I + E \oplus F' \cdot G' \cdot H \cdot I) \cdot$ (n90)
$(A \oplus B' \cdot B \oplus C \cdot C \oplus D' + A \oplus B \cdot C \oplus D) \cdot K' + G' \cdot H' \cdot K$ (Pn91*;Pn96*;n94*;n98*)

FIG. 34

A-BIT DECODING

| Name | abcdefghi | A | S | Name | abcdefghi | A | Coding Label |
|------|-----------|---|---|------|-----------|---|--------------|
| D96  | 101001100 | 0 | 1 | D415 | 010100011 | 1 | (f⊕i•g⊕h +f⊕g•h⊕i) • (d⊕g•g⊕i')' • a⊕b•b⊕c•c⊕d•e' |
| D384 | 101000011 | 0 | 1 | D127 | 010101100 | 1 | |
| D160 | 101001010 | 0 | 1 | D351 | 010100101 | 1 | |
| D192 | 101000110 | 0 | 1 | D319 | 010101001 | 1 | |
| D288 | 101001001 | 0 | 1 | D223 | 010100110 | 1 | |
| D320 | 101000101 | 0 | 1 | D191 | 011001010 | 1 | a⊕b•b⊕g•f⊕g•g⊕h•h⊕i•c•d'•e' |
| D16  | 100110001 | 0 | 1 | D255 | 011001100 | 1 | a⊕b•b⊕c'•c⊕d•d⊕e' • e⊕f•f⊕g'•g⊕i • h' |
| D32  | 100101001 | 0 | 1 | D447 | 011001001 | 1 | a⊕b•b⊕c'•c⊕d • e'•i • (f•g'•h' + f'•g•h' + f'•g'•h) |
| D64  | 100100101 | 0 | 1 | D383 | 011000101 | 1 | |
| D128 | 100100011 | 0 | 1 | D479 | 011000011 | 1 | |
| D224 | 100001110 | 0 | 1 | D495 | 000101101 | 1 | a⊕d•h⊕i • b'•c' • e'•f•g |
| D352 | 100001101 | 0 | 1 | D239 | 000101110 | 1 | |
| D0   | 111000100 | 0 | 1 | D272 | 101010001 | 0 | b⊕e•e⊕g•g⊕i • a•c•d'•f'•h' |
|      |           |   |   | D31  | 001110001 | 1 | (e⊕f • g'•h'•i + h⊕i • e'•f'•g + e'•f•g•h'•i') • a'•b'•c•d |
|      |           |   |   | D63  | 001101001 | 1 | |
|      |           |   |   | D159 | 001100110 | 1 | |
|      |           |   |   | D341 | 001100101 | 1 | |
|      |           |   |   | D15  | 001101100 | 1 | |

TABLE 11A $A1$ = (f⊕i•g⊕h + f⊕g•h⊕i) • (d⊕g•g⊕i')' • a⊕b•b⊕c•c⊕d • e' +  (Pn0*)
a⊕b•b⊕c'•c⊕d • d⊕e'•e⊕f•f⊕g'•g⊕i • h' +  (Pn0*)
(e⊕f • g'•h'•i + h⊕i • e'•f'•g + e'•f•g•h'•i') • a'•b'•c•d + h⊕i•b'•c'•e'•f•g +  (n2)
a⊕b•b⊕c'•c⊕d • e'•i • (f•g'•h' + f'•g•h' + f'•g'•h) +  (Pn1*)
b⊕g•f⊕g•g⊕h•h⊕i • c•d'•e' + b⊕e•e⊕g•g⊕i • c•d'•f'•h'  (Pn0*;Pn1*)

FIG. 35

B-BIT DECODING

| Name | abcdefghi | B | S | Name | abcdefghi | B | Coding Label |
|------|-----------|---|---|------|-----------|---|--------------|
| D48  | 010110001 | 0 | 1 | D464 | 010010110 | 0 | $d \oplus g \cdot g \oplus h' \cdot h \oplus i \cdot a' \cdot \underline{b} \cdot c' \cdot e \cdot f'$ |
| D80  | 011100100 | 0 | 1 | D432 | 011010001 | 0 | $d \oplus e \cdot e \oplus g \cdot g \oplus i \cdot a' \cdot \underline{b} \cdot c \cdot f' \cdot h'$ |
| D0   | 111000100 | 0 | 1 | D448 | 011000110 | 0 | $a \oplus h \cdot \underline{b} \cdot c \cdot d' \cdot e' \cdot f' \cdot g \cdot i'$ |
|      |           |   |   | D15  | 001101100 | 1 | $(f \oplus h \cdot e' \cdot g \cdot i' + e \oplus f \cdot g' \cdot h' \cdot i) \cdot$ |
|      |           |   |   | D159 | 001100110 | 1 | $a' \cdot \underline{b}' \cdot c \cdot d$ |
|      |           |   |   | D31  | 001110001 | 1 |  |
|      |           |   |   | D63  | 001101001 | 1 |  |
|      |           |   |   | D511 | 100101010 | 1 | $a \cdot \underline{b}' \cdot c' \cdot d \cdot e' \cdot f \cdot g' \cdot h \cdot i'$ |
| D416 | 010001110 | 0 | 1 | D239 | 000101110 | 1 | $\underline{b \oplus d} \cdot h \oplus i \cdot a' \cdot c' \cdot e' \cdot f \cdot g$ |
| D480 | 010001101 | 0 | 1 | D495 | 000101101 | 1 |  |

TABLE 11B $B1 = (f \oplus h \cdot e' \cdot g \cdot i' + e \oplus f \cdot g' \cdot h' \cdot i) \cdot a' \cdot \underline{b}' \cdot c \cdot d + a \oplus h \cdot \underline{b} \cdot c \cdot d' \cdot e' \cdot f' \cdot g \cdot i' +$  (Pn5*)
$d \oplus g \cdot g \oplus h' \cdot h \oplus i \cdot a' \cdot c' \cdot e \cdot f' + d \oplus e \cdot e \oplus g \cdot g \oplus i \cdot a' \cdot c \cdot f' \cdot h' +$  (Pn3*)
$h \oplus i \cdot a' \cdot c' \cdot e' \cdot f \cdot g + a \cdot \underline{b}' \cdot c' \cdot d \cdot e' \cdot f \cdot g' \cdot h \cdot i'$  (Pn3*;Pn5*)

FIG. 36

C-BIT DECODING

| Name | abcdefghi | C | S | Name | abcdefghi | C | Coding Label |
|------|-----------|---|---|------|-----------|---|--------------|
| D96  | 101001100 | 0 | 1 | D415 | 010100011 | 1 | |
| D384 | 101000011 | 0 | 1 | D127 | 010101100 | 1 | $(f \oplus i \cdot g \oplus h + f \oplus g \cdot h \oplus i) \cdot$ |
| D160 | 101001010 | 0 | 1 | D351 | 010100101 | 1 | $(d \oplus g \cdot g \oplus i')' \cdot \underline{a \oplus b} \cdot b \oplus c \cdot \underline{c \oplus d} \cdot e'$ |
| D192 | 101000110 | 0 | 1 | D319 | 010101001 | 1 | |
| D288 | 101001001 | 0 | 1 | D223 | 010100110 | 1 | |
| D80  | 01$\overline{1}$100100 | 0 | 1 | D287 | 11001000$\overline{1}$ | 1 | $\underline{a \oplus c} \cdot d \oplus e \cdot e \oplus g \cdot g \oplus i \cdot b \cdot f' \cdot h'$ |
| D432 | 01$\overline{1}$01000$\overline{1}$ | 0 | 1 | D95 | 110100100 | 1 | |
| D240 | 00$\overline{1}$001110 | 0 | 1 | D495 | 000$\overline{1}$01101 | 1 | $\underline{c \oplus d} \cdot h \oplus i \cdot a' \cdot b' \cdot e' \cdot f \cdot g$ |
| D368 | 00$\overline{1}$001101 | 0 | 1 | D239 | 000$\overline{1}$0111$\overline{1}$0 | 1 | |
| D144 | 001010$\overline{1}$10 | 0 | 1 | D272 | 101010001 | 0 | $a \oplus h \cdot g \oplus h' \cdot h \oplus i \cdot b' \cdot \underline{c} \cdot d \cdot e \cdot f'$ |
| D0   | 111000100 | 0 |   |      |           |   | $a \oplus h \cdot b \cdot \underline{c} \cdot d' \cdot e' \cdot f' \cdot g \cdot i'$ |
| D448 | 011000110 | 0 |   |      |           |   | |
| D256 | 001100011 | 0 | 1 | D320 | 101000101 | 0 | $a \oplus d \cdot a \oplus h \cdot g \oplus h \cdot b' \cdot \underline{c} \cdot e' \cdot f' \cdot i$ |
|      |           |   |   | D111 | 110001100 | 1 | |
|      |           |   |   | D399 | 110000011 | 1 | |
|      |           |   |   | D175 | 110001010 | 1 | $(f \oplus i \cdot g \oplus h + f \oplus g \cdot h \oplus i) \cdot$ |
|      |           |   |   | D207 | 110000110 | 1 | $a \cdot b \cdot \underline{c}' \cdot d' \cdot e'$ |
|      |           |   |   | D303 | 110001001 | 1 | |
|      |           |   |   | D335 | 110000101 | 1 | |
|      |           |   |   | D511 | 100101010 | 1 | $a \cdot b' \cdot \underline{c}' \cdot d \cdot e \cdot f \cdot g' \cdot h \cdot i'$ |

TABLE 11C $C1 = (f \oplus i \cdot g \oplus h + f \oplus g \cdot h \oplus i) \cdot (d \oplus g \cdot g \oplus i')' \cdot \underline{a \oplus b} \cdot b \oplus c \cdot \underline{c \oplus d} \cdot e' +$ (Pn6*)
$a \oplus d \cdot a \oplus h \cdot g \oplus h \cdot b' \cdot e' \cdot f' \cdot i +$ (Pn6*)
$(f \oplus i \cdot g \oplus h + f \oplus g \cdot h \oplus i) \cdot a \cdot b \cdot \underline{c}' \cdot d' \cdot e' + h \oplus i \cdot a' \cdot b' \cdot e' \cdot f \cdot g +$ (Pn7)
$d \oplus e \cdot e \oplus g \cdot g \oplus i \cdot b \cdot f' \cdot h' + a \oplus h \cdot g \oplus h' \cdot h \oplus i \cdot b' \cdot d' \cdot e \cdot f' +$ (Pn9*)
$a \oplus h \cdot b \cdot \underline{c} \cdot d' \cdot e' \cdot f' \cdot g \cdot i' + a \cdot b' \cdot \underline{c}' \cdot d \cdot e' \cdot f \cdot g' \cdot h \cdot i'$ (n8*)

FIG. 37

D-BIT DECODING

| Name | abcdefghi | D | S | Name | abcdefghi | D | Coding Label |
|------|-----------|---|---|------|-----------|---|--------------|
| D32  | 100101001 | 0 | 1 | D447 | 011001001 | 1 | (a⊕b•b⊕c'•c⊕d) • e'•i • (f•g'•h'+f'•g•h'+ f'•g'•h) |
| D64  | 100100101 | 0 | 1 | D383 | 011000101 | 1 | |
| D128 | 100100011 | 0 | 1 | D479 | 011000011 | 1 | |
| D16  | 100110001 | 0 | 1 | D255 | 011001100 | 1 | a⊕b•b⊕c'•c⊕d•d⊕e' • e⊕f•f⊕g'•g⊕i • h' |
| D80  | 011100100 | 0 | 1 | D256 | 001100011 | 0 | b⊕g'•g⊕h•h⊕i' • a'•c•d•e'•f |
| D341 | 001100101 | 0 | 1 | D191 | 011001010 | 1 | b⊕d•d⊕g'•f⊕g•g⊕h•h⊕i•a'•c•e' |
|      |           |   |   | D287 | 110010001 | 1 | a•b•c'•d'•e•f'•g'•h'•i |
|      |           |   |   | D111 | 110001100 | 1 | (f⊕i•g⊕h + f⊕g•h⊕i) • a•b•c'•d'•e' |
|      |           |   |   | D399 | 110000011 | 1 | |
|      |           |   |   | D175 | 110001010 | 1 | |
|      |           |   |   | D207 | 110000110 | 1 | |
|      |           |   |   | D303 | 110001001 | 1 | |
|      |           |   |   | D335 | 110000101 | 1 | |

TABLE 11D $D1 = a⊕b•b⊕c'•c⊕d • e'•i • (f•g'•h' + f'•g•h' + f'•g'•h) +$     (Pn10*)
$a⊕b•b⊕c'•c⊕d•d⊕e' • e⊕f•f⊕g'•g⊕i • h' +$     (Pn10*)
$(f⊕i•g⊕h + f⊕g•h⊕i) • a•b•c'•d' • e' +$     (Pn11*;Pn10*)
$b⊕g•f⊕g•g⊕h•h⊕i • a'•c•e' +$     (Pn10*)
$b⊕g'•g⊕h•h⊕i' • a'•c•e' • f + a•b•c'•d' • e•f'•g' • h'•i$     (Pn11*)

FIG. 38

E-BIT DECODING

| Name | abcdefghi | E | S | Name | abcdefghi | E | Coding Label |
|---|---|---|---|---|---|---|---|
| D1 | 100010101 | 0 | 1 | D510 | 011100010 | 1 | (a⊕b•c⊕d'•d⊕e + |
| D2 | 010010101 | 0 | 1 | D509 | 101100010 | 1 | a⊕b'•b⊕e•c⊕d) • |
| D4 | 001010101 | 0 | 1 | D507 | 110100010 | 1 | e⊕g'•g⊕h•h⊕i • f' |
| D8 | 000110101 | 0 | 1 | D503 | 111000010 | 1 | |
| D80 | 011100100 | 1 | 1 | D508 | 001101010 | 1 | a⊕c•b⊕g'•f⊕g•g⊕h • d•e'•i' |
| D95 | 110100100 | 1 | 1 | D511 | 100101010 | 1 | |
| D3 | 110010100 | 0 | | | | | |
| D12 | 001110100 | 0 | | | | | |
| D5 | 101010100 | 0 | | | | | (a⊕d•b⊕c + a⊕b•c⊕d) • |
| D6 | 011010100 | 0 | | | | | e•f'•g•h'•i' |
| D9 | 100110100 | 0 | | | | | |
| D10 | 010110100 | 0 | | | | | |
| D65 | 100011100 | 0 | | | | | |
| D66 | 010011100 | 0 | | | | | |
| D68 | 001011100 | 0 | | | | | |
| D72 | 000111100 | 0 | | | | | |
| D129 | 100011010 | 0 | | | | | (a⊕b • c'•d' + c⊕d • a'•b') • |
| D130 | 010011010 | 0 | | | | | (g•h'•i' + g'•h•i' + g'•h'•i) • e•f |
| D132 | 001011010 | 0 | | | | | |
| D136 | 000111010 | 0 | | | | | |
| D257 | 100011001 | 0 | | | | | |
| D258 | 010011001 | 0 | | | | | |
| D260 | 001011001 | 0 | | | | | |
| D264 | 000111001 | 0 | | | | | |
| | | | | D127 | 010101100 | 1 | |
| | | | | D415 | 010100011 | 1 | |
| | | | | D319 | 010101001 | 1 | |
| | | | | D351 | 010100101 | 1 | |
| | | | | D223 | 010100110 | 1 | |
| | | | | D255 | 011001100 | 1 | (f⊕i•g⊕h + f⊕g•h⊕i) • |
| | | | | D479 | 011000011 | 1 | (d⊕g • h•i')' • c⊕d • a'•b•e' |
| | | | | D383 | 011000101 | 1 | |
| | | | | D447 | 011001001 | 1 | |
| | | | | D191 | 011001010 | 1 | |
| | | | | D63 | 001101001 | 1 | |
| | | | | D159 | 001100110 | 1 | (d⊕f•h⊕i • g + d•f•g'•h'•i) • |
| | | | | D341 | 001100101 | 1 | a'•b'•c•e' |
| | | | | D240 | 001001110 | 1 | |
| | | | | D368 | 001001101 | 1 | |

TABLE 11E

FIG. 39

$E1 = (a \oplus b \cdot c \oplus d' \cdot d \oplus \underline{e} + a \oplus b' \cdot b \oplus \underline{e} \cdot c \oplus d) \cdot \underline{e} \oplus g' \cdot g \oplus h \cdot h \oplus i \cdot f' +$ (Pn12*)
$(a \oplus d \cdot b \oplus c + a \oplus b \cdot c \oplus d) \cdot \underline{e} \cdot f' \cdot g \cdot h' \cdot i' +$ (Pn12*;Pn15*)
$(a \oplus b \cdot c' \cdot d' + c \oplus d \cdot a' \cdot b') \cdot (g \cdot h' \cdot i' + g' \cdot h \cdot i' + g' \cdot h' \cdot i) \cdot \underline{e} \cdot f +$ (Pn13*)
$(f \oplus i \cdot g \oplus h + f \oplus g \cdot h \oplus i) \cdot (d \oplus g \cdot h \cdot i')' \cdot c \oplus d \cdot a' \cdot b +$ (Pn16*)
$a \oplus c \cdot b \oplus g' \cdot f \oplus g \cdot g \oplus h \cdot d \cdot i' +$ (Pn13*)
$(d \oplus f \cdot h \oplus i \cdot g + d \cdot f \cdot g' \cdot h' \cdot i) \cdot a' \cdot b' \cdot c$ (n15*)

FIG. 40

F-BIT DECODING

| Name | abcdefghi | F | Name | abcdefghi | F | Coding Label |
|------|-----------|---|------|-----------|---|--------------|
| D65  | 100011100 | 0 |      |           |   |              |
| D66  | 010011100 | 0 |      |           |   |              |
| D68  | 001011100 | 0 |      |           |   |              |
| D72  | 000111100 | 0 |      |           |   |              |
| D129 | 100011010 | 0 |      |           |   | $(a \oplus b \cdot c' \cdot d' + c \oplus d \cdot a' \cdot b') \cdot$ |
| D130 | 010011010 | 0 |      |           |   | $(g \cdot h' \cdot i' + g' \cdot h \cdot i' + g' \cdot h' \cdot i) \cdot e \cdot \underline{f}$ |
| D132 | 001011010 | 0 |      |           |   |              |
| D136 | 000111010 | 0 |      |           |   |              |
| D257 | 100011001 | 0 |      |           |   |              |
| D258 | 010011001 | 0 |      |           |   |              |
| D260 | 001011001 | 0 |      |           |   |              |
| D264 | 000111001 | 0 |      |           |   |              |
| D15  | 001101100 | 0 |      |           |   | $a' \cdot b' \cdot c \cdot d \cdot e' \cdot f \cdot g \cdot h' \cdot i'$ |
|      |           |   | D510 | 011100010 | 1 |              |
|      |           |   | D509 | 101100010 | 1 | $(a \oplus b \cdot c \cdot d + c \oplus d \cdot a \cdot b) \cdot e' \cdot \underline{f} \cdot g \cdot h \cdot i'$ |
|      |           |   | D507 | 110100010 | 1 |              |
|      |           |   | D503 | 111000010 | 1 |              |
|      |           |   | D432 | 011010001 | 1 | $\underline{e} \oplus g \cdot a' \cdot b \cdot c \cdot d' \cdot \underline{f} \cdot h' \cdot i$ |
|      |           |   | D383 | 011000101 | 1 |              |

TABLE 11F $F1 = (a \oplus b \cdot c' \cdot d' + c \oplus d \cdot a' \cdot b') \cdot (g \cdot h' \cdot i' + g' \cdot h \cdot i' + g' \cdot h' \cdot i) \cdot e \cdot \underline{f} +$ (Pn18*)
$(a \oplus b \cdot c \cdot d + c \oplus d \cdot a \cdot b) \cdot e' \cdot g' \cdot h \cdot i' +$ (Pn19)
$e \oplus g \cdot a' \cdot b \cdot c \cdot d' \cdot \underline{f} \cdot h' \cdot i + a' \cdot b' \cdot c \cdot d \cdot e' \cdot \underline{f} \cdot g \cdot h' \cdot i'$ (n17)

FIG. 41

G-BIT DECODING

| Name | abcdefghi | G | S | Name | abcdefghi | G | Coding Label |
|------|-----------|---|---|------|-----------|---|--------------|
| D1   | 100010101 | 0 | 1 | D510 | 011100010 | 1 | (a⊕b•c⊕d'•d⊕e + |
| D2   | 010010101 | 0 | 1 | D509 | 101100010 | 1 | a⊕b'•b⊕e•c⊕d) • |
| D4   | 001010101 | 0 | 1 | D507 | 110100010 | 1 | e⊕g̲'•g⊕h•h⊕i • f' |
| D8   | 000110101 | 0 | 1 | D503 | 111000010 | 1 | |
| D144 | 001010110 | 0 | 1 | D416 | 010001110 | 0 | b⊕c•c⊕f•e⊕f • a'•d'•g•h•i' |
| D159 | 001100110 | 0 | 1 | D479 | 011000011 | 1 | b⊕d•d⊕g̲'•g⊕i • a'•c•e'•f'•h |
| D0   | 111000100 | 0 | 0 |      |           |   | a⊕b'•b⊕d•d⊕f' • c•e'•g•h'•i' |
| D15  | 001101100 | 0 | 0 |      |           |   | |
|      |           |   |   | D511 | 100101010 | 1 | a⊕c • b'•d•e'•f•g̲'•h•i' |
|      |           |   |   | D508 | 001101010 | 1 | |
| D3   | 110010100 | 0 |   |      |           |   | |
| D12  | 001110100 | 0 |   |      |           |   | |
| D5   | 101010100 | 0 |   |      |           |   | (a⊕d•b⊕c + a⊕b•c⊕d) • |
| D6   | 011010100 | 0 |   |      |           |   | e•f'•g•h'•i' |
| D9   | 100110100 | 0 |   |      |           |   | |
| D10  | 010110100 | 0 |   |      |           |   | |

TABLE 11G

H-BIT DECODING

| Name | abcdefghi | H | S | Name | abcdefghi | H | Coding Label |
|------|-----------|---|---|------|-----------|---|--------------|
| D256 | 001100011 | 0 | 1 | D495 | 000101101 | 1 | c⊕f•f⊕g'•g⊕h • a'•b'•d•e'•i |
| D19  | 110010010 | 0 | | | | | |
| D28  | 001110010 | 0 | | | | | |
| D21  | 101010010 | 0 | | | | | (a⊕d•b⊕c+a⊕b•c⊕d) • |
| D22  | 011010010 | 0 | | | | | e•f'•g'•h•i' |
| D25  | 100110010 | 0 | | | | | |
| D26  | 010110010 | 0 | | | | | |
| D17  | 100010011 | 0 | | | | | |
| D18  | 010010011 | 0 | | | | | |
| D20  | 001010011 | 0 | | | | | |
| D24  | 000110011 | 0 | | | | | (a⊕b • c'•d'+c⊕d • a'•b') • |
| D33  | 100001̄011 | 0 | | | | | e⊕f • g'•h•i |
| D34  | 010001̄011 | 0 | | | | | |
| D36  | 001001̄011 | 0 | | | | | |
| D40  | 000101̄011 | 0 | | | | | |
| | | | | D255 | 011001100 | 1 | g⊕i • a'•b•c•d' • e'•f•h' |
| | | | | D447 | 011001001 | 1 | |
| | | | | D432 | 011010001 | 1 | c⊕f•e⊕f•f⊕g' • a'•b•d'•h'•i |
| | | | | D480 | 010001101 | 1 | |

TABLE 11H $H1 = (a \oplus d \cdot b \oplus c + a \oplus b \cdot c \oplus d) \cdot e \cdot f' \cdot g' \cdot i' +$  (Pn53*;n55*)
$(a \oplus b \cdot c' \cdot d' + c \oplus d \cdot a' \cdot b') \cdot e \oplus f \cdot g' \cdot \underline{h} \cdot i +$  (Pn53*;Pn54*)
$c \oplus f \cdot e \oplus f \cdot f \oplus g' \cdot a' \cdot b \cdot d' \cdot i + c \oplus f \cdot f \oplus g' \cdot a' \cdot b' \cdot d \cdot e' \cdot i +$  (Pn54*;Pn53*)
$g \oplus i \cdot a' \cdot b \cdot c \cdot d' \cdot e' \cdot f$  (n55*)

FIG. 43

I-BIT DECODING

| Name | abcdefghi | I | S | Name | abcdefghi | I | Coding Label |
|---|---|---|---|---|---|---|---|
| D1 | 100010101 | 0 | 1 | D510 | 011100010 | 1 | (a⊕b•c⊕d'•d⊕e + |
| D2 | 010010101 | 0 | 1 | D509 | 101100010 | 1 | a⊕b'•b⊕e•c⊕d) • |
| D4 | 001010101 | 0 | 1 | D507 | 110100010 | 1 | e⊕g'•g⊕h•h⊕i • f' |
| D8 | 000110101 | 0 | 1 | D503 | 111000010 | 1 | |
| D48 | 010110001 | 0 | 1 | D416 | 010001110 | 1 | d⊕e'•e⊕f•f⊕g'•g⊕h'•h⊕i • a'•b•c' |
| D7 | 111000001 | 0 | | | | | |
| D11 | 110100001 | 0 | | | | | (c⊕d • a•b + a⊕b•c•d) • |
| D13 | 101100001 | 0 | | | | | e'•f'•g'•h'•i |
| D14 | 011100001 | 0 | | | | | |
| D16 | 100110001 | 0 | | | | | |
| D32 | 100101001 | 0 | | | | | a⊕c•e⊕f • b'•d•g'•h'•i |
| D31 | 001110001 | 0 | | | | | |
| D63 | 001101001 | 0 | | | | | |
| D64 | 100100101 | 0 | | | | | g⊕h • a•b'•c'•d • e'•f'•i |
| D128 | 100100011 | 0 | | | | | |
| D17 | 100010011 | 0 | | | | | |
| D18 | 010010011 | 0 | | | | | |
| D20 | 001010011 | 0 | | | | | |
| D24 | 000110011 | 0 | | | | | (a⊕b • c'•d' + c⊕d • a'•b') • |
| D33 | 100001011 | 0 | | | | | e⊕f • g'•h•i |
| D34 | 010001011 | 0 | | | | | |
| D36 | 001001011 | 0 | | | | | |
| D40 | 000101011 | 0 | | | | | |
| | | | | D464 | 010010110 | 1 | c⊕e •a'•b•d'•f' • g•h•i' |
| | | | | D448 | 011000110 | 1 | |
| | | | | D511 | 100101010 | 1 | a⊕c • b'•d • e'•f•g'•h•i' |
| | | | | D508 | 001101010 | 1 | |

TABLE 11I $I1 = (a⊕b•c⊕d'•d⊕e + a⊕b'•b⊕e•c⊕d) • e⊕g'•g⊕h•h⊕i • f' +$ (Pn56*)
$d⊕e'•e⊕f•f⊕g'•g⊕h' • a'•b•c' +$ (Pn59*)
$(a⊕b • c'•d' + c⊕d • a'•b') • e⊕f • g'•h•i +$ (Pn56*)
$(c⊕d • a•b + a⊕b • c•d) • e'•f'•g'•h' + a⊕c•e⊕f • b'•d•g'•h'•i +$ (n57)
$g⊕h•a•b'•c'•d • e'•f' + c⊕e•a'•b•d'•f' • g•h•i' + a⊕c • b'•d•e'•f•g'•h•i'$ (n58)

FIG. 44

K-BIT DECODING

| Name | abcdefghij | K | S | Name | abcdefghij | K | Coding Label |
|---|---|---|---|---|---|---|---|
| K201 | 1001001101 | 1 | | | | | (d⊕e•a+a'•d•e) • |
| K209 | 1000101101 | 1 | | | | | b'•c'•f'•g•h•i'•j |
| K216 | 0001101101 | 1 | | | | | |
| K77 | 1011001001 | 1 | | | | | c⊕f • a•b'•d•e'•g•h'•i'•j |
| K105 | 1001011001 | 1 | | | | | |
| K170 | 0101010101 | 1 | 1 | K341 | 1010101010 | 1 | a⊕b•b⊕c•c⊕d•d⊕e• e⊕f•f⊕g•g⊕h•h⊕i•i⊕j |
| C508P | 0011111110 | 1 | 1 | C508A | 1100000001 | 1 | c⊕d'•d⊕e'•e⊕f• f⊕g'•g⊕h'•h⊕i' |
| K39P* | 1110010000 | 1 | 1 | K39A* | 0001101111 | 1 | (a⊕b'•c⊕d•b⊕e•e⊕g' + a⊕b•c⊕d'•d⊕e•e⊕g' + a⊕d•b⊕c•e⊕g + a⊕b•c⊕d•e⊕g) • f⊕g•g⊕h'•h⊕i'•i⊕j' |
| K43P* | 1101010000 | 1 | 1 | K43A* | 0010101111 | 1 | |
| K45P* | 1011010000 | 1 | 1 | K45A* | 0100101111 | 1 | |
| K46P* | 0111010000 | 1 | 1 | K46A* | 1000101111 | 1 | |
| K51P* | 1100110000 | 1 | 1 | K51A* | 0011001111 | 1 | |
| K60P* | 0011110000 | 1 | 1 | K60A* | 1100001111 | 1 | |
| K53P* | 1010110000 | 1 | 1 | K53A* | 0101001111 | 1 | |
| K54P* | 0110110000 | 1 | 1 | K54A* | 1001001111 | 1 | |
| K57P* | 1001110000 | 1 | 1 | K57A* | 0110001111 | 1 | |
| K58P* | 0101110000 | 1 | 1 | K58A* | 1010001111 | 1 | |

TABLE 11K

* Optional control vector for 16B18B code, not valid for contiguous 9B10B vectors.

116 BALANCED, DISPARITY INDEPENDENT VECTORS OF FIG. 10 WITH j=1

| Nodes | abcd | Coding Label | Nodes | efghi | Coding Label |
|---|---|---|---|---|---|
| 0-4u | 1110 | a⊕b•c•d+c⊕d•a•b | 4u-M | 10000 | e⊕f•g'•h'•i' + g⊕h•e'•f'•i' + h⊕i•e'•f'•g' |
|  | 1101 |  |  | 01000 |  |
|  | 1011 |  |  | 00100 |  |
|  | 0111 |  |  | 00010 |  |
|  |  |  |  | 00010* |  |
|  |  |  |  | 00001 |  |
| 0-4b | 1100 | a⊕d•b⊕c + a⊕b•c⊕d | 4b-M | 11000 | e⊕f'•f⊕g•g⊕h'•i' + e⊕f•g⊕h•i' + e⊕f•g'•h'•i + g⊕h•e'•f'•i |
|  | 0011 |  |  | 00110 |  |
|  | 1010 |  |  | 10100 |  |
|  | 0110 |  |  | 01100 |  |
|  | 1001 |  |  | 10010 |  |
|  | 0101 |  |  | 01010 |  |
|  |  |  |  | 10001 |  |
|  |  |  |  | 01001 |  |
|  |  |  |  | 00101 |  |
|  |  |  |  | 00011 |  |
| 0-4m | 1000 | a⊕b•c'•d' + c⊕d•a'•b' | 4m-M | 11100 | (f⊕i•g⊕h + f⊕g•h⊕i)•e + (g'•h•i + g•h'•i + g•h•i') • e'•f |
|  | 0100 |  |  | 10011 |  |
|  | 0010 |  |  | 11010 |  |
|  | 0001 |  |  | 11001 |  |
|  |  |  |  | 10110 |  |
|  |  |  |  | 10101 |  |
|  |  |  |  | 01110 |  |
|  |  |  |  | 01101 |  |
|  |  |  |  | 01011 |  |

TABLE 12

CMPL10 = j • [ (e⊕f'•f⊕g•g⊕h'•i' + e⊕f•g⊕h•i' + e⊕f•g'•h'•i + g⊕h•e'•f'•i) •   (n80*)
  (a⊕d•b⊕c + a⊕b•c⊕d) +   (n80)
[(f⊕i•g⊕h + f⊕g•h⊕i)•e + (g'•h•i + g•h'•i + g•h•i') • e'•f)] •   (n82*;n83*)
  (a⊕b•c'•d' + c⊕d•a'•b') +   (n82;n83)
(e⊕f•g'•h'•i' + g⊕h•e'•f'•i' + h⊕i•e'•f'•g') • (a⊕b•c•d + c⊕d•a•b)}'   (n81)

FIG. 46

196 INVALID VECTORS

| abcdefghij | abcdefghij | Coding Label |
|---|---|---|
| 11111xxxxx | 00000xxxxx | a⊕b'•b⊕c'•c⊕d'•d⊕e' + f⊕g'•g⊕h'•h⊕i'•i⊕j' |
| xxxxx11111 | xxxxx00000 | |
| 1111̄011100 | 0000̄100011 | (f⊕g'•g⊕h'•h⊕i•i⊕j' + f⊕i•g⊕h+f⊕g•h⊕i)•<br>  a⊕b'•b⊕c'•c⊕d'•a⊕j |
| 1111̄011000 | 0000̄100111 | |
| 1111̄000110 | 0000̄111001 | |
| 1111̄010100 | 0000̄101011 | |
| 1111̄001100 | 0000̄110011 | |
| 1111̄010010 | 0000̄101101 | |
| 1111̄001010 | 0000̄110101 | |
| 1111̄010001 | 0000̄101110 | (f⊕g•h⊕i'•i⊕j + c⊕f•f⊕g'•h⊕i) •<br>  a⊕b'•b⊕c'•c⊕d'•a⊕j' |
| 1111̄001001 | 0000̄110110 | |
| 1111̄000101 | 0000̄111010 | |
| 1111̄000011 | 0000̄111100 | |
| 1111̄001111 | 00001̄10000 | (a⊕b'•b⊕c•a⊕j'•d⊕e + a⊕d'•d⊕e'•a⊕j'•b⊕c +<br>  b⊕c'•c⊕d'•d⊕e'•d⊕g') • g⊕h'•h⊕i'•i⊕j' |
| 1110̄101111 | 00010̄10000 | |
| 1101̄101111 | 00100̄10000 | |
| 1011̄101111 | 01000̄10000 | |
| 0111̄101111 | 10000̄10000 | |
| 1111̄011110 | 0000̄100001 | (b⊕c'•c⊕d'•d⊕e'•e⊕f'+a⊕b'•b⊕c'•c⊕f'•d⊕e+<br>  a⊕d'•d⊕e'•e⊕f'•b⊕c)•(f⊕g'•g⊕h'•i⊕j+f⊕i'•i⊕j'•g⊕h) |
| 1111̄011101 | 0000̄100010 | |
| 1111̄011011 | 0000̄100100 | |
| 1111̄010111 | 0000̄101000 | |
| 1110̄111110 | 0001̄000001 | |
| 1110̄111101 | 0001̄000010 | |
| 1110̄111011 | 0001̄000100 | |
| 1110̄110111 | 0001̄001000 | |
| 1101̄111110 | 0010̄000001 | |
| 1101̄111101 | 0010̄000010 | |
| 1101̄111011 | 0010̄000100 | |
| 1101̄110111 | 0010̄001000 | |
| 1011̄111110 | 0100̄000001 | |
| 1011̄111101 | 0100̄000010 | |
| 1011̄111011 | 0100̄000100 | |
| 1011̄110111 | 0100̄001000 | |
| 0111̄111110 | 1000̄000001 | |
| 0111̄111101 | 1000̄000010 | |
| 0111̄111011 | 1000̄000100 | |
| 0111̄110111 | 1000̄001000 | |

TABLE 13

FIG. 47

$INV = (b{\oplus}c'{\bullet}c{\oplus}d'{\bullet}d{\oplus}e'{\bullet}e{\oplus}f' + a{\oplus}b'{\bullet}b{\oplus}c'{\bullet}c{\oplus}f'{\bullet}d{\oplus}e + a{\oplus}d'{\bullet}d{\oplus}e'{\bullet}e{\oplus}f'{\bullet}b{\oplus}c)$     (n63)
   $\bullet (f{\oplus}g'{\bullet}g{\oplus}h'{\bullet}i{\oplus}j + f{\oplus}i'{\bullet}i{\oplus}j'{\bullet}g{\oplus}h) +$     (Pn64*)
$(a{\oplus}b'{\bullet}b{\oplus}c'{\bullet}a{\oplus}j'{\bullet}d{\oplus}e + a{\oplus}d'{\bullet}d{\oplus}e'{\bullet}a{\oplus}j'{\bullet}b{\oplus}c + b{\oplus}c'{\bullet}c{\oplus}d'{\bullet}d{\oplus}e'{\bullet}d{\oplus}g') \bullet$     (n65)
   $g{\oplus}h'{\bullet}h{\oplus}i'{\bullet}i{\oplus}j' +$     (Pn66*)
$(f{\oplus}g'{\bullet}g{\oplus}h'{\bullet}h{\oplus}i'{\bullet}i{\oplus}j' + f{\oplus}i'{\bullet}g{\oplus}h + f{\oplus}g'{\bullet}h{\oplus}i){\bullet}a{\oplus}b'{\bullet}b{\oplus}c'{\bullet}c{\oplus}d'{\bullet}a{\oplus}j +$     (n70)
$(f{\oplus}g{\bullet}h{\oplus}i'{\bullet}i{\oplus}j + c{\oplus}f{\bullet}f{\oplus}g'{\bullet}h{\oplus}i) \bullet a{\oplus}b'{\bullet}b{\oplus}c'{\bullet}c{\oplus}d'{\bullet}a{\oplus}j' +$     (Pn67;n68)
$a{\oplus}b'{\bullet}b{\oplus}c'{\bullet}c{\oplus}d'{\bullet}d{\oplus}e' + f{\oplus}g'{\bullet}g{\oplus}h'{\bullet}h{\oplus}i'{\bullet}i{\oplus}j'$     (Pn71*)

$INVK = (a{\oplus}b'{\bullet}c{\oplus}d{\bullet}b{\oplus}e{\bullet}e{\oplus}g' + a{\oplus}b{\bullet}c{\oplus}d'{\bullet}d{\oplus}e{\bullet}e{\oplus}g' +$
   $a{\oplus}d{\bullet}b{\oplus}c{\bullet}e{\oplus}g + a{\oplus}b{\bullet}c{\oplus}d{\bullet}e{\oplus}g) \bullet g{\oplus}h'{\bullet}h{\oplus}i'{\bullet}i{\oplus}j'$     (Pn60)

FIG. 48

$PDR = \{a'{\bullet}b'{\bullet}(c'+d'+e') + d'{\bullet}e'{\bullet}(a'+b'+c') + (a'+b'){\bullet}(d'+e'){\bullet}c'\} \bullet$
   $\{f'{\bullet}g'{\bullet}(h'+i'+j') + i'{\bullet}j'{\bullet}(f'+g'+h') + (f'+g'){\bullet}(i'+j'){\bullet}h'\} +$
$\{a'{\bullet}b'{\bullet}c'{\bullet}(d'+e') + c'{\bullet}d'{\bullet}e'{\bullet}(a'+b') + a'{\bullet}b'{\bullet}d'{\bullet}e'\} \bullet$
   $\{f'{\bullet}(g'+h'+i'+j') + g'{\bullet}(h'+i'+j') + h'{\bullet}(i'+j')+i'{\bullet}j'\} +$
$\{a'{\bullet}(b'+c'+d'+e') + b'{\bullet}(c'+d'+e') + c'{\bullet}(d'+e')+d'{\bullet}e'\} \bullet$
   $\{f'{\bullet}g'{\bullet}h'{\bullet}(i'+j') + h'{\bullet}i'{\bullet}j'{\bullet}(f'+g') + f'{\bullet}g'{\bullet}i'{\bullet}j'\} +$
$a'{\bullet}b'{\bullet}e'{\bullet}f'{\bullet}(c'+d') + c'{\bullet}d'{\bullet}e'{\bullet}f'{\bullet}(a'+b') + a'{\bullet}b'{\bullet}c'{\bullet}d'$ $NDR = \{a{\bullet}b{\bullet}(c+d+e)+d{\bullet}e{\bullet}(a+b+c)+(a+b){\bullet}(d+e){\bullet}c\} \bullet$
   $\{f{\bullet}g{\bullet}(h+i+j)+i{\bullet}j{\bullet}(f+g+h)+(f+g){\bullet}(i+j){\bullet}h\} +$
$\{a{\bullet}b{\bullet}c{\bullet}(d+e)+c{\bullet}d{\bullet}e{\bullet}(a+b)+a{\bullet}b{\bullet}d{\bullet}e\} \bullet \{f{\bullet}(g+h+i+j)+g{\bullet}(h+i+j)+h{\bullet}(i+j)+i{\bullet}j\} +$
$\{a{\bullet}(b+c+d+e)+b{\bullet}(c+d+e)+c{\bullet}(d+e)+d{\bullet}e\} \bullet \{f{\bullet}g{\bullet}h{\bullet}(i+j)+h{\bullet}i{\bullet}j{\bullet}(f+g)+f{\bullet}g{\bullet}i{\bullet}j\} +$
$a{\bullet}b{\bullet}e{\bullet}f{\bullet}(c+d) + c{\bullet}d{\bullet}e{\bullet}f{\bullet}(a+b)+a{\bullet}b{\bullet}c{\bullet}d$

FIG. 49

RUNNING DISPARITIES PRD, NRD, RD1, RD3

| PRD | NRD | RD1 | RD3 | PDB4 | NDB4 | PDB2 | NDB2 | PDB0 | NDB0 | PDB2L | NDB2L | RD1L | RD3L |
|---|---|---|---|---|---|---|---|---|---|---|---|---|---|
| 1 |   |   |   | 1 |   |   |   |   |   |   |   |   |   |
| 1 |   |   |   |   |   | 1 |   |   |   |   | 1 | 1 |   |
| 1 |   |   |   |   |   |   |   | 1 |   | 1 |   |   |   |
|   | 1 |   |   |   | 1 |   |   |   |   |   |   |   |   |
|   | 1 |   |   |   |   |   | 1 |   |   | 1 | 1 |   |   |
|   | 1 |   |   |   |   |   |   |   | 1 |   | 1 |   |   |
|   |   | 1 |   |   |   | 1 | 1 |   |   |   |   |   |   |
|   |   | 1 |   | 1 | 1 |   |   |   |   |   |   |   | 1 |
|   |   |   | 1 | 1 | 1 |   |   |   |   |   |   | 1 |   |

TABLE 14

FIG. 50

$PDB4 = \{(d+e) \cdot a \cdot b \cdot c + (a+b) \cdot c \cdot d \cdot e + a \cdot b \cdot d \cdot e\} \cdot$
$\quad \{(h+i+j) \cdot f \cdot g + (f+g+h) \cdot i \cdot j + (f+g) \cdot (i+j) \cdot h\} +$
$\quad \{(c+d+e) \cdot a \cdot b + (a+b+c) \cdot d \cdot e + (a+b) \cdot (d+e) \cdot c\} \cdot$
$\quad \{(i+j) \cdot f \cdot g \cdot h + (f+g) \cdot h \cdot i \cdot j + f \cdot g \cdot i \cdot j\}$ $NDB4 = \{(d'+e') \cdot a' \cdot b' \cdot c' + (a'+b') \cdot c' \cdot d' \cdot e' + a' \cdot b' \cdot d' \cdot e'\} \cdot$
$\quad \{(h'+i'+j') \cdot f' \cdot g' + (f'+g'+h') \cdot i' \cdot j' + (f'+g') \cdot (i'+j') \cdot h'\} +$
$\quad \{(c'+d'+e') \cdot a' \cdot b' + (a'+b'+c') \cdot d' \cdot e' + (a'+b') \cdot (d'+e') \cdot c'\} \cdot$
$\quad \{(i'+j') \cdot f' \cdot g' \cdot h' + (f'+g') \cdot h' \cdot i' \cdot j' + f' \cdot g' \cdot i' \cdot j'\}$

FIG. 51

$PDB2 = \{(a \oplus b' \cdot b \oplus d \cdot d \oplus e' + a \oplus b \cdot d \oplus e) \cdot c + (a \oplus b \cdot d \cdot e + d \oplus e \cdot a \cdot b) \cdot c'\} \cdot$
$\quad \{(f \oplus g' \cdot g \oplus i \cdot i \oplus j' + f \oplus g \cdot i \oplus j) \cdot h + (f \oplus g \cdot i \cdot j + i \oplus j \cdot f \cdot g) \cdot h'\} +$
$\quad \{(a \oplus b' \cdot b \oplus d \cdot d \oplus e' + a \oplus b \cdot d \oplus e) \cdot c' + (a \oplus b \cdot d' \cdot e' + d \oplus e \cdot a' \cdot b') \cdot c\} \cdot$
$\quad \{(f+g) \cdot h \cdot i \cdot j + (i+j) \cdot f \cdot g \cdot h + f \cdot g \cdot i \cdot j\} +$
$\quad \{(a+b) \cdot c \cdot d \cdot e + (d+e) \cdot a \cdot b \cdot c + a \cdot b \cdot d \cdot e\} \cdot$
$\quad \{(f \oplus g' \cdot g \oplus i \cdot i \oplus j' + f \oplus g \cdot i \oplus j) \cdot h' + (f \oplus g \cdot i' \cdot j' + i \oplus j \cdot f' \cdot g') \cdot h\}$ $NDB2 = \{(a \oplus b' \cdot b \oplus d \cdot d \oplus e' + a \oplus b \cdot d \oplus e) \cdot c' + (a \oplus b \cdot d' \cdot e' + d \oplus e \cdot a' \cdot b') \cdot c\} \cdot$
$\quad \{(f \oplus g' \cdot g \oplus i \cdot i \oplus j' + f \oplus g \cdot i \oplus j) \cdot h' + (f \oplus g \cdot i' \cdot j' + i \oplus j \cdot f' \cdot g') \cdot h\} +$
$\quad \{(a \oplus b' \cdot b \oplus d \cdot d \oplus e' + a \oplus b \cdot d \oplus e) \cdot c + (a \oplus b \cdot d \cdot e + d \oplus e \cdot a \cdot b) \cdot c'\} \cdot$
$\quad \{(f'+g') \cdot h' \cdot i' \cdot j' + (i'+j') \cdot f' \cdot g' \cdot h' + f' \cdot g' \cdot i' \cdot j'\} +$
$\quad \{(a'+b') \cdot c' \cdot d' \cdot e' + (d'+e') \cdot a' \cdot b' \cdot c' + a' \cdot b' \cdot d' \cdot e'\} \cdot$
$\quad \{(f \oplus g' \cdot g \oplus i \cdot i \oplus j' + f \oplus g \cdot i \oplus j) \cdot h + (f \oplus g \cdot i \cdot j + i \oplus j \cdot f \cdot g) \cdot h'\}$

FIG. 52

$PDB0 = (f \oplus g \cdot h \cdot i \cdot j + i \oplus j \cdot f \cdot g \cdot h + f \cdot g \cdot h' \cdot i \cdot j) \cdot a' \cdot b' \cdot c' \cdot d' \cdot e +$
$\quad (a \oplus b \cdot c' \cdot d' + c \oplus d \cdot a' \cdot b') \cdot e' \cdot f' \cdot g \cdot h \cdot i \cdot j$ $NDB0 = (f \oplus g \cdot h' \cdot i' \cdot j' + i \oplus j \cdot f' \cdot g' \cdot h' + f' \cdot g' \cdot h \cdot i' \cdot j') \cdot a \cdot b \cdot c \cdot d \cdot e' +$
$\quad (a \oplus b \cdot c \cdot d + c \oplus d \cdot a \cdot b) \cdot e \cdot f \cdot g' \cdot h' \cdot i' \cdot j'$

9B10B BIT ENCODING fghij

9B10B DISPARITY CONTROL

10B9B BIT DECODING ABCDEF

10B9B BIT DECODING GHIK, VALIDITY

FIG. 57.A1
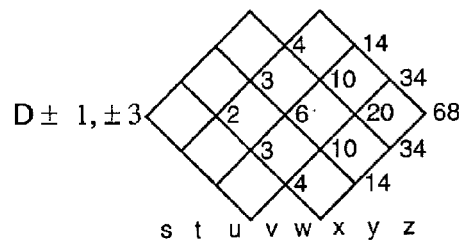
FIG. 57A.2
FIG. 57B
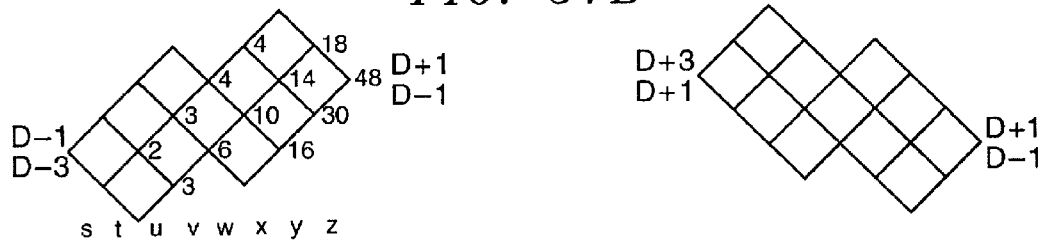
FIG. 57C.1
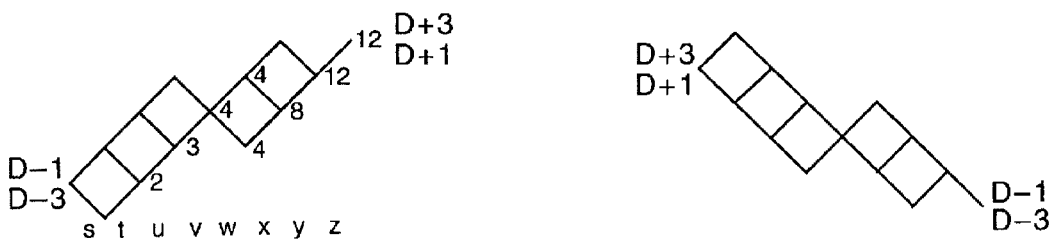
FIG. 57C.2
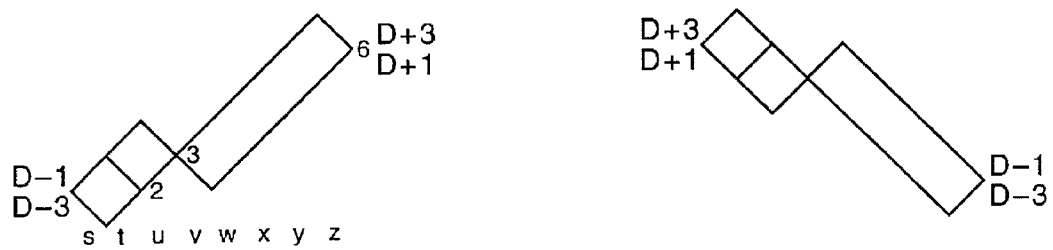

COMMA SEQUENCE EMBEDDED IN TWO 8B BLOCKS

COMMA SEQUENCE EMBEDDED IN A 8B BLOCK AND A 6B BLOCK

7B8B ENCODING

| Name | STUVWXY K | Bit Encoding Class | Primary stuvwxyz | Alternate stuvwxyz | DR | DB |
|---|---|---|---|---|---|---|
| D0 | 0000000 x | BSTVWZ | 01011001 |  | ± | 0 |
| D1 | 1000000 x | BQVWZ | 10011001 |  | ± | 0 |
| D2 | 0100000 x | BQWYZ | 01001011 |  | ± | 0 |
| D3 | 1100000 x | BT3uYZ | 11000011 |  | ± | 0 |
| D4 | 0010000 x | BQXYZ | 00100111 |  | ± | 0 |
| D5 | 1010000 x | BT3uYZ | 10100011 |  | ± | 0 |
| D6 | 0110000 x | BT3uYZ | 01100011 |  | ± | 0 |
| D7 | 1110000 0 | BM(K')4uZ | 11100001 |  | ± | 0 |
| D8 | 0001000 x | BQSXZ | 10010101 |  | ± | 0 |
| D9 | 1001000 x | FT3m4b | 10010000 | 01101111 | + | -4 |
| D10 | 0101000 x | FT3m4b | 01010000 | 10101111 | + | -4 |
| D11 | 1101000 x | BM4uZ | 11010001 |  | ± | 0 |
| D12 | 0011000 x | FT3m4b | 00110000 | 11001111 | + | -4 |
| D13 | 1011000 x | BM4uZ | 10110001 |  | ± | 0 |
| D14 | 0111000 x | BM4uZ | 01110001 |  | ± | 0 |
| D15 | 1111000 x | BU4c | 11110000 | 00001111 | − | 0 |
| D16 | 0000100 x | BQSUZ | 10101001 |  | ± | 0 |
| D17 | 1000100 x | FT4m | 10001000 | 01110111 | + | -4 |
| D18 | 0100100 x | FT4m | 01001000 | 10110111 | + | -4 |
| D19 | 1100100 0 | DMK'4u'4t' | 11001000 | 00110111 | + | -2 |
| D20 | 0010100 x | FT4m | 00101000 | 11010111 | + | -4 |
| D21 | 1010100 x | DM4u'4t' | 10101000 | 01010111 | + | -2 |
| D22 | 0110100 0 | DMK'4u'4t' | 01101000 | 10010111 | + | -2 |
| D23 | 1110100 0 | BU(K')4c' | 11101000 |  | ± | 0 |
| D24 | 0001100 x | FT4m | 00011000 | 11100111 | + | -4 |
| D25 | 1001100 x | DM4u'4t' | 10011000 | 01100111 | + | -2 |
| D26 | 0101100 x | DM4u'4t' | 01011000 | 10100111 | + | -2 |
| D27 | 1101100 x | BU4c' | 11011000 |  | ± | 0 |
| D28 | 0011100 x | DM4u'4t' | 00111000 | 11000111 | + | -2 |
| D29 | 1011100 x | BU4c' | 10111000 |  | ± | 0 |
| D30 | 0111100 x | BU4c' | 01111000 |  | ± | 0 |
| D31 | 1111100 x | BC4cSTZ | 00111001 |  | ± | 0 |
| D32 | 0000010 x | BQSTZ | 11000101 |  | ± | 0 |
| D33 | 1000010 x | FT4m | 10000100 | 01111011 | + | -4 |
| D34 | 0100010 x | FT4m | 01000100 | 10111011 | + | -4 |

TABLE 15A

FIG. 68B
7B8B ENCODING

| Name | STUVWXY K | Bit Encoding Class | Primary stuvwxyz | Alternate stuvwxyz | DR | DB |
|---|---|---|---|---|---|---|
| D35 | 1100010 x | DM4u'4t' | 11000100 | 00111011 | + | -2 |
| D36 | 0010010 x | FT4m | 00100100 | 11011011 | + | -4 |
| D37 | 1010010 x | DM4u'4t' | 10100100 | 01011011 | + | -2 |
| D38 | 0110010 x | DM4u'4t' | 01100100 | 10011011 | + | -2 |
| D39 | 1110010 0 | BU(K')4c' | 11100100 | | ± | 0 |
| D40 | 0001010 x | FT4m | 00010100 | 11101011 | + | -4 |
| D41 | 1001010 x | DM4u'4t' | 10010100 | 01101011 | + | -2 |
| D42 | 0101010 0 | DMK'4u'4t' | 01010100 | 10101011 | + | -2 |
| D43 | 1101010 x | BU4c' | 11010100 | | ± | 0 |
| D44 | 0011010 x | DM4u'4t' | 00110100 | 11001011 | + | -2 |
| D45 | 1011010 x | BU4c' | 10110100 | | ± | 0 |
| D46 | 0111010 x | BU4c' | 01110100 | | ± | 0 |
| D47 | 1111010 x | BC4cSTZ | 00110101 | | ± | 0 |
| D48 | 0000110 x | BT4tSZ | 10001101 | | ± | 0 |
| D49 | 1000110 x | DM4u'4t' | 10001100 | 01110011 | + | -2 |
| D50 | 0100110 0 | DMK'4u'4t' | 01001100 | 10110011 | + | -2 |
| D51 | 1100110 x | BU4c' | 11001100 | | ± | 0 |
| D52 | 0010110 x | DM4u'4t' | 00101100 | 11010011 | + | -2 |
| D53 | 1010110 x | BU4c' | 10101100 | | ± | 0 |
| D54 | 0110110 x | BU4c' | 01101100 | | ± | 0 |
| D55 | 1110110 x | DC4c' | 11101100 | 00010011 | − | +2 |
| D56 | 0001110 x | DM4u'4t' | 00011100 | 11100011 | + | -2 |
| D57 | 1001110 x | BU4c' | 10011100 | | ± | 0 |
| D58 | 0101110 x | BU4c' | 01011100 | | ± | 0 |
| D59 | 1101110 x | DC4c' | 11011100 | 00100011 | − | +2 |
| D60 | 0011110 x | BU4c' | 00111100 | | ± | 0 |
| D61 | 1011110 x | DC4c' | 10111100 | 01000011 | − | +2 |
| D62 | 0111110 x | DC4c' | 01111100 | 10000011 | − | +2 |
| D63 | 1111110 x | BV3cSTUZ | 00011101 | | ± | 0 |
| D64 | 0000001 x | BQSVZ | 10010011 | | ± | 0 |
| D65 | 1000001 x | FT4m | 10000010 | 01111101 | + | -4 |
| D66 | 0100001 x | FT4m | 01000010 | 10111101 | + | -4 |
| D67 | 1100001 x | DM4u'4t' | 11000010 | 00111101 | + | -2 |
| D68 | 0010001 x | FT4m | 00100010 | 11011101 | + | -4 |
| D69 | 1010001 x | DM4u'4t' | 10100010 | 01011101 | + | -2 |

TABLE 15B

FIG. 68C

7B8B ENCODING

| Name | STUVWXY K | Bit Encoding Class | Primary stuvwxyz | Alternate stuvwxyz | DR | DB |
|---|---|---|---|---|---|---|
| D70 | 0110001 x | DM4u'4t' | 01100010 | 10011101 | + | -2 |
| D71 | 1110001 0 | BU(K')4c' | 11100010 | | ± | 0 |
| D72 | 0001001 x | FT4m | 00010010 | 11101101 | + | -4 |
| D73 | 1001001 x | DM4u'4t' | 10010010 | 01101101 | + | -2 |
| D74 | 0101001 0 | DMK'4u'4t' | 01010010 | 10101101 | + | -2 |
| D75 | 1101001 x | BU4c' | 11010010 | | ± | 0 |
| D76 | 0011001 x | DM4u'4t' | 00110010 | 11001101 | + | -2 |
| D77 | 1011001 x | BU4c' | 10110010 | | ± | 0 |
| D78 | 0111001 x | BU4c' | 01110010 | | ± | 0 |
| D79 | 1111001 x | BC4cSTZ | <u>00</u>1100<u>11</u> | | ± | 0 |
| D80 | 0000101 x | BT4tSZ | <u>1</u>000101<u>1</u> | | ± | 0 |
| D81 | 1000101 x | DM4u'4t' | 10001010 | 01110101 | + | -2 |
| D82 | 0100101 x | DM4u'4t' | 01001010 | 10110101 | + | -2 |
| D83 | 1100101 x | BU4c' | 11001010 | | ± | 0 |
| D84 | 0010101 x | DM4u'4t' | 00101010 | 11010101 | + | -2 |
| D85 | 1010101 0 | BUK'SZ | <u>00</u>101011 | | ± | 0 |
| D86 | 0110101 x | BU4c' | 01101010 | | ± | 0 |
| D87 | 1110101 x | DC4c' | 11101010 | 00010101 | − | +2 |
| D88 | 0001101 x | DM4u'4t' | 00011010 | 11100101 | + | -2 |
| D89 | 1001101 x | BU4c' | 10011010 | | ± | 0 |
| D90 | 0101101 x | BU4c' | 01011010 | | ± | 0 |
| D91 | 1101101 x | DC4c' | 11011010 | 00100101 | − | +2 |
| D92 | 0011101 x | BU4c' | 00111010 | | ± | 0 |
| D93 | 1011101 x | DC4c' | 10111010 | 01000101 | − | +2 |
| D94 | 0111101 x | DC4c' | 01111010 | 10000101 | − | +2 |
| D95 | 1111101 x | BV3cSTUZ | <u>000</u>1101<u>1</u> | | ± | 0 |
| D96 | 0000011 x | BT4tSZ | <u>1</u>000011<u>1</u> | | ± | 0 |
| D97 | 1000011 x | DM4u'4t' | 10000110 | 01111001 | + | -2 |
| D98 | 0100011 x | DM4u'4t' | 01000110 | 10111001 | + | -2 |
| D99 | 1100011 x | BU4c' | 11000110 | | ± | 0 |
| D100 | 0010011 x | DM4u'4t' | 00100110 | 11011001 | + | -2 |
| D101 | 1010011 x | BU4c' | 10100110 | | ± | 0 |
| D102 | 0110011 x | BU4c' | 01100110 | | ± | 0 |
| D103 | 1110011 x | DC4c' | 11100110 | 00011001 | − | +2 |
| D104 | 0001011 x | DM4u'4t' | 00010110 | 11101001 | + | -2 |

TABLE 15C

FIG. 68D
7B8B ENCODING

| Name | STUVWXY K | Bit Encoding Class | Primary stuvwxyz | Alternate stuvwxyz | DR | DB |
|---|---|---|---|---|---|---|
| D105 | 1001011 x | BU4c' | 10010110 | | ± | 0 |
| D106 | 0101011 x | BU4c' | 01010110 | | ± | 0 |
| D107 | 1101011 x | DC4c' | 11010110 | 00101001 | − | +2 |
| D108 | 0011011 x | BU4c' | 00110110 | | ± | 0 |
| D109 | 1011011 x | DC4c' | 10110110 | 01001001 | − | +2 |
| D110 | 0111011 x | DC4c' | 01110110 | 10001001 | − | +2 |
| D111 | 1111011 x | BV3cSUVZ | 0<u>1</u>00<u>0</u>1<u>1</u> | | ± | 0 |
| D112 | 0000111 x | BM4tVWZ | 000<u>1</u>0111 | | ± | 0 |
| D113 | 1000111 x | BU4c' | 10001110 | | ± | 0 |
| D114 | 0100111 x | BU4c' | 01001110 | | ± | 0 |
| D115 | 1100111 x | DC4c' | 11001110 | 00110001 | − | +2 |
| D116 | 0010111 x | BU4c' | 00101110 | | ± | 0 |
| D117 | 1010111 x | DC4c' | 10101110 | 01010001 | − | +2 |
| D118 | 0110111 x | DC4c' | 01101110 | 10010001 | − | +2 |
| D119 | 1110111 x | BV3cSTYZ | <u>00</u>1010<u>1</u>1 | | ± | 0 |
| D120 | 0001111 x | BU4c' | 00011110 | | ± | 0 |
| D121 | 1001111 x | DC4c' | 10011110 | 01100001 | − | +2 |
| D122 | 0101111 x | DC4c' | 01011110 | 10100001 | − | +2 |
| D123 | 1101111 x | FV3u | 11011110 | 00100001 | − | +4 |
| D124 | 0011111 x | DC4c' | 00111110 | 11000001 | − | +2 |
| D125 | 1011111 x | FV3u | 10111110 | 01000001 | − | +4 |
| D126 | 0111111 0 | BVK'1mVWYZ | 011<u>00</u>101 | | ± | 0 |
| D127 | 1111111 x | BHTVWYZ | 1<u>0</u>1<u>00</u>101 | | ± | 0 |
| K7[1] | 1110000 1 | BMK4u | 1110000<u>1</u> | 00011110 | + | 0 |
| K23[1] | 1110100 1 | BUK4c' | 11101000 | 00010111 | + | 0 |
| K39[1] | 1110010 1 | BUK4c' | 11100100 | 00011011 | + | 0 |
| K71[1] | 1110001 1 | BUK4c' | 11100010 | 00011101 | + | 0 |
| K19 | 1100100 1 | BMKZ | 1100100<u>1</u> | | ± | 0 |
| K22 | 0110100 1 | BMKZ | 0110100<u>1</u> | | ± | 0 |
| K42 | 0101010 1 | BMKZ | 0101010<u>1</u> | | ± | 0 |
| K50 | 0100110 1 | BMKZ | 0100110<u>1</u> | | ± | 0 |
| K74 | 0101001 1 | BMKZ | 0101001<u>1</u> | | ± | 0 |
| K85 | 1010101 1 | BUK | 10101010 | | ± | 0 |
| C126 | 0111111 1 | FVK3u | 01111110 | 10000001 | − | +4 |

TABLE 15D

1. USE RESTRICTED TO COMMA TRAILER

FIG. 69

34 DISPARITY INDEPENDENT VECTORS BM4t'Z FROM FIG. 14

| NAME | STUVWXY K | stuvwxyz | S | NAME | STUVWXY K | stuvwxyz |
|---|---|---|---|---|---|---|
| D3 | 1100000 x | 11000011 | 0 | D7 | 1110000 x | 11100001 |
| D5 | 1010000 x | 10100011 | 0 | D11 | 1101000 x | 11010001 |
| D6 | 0110000 x | 01100011 | 0 | D13 | 1011000 x | 10110001 |
| D2 | 0100000 x | 01001011 | 0 | D14 | 0111000 x | 01110001 |
| D4 | 0010000 x | 00100111 | | | | |
| D0 | 0000000 x | 01011001 | 1 | D127 | 1111111 x | 10100101 |
| D1 | 1000000 x | 10011001 | 1 | D126 | 0111111 0 | 01100101 |
| D8 | 0001000 x | 10010101 | 1 | D119 | 1110111 x | 00101101 |
| D16 | 0000100 x | 10101001 | 1 | D111 | 1111011 x | 01000111 |
| D32 | 0000010 x | 11000101 | 1 | D95 | 1111101 x | 00011011 |
| D64 | 0000001 x | 10010011 | 1 | D63 | 1111110 x | 00011101 |
| D48 | 0000110 x | 10001101 | 1 | D79 | 1111001 x | 00110011 |
| D80 | 0000101 x | 10001011 | 1 | D47 | 1111010 x | 00110101 |
| D96 | 0000011 x | 10000111 | 1 | D31 | 1111100 x | 00111001 |
| D112 | 0000111 x | 00010111 | 0 | D85 | 1010101 0 | 00101011 |
| K19 | 1100100 1 | 11001001 | 0 | K50 | 0100110 1 | 01001101 |
| K22 | 0110100 1 | 01101001 | 0 | K74 | 0101001 1 | 01010011 |
| K42 | 0101010 1 | 01010101 | | | | |

TABLE 16

FIG. 70
s-BIT ENCODING

| Name | STUVWXY K | a | S | Name | STUVWXY K | a | Coding Label |
|------|-----------|---|---|------|-----------|---|--------------|
| D8   | 0001000 x | 1 | 1 | D119 | 1110111 x | 0 | |
| D16  | 0000100 x | 1 | 1 | D111 | 1111011 x | 0 | $(U \oplus X' \cdot X \oplus Y' \cdot V \oplus W +$ |
| D32  | 0000010 x | 1 | 1 | D95  | 1111101 x | 0 | $U \oplus V' \cdot V \oplus W' \cdot X \oplus Y) \cdot S \oplus T' \cdot T \oplus U'$ |
| D64  | 0000001 x | 1 | 1 | D63  | 1111110 x | 0 | |
| D48  | 0000110 x | 1 | 1 | D79  | 1111001 x | 0 | $(V \oplus W' \cdot W \oplus X \cdot X \oplus Y' + V \oplus W \cdot X \oplus Y) \cdot$ |
| D80  | 0000101 x | 1 | 1 | D47  | 1111010 x | 0 | $S \oplus T' \cdot T \oplus U' \cdot U \oplus V'$ |
| D96  | 0000011 x | 1 | 1 | D31  | 1111100 x | 0 | |
|      |           |   |   | D85  | 1010101 0 | 0 | $S \cdot T' \cdot U \cdot V' \cdot W \cdot X' \cdot Y \cdot K'$ |

TABLE 17s $s = S \oplus \{(U \oplus X' \cdot X \oplus Y' \cdot V \oplus W + U \oplus V' \cdot V \oplus W' \cdot X \oplus Y) \cdot S \oplus T' \cdot T \oplus U' +$ (Pn1)
$(V \oplus W' \cdot W \oplus X \cdot X \oplus Y' + V \oplus W \cdot X \oplus Y) \cdot S \oplus T' \cdot T \oplus U' \cdot U \oplus V' +$ (Pn2*)
$S \cdot T' \cdot U \cdot V' \cdot W \cdot X' \cdot Y \cdot K'\}$ (Pn2*)

FIG. 71
t-BIT ENCODING

| Name | STUVWXY K | t | S | Name | STUVWXY K | t | Coding Label |
|------|-----------|---|---|------|-----------|---|--------------|
| D0   | 0000000 x | 1 | 1 | D127 | 1111111 x | 0 | $S \oplus T' \cdot T \oplus U' \cdot U \oplus V' \cdot V \oplus W' \cdot W \oplus Y'$ |
| D32  | 0000010 x | 1 | 1 | D95  | 1111101 x | 0 | |
|      |           |   |   | D63  | 1111110 x | 0 | $V \oplus Y \cdot S \cdot T \cdot U \cdot W \cdot X$ |
|      |           |   |   | D119 | 1110111 x | 0 | |
|      |           |   |   | D31  | 1111100 x | 0 | $(W \cdot X' \cdot Y + W \cdot X \cdot Y' + W' \cdot X \cdot Y) \cdot$ |
|      |           |   |   | D47  | 1111010 x | 0 | $S \cdot T \cdot U \cdot V$ |
|      |           |   |   | D79  | 1111001 x | 0 | |

TABLE 17t $t = T \oplus \{(W \cdot X' \cdot Y + W \cdot X \cdot Y' + W' \cdot X \cdot Y) \cdot S \cdot T \cdot U \cdot V +$ (Pn3)
$S \oplus T' \cdot T \oplus U' \cdot U \oplus V' \cdot V \oplus W' \cdot W \oplus Y' + V \oplus Y \cdot S \cdot T \cdot U \cdot W \cdot X\}$ (NCt1*)

FIG. 72
u-BIT ENCODING

| Name | STUVWXY K | u | S | Name | STUVWXY K | u | Coding Label |
|------|-----------|---|---|------|-----------|---|--------------|
| D16  | 0000100 x | 1 | 1 | D111 | 1111011 x | 0 | $S \oplus T' \cdot T \oplus U' \cdot U \oplus V' \cdot V \oplus W \cdot W \oplus X \cdot X \oplus Y'$ |
|      |           |   |   | D63  | 1111110 x | 0 | $X \oplus Y \cdot S \cdot T \cdot U \cdot V \cdot W$ |
|      |           |   |   | D95  | 1111101 x | 0 | |

TABLE 17u $u = U \oplus \{S \oplus T' \cdot T \oplus U' \cdot U \oplus V' \cdot V \oplus W \cdot W \oplus X \cdot X \oplus Y' + X \oplus Y \cdot S \cdot T \cdot U \cdot V \cdot W\}$ (NCu1)

FIG. 73
v-BIT ENCODING

| Name | STUVWXY K | v | S | Name | STUVWXY K | v | Coding Label |
|------|-----------|---|---|------|-----------|---|--------------|
| D0   | 0000000 x | 1 | 1 | D127 | 1111111 x | 0 | T⊕U'•U⊕V'•V⊕W'•W⊕X'•X⊕Y'•K' |
| D1   | 1000000 x | 1 | 1 | D126 | 0111111 0 | 0 |              |
| D112 | 0000111 x | 1 | 1 | D111 | 1111011 x | 0 | S⊕T'•T⊕U'•U⊕V'•V⊕W • X•Y |
| D0*  | 0000000 x | 1 |   |      |           |   | S'•T'•U'•V'•W'•X' |
| D64  | 0000001 x | 1 |   |      |           |   |              |

TABLE 17v $$v = V \oplus (T \oplus U' \cdot U \oplus V' \cdot V \oplus W' \cdot W \oplus X' \cdot X \oplus Y' \cdot K' +$$
$$S \oplus T' \cdot T \oplus U' \cdot U \oplus V' \cdot V \oplus W \cdot X \cdot Y + S' \cdot T' \cdot U' \cdot V' \cdot W' \cdot X')$$

(Pn5*)
(Pn5*; NCv1*)

FIG. 74
w-BIT ENCODING

| Name | STUVWXY K | w | Name | STUVWXY K | w | Coding Label |
|------|-----------|---|------|-----------|---|--------------|
| D0   | 0000000 x | 1 |      |           |   | (S'+T') • U'•V'•W'•X'•Y' |
| D1   | 1000000 x | 1 |      |           |   |              |
| D2   | 0100000 x | 1 |      |           |   |              |
|      |           |   | D112 | 0000111 x | 0 | S'•T'•U'•V' • W•X•Y |
|      |           |   | D126 | 0111111 0 | 0 | T•U•V•W•X•Y•K' |
|      |           |   | D127 | 1111111 x | 0 |              |

TABLE 17w $$w = W \oplus \{(S'+T') \cdot U' \cdot V' \cdot W' \cdot X' \cdot Y' + S' \cdot T' \cdot U' \cdot V' \cdot W \cdot X \cdot Y + T \cdot U \cdot V \cdot W \cdot X \cdot Y \cdot K'\} \quad (NCw1)$$

FIG. 75
x-BIT ENCODING

| Name | STUVWXY K | x | Name | STUVWXY K | x | Coding Label |
|------|-----------|---|------|-----------|---|--------------|
| D4   | 0010000 x | 1 |      |           |   | U⊕V • S'•T'•W'•X'•Y' |
| D8   | 0001000 x | 1 |      |           |   |              |

TABLE 17x $$x = X \oplus (U \oplus V \cdot S' \cdot T' \cdot W' \cdot X' \cdot Y') \quad (NCx1)$$

FIG. 76 y-BIT ENCODING

| Name | STUVWXY K | y | Name | STUVWXY K | y | Coding Label |
|------|-----------|---|------|-----------|---|--------------|
| D2   | 0100000 x | 1 |      |           |   |              |
| D4   | 0010000 x | 1 |      |           |   |              |
| D3   | 1100000 x | 1 |      |           |   | (T⊕U + S'•T•U) • V'•W'•X'•Y' |
| D5   | 1010000 x | 1 |      |           |   |              |
| D6   | 0110000 x | 1 |      |           |   |              |
|      |           |   | D119 | 1110111 x | 0 |              |
|      |           |   | D126 | 0111111 0 | 0 | (S+V) • T•U•W•X•Y•K' |
|      |           |   | D127 | 1111111 x | 0 |              |

TABLE 17y $y = Y \oplus \{(T \oplus U + S' \cdot T \cdot U) \cdot V' \cdot W' \cdot X' \cdot Y' + (S+V) \cdot T \cdot U \cdot W \cdot X \cdot Y \cdot K'\}$ (NCy1)

FIG. 77 z-BIT ENCODING

| Name | STUVWXY K | z | S | Name | STUVWXY K | z | Coding Label |
|------|-----------|---|---|------|-----------|---|--------------|
| D2   | 0100000 x | 1 |   |      |           |   |              |
| D3   | 1100000 x | 1 |   |      |           |   |              |
| D4   | 0010000 x | 1 |   |      |           |   | $(T+U) \cdot V' \cdot W' \cdot X' \cdot Y'$ |
| D5   | 1010000 x | 1 |   |      |           |   |              |
| D6   | 0110000 x | 1 |   |      |           |   |              |
| D7   | 1110000 x | 1 |   |      |           |   |              |
| D3*  | 1100000 x | 1 | 1 | D11  | 1101000 x | 1 | $(S \cdot T \cdot U' + S \cdot T' \cdot U + S' \cdot T \cdot U) \cdot$ |
| D5*  | 1010000 x | 1 | 1 | D13  | 1011000 x | 1 | $W' \cdot X' \cdot Y'$ |
| D6*  | 0110000 x | 1 | 1 | D14  | 0111000 x | 1 |              |
| D0   | 0000000 x | 1 | 1 | D127 | 1111111 x | 1 | $T \oplus U' \cdot U \oplus V' \cdot V \oplus W' \cdot W \oplus X' \cdot X \oplus Y' \cdot K'$ |
| D1   | 1000000 x | 1 | 1 | D126 | 0111111 0 | 1 |              |
| D8   | 0001000 x | 1 | 1 | D119 | 1110111 x | 1 |              |
| D16  | 0000100 x | 1 | 1 | D111 | 1111011 x | 1 | $(V \oplus W \cdot U \oplus X' \cdot X \oplus Y' +$ |
| D32  | 0000010 x | 1 | 1 | D95  | 1111101 x | 1 | $U \oplus V \cdot V \oplus W' \cdot X \oplus Y) \cdot S \oplus T' \cdot T \oplus U'$ |
| D64  | 0000001 x | 1 | 1 | D63  | 1111110 x | 1 |              |
| D48  | 0000110 x | 1 | 1 | D79  | 1111001 x | 1 | $(V \oplus W' \cdot W \oplus X \cdot X \oplus Y' + V \oplus W \cdot X \oplus Y) \cdot$ |
| D80  | 0000101 x | 1 | 1 | D47  | 1111010 x | 1 | $S \oplus T' \cdot T \oplus U' \cdot U \oplus V'$ |
| D96  | 0000011 x | 1 | 1 | D31  | 1111100 x | 1 |              |
| D112 | 0000111 x | 1 |   |      |           |   | $S' \cdot T' \cdot U' \cdot V' \cdot W \cdot X \cdot Y$ |
| K42  | 0101010 1 | 1 | 1 | D85  | 1010101 0 | 1 | $S \oplus T \cdot T \oplus U \cdot U \oplus V \cdot V \oplus W \cdot W \oplus X \cdot X \oplus Y \cdot Y \oplus K$ |
| K19  | 1100100 1 | 1 |   |      |           |   | $S \oplus U \cdot T \cdot V' \cdot W \cdot X' \cdot Y' \cdot K$ |
| K22  | 0110100 1 | 1 |   |      |           |   |              |
| K50  | 0100110 1 | 1 | 1 | K74  | 0101001 1 | 1 | $V \oplus W \cdot W \oplus X' \cdot X \oplus Y \cdot S' \cdot U \cdot V' \cdot K$ |

TABLE 17z $z = Z \oplus \{(V \oplus W' \cdot W \oplus X \cdot X \oplus Y' + V \oplus W \cdot X \oplus Y) \cdot S \oplus T' \cdot T \oplus U' \cdot U \oplus V' +$ (Pn6)
$(V \oplus W \cdot U \oplus X' \cdot X \oplus Y' + U \oplus V \cdot V \oplus W' \cdot X \oplus Y) \cdot S \oplus T' \cdot T \oplus U' +$ (Pn7)
$(S \cdot T \cdot U' + S \cdot T' \cdot U + S' \cdot T \cdot U) \cdot W' \cdot X' \cdot Y' +$ (n8)
$S \oplus T \cdot T \oplus U \cdot U \oplus V \cdot V \oplus W \cdot W \oplus X \cdot X \oplus Y \cdot Y \oplus K +$ (Pn9*)
$T \oplus U' \cdot U \oplus V' \cdot V \oplus W' \cdot W \oplus X' \cdot X \oplus Y' \cdot K' +$ (Pn9*)
$V \oplus W \cdot W \oplus X' \cdot X \oplus Y \cdot S' \cdot U \cdot V' \cdot K +$ (n10*)
$S \oplus U \cdot T \cdot V' \cdot W \cdot X' \cdot Y' \cdot K + (T+U) \cdot V' \cdot W' \cdot X' \cdot Y' + S' \cdot T' \cdot U' \cdot V' \cdot W \cdot X \cdot Y\}$ (n10*)

FIG. 78A

SOURCE VECTORS WITH POSITIVE REQUIRED DISPARITY DR=+

| Name | DR Class | S T U V W X Y  K | Coding Label |
|------|----------|------------------|--------------|
| D9   | FT3m4b   | 1001000 x |  |
| D10  | FT3m4b   | 0101000 x |  |
| D12  | FT3m4b   | 0011000 x |  |
| D17  | FT4m     | 1000100 x |  |
| D18  | FT4m     | 0100100 x |  |
| D20  | FT4m     | 0010100 x |  |
| D25  | DM4u'4t' | 1001100 x |  |
| D26  | DM4u'4t' | 0101100 x |  |
| D28  | DM4u'4t' | 0011100 x |  |
| D41  | DM4u'4t' | 1001010 x |  |
| D42  | DM4u'4t' | 0101010 0 |  |
| D44  | DM4u'4t' | 0011010 x |  |
| D49  | DM4u'4t' | 1000110 x |  |
| D50  | DM4u'4t' | 0100110 0 |  |
| D52  | DM4u'4t' | 0010110 x | $\{(V \oplus W \cdot X \oplus Y \cdot K' + (V+W) \cdot X' \cdot Y' + (X+Y) \cdot V' \cdot W'\} \cdot$ |
| D73  | DM4u'4t' | 1001001 x | $(S \cdot T' \cdot U' + S' \cdot T \cdot U' + S' \cdot T' \cdot U)$ |
| D74  | DM4u'4t' | 0101001 0 |  |
| D76  | DM4u'4t' | 0011001 x |  |
| D81  | DM4u'4t' | 1000101 x |  |
| D82  | DM4u'4t' | 0100101 x |  |
| D84  | DM4u'4t' | 0010101 x |  |
| D33  | FT4m     | 1000010 x |  |
| D34  | FT4m     | 0100010 x |  |
| D36  | FT4m     | 0010010 x |  |
| D65  | FT4m     | 1000001 x |  |
| D66  | FT4m     | 0100001 x |  |
| D68  | FT4m     | 0010001 x |  |
| D97  | DM4u'4t' | 1000011 x |  |
| D98  | DM4u'4t' | 0100011 x |  |
| D100 | DM4u'4t' | 0010011 x |  |

TABLE 18A

FIG. 78B

SOURCE VECTORS WITH POSITIVE REQUIRED DISPARITY DR=+

| Name | DR Class | STUVWXY K | Coding Label |
|---|---|---|---|
| D19 | DM4u'4t' | 1100100 0 | |
| D21 | DM4u'4t' | 1010100 x | |
| D22 | DM4u'4t' | 0110100 0 | |
| D35 | DM4u'4t' | 1100010 x | $(S \cdot T \cdot U' + S \cdot T' \cdot U + S' \cdot T \cdot U) \cdot$ |
| D37 | DM4u'4t' | 1010010 x | $(W \cdot X' \cdot Y' + W' \cdot X \cdot Y' + W' \cdot X' \cdot Y) \cdot V' \cdot K'$ |
| D38 | DM4u'4t' | 0110010 x | |
| D67 | DM4u'4t' | 1100001 x | |
| D69 | DM4u'4t' | 1010001 x | |
| D70 | DM4u'4t' | 0110001 x | |
| D24 | FT4m | 0001100 x | |
| D40 | FT4m | 0001010 x | |
| D72 | FT4m | 0001001 x | $(W'+X'+Y') \cdot (W+X+Y) \cdot S' \cdot T' \cdot U' \cdot V$ |
| D56 | DM4u'4t' | 0001110 x | |
| D88 | DM4u'4t' | 0001101 x | |
| D104 | DM4u'4t' | 0001011 x | |
| K7 | | 1110000 1 | |
| K71 | | 1110001 1 | $(W \oplus X \cdot Y' + W' \cdot X') \cdot S \cdot T \cdot U \cdot V \cdot K$ |
| K23 | | 1110100 1 | |
| K39 | | 1110010 1 | |

TABLE 18B $PDR = \{(V \oplus W \cdot X \oplus Y \cdot K' + (V+W) \cdot X' \cdot Y' + (X+Y) \cdot V' \cdot W') \cdot$     (n20)
$(S \cdot T \cdot U' + S' \cdot T \cdot U' + S' \cdot T' \cdot U) +$     (Pn21*)
$(S \cdot T \cdot U' + S \cdot T' \cdot U + S' \cdot T \cdot U) \cdot (W \cdot X' \cdot Y' + W' \cdot X \cdot Y' + W' \cdot X' \cdot Y) \cdot V' \cdot K' +$     (n22;Pn23*)
$(W \oplus X \cdot Y' + W' \cdot X') \cdot S \cdot T \cdot U \cdot V \cdot K +$     (Pn24)
$(W'+X'+Y') \cdot (W+X+Y) \cdot S' \cdot T' \cdot U' \cdot V$     (Pn25)

FIG. 79

NEGATIVE REQUIRED DISPARITY DR=−

| Name | DR Class | STUVWXY K | Coding Label |
|---|---|---|---|
| D55 | DC4c' | 1110110 x | $U \oplus V \cdot X \oplus Y \cdot S \cdot T \cdot W$ |
| D59 | DC4c' | 1101110 x | |
| D87 | DC4c' | 1110101 x | |
| D91 | DC4c' | 1101101 x | |
| D61 | DC4c' | 1011110 x | $S \oplus T \cdot X \oplus Y \cdot U \cdot V \cdot W$ |
| D62 | DC4c' | 0111110 x | |
| D93 | DC4c' | 1011101 x | |
| D94 | DC4c' | 0111101 x | |
| D109 | DC4c' | 1011011 x | $S \oplus T \cdot V \oplus W \cdot U \cdot X \cdot Y$ |
| D110 | DC4c' | 0111011 x | |
| D117 | DC4c' | 1010111 x | |
| D118 | DC4c' | 0110111 x | |
| D121 | DC4c' | 1001111 x | $(V \cdot W \cdot X \cdot Y) \cdot (S+T+U) \cdot (T'+U')$ |
| D122 | DC4c' | 0101111 x | |
| D123 | FV3u | 1101111 x | |
| D124 | DC4c' | 0011111 x | |
| D125 | FV3u | 1011111 x | |
| D15 | BU4c | 1111000 x | $V \oplus X \cdot X \oplus Y' \cdot S \cdot T \cdot U \cdot W'$ |
| D103 | DC4c' | 1110011 x | |
| D107 | DC4c' | 1101011 x | $V \oplus W \cdot S \cdot T \cdot U' \cdot X \cdot Y$ |
| D115 | DC4c' | 1100111 x | |
| C126 | FV3uK | 0111111 1 | $K \cdot X \cdot Y$ |

TABLE 19

$NDR = V \oplus X \cdot X \oplus Y' \cdot S \cdot T \cdot U \cdot W' + U \oplus V \cdot X \oplus Y \cdot S \cdot T \cdot W +$ (n26*)
$S \oplus T \cdot X \oplus Y \cdot U \cdot V \cdot W + S \oplus T \cdot V \oplus W \cdot U \cdot X \cdot Y +$ (n26*)
$V \oplus W \cdot S \cdot T \cdot U' \cdot X \cdot Y + (V \cdot W \cdot X \cdot Y) \cdot (S+T+U) \cdot (T'+U') + K \cdot X \cdot Y$ (n27)

FIG. 80

DISPARITY OF FOUR, DB4

| Name | STUVWXY K | S | Name | STUVWXY K | Coding Label |
|---|---|---|---|---|---|
| D17 | 1000100 x | | | | |
| D24 | 0001100 x | | | | |
| D18 | 0100100 x | | | | |
| D20 | 0010100 x | | | | |
| D33 | 1000010 x | | | | |
| D40 | 0001010 x | | | | (W•X'•Y' + W'•X•Y'+ W'•X'•Y) • |
| D34 | 0100010 x | | | | (S⊕V • T'•U' + T⊕U • S'•V') |
| D36 | 0010010 x | | | | |
| D65 | 1000001 x | | | | |
| D72 | 0001001 x | | | | |
| D66 | 0100001 x | | | | |
| D68 | 0010001 x | | | | |
| D9 | 100 7000 x | 1 | C126 | 011 7111 1 | {S⊕T•T⊕U'•U⊕W' • (K+Y') + |
| D10 | 010 7000 x | 1 | D125 | 101 7111 x | S⊕W'•T⊕U} • W⊕X'•X⊕Y' • V |
| D12 | 001 7000 x | 1 | D123 | 110 7111 x | |

TABLE 20

BLOCK DISPARITY OF TWO, DB2

| Name | STUVWXY K | S | Name | STUVWXY K | Coding Label |
|---|---|---|---|---|---|
| D19 | 1100100 0 | 1 | D44 | 0011010 x | S⊕T'•T⊕U•U⊕V'•W⊕X • Y'•K' |
| D35 | 1100010 x | 1 | D28 | 0011100 x | |
| D88 | 0001101 x | 1 | D103 | 1110011 x | S⊕T'•T⊕U'•U⊕V•V⊕W'•W⊕X •Y |
| D55 | 1110110 x | | | | |
| D59 | 1101110 x | | | | U⊕V•X⊕Y • S•T•W |
| D87 | 1110101 x | | | | |
| D91 | 1101101 x | | | | |
| D21 | 1010100 x | | | | |
| D22 | 0110100 0 | | | | |
| D25 | 1001100 x | | | | |
| D26 | 0101100 x | | | | S⊕T•U⊕V•W⊕X • Y'•K' |
| D37 | 1010010 x | | | | |
| D38 | 0110010 x | | | | |
| D41 | 1001010 x | | | | |
| D42 | 0101010 0 | | | | |
| D61 | 1011110 x | | | | |
| D62 | 0111110 x | | | | S⊕T•X⊕Y • U•V•W |
| D93 | 1011101 x | | | | |
| D94 | 0111101 x | | | | |
| D49 | 1000110 x | | | | |
| D50 | 0100110 0 | | | | |
| D97 | 1000011 x | | | | |
| D98 | 0100011 x | | | | (S⊕T•U'•V'•K' + U⊕V•S'•T') • W⊕Y • X |
| D52 | 0010110 x | | | | |
| D56 | 0001110 x | | | | |
| D100 | 0010011 x | | | | |
| D104 | 0001011 x | | | | |
| D73 | 1001001 x | 1 | D110 | 0111011 x | |
| D74 | 0101001 0 | 1 | D109 | 1011011 x | |
| D81 | 1000101 x | 1 | D118 | 0110111 x | (S⊕T'•T⊕U•U⊕X + S⊕T•U⊕X' • K') • |
| D82 | 0100101 x | 1 | D117 | 1010111 x | V⊕W •Y |
| D76 | 0011001 x | 1 | D107 | 1101011 x | |
| D84 | 0010101 x | 1 | D115 | 1100111 x | |
| D67 | 1100001 x | 1 | D124 | 0011111 x | (S⊕T'•T⊕U•U⊕V' + S⊕T•U⊕V) • |
| D69 | 1010001 x | 1 | D122 | 0101111 x | V⊕W'•W⊕X'•Y |
| D70 | 0110001 x | 1 | D121 | 1001111 x | |

TABLE 21

FIG. 82

$DB2 = (S \oplus T' \cdot T \oplus U \cdot U \oplus V' + S \oplus T \cdot U \oplus V) \cdot V \oplus W' \cdot W \oplus X' \cdot Y +$           (P1DB2*)
$(S \oplus T' \cdot T \oplus U \cdot U \oplus X + S \oplus T \cdot U \oplus X' \cdot K') \cdot V \oplus W \cdot Y +$           (P1DB2*;P2DB2*)
$(S \oplus T \cdot U' \cdot V' \cdot K' + U \oplus V \cdot S' \cdot T') \cdot W \oplus Y \cdot X +$           (P2DB2*)
$S \oplus T' \cdot T \oplus U \cdot U \oplus V \cdot V \oplus W' \cdot W \oplus X \cdot Y + S \oplus T' \cdot T \oplus U \cdot U \oplus V' \cdot W \oplus X \cdot Y' \cdot K' +$           (P3DB2*)
$S \oplus T \cdot U \oplus V \cdot W \oplus X \cdot Y' \cdot K' + S \oplus T \cdot X \oplus Y \cdot U \cdot V \cdot W + U \oplus V \cdot X \oplus Y \cdot S \cdot T \cdot W$           (n34)

FIG. 83

$CMPLA = z \cdot \{(s \oplus t' \cdot t \oplus u \cdot u \oplus v' + s \oplus t \cdot u \oplus v) \cdot (w \cdot x' \cdot y' + w' \cdot x \cdot y' + w' \cdot x' \cdot y)\}' \cdot$           (n7)
$\{(s \oplus t \cdot u' \cdot v' + u \oplus v \cdot s' \cdot t') \cdot (w \cdot x \cdot y' + w \cdot x' \cdot y + w' \cdot x \cdot y)\}' \cdot$           (n8)
$\{(s \oplus t \cdot u \cdot v + u \oplus v \cdot s \cdot t) \cdot w' \cdot x' \cdot y'\}' +$           (n9)
$C126PREF \cdot (w \oplus x \cdot y \cdot z + y \oplus z \cdot w \cdot x) \cdot s' \cdot t' \cdot u' \cdot v$           (NCMPLA2)

FIG. 84

25 VECTORS WITH CHANGES IN THE FIRST 7 BITS FOR DECODING

| NAME | stuvwxyz | SY | NAME | stuvwxyz |
|------|----------|----|----|----------|
| D3   | 11000011 |    |      |          |
| D5   | 10100011 |    |      |          |
| D6   | 01100011 |    |      |          |
| D2   | 01001011 |    |      |          |
| D4   | 00100111 |    |      |          |
| D0   | 01011001 | 1  | D127 | 10100101 |
| D1   | 10011001 | 1  | D126 | 01100101 |
| D8   | 10010101 | 1  | D119 | 00101101 |
| D16  | 10101001 | 1  | D111 | 01000111 |
| D32  | 11000101 | 1  | D95  | 00011011 |
| D64  | 10010011 | 1  | D63  | 00011101 |
| D48  | 10001101 | 1  | D79  | 00110011 |
| D80  | 10001011 | 1  | D47  | 00110101 |
| D96  | 10000111 | 1  | D31  | 00111001 |
| D112 | 00010111 | 0  | D85  | 00101011 |

TABLE 22

FIG. 85
S-BIT DECODING

| Name | stuvwxyz | S | SY | Name | stuvwxyz | S | Decoding Label |
|---|---|---|---|---|---|---|---|
| D8  | 10010101 | 0 | 1 | D119 | 00101101 | 1 | s⊕u•u⊕v•v⊕w • t'•x•y'z |
| D16 | 10101001 | 0 | 1 | D111 | 01000111 | 1 | s⊕t•t⊕u•t⊕x'•w⊕x•x⊕y' • v'•z |
| D32 | 11000101 | 0 | 1 | D95  | 00011011 | 1 | s⊕t'•t⊕x'•v⊕w'•w⊕x•x⊕y • u'•z |
| D64 | 10010011 | 0 | 1 | D63  | 00011101 | 1 | s⊕w•w⊕x'•x⊕y • t'•u'•v•z |
| D48 | 10001101 | 0 | 1 | D79  | 00110011 | 1 | (v⊕w'•w⊕x•x⊕y' + v⊕w•x⊕y) • |
| D80 | 10001011 | 0 | 1 | D47  | 00110101 | 1 | s⊕u•u⊕v' • t'•z |
| D96 | 10000111 | 0 | 1 | D31  | 00111001 | 1 |  |
|     |          |   |   | D85  | 00101011 | 1 | s'•t'•u•v'•w•x'•y•z |

TABLE 23S $S = s \oplus \{(v \oplus w' \cdot w \oplus x \cdot x \oplus y' + v \oplus w \cdot x \oplus y) \cdot u \oplus v' \cdot t' \cdot z +$ (Pn0)
$s \oplus t \cdot t \oplus u \cdot t \oplus x' \cdot w \oplus x \cdot x \oplus y' \cdot v' \cdot z + s \oplus t' \cdot t \oplus x' \cdot v \oplus w' \cdot w \oplus x \cdot x \oplus y \cdot u' \cdot z +$ (Pn1)
$u \oplus v \cdot v \oplus w \cdot t' \cdot x \cdot y' z + w \oplus x' \cdot x \oplus y \cdot t' \cdot u' \cdot v \cdot z + t' \cdot u \cdot v' \cdot w \cdot x' \cdot y \cdot z\}$ (Pn2)

FIG. 86
T-BIT DECODING

| Name | stuvwxyz | T | SY | Name | stuvwxyz | T | Decoding Label |
|---|---|---|---|---|---|---|---|
| D0  | 01011001 | 0 | 1 | D127 | 10100101 | 1 | s⊕t•t⊕u•u⊕v•v⊕w'•w⊕x • y'•z |
| D32 | 11000101 | 0 | 1 | D95  | 00011011 | 1 | s⊕t'•t⊕x'•v⊕w'•w⊕x•x⊕y • u'•z |
|     |          |   |   | D119 | 00101101 | 1 | u⊕v•s'•t'•w•x•y'•z |
|     |          |   |   | D63  | 00011101 | 1 |  |
|     |          |   |   | D47  | 00110101 | 1 |  |
|     |          |   |   | D79  | 00110011 | 1 | (x⊕y•w' + w•x'•y') • s'•t'•u•v•z |
|     |          |   |   | D31  | 00111001 | 1 |  |

TABLE 23T $T = t \oplus \{s \oplus t \cdot t \oplus u \cdot u \oplus v \cdot v \oplus w' \cdot w \oplus x \cdot y' \cdot z + s \oplus t' \cdot t \oplus x' \cdot v \oplus w' \cdot w \oplus x \cdot x \oplus y \cdot u' \cdot z +$ (Pn3)
$(x \oplus y \cdot w' + w \cdot x' \cdot y') \cdot s' \cdot u \cdot v \cdot z + u \oplus v \cdot s' \cdot w \cdot x \cdot y' \cdot z\}$ (Pn4)

FIG. 87
U-BIT DECODING

| Name | stuvwxyz | U | SY | Name | stuvwxyz | U | Decoding Label |
|---|---|---|---|---|---|---|---|
| D16 | 10101001 | 0 | 1 | D111 | 01000111 | 1 | s⊕t•t⊕u•t⊕x'•w⊕x•x⊕y' • v'•z |
|     |          |   |   | D95  | 00011011 | 1 | x⊕y • s'•t'•u•v•w•z |
|     |          |   |   | D63  | 00011101 | 1 |  |

TABLE 23U $U = u \oplus (s \oplus t \cdot t \oplus u \cdot t \oplus x' \cdot w \oplus x \cdot x \oplus y' \cdot v' \cdot z + x \oplus y \cdot s' \cdot t' \cdot v \cdot w \cdot z)$ (PU1)

FIG. 88
V-BIT DECODING

| Name | stuvwxyz | V | SY | Name | stuvwxyz | V | Decoding Label |
|------|----------|---|----|------|----------|---|----------------|
| D0   | 01011001 | 0 | 1  | D127 | 10100101 | 1 | s⊕t•u⊕$\underline{v}$•v⊕w'•w⊕x • y'•z |
| D1   | 10011001 | 0 | 1  | D126 | 01100101 | 1 | |
| D64  | 10010011 | 0 |    |      |          |   | s⊕x • t'•u'•$\underline{v}$•w'•y•z |
| D112 | 00010111 | 0 |    |      |          |   | |
|      |          |   |    | D111 | 01000111 | 1 | s'•t•u'•$\underline{v}$'•w'•x•y•z |

TABLE 23V $V = v \oplus (s \oplus t \cdot u \oplus v \cdot v \oplus w' \cdot w \oplus x \cdot y' \cdot z + s \oplus x \cdot t' \cdot u' \cdot w' \cdot y \cdot z + s' \cdot t \cdot u' \cdot w' \cdot x \cdot y \cdot z)$  (PV1)

FIG. 89
W-BIT DECODING

| Name | stuvwxyz | W | SY | Name | stuvwxyz | W | Decoding Label |
|------|----------|---|----|------|----------|---|----------------|
| D0   | 01011001 | 0 | 1  | D127 | 10100101 | 1 | s⊕t•u⊕v•v⊕$\underline{w}$'•w⊕x • y'•z |
| D1   | 10011001 | 0 | 1  | D126 | 01100101 | 1 | |
| D2   | 01001011 | 0 | 1  | D112 | 00010111 | 1 | t⊕x•v⊕$\underline{w}$•w⊕x • s'•u'•y•z |

TABLE 23W $W = w \oplus (s \oplus t \cdot u \oplus v \cdot v \oplus w' \cdot w \oplus x \cdot y' \cdot z + t \oplus x \cdot v \cdot w \cdot w \oplus x \cdot s' \cdot u' \cdot y \cdot z)$  (PW1)

FIG. 90
X-BIT DECODING

| Name | stuvwxyz | X | Decoding Label |
|------|----------|---|----------------|
| D4   | 00100111 | 0 | s⊕u•u⊕v•u⊕y' • t'•w'•$\underline{x}$•z |
| D8   | 10010101 | 0 | |

TABLE 23X $X = x \oplus (s \oplus u \cdot u \oplus v \cdot u \oplus y' \cdot t' \cdot w' \cdot z)$  (NCMPLx1)

FIG. 91
Y-BIT DECODING

| Name | stuvwxyz | Y | SY | Name | stuvwxyz | Y | Decoding Label |
|------|----------|---|----|------|----------|---|----------------|
| D2 | 01001011 | 0 | 1 | D4 | 00100111 | | $t \oplus u \cdot t \oplus x \cdot w \oplus x \cdot s' \cdot v' \cdot \underline{y} \cdot z$ |
| D3 | 11000011 | 0 | | | | | $(s \cdot t \cdot u' + s \cdot t' \cdot u + s' \cdot t \cdot u) \cdot$ |
| D5 | 10100011 | 0 | | | | | $v' \cdot w' \cdot x' \cdot \underline{y} \cdot z$ |
| D6 | 01100011 | 0 | | | | | |
| | | | | D127 | 10100101 | 1 | |
| | | | | D126 | 01100101 | 1 | $(s \oplus t \cdot w' + s' \cdot t' \cdot w) \cdot u \cdot v' \cdot x \cdot \underline{y}' \cdot z$ |
| | | | | D119 | 00101101 | 1 | |

TABLE 23Y $Y = y \oplus \{(s \cdot t \cdot u' + s \cdot t' \cdot u + s' \cdot t \cdot u) \cdot v' \cdot w' \cdot x' \cdot z +$      (Pn5)
$(s \oplus t \cdot w' + s' \cdot t' \cdot w) \cdot u \cdot v' \cdot x \cdot z +$      (Pn6)
$t \oplus u \cdot t \oplus x \cdot w \oplus x \cdot s' \cdot v' \cdot z\}$      (NCMPLy1*)

FIG. 92
K-BIT DECODING

| Name | stuvwxyz | Coding Label |
|------|----------|--------------|
| K19 | 11001001 | $s \oplus u \cdot t \cdot v' \cdot w \cdot x' \cdot y' \cdot z$ |
| K22 | 01101001 | |
| K42 | 01010101 | $s \oplus t \cdot t \oplus u \cdot u \oplus v \cdot v \oplus w \cdot w \oplus x \cdot x \oplus y \cdot y \oplus z$ |
| K85 | 10101010 | |
| K50 | 01001101 | $v \oplus w \cdot w \oplus x' \cdot x \oplus y \cdot s' \cdot t \cdot u' \cdot z$ |
| K74 | 01010011 | |
| C126P | 01111110 | $s \oplus t \cdot t \oplus u' \cdot u \oplus v' \cdot v \oplus w' \cdot w \oplus x' \cdot x \oplus y' \cdot y \oplus z$ |
| C126A | 10000001 | |

TABLE 23K $K = s \oplus t \cdot t \oplus u \cdot u \oplus v \cdot v \oplus w \cdot w \oplus x \cdot x \oplus y \cdot y \oplus z +$      (PK*)
$s \oplus t \cdot t \oplus u' \cdot u \oplus v' \cdot v \oplus w' \cdot w \oplus x' \cdot x \oplus y' \cdot y \oplus z +$      (NC126)
$v \oplus w \cdot w \oplus x' \cdot x \oplus y \cdot s' \cdot t \cdot u' \cdot z + s \oplus u \cdot t \cdot v' \cdot w \cdot x' \cdot y' \cdot z$      (PK*)

FIG. 93

54 INVALID VECTORS

| Name | DB Class | DB | stuvwxyz | stuvwxyz | Decoding Label |
|---|---|---|---|---|---|
| I31/I224 | U/M | 2 | 11111000 | 00000111 | |
| I47/I208 | U/M | 2 | 11110100 | 00001011 | |
| I63/I192 | C/T | 4 | 11111100 | 00000011 | |
| I79/I176 | U/M | 2 | 11110010 | 00001101 | |
| I95/I160 | C/T | 4 | 11111010 | 00000101 | |
| I111/I144 | C/T | 4 | 11110110 | 00001001 | |
| I127/I128 | V/Q | 6 | 11111110 | 00000001 | $s \oplus t' \cdot t \oplus u' \cdot u \oplus v' \cdot$ |
| I143/I112 | U/M | 2 | 11110001 | 00001110 | $(v \oplus w \cdot w \oplus x' \cdot x \oplus y' \cdot y \oplus z')'$ |
| I159/I96 | C/T | 4 | 11111001 | 00000110 | |
| I175/I80 | C/T | 4 | 11110101 | 00001010 | |
| I191/I64 | V/Q | 6 | 11111101 | 00000010 | |
| I207/I48 | C/T | 4 | 11110011 | 00001100 | |
| I223/I32 | V/Q | 6 | 11111011 | 00000100 | |
| I239/I16 | V/Q | 6 | 11110111 | 00001000 | |
| I255/I0 | H/S | 8 | 11111111 | 00000000 | |
| I241/I14 | U/M | 2 | 10001111 | 01110000 | $(s \oplus t \cdot u \oplus v' + s \oplus t' \cdot u \oplus v) \cdot$ |
| I242/I13 | U/M | 2 | 01001111 | 10110000 | $v \oplus w \cdot w \oplus x' \cdot x \oplus y' \cdot y \oplus z'$ |
| I244/I11 | U/M | 2 | 00101111 | 11010000 | |
| I247/I8 | V/Q | 6 | 11101111 | 00010000 | |
| I248/I7 | U/M | 2 | 00011111 | 11100000 | |
| I249/I6 | C/T | 4 | 10011111 | 01100000 | |
| I250/I5 | C/T | 4 | 01011111 | 10100000 | |
| I251/I4 | V/Q | 6 | 11011111 | 00100000 | $v \oplus w' \cdot w \oplus x' \cdot x \oplus y' \cdot y \oplus z$ |
| I252/I3 | C/T | 4 | 00111111 | 11000000 | |
| I253/I2 | V/Q | 6 | 10111111 | 01000000 | |
| I254/I1 | V/Q | 6 | 01111111 | 10000000 | |
| *I255/I0 | H/S | 8 | 11111111 | 00000000 | |
| I119/I136 | C/T | 4 | 11101110 | 00010001 | $s \oplus t' \cdot t \oplus u' \cdot u \oplus w' \cdot w \oplus x' \cdot x \oplus y' \cdot y \oplus z$ |
| *I127/I128 | V/Q | 6 | 11111110 | 00000001 | |

TABLE 24

$INVAL8 = s \oplus t' \cdot t \oplus u' \cdot u \oplus v' \cdot (v \oplus w \cdot w \oplus x' \cdot x \oplus y' \cdot y \oplus z')' +$ (n10)
$(s \oplus t \cdot u \oplus v' + s \oplus t' \cdot u \oplus v) \cdot v \oplus w \cdot w \oplus x' \cdot x \oplus y' \cdot y \oplus z' +$ (n11)
$s \oplus t' \cdot t \oplus u' \cdot u \oplus w' \cdot w \oplus x' \cdot x \oplus y' \cdot y \oplus z + v \oplus w' \cdot w \oplus x' \cdot x \oplus y' \cdot y \oplus z$ (PINVALB*)

FIG. 94

PDR = (s'•t'•u'+s'•t'•v'+s'•u'•v'+t'•u'•v')•(w'•x'+w'•y'+w'•z'+x'•y'+x'•z'+y'•z') +
(s'•t'+s'•u'+s'•v'+t'•u'+t'•v'+u'•v')•(w'•x'•y'+w'•x'•z'+w'•y'•z'+x'•y'•z') +s'•t'•u'•v'

NDR = (s•t•u+s•t•v+s•u•v+t•u•v)•(w•x+w•y+w•z+x•y+x•z+y•z) +
(s•t+s•u+s•v+t•u+t•v+u•v)•(w•x•y+w•x•z+w•y•z+x•y•z) + s•t•u•v

FIG. 95

PBD4 = (s•t•u+s•t•v+s•u•v+t•u•v)•(w•x•y+w•x•z+w•y•z+x•y•z) +
(s•t+s•u+s•v+t•u+t•v+u•v)•w•x•y•z

PBD2 = (s•t•u+s•t•v+s•u•v+t•u•v) • (w⊕z•x⊕y + w⊕x•y⊕z) +
(s⊕v•t⊕u + s⊕t•u⊕v) • (w•x•y+w•x•z+w•y•z+x•y•z)

NBD2= (s'•t'•u'+s'•t'•v'+s'•u'•v'+t'•u'•v') • (w⊕z•x⊕y + w⊕x•y⊕z) +
(s⊕v•t⊕u + s⊕t•u⊕v) • (w'•x'•y'+w'•x'•z'+w'•y'•z'+x'•y'•z')

NBD4 = (s'•t'•u'+s'•t'•v'+s'•u'•v'+t'•u'•v')•(w'•x'•y'+w'•x'•z'+w'•y'•z'+x'•y'•z') +
(s'•t'+s'•u'+s'•v'+t'•u'+t'•v'+u'•v')•w'•x'•y'•z'

7B8B BIT ENCODING

8B7B BIT DECODING

8B7B BIT COMPLEMENTATION

TECHNIQUES FOR 9B10B AND 7B8B CODING AND DECODING

CROSS-REFERENCE TO RELATED APPLICATIONS

This application is a continuation of U.S. patent application Ser. No. 11/668,549, filed Jan. 30, 2007, now U.S. Pat No. 7,405,679 the complete disclosure of which is expressly incorporated by reference herein in its entirety for all purposes.

FIELD OF THE INVENTION

The present invention generally relates to communications systems and, more particularly, to encoding and decoding techniques.

BACKGROUND OF THE INVENTION

Coding is employed in communications systems for a variety of purposes Among these are the improvement of transmission reliability, DC balance, the detection of errors, and the correction of errors. U.S. Pat. Nos. 6,198,413 and 6,614,369, both to Albert X Widmer, describe the principles for the construction of a 16B16B transmission code which is partitioned into a 9B10B and a 7B8B part For high speed bus applications as described in U.S. Pat. No. 6,978,416, also to Albert X Widmer, the compatibility with an 8-bit byte format is often not an advantage or irrelevant for very wide busses with dozens of parallel lines. The higher coding efficiency and other features may outweigh the lower complexity of the traditional 8B10B code, known, for example, from Albert X Widmer, The ANSI Fibre Channel Transmission Code, IBM Research Report RC 18855, 4/23/93, and U.S. Pat. Nos. 4,486,739, of Franaszek and Widmer, and 6,977,599, of Albert X Widmer.

Various versions of 7B8B codes have been used by British Telecom, as known from J R. Alexander and A. S. T. Nagra, "Transformation of binary coded signals into a form having lower disparity", British Patent 1540617, 14 Feb. 1979, and P. Cochrane, R. Brooks, and R. Dawes, "A High Reliability 565 Mbit/s Trunk Transmission System, " IEEE JOURNAL ON SELECTED AREAS IN COMMUNICATIONS, VOL. SAC-4, NO. 9, December 1986, pp. 1396-1403, and by Standard Telephones and Communications plc, as known from R L Williamson and M Chown, "The NL1 Submarine System," IEEE JOURNAL ON SELECTED AREAS IN COMMUNICATIONS, VOL SAC-1, NO 3, April 1983, pp. 454-458. A coding table for one such version is listed in A. J. Sharland and A. Stevenson, "A simple in-service error detection scheme based on the statistical properties of line codes for optical fibre Systems," INT. J. ELECTRONICS, 1983, VOL. 55, NO. 1, 3-33. It is not suitable for implementation with combinational logic elements. A good general introduction to this kind of line coding is given in K. W. Cattermole, "Principles of digital line coding," INT J. ELECTRONICS, 1983, VOL 55, NO. 1, 3-33, and in R. M. Brooks and A. Jessop, "Line coding for optical fibre systems", INT. J. ELECTRONICS, 1983, VOL 55, NO. 1, 81-120.

It would be desirable to provide both a 9B10B coding implementation and a 7B8B coding implementation that can be efficiently implemented in hardware.

SUMMARY OF THE INVENTION

Principles of the present invention provide techniques for implementing one or more coding and decoding schemes. An exemplary method of encoding 9-binary symbol (9B) source vectors into 10-binary symbol (10B) encoded vectors, according to one aspect of the invention, includes the steps of obtaining a plurality of 9B source vectors, and encoding the 9B source vectors into a plurality of 10B encoded vectors according to an encoding scheme. The 10B encoded vectors include at least 10B encoded data vectors (i.e., control vectors could be included in addition to the data vectors). The encoding scheme maps at least a first portion of the 9B source vectors into 10B encoded data vectors comprising disparity independent encoded vectors. The encoding scheme mapping at least a second portion of the 9B source vectors into 10B encoded data vectors comprising disparity dependent encoded vectors having primary representations and alternate representations complementary to the primary representations. The 10B encoded data vectors have one binary symbol appended thereto by the encoding scheme. A fraction of the 10B encoded data vectors have binary symbol changes, other than whole-vector complementation, compared to corresponding ones of the 9B source vectors, the fraction not including any of the disparity dependent encoded representations.

In another aspect an exemplary method of decoding 10-binary symbol (10B) encoded vectors into decoded 9-binary symbol (9B) source vectors includes the steps of obtaining a plurality of 10B encoded vectors that were encoded from a plurality of 9B source vectors according to an encoding scheme of the kind just described, and decoding the 10B encoded vectors into a plurality of 9B source vectors according to decoding rules of the encoding scheme.

In still another aspect, an exemplary method of encoding 7-binary symbol (7B) source vectors into 8-binary symbol (8B) encoded vectors, according to one aspect of the invention, includes the steps of obtaining a plurality of 7B source vectors, and encoding the 7B source vectors into a plurality of 8B encoded vectors according to an encoding scheme. The 8B encoded vectors include at least 8B encoded data vectors (i.e., control vectors could be included in addition to the data vectors). The encoding scheme maps at least a first portion of the 7B source vectors into 8B encoded data vectors comprising disparity independent encoded vectors. The encoding scheme mapping at least a second portion of the 7B source vectors into 8B encoded data vectors comprising disparity dependent encoded vectors having primary representations and alternate representations complementary to the primary representations The 8B encoded data vectors have one binary symbol appended thereto by the encoding scheme. A fraction of the 8B encoded data vectors have binary symbol changes, other than whole-vector complementation, compared to corresponding ones of the 7B source vectors, the fraction not including any of the disparity dependent encoded representations.

In yet another aspect, an exemplary method of decoding 8-binary symbol (8B) encoded vectors into decoded 7-binary symbol (7B) source vectors includes the steps of obtaining a plurality of 8B encoded vectors that were encoded from a plurality of 7B source vectors according to an encoding scheme of the kind just described, and decoding the 8B encoded vectors into a plurality of 7B source vectors according to decoding rules of the encoding scheme.

These and other aspects of the invention will become apparent from the following detailed description of illustrative embodiments thereof, which is to be read in connection with the accompanying drawings.

BRIEF DESCRIPTION OF THE DRAWINGS

FIG. 1 depicts trellis diagrams similar to those of U.S. Pat. Nos. 6,198,413 and 6,614,369, modified in accordance with an aspect of the invention;

FIG. 3A shows an exemplary conceptual view of the flow of 9B10B decoding, according to an aspect of the invention;

FIG. 3B shows a circuit block diagram of an exemplary circuit for 9B10B decoding, according to an aspect of the invention;

FIG. 4 depicts trellis diagrams for an exemplary embodiment of 9B10B code, according to an aspect of the invention;

FIG. 5 shows a trellis diagram and comma characters fox an exemplary embodiment of 9B10B code, according to an aspect of the invention;

FIG. 6 shows a specific exemplary implementation of a 9B10B encoding table;

FIG. 14 shows the set of 10B vectors requiring individual bit changes for encoding, in an exemplary embodiment;

FIGS. 15-33 depict exemplary encoding logic equations for an exemplary embodiment of 9B10B code, according to an aspect of the invention;

FIGS. 34-45 depict exemplary decoding logic equations for an exemplary embodiment of 9B10B code, according to an aspect of the invention;

FIGS. 46 and 47 depict invalid vectors for an exemplary embodiment of 9B10B code, according to an aspect of the invention;

FIGS. 48-52 address disparity checking and equations for required and running disparity for an exemplary embodiment of 9B10B code, according to an aspect of the invention;

FIG. 57 depicts trellis diagrams for an exemplary embodiment of 7B8B code, according to an aspect of the invention;

FIG. 68 shows a specific exemplary implementation of a 7B8B encoding table;

FIG. 69 shows the set of 8B vectors requiring individual bit changes for encoding, in an exemplary embodiment;

FIGS. 70-82 depict exemplary encoding logic equations for an exemplary embodiment of 7B8B code, according to an aspect of the invention;

FIGS. 83-95 depict aspects of decoding and error checking for an exemplary embodiment of 7B8B code, according to an aspect of the invention;

DETAILED DESCRIPTION OF PREFERRED EMBODIMENTS

Introduction

Notation

Figure 2A:
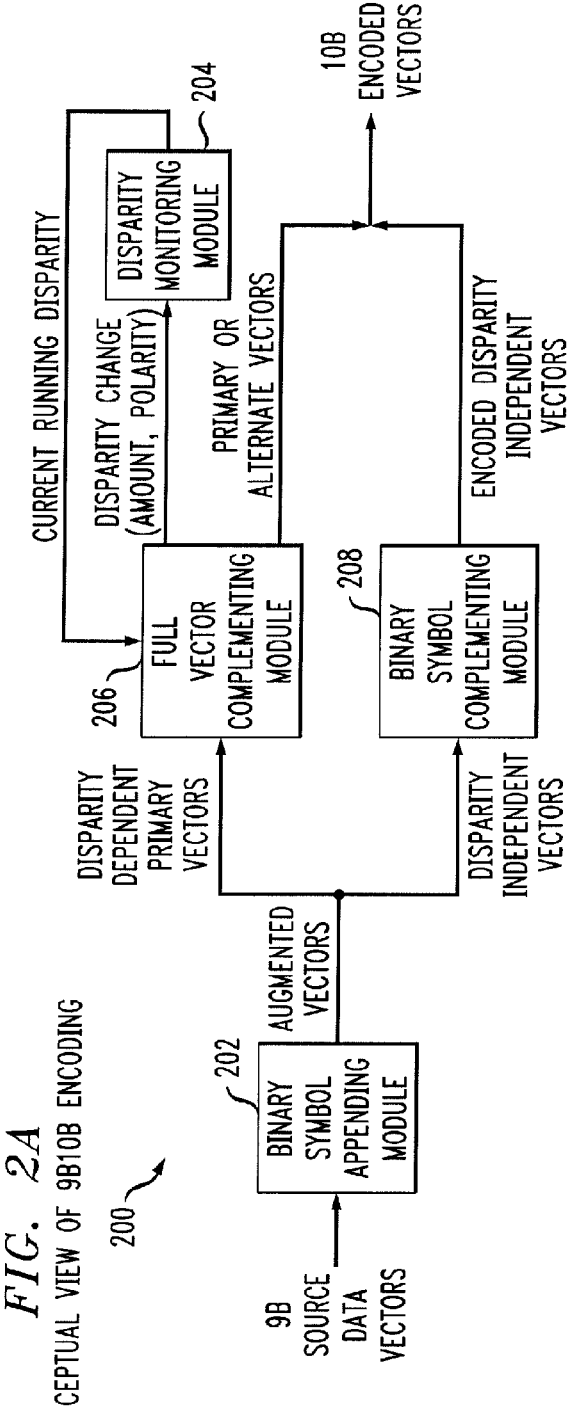
FIG. 2A shows an exemplary conceptual view of the flow of 9B10B encoding, according to an aspect of the invention.

The capital "B" in 9B10B and 7B8B refers to "Binary Symbol," not "bit," as a distinction from codes which use symbols with more than two levels, e.g. ternary symbols with three levels, commonly referred to by the capital letter "T" Also, the number of inputs is actually ten or 8, respectively, to accommodate control characters, and the numbers 9 and 7 refer to the data vectors only.

Bit Names

The bits of the uncoded 9B and 7B data vectors are labeled with the upper case letters 'ABCDEFGHI' and 'STUVWXY,' respectively. The control input for special non-data characters is labeled with 'K.' The bits of the coded 10B vectors are labeled with the lower case letters 'abcdefghij' and 'stuvwxyz,' respectively. Serial transmission is in alphabetical older starting with 'a' or 's.'

In the logic equations, some capital letters have overlapping use for group classifications and for the designation of a specific uncoded input bit If the dual use can be ambiguous such as for a single letter designating a classification, the classification is referred to with bold, underlined type The bit designations are always referred to with plain type. As an example, the bold letter $\underline{S}$ refers to the input pattern which leads to the node 7s in the trellis of FIG. 1, and the plain letter S refers to the uncoded bit S of the 7B8B code.

Tables

In some tables, a free standing letter S in the column header alerts for some symmetry between the left and right side of the table if there is a 1 in a specific row. The symmetric relationship might be complementary or equal values for the bit positions marked by bold type or by italic type. This use is not uniform because bold type is also used to highlight bit positions with equal values on several rows or to mark encoded bit positions which are the complements of the respective uncoded positions. The Coding Labels in the right column of the tables are used to write the coding and decoding equations.

Logic Equations

In the logic equations, the EXCLUSIVE OR function ($\oplus$) is executed first, followed by the AND ($\cdot$), and then the OR (+) function. The EXOR function is defined with a single parameter on each side, i.e. $x \oplus y$ is equivalent to $(x \oplus y)$ to allow the elimination of one level of parentheses. In the coding equations and tables, some vectors are included redundantly for simplification. Redundant vector names are preceded by an asterisk.

In any of the Exclusive OR relationships between two groups of contiguous bits, any bit in the first and second group can be selected as the first and second input, respectively, of the XOR2 gate. The inputs have been selected to maximize commonality among the several encoding equations.

The expressions in parentheses at the right edge of the equations refer to the corresponding net names in the circuit diagram. An asterisk * following the net name means that the correlation is not exact because of missing or additional terms listed on the same line. In the logic labels and equations, the components are usually listed in descending order of the estimated circuit delay.

Net Names in the Circuit Diagrams

Some abbreviated signal and wire names are used in the circuits for convenience and brevity and to avoid special symbols which are not compatible with the logic design systems.

In the encoding circuits, the letters 'a' and 'o' within netnames refer to the Boolean AND and OR functions, respectively, but in most cases, the AND operator is omitted. The letter 'n' within a name negates the preceding parameter. The letters 'e' and 'u' represent the symbols '=' and '≠', respectively. The capital letters "ABCDEFGHI" and "STUVWXY" represent the uncoded input bits and the lower case letters "abcdefghij" and "stuvwxyz" represent the coded format, usually prefixed with C(oded) because some chip design and simulation programs do not distinguish between upper and lower case letters. The lower case letter "n" followed by a number refers to a net number. Leading capital letters "P" or "N" refer to logic functions which are true at the upper or lower logic level, respectively. Numbered net names such as n45, are true at the lower level and take a P prefix if true at the upper level, e.g. Pn45.

The notation used in the decoding diagrams is analogous to that of the encoding circuit but lower case letters for logic functions are exchanged for upper case and vice versa The letters 'A' and 'O' within net-names refer to the Boolean AND and OR functions, respectively. The letter 'N' within a name negates the preceding parameter The letters 'E' and 'U' represent the symbols '=' and '≠', respectively.

Disparity Diagrams

For easy reference, some of the trellis diagrams of U.S. Pat. Nos. 6,198,413 and 6,614,369, modified in accordance with the teachings of the invention (as explained below), are reproduced here. In the trellis diagrams such as shown in FIG. 1, an upwards sloping line for one interval represents a binary symbol with a value of one, conversely, a slope downwards represents a zero value. The horizontal coordinates on the time axis of the left trellis of FIG. 1 are labeled by a number in ascending order from left to right. Each unit increment represents one additional binary symbol. The vertical coordinates which represent the running disparity are expressed by a lower case letter as follows:

b (balance) indicates a disparity of 0 u (up, uni) indicates a disparity of +1 when paired with an odd preceding number and a disparity of +2 when paired with an even preceding number m (minus) indicates a disparity of 1 when paired with an odd preceding number and a disparity of −2 when paired with an even preceding number c (cube) indicates a disparity of +3 when paired with an odd preceding number and a disparity of +4 when paired with an even preceding number t (three) indicates a disparity of −3 when paired with an odd preceding number and a disparity of −4 when paired with an even preceding number v (Roman numeral V) indicates a disparity of +5 when paired with an odd preceding number and a disparity of +6 when paired with an even preceding number q (quint) indicates a disparity of −5 when paired with an odd preceding number and a disparity of −6 when paired with an even preceding number h (hepta) indicates a disparity of +7 when paired with an odd preceding number and a disparity of +8 when paired with an even preceding number s (seven) indicates a disparity of −7 when paired with an odd preceding number and a disparity of −8 when paired with an even preceding number x (Roman numeral IX) indicates a disparity of +9 when paired with an odd preceding number and a disparity of +10 when paired with an even preceding number n (nine, negative) indicates a disparity of −9 when paired with an odd preceding number and a disparity of −10 when paired with an even preceding number.

As an example, the expression "5*c*" in the left trellis of FIG. 1 refers to a disparity value of +3 after the end of the fifth bit and the expression "6*c*" refers to a disparity value of +4 after the end of the sixth bit. FIG. 1 shows the trellis diagrams for vectors comprising up to 10 bits. The left-side trellis lists the node names and is used to define the vector classifications and the right-side trellis shows the number of different paths or vectors leading from the origin to each node. Note that these numbers are identical to the binomial coefficients.

Vector Classification

The following notation is used for names attached to sets of source vectors or encoded vectors:

The first capital letter B, P, D, or F indicates the disparity of the coded vectors:

B indicates disparity independent Balanced coded vectors

P indicates a complementary pair of disparity dependent balanced coded vectors which are selected based on the Polarity of the running disparity.

D indicates a complementary pair of coded vectors with a disparity of two.

F indicates a complementary pair of coded vectors with a disparity of Four.

A second capital letter, if present, indicates the block disparity of the uncoded vector or the vertical coordinate after bit 9 (I) or 7 (Y) in the left-side trellis of FIG. 1 using the capital version of the disparity values listed above.

A third capital letter, if present, indicates the value of the control input bit K Up to three leading capital letters may be followed by one or more sets of a number paired with a lower case letter to indicate trellis nodes through which the members of the class must go, or not go if negated. Vectors going through negated nodes, e.g. 4t', must not be part of the specified class of vectors. This notation is illustrated in the left-side trellis of FIG. 1.

The third and following capital letters, other than K, mark the uncoded bits, if any, which must be complemented to obtain the respective coded primary vector. The last coded bit j or z is appended with a default value zero and complemented, if indicated by a classification name ending in J or Z, respectively Conceptual and Circuit Views for Encoding and Decoding FIGS. 2A and 3A show a conceptual view of encoding and decoding, respectively, which have first been successfully applied to an 8B10B code with local parity as described in U.S. patent application Ser. No. 11/140,778 of inventor Albert X. Widmer filed May 31, 2005 and entitled "NB/MB Coding Apparatus and Method Using Both Disparity Independent and Disparity Dependent Encoded Vectors"

Figure 2B:
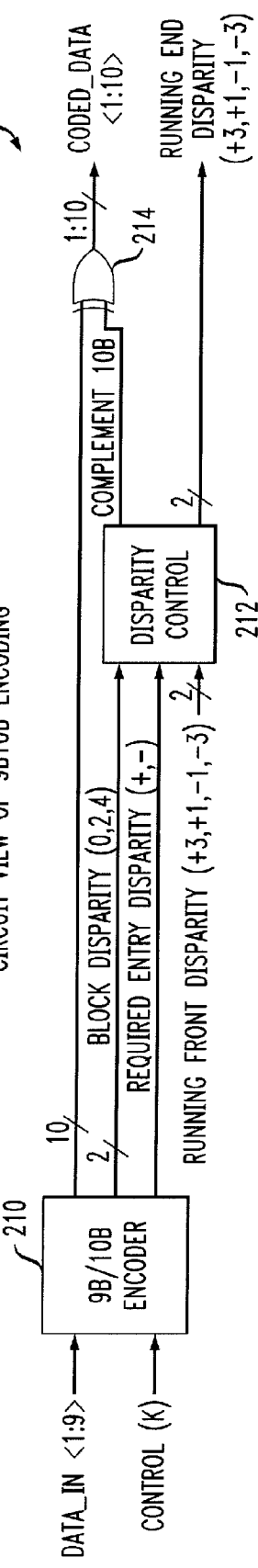
FIG. 2B shows a circuit block diagram of an exemplary circuit for 9B10B encoding, according to an aspect of the invention.

FIGS. 2B and 3B present another view of encoding and decoding, and are more circuit oriented. FIGS. 2A, 2B, 3A and 3B illustrate the example of the 9B10B code but are equally applicable to the 7B8B code if the numbers 10 and 9 are replace by 8 and 7, respectively. They show the parallelism in the processing of various vector classes which is significant for a simple implementation with low latency. Note that full vector complementation and changes in individual bits are completely separate and independent of each other.

Reference should now be had to FIG. 2A, which depicts an exemplary apparatus 200 for encoding 9 binary symbol (9B) source data vectors into 10 binary symbol (10 B) encoded vector's, according to an aspect of the invention (and is also indicative of method steps in an exemplary encoding method according to an aspect of the invention). The apparatus 200 can include a binary symbol appending module 202; optionally, a disparity monitoring module 204; a full vector complementing module 206; and a binary symbol complementing module 208. Binary symbol appending module 202 can be configured to append a binary symbol to the 9B source data vectors so as to obtain augmented vectors. Where employed, disparity monitoring module 204 can be coupled to the full vector complementing module 206, and can be configured to determine current running disparity for use in assigning proper disparity dependent encoded vectors to given ones of the 9B source data vectors.

Full vector complementing module 206 can be configured to complement 10 binary symbols of a given one of the augmented vectors. The binary symbol complementing module 208 can be configured to complement less than 9 binary symbols of a given one of the 9B source data vectors to obtain a corresponding portion of another given one of the 10B encoded vectors. The binary symbol complementing module 208 and the full vector complementing module 206 can be configured to operate substantially in parallel. As used herein, "substantially in parallel" means either entirely in parallel or with sufficient parallelism that desirable enhancements in processing associated with encoding and/or decoding can be achieved. The modules 206, 208 can be coupled to each other and can be configured to implement any of the encoding schemes described herein. It is believed preferable that the module 208 complements appropriate individual bits of the augmented vector, but any appropriate scheme for complementing one or more individual binary symbols is encompassed within the scope of the present invention. Further, note that as used herein, "coupled" should be understood broadly to include direct coupling, indirect coupling through one or more other components, sharing of one or mole logic gates as discussed below, and the like.

An exemplary method of encoding 9B source vectors into 10B encoded vectors, according to an aspect of the invention, includes the steps of obtaining a plurality of 9B source vectors, as at the input to block 202, and encoding the 9B source vectors into a plurality of 10B encoded vectors, as at the output of blocks 206 and 208, according to an encoding scheme to be described herein. The 10B encoded vectors include at least 10B encoded data vectors ("at least" is used to indicate that, for example, control vectors could be included in addition to the data vectors). The encoding scheme maps at least a first portion of the 9B source vectors into 10B encoded data vectors comprising disparity independent encoded vectors, and at least a second portion of the 9B source vectors into 10B encoded data vectors comprising disparity dependent encoded vectors having primary representations and alternate representations complementary to the primary representations. The 10B encoded data vectors have one binary symbol appended thereto by the encoding scheme (for example, by module 202).

A fraction of the 10B encoded data vectors have binary symbol changes, other than whole-vector complementation, compared to corresponding ones of the 9B source vectors. The fraction does not include any of the disparity dependent encoded representations. In the exemplary embodiment none of the encoded data vectors comprise exclusively alternating ones and zeroes (it is to be understood that in other embodiments, vector's comprising exclusively alternating ones and zeroes could be used as data vectors; for example, decision feedback equalization (DFE) typically requires a run of at least two for error recovery, but where DFE is not employed this may not be a concern so that vectors comprising exclusively alternating ones and zeroes could be used as data vectors). Optionally, the fraction of the 10B encoded vectors includes the disparity independent encoded vectors, the disparity independent encoded vectors being dc-balanced and having no alternate representations.

Further, the 9B source vectors can include 9B source data vectors and at least one 9B source control vector, and the encoding scheme can further map the at least one 9B source control vector into at least one 10B encoded control vector Yet further, at least some of the second portion of the 9B source vectors that are mapped into 10B encoded data vectors comprising disparity dependent encoded vectors having primary representations and alternate representations complementary to the primary representations are mapped to dc-balanced 10B encoded data vectors.

The first portion of the 9B source vectors can be mapped into 10B encoded vectors comprising a set of 116 disparity independent encoded vectors which does not require any bit changes during encoding, and the first portion of the 9B source vectors can include source vectors having:

a disparity of +1,
a leading run-length no greater than 3,
no more than 2 trailing zeros in the case of those of the source vectors having trailing zeroes, and
no more than 4 trailing ones in the case of those of the source vectors having trailing ones.

The source vectors of the first portion can be appended during encoding with a single binary symbol with a value of zero. 115 of the 116 disparity independent encoded vectors are the encoded data vectors and the remaining one of the 116 disparity independent encoded vectors, comprising alternating ones and zeros, is defined as the encoded control vector. In other embodiments, such vector could instead be defined as an invalid vector; indeed, in general, any or all control vectors can instead be defined as invalid characters (invalid vectors) and synchronization can be acquired via techniques other than the comma character.

The first portion of the 9B source vectors is mapped into 10B encoded vectors comprising a set of 116 disparity independent encoded vectors, a fraction of the 116 disparity independent encoded vectors requiring individual bit changes during encoding, and the set of 116 encoded vectors comprises vectors having:

nine leading binary symbols with a disparity of −1,
a leading run-length no greater than 3,
no more than 2 trailing ones in the case of those of the source vectors having trailing ones,
no more than 4 trailing zeros in the case of those of the source vectors having trailing zeroes.

The first portion of the 9B source vectors becomes a 9B set, and the 9B set is appended with a single binary symbol with a value of one when being encoded to obtain the 116 encoded vectors; 115 of the 116 disparity independent encoded vectors comprising the encoded data vectors and a remaining one of the 116 disparity independent encoded vectors, comprising alternating ones and zeros, being defined as the encoded control vector In other embodiments, such vector could instead be defined as an invalid vector; indeed, in general, any or all control vectors can instead be defined as invalid characters (invalid vectors) and synchronization can be acquired via techniques other than the comma character. The terminology "9B set" is used because some of the source bits are changed before they become the first 9 bits of the encoded vector.

Complementary implementations are also within the inventive scope. For example, in such an implementation, the first portion of the 9B source vectors is mapped into 10B encoded vectors comprising a set of 116 disparity independent encoded vectors which does not require any bit changes during encoding, and the first portion of the 9B source vectors comprises source vectors having:

a disparity of −1,
a leading run-length no greater than 3,
no more than 2 trailing ones in the case of those of the source vectors having trailing ones, and
no more than 4 trailing zeroes in the case of those of the source vectors having trailing zeroes.

The source vectors of the first position are appended during encoding with a single binary symbol with a value of one, 115 of the 116 disparity independent encoded vectors are the encoded data vectors and a remaining one of the 116 disparity independent encoded vectors, comprising alternating zeroes and ones, is defined as the encoded control vector.

Also by way of further details with regard to a complementary implementation, the first portion of the 9B source vectors could be mapped into 10B encoded vectors comprising a set of 116 disparity independent encoded vectors, a fraction of the 116 disparity independent encoded vectors requiring individual bit changes during encoding. The set of 116 encoded vectors could include vectors having:

nine leading binary symbols with a disparity of +1,
a leading run-length no greater than 3,
no more than 2 trailing zeroes in the case of those of the source vectors having trailing zeroes, and
no more than 4 trailing ones in the case of those of the source vectors having trailing ones.

The first portion of the 9B source vectors could becoming a 9B set, and the 9B set could be appended with a single binary symbol with a value of zero when being encoded to obtain the 116 encoded vectors; 115 of the 116 disparity independent encoded vectors could be the encoded data vectors and a remaining one of the 116 disparity independent encoded vectors, comprising alternating zeroes and ones, could be defined as the encoded control vector.

Variations from the source to encoded vector assignments are possible, for example:

(i) The appended binary symbol could have a default value of 1 and some or all of the specifications for the primary approach could be changed to complementary bit values and disparity polarities, or (ii) Some or all primary and alternate vector sets could be swapped with the respective complementary sets either in combination with item (i) or independently.

Figure 54A:
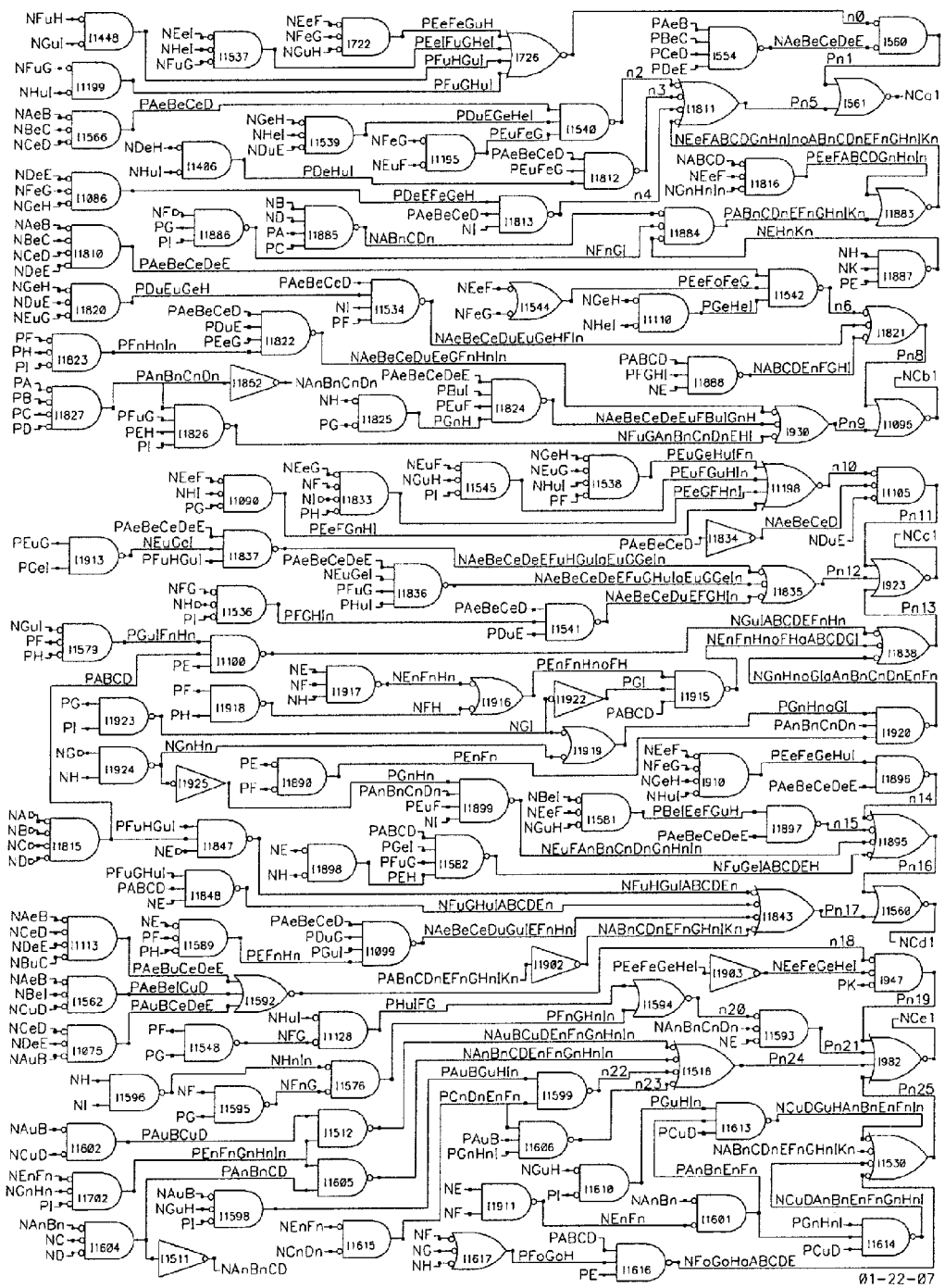
FIGS. 54A-54C show gate level circuit diagrams of the circuit of FIG. 53.
Figure 54B:
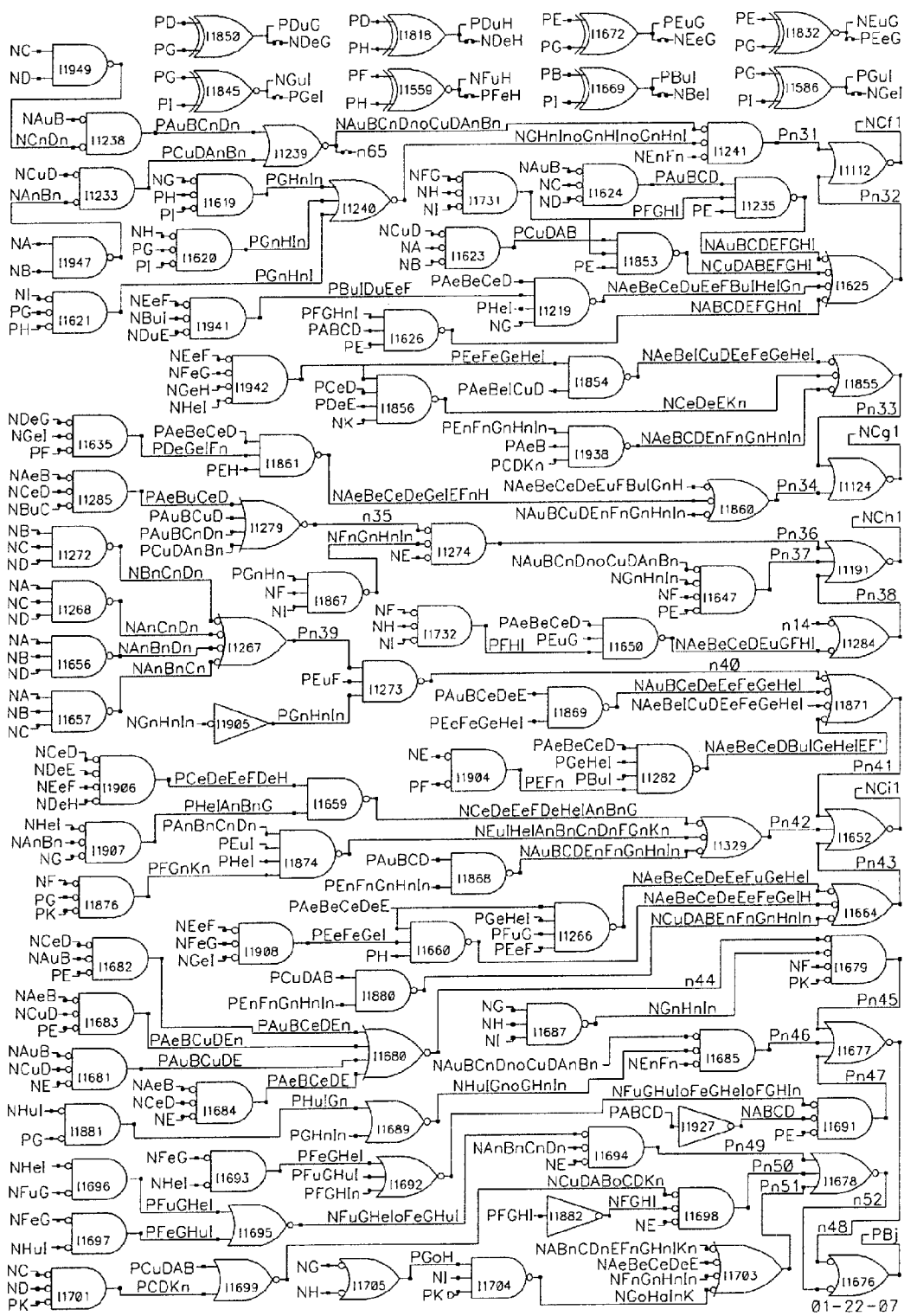
Figure 54C:
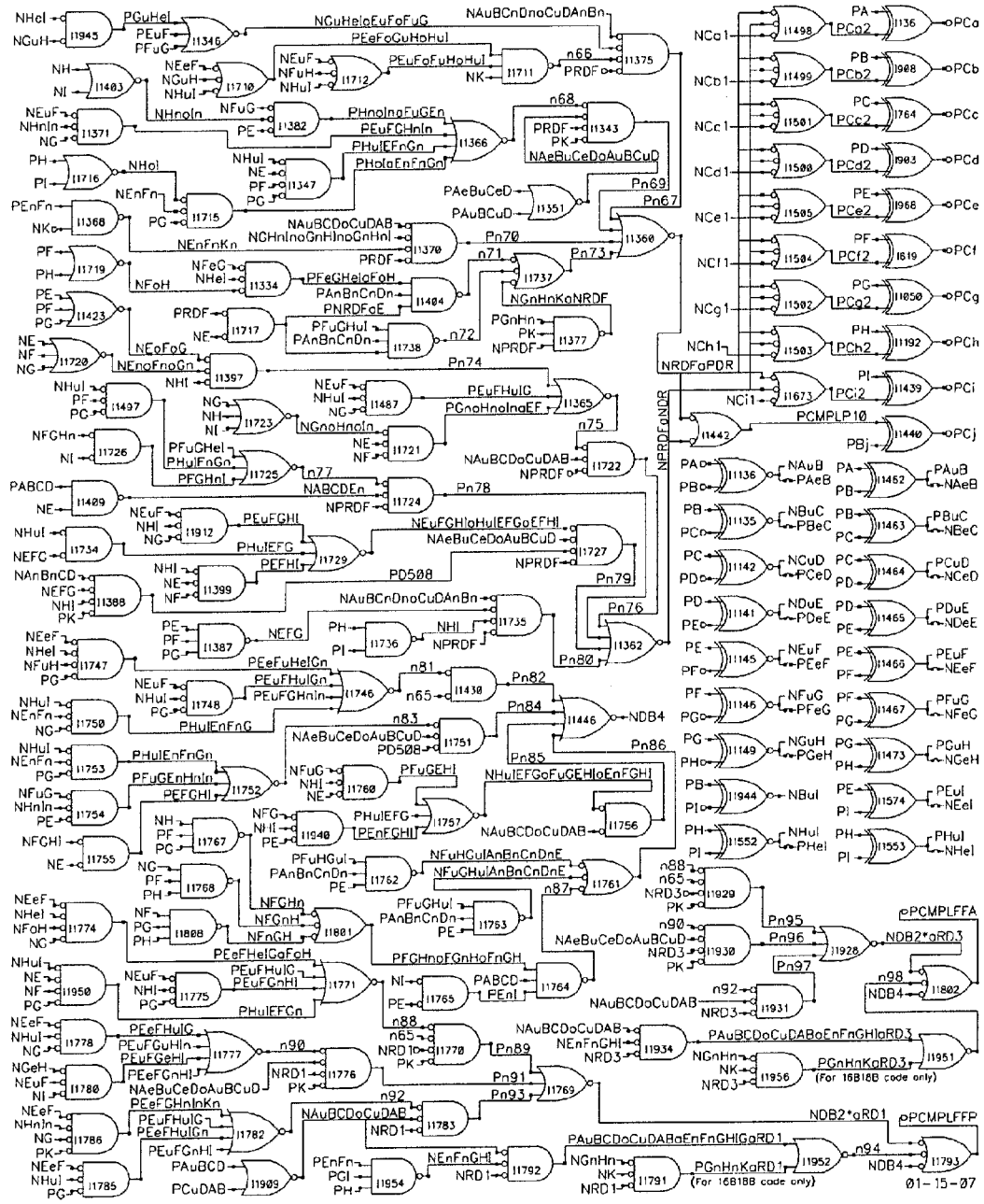

Referring now to FIG. 2B, a hardware-oriented view of exemplary circuit 200 includes encoder block 210, disparity control block 212, and exclusive OR gate 214—further specific details are provided below with regard to FIGS. 54A-54C.

Attention should now be given to FIG. 3A, which illustrates an exemplary embodiment of apparatus 300 for decoding 10B encoded vectors into 9B source data vectors, in accordance with an aspect of the invention. Apparatus 300 includes a full vector (N=9) complementing module 302, a binary symbol complementing module 304, and, optionally, a validity check module 306. Full vector complementing module 302 can be configured to complement at least 9 binary symbols of a given one of the 10B encoded vectors to recover a given one of the 9B source data vectors that corresponds to the given one of the 10B encoded vectors.

The binary symbol complementing binary module 304 can be coupled to the full vector complementing module 302 and can be configured to complement less than 9 binary symbols of another given one of the 10B encoded vectors to recover a corresponding portion of another given one of the 9B source data vectors corresponding to the other given one of the 913 encoded vectors. Modules 302, 304, and (optionally) 306 can be configured to operate substantially in parallel, where "substantially in parallel" has the meaning set forth above. Modules 302, 304, and 306 can be configured to implement any encoding scheme in accordance with the invention. In the exemplary embodiment depicted in FIG. 3A, modules 302, 304 are also configured to strip off the appended binary symbols. Modules 302, 304, 306 can "see" the appended binary symbols at the inputs but such symbols can be dropped before complementation. Note that the full vector complementing module does not have to complement vectors that are already in their primary (as opposed to alternate) form.

Where employed, validity check module 306 can be coupled to modules 302, 304 and can be configured to obtain putative encoded vectors and to determine if given ones of the putative encoded vectors are valid 10B encoded vectors Note that this can be performed by comparing received vectors to valid vectors to determine whether they are valid, or, conversely, by determining whether they are invalid, for example, by comparing them to invalid vectors.

FIG. 3A is also indicative of exemplary method steps in a method of decoding 10B encoded vectors into decoded 9B source vectors, including the steps of obtaining a plurality of 10B encoded vectors that were encoded from a plurality of 9B source vectors according to an encoding scheme as described herein, as at the input of blocks 302, 304, and 306, and decoding the 10B encoded vectors into a plurality of 9B source vectors, as at the corresponding outputs, according to decoding rules of the encoding scheme. Optionally, the method can include an additional step of checking the plurality of 10B encoded vectors for selected ones of the encoded vectors that are not balanced and that end with a predetermined binary symbol. The predetermined binary symbol can be a "one" in a primary implementation of the encoding scheme and a "zero" in a complementary implementation of the encoding scheme. The decoding can include at least automatically complementing the selected ones of the encoded vectors Further details are provided below with regard to a specific exemplary implementation of an inventive coding and decoding scheme. In one or more embodiments, the code is specially designed to allow one to look for automatic complementation. There can be some other cases of auto complementation, such as for vectors that are dc balanced and end with four ones (or, four zeroes in complementary form).

The exemplary decoder circuit 300 includes a check for invalid vectors. In the presence of errors, the received blocks may have a disparity of ±6, ±8, or ±10, which are outside the normal range but are assigned a disparity value of ±4 for purposes of the running disparity. The disparity monitoring circuit shown in FIG. 3B has not been included in this exemplary design, because, in one or more applications, it may not contribute enough to the overall error checking schemes to justify the added complexity; however, it is to be understood that in other applications, one or more inventive embodiments could include such a circuit. In general, in the hardware-oriented view of FIG. 3B, circuit 300 includes decoder block 308 and disparity check block 310, further details to be provided below with respect to FIGS. 56A-C.

Implementation issues to be addressed for Encoder and Decoder may include, for example, circuit area and delay reduction. Design principles illustrated for the simpler case of the 8B10B_P code with local parity of the aforementioned U.S. patent application Ser. No. 11/140,778, discussed in detail above, are applicable here as well:
1. All vectors with individual bit changes are relegated to a class of vectors which are balanced and disparity independent.
2. Assignment of uncoded source vectors to coded vectors such that the number of vectors with individual bit changes is minimized.
3. Extensive sorting of vectors into groups with commonalties
4. Definition of the set of alternate vectors as a class of vectors which can be identified by a relatively simple logic equation.

Disparity Requirements for 7B8B and 9B10B Code

At all 8B or 10B boundaries, the running disparity D can assume one of four values, D=±1, or D=±3. Encoded vectors in these codes are either balanced and disparity independent, balanced and disparity dependent (new), or have a disparity of ±2, or a disparity of ±4. If the current running disparity is positive (+1 or +3), only disparity independent vectors or vectors with a requited positive entry disparity may be entered and complementary rules apply for a negative running disparity. Almost half the source vectors axe translated into a single balanced disparity independent encoded vector. All other 7B and 9B vectors are translated into one of a pair of complementary 10B vector's, respectively, according to the disparity rules above.

DESCRIPTION OF EXEMPLARY 9B10B TRANSMISSION LINE CODE

A. 9B10B Code Definition

The 9B10B code comprises a total of 530 code points with 828 coded 10B vectors as illustrated by the trellis diagrams of FIG. 4.

1) 232 Balanced Disparity Independent 10B Vectors (FIG. 4A.1)

There are 232 disparity independent balanced vectors. Disparity independence means that they can be entered in a sequence regardless of the current starting disparity (one of the 4 values defined above). Balance means that the running disparities at the start and end of the vector are identical. The subset (232) of all possible 10B vectors (1024) chosen is the set of balanced vectors with a run length of no more than three at the leading and trailing boundaries as shown in FIG. 4A1.

2) 2×9 Balanced, Disparity Dependent 10B Vectors (FIG. 4A.2)

These 9 data vectors have been added as a partial replacement of 10 vectors from FIG. 4B which have been reassigned for control characters. For a negative running disparity, 8 balanced vectors with either for leading ones or four trailing zeros and one vector with both four leading ones and four trailing zeros are included. For a positive running disparity, the complementary vectors on the right side of FIG. 4A.2 are used.

3) 2×190 (180*) 10B Vectors with Disparity +/−2 (FIG. 4B)

A set of 190 10B vectors illustrated in FIG. 4B comprises all bit patterns with a disparity of 2, a run length of no more than three at the front end and no more than three zeros or four ones at the trailing end. An exact complementary set of another 190 vectors on the right side has a disparity of 2. With regard to the asterisk in the above heading, note that in FIG. 4B, the set of 10 vectors with trailing ones is reserved for control characters in the 16B18B environment and is not used for applications where it could generate false commas, e.g. for contiguous 10B vectors.

4). 2×99 10B Vectors with Disparity +/−4 (FIG. 4C.1 and FIG. 4C.2)

The set of 95 10B vectors of FIG. 4C.1 comprises all bit patterns with a disparity of 4, no more than four ones or two zeros at the front end and no more than one zero or four ones at the trailing end. An exact complementary set of another 95 vectors on the right side has a disparity of 4 The set of four 10B vectors of FIG. 4C.2 comprises all bit patterns with a disparity of 4, no more than 3 ones or one zero at the front end and exactly two zeros at the trailing end. An exact complementary set of another 4 vectors on the right side has a disparity of 4.

5) Control and Comma Characters

Up to eighteen 10B vectors can be reserved for information other than normal data. If any of the 18 control characters is to be encoded, a control line K must be asserted together with an appropriate data field. One of the control vectors is reserved for the generation of a singular comma sequence for quick synchronization. The comma extends over a first 10B field and the first three bits of the next following vector which may belong also to the 9B10B code, to the 7B8B code, or other similar compatible codes. The comma bit pattern is 0011111110'111 for a negative starting disparity, or its complement for a positive starting disparity. For synchronization, only the 10 ones in bold type (or zeros) in an 11-bit field need to be monitored, assuming a synchronization enabling circuit is activated only after a majority of misaligned commas has been received. The construction of a complete 18B comma character is known, as discussed in U.S. Pat. Nos. 6,198,413 and 6,614,369

The 10B part of the comma sequence is listed as C508 together with the other control characters Kx in Table 1M of FIG. 6M.

6) Comma Characters for Concatenated 9B10B Vectors (FIG. 5)

FIG. 5 illustrates how the complete comma of either polarity fits into the trellis diagram. For purposes of the comma function, the possible location of the sequence at different disparity levels is irrelevant. To acquire the 2-byte word synchronization, the circuits may search for either one or both of the bit sequences '1111111 x111' and '0000000x000.'

The input to the encoder should be the specified bit patterns, but only the first source vector (9B) should be accompanied with a K value of one. Coded 10B blocks from the revised 9B10B code can be concatenated without any change in the code. The run length remains at 7, and the digital sum variation also remains constrained to 12. The comma pattern also remains unchanged as shown in FIG. 5. The second part is provided by selected 10B vectors as follows:

a) Basic Set of 2-Vector Comma Sequences

The C508 vector (0011111110/1100000001) can be paired with one of the disparity dependent vectors D71, D135, D263, or D504 as listed in FIG. 5 to end at node Y in FIG. 5. Four different 20-bit control blocks which include the comma sequence can be generated regardless of the running disparity and without the special disparity controls needed for the second vector of the comma in the 16B18B code.

b) Extended Set of 2-Vector Comma Sequences

If more than four 20-bit control blocks with a comma are useful, up to 14 additional ones can be provided using 14 balanced complementary vectors pairs with a leading run of three from the trellis of FIG. 4A.1. For the generation of the comma sequence, this subset of balanced 10B vectors must be made disparity dependent it they follow C508 of Table 1, similar to what is done for balanced 4B vectors in 8B10B control characters of the following references: Albert X Widmer, The ANSI Fibre Channel Transmission Code, IBM Research Report RC18855, Apr. 23, 1993, and U.S. Pat. Nos. 4,486,739, of Franaszek and Widmer, and 6,977,599, of Albert X. Widmer, and for the second part of the comma sequence of contiguous 7B8B vectors below. One or the other of the complements must be chosen depending on the polarity of the running disparity at the end of the C508 vector. This extended set is not included in the tables, equations and circuits of this repot.

The 10B bit patterns from Table 1 suitable for comma generation together with the required polarity in front of the 10B vector are listed below:

| | |
|---|---|
| D488 − 0001011110 + 1110100001 | D23 |
| D472 − 0001101110 + 1110010001 | D39 |
| D440 − 0001110110 + 1110001001 | D0 |
| D376 − 0001111010 + 1110000101 | D503 |
| D248 − 0001111100 + 1110000011 | D7 |
| D87  + 1110101000 − 0001010111 | D40 |
| D103 + 1110011000 − 0001100111 | D24 |
| D151 + 1110100100 − 0001011011 | D495 |
| D167 + 1110010100 − 0001101011 | D8 |
| D199 + 1110001100 − 0001110011 | D264 |
| D279 + 1110100010 − 0001011101 | D239 |
| D295 + 1110010010 − 0001101101 | K216 |
| D327 + 1110001010 − 0001110101 | D136 |
| D391 + 1110000110 − 0001111001 | D72 |

The alternate vectors of the right column are decoded by full vector complementation if they contiguously follow the comma vector C508

B. Properties of the 9B10B Code

Significant characteristics of the code can be directly extracted from the trellis diagram of FIG. 5 which also shows four possible configurations for the comma sequence. Using FIG. 5 together with the trellis diagrams defining the code (FIG. 4$x.y$), one can verify that the comma sequence is singular, i.e. it cannot be reproduced in any other position relative to the vector boundaries neither within the 20B block nor across 20B block boundaries. U.S. Pat. No. 6,614,369 shows an identical comma sequence satisfying the singularity requirement for a 16B18B code comprising a 9B10B and a 7B8B part.

1) Clocking and Synchronization Parameters

The maximum run length is seven and no contiguous runs of seven are possible The minimum transition density is two per 10B block for an indefinite length. The code includes a singular comma sequence.

2) Compatibility with Decision Feedback Equalization (DFE)

In the exemplary embodiment, any run of alternating ones and zeros in a sequence of data vectors is less than two vectors long. However, such a pattern of arbitrary length can be generated by a steady sequence of either the K170 or the K341 control character.

3) Low Frequency Characteristics

The code is DC balanced. The maximum digital sum variation is 12. The normalized DC offset or area between zero disparity and the extreme contour of the trellis diagram as defined in Widmer, The ANSI Fibre Channel Transmission Code, mentioned above, is 4.9. The low frequency cut-off point for high pass filters should be located about 2.5 times lower than for Fibre Channel 8B10B code for equal eye closure. The low frequency wander can be reduced on a statistical basis by scrambling the data before encoding 8B10B coded, scrambled data can operate with a 50% higher low frequency cut-off point than a coded worst case pattern. For 9B10B code, the gain from scrambling before encoding is expected to be more.

4) 10B and 18B Control Characters

For operation with contiguous 10B vectors, there are 8 control vectors available In the 16B18B domain, the 10B and 8B fields include 18 and 7 control characters, respectively, so it possible to generate a total of $[(18\times135)+(7\times530)]=6140$ control characters in the 18-bit domain. The code includes four 18B comma sequences. Depending on the application, the user may relegate some of the unused control characters to the class of invalid vectors.

C. 9B10B Encoding Table

Table 1 of FIGS. 6A through 6M represents a specific coding assignment between uncoded and coded vectors in the 9B10B domain.

1) Designing Principles

The coding tables are created in steps as follows:

1. Generate a list of all source vectors and all valid encoded vectors. Assume a default value for the appended bit. This design assumes a default value of zero. An alternate, equivalent code can be constructed by choosing complementary values for the appended bit and the vector sets 2. In the coded domain, reserve the vector required for the comma generation (0011111110). Assign it a source vector which matches the first n−1 coded bits.

3. Assign all source vectors which match the first 9 bits of encoded vectors ending with the default value of j=0 to the respective matching vectors and remove them from both lists.

4. The remaining source vectors are assigned to the class of disparity independent balanced vectors which end with j=1, the complement of the default value Assign the source vectors which match the first 9 bits of this set to the respective encoded vectors 5. Find sets of several source vectors, preferably complementary sets, which can be made to match an encoded vector in this class by complementing just one common bit position in the source vector and make the assignment.

6. The remaining uncoded vectors are sorted into complementary pairs to the extent possible, and the remaining available encoded vectors are also sorted into pairs which are complementary in all or most of the leading 9 bits.

7. Find close matches between the two sets and change one or more bit positions in the source pail to obtain a match with the closest unassigned encoded pair.

8. Look for single vectors which can be made to match a coded vector by changing just one bit, then look for matches based on 2-bit changes, and so on 9. Once all data vectors have been assigned, assign the remaining coded vectors to control characters and choose a corresponding source vector which matches the first n−1 bits.

2) Construction of the 9B10B Coding Table 1

This section describes auxiliary graphs and diagrams which were used for the assignment of coded 10B vectors to uncoded 9B vectors in Table 1 a) 414 9B Vectors congruent with the first 9 Bits of the 10B encoded Vectors (FIGS. 7-12)

Figure 7:
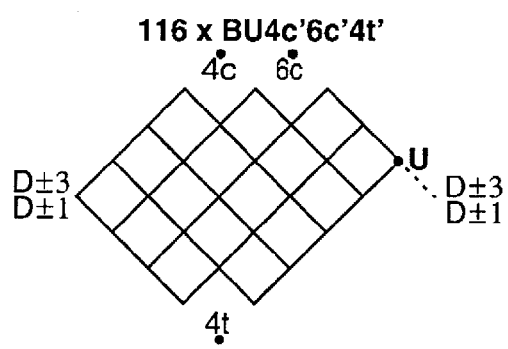
FIGS. 7-13 show corresponding trellis diagrams.

For 414 vectors (402 data, 12 control), represented by the trellis diagrams of FIGS. 7 to 12, the first nine bits of the primary encoded vectors are identical to the corresponding source vectors and the appended bit assumes the default value (0). FIG. 7 represents the subset of 116 balanced, disparity independent vectors of FIG. 4A.1 which end with a zero.

Figure 8A:
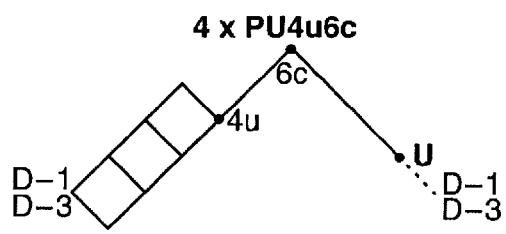
Figure 8B:
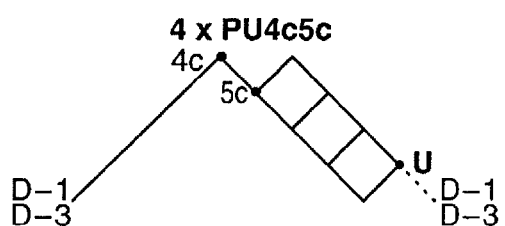
Figure 8C:
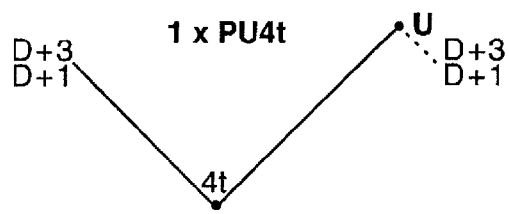

FIGS. 8A, 8B, and 8c Represent the 9 Balanced, Disparity Dependent Vectors of FIG. 4A.2. FIG. 5A is a copy of the lower left side of FIG. 4A.2 and is assigned to the balanced primary data vectors D55, D59, D61, and D62 which require a negative entry disparity. FIG. 8B represents those 4 vectors of the upper left side of FIG. 4A.2 which end with zero and are assigned to the balanced primary data vectors D47, D79, D143, and D271 which require a negative entry disparity. FIG. 8C is from the upper right side of FIG. 4A.2 ending with a zero and is assigned to the balanced data primary vector D496 which requires a positive entry disparity.

Figure 9A:
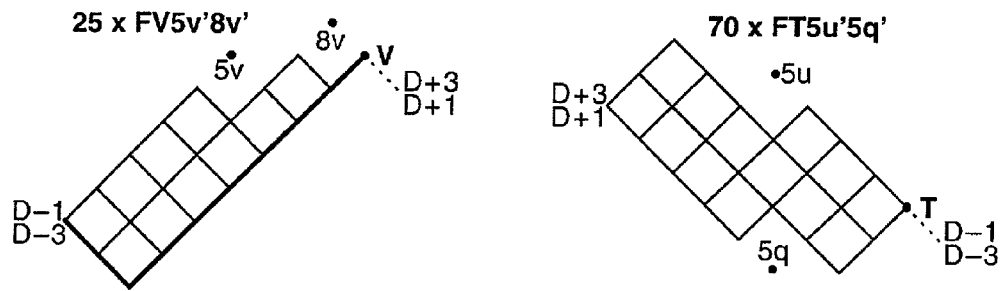

FIG. 9A uses all 95 vectors of FIG. 4C.1 with a disparity of four. The bold lines on the left side represent the control vector used for comma generation.

Enumeration of 25 primary Vectors FV5v'8v' of FIG. 9A(L) which require a negative entry disparity:

| | | | | | | | | | |
|---|---|---|---|---|---|---|---|---|---|
| D367 | D375 | D379 | D381 | D382 | D431 | D439 | D443 | D445 | D446 |
| D463 | D471 | D475 | D477 | D478 | D487 | D491 | D493 | D494 | D499 |
| D501 | D502 | D505 | D506 | C508* | | | | | |

*The source vector C508 = 001111111 with K = 1 is coded into 0011111110. This represents the special character C508 and is part of the comma sequence. The same source vector D508 with K = 0 represents the data vector D508 and is coded into 0011010101.

Enumeration of 70 primary Vectors FI5u'5q' of FIG. 9A(R) which require a positive entry disparity:

| | | | | | | | | | |
|---|---|---|---|---|---|---|---|---|---|
| D35 | D37 | D38 | D41 | D42 | D44 | D49 | D50 | D52 | D56 |
| D67 | D69 | D70 | D73 | D74 | D76 | D81 | D82 | D84 | D88 |
| D97 | D98 | D100 | D104 | D112 | D131 | D133 | D134 | D137 | D138 |
| D140 | D145 | D146 | D148 | D152 | D161 | D162 | D164 | D168 | D176 |
| D193 | D194 | D196 | D200 | D208 | D259 | D261 | D262 | D265 | D266 |
| D268 | D273 | D274 | D276 | D280 | D289 | D290 | D292 | D296 | D304 |
| D321 | D322 | D324 | D328 | D336 | D385 | D386 | D388 | D392 | D400 |

Figure 9B:
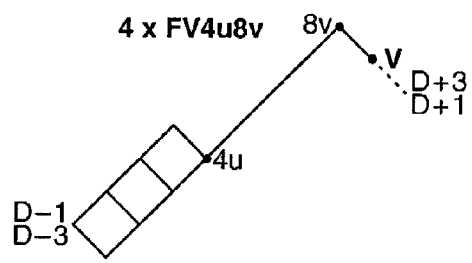

The 4 vectors of FIG. 9B with disparity of plus four correspond to the 4 vectors of FIG. 4C.2 and are assigned to the primary data vectors D247, D251, D253, and D254 and require a negative entry disparity. The 74 vectors of FIG. 10 with a disparity of +2 are the subset of the vectors of FIG. 4B(L) which end with a zero and require a negative entry disparity.

Figure 10:
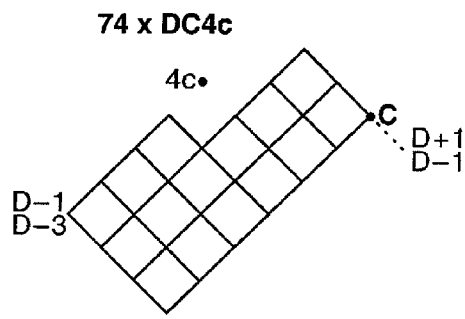

Enumeration of 74 Vectors DC4c' of FIG. 10:

| | | | | | | | | | |
|---|---|---|---|---|---|---|---|---|---|
| D119 | D123 | D125 | D126 | D183 | D187 | D189 | D190 | D215 | D219 |
| D221 | D222 | D231 | D235 | D237 | D238 | D243 | D245 | D246 | D249 |
| D250 | D252 | D311 | D315 | D317 | D318 | D343 | D347 | D349 | D350 |
| D359 | D363 | D365 | D366 | D371 | D373 | D374 | D377 | D378 | D380 |
| D407 | D411 | D413 | D414 | D423 | D427 | D429 | D430 | D435 | D437 |
| D438 | D441 | D442 | D444 | D455 | D459 | D461 | D462 | D467 | D469 |
| D470 | D473 | D474 | D476 | D483 | D485 | D486 | D489 | D490 | D492 |
| D497 | D498 | D500 | D504 | | | | | | |

Figure 11:
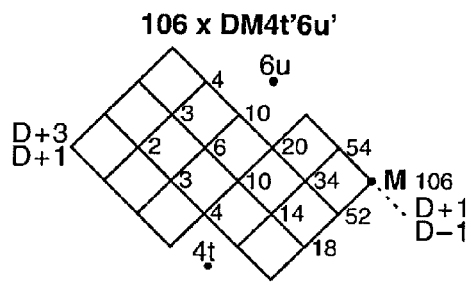

The 106 primary vectors of FIG. 11 are the subset of vectors of FIG. 4B(R) with one to three trailing zeros, a disparity of −2 and require a positive entry disparity

| | | | | | | | | | |
|---|---|---|---|---|---|---|---|---|---|
| D71 | D75 | D77 | D78 | D83 | D85 | D86 | D89 | D90 | D92 |
| D99 | D101 | D102 | D105 | D106 | D108 | D113 | D114 | D116 | D120 |
| D135 | D139 | D141 | D142 | D147 | D149 | D150 | D153 | D154 | D156 |
| D163 | D165 | D166 | D169 | D170 | D172 | D177 | D178 | D180 | D184 |
| D195 | D197 | D198 | D201 | D202 | D204 | D209 | D210 | D212 | D216 |
| D22 | D226 | D228 | D232 | D263 | D267 | D269 | D270 | D275 | D277 |
| D278 | D281 | D282 | D284 | D291 | D293 | D294 | D297 | D298 | D300 |
| D305 | D306 | D308 | D312 | D323 | D325 | D326 | D329 | D330 | D332 |
| D337 | D338 | D340 | D344 | D353 | D354 | D356 | D360 | D387 | D389 |
| D390 | D393 | D394 | D396 | D401 | D402 | D404 | D408 | D417 | D418 |
| D420 | D424 | D449 | D450 | D452 | D456 | | | | |

Figure 12:
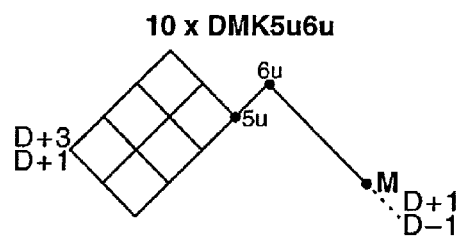

FIG. 12 defines a set of 10 primary vectors with a disparity of −2 from FIG. 4B(R) with four trailing zeros as optional control vectors. They require a positive entry disparity. These 10 control vectors can be used in the context of the 16B18B code. If 10B vectors are directly concatenated, they would generate false commas and are invalid vectors for that application. For all other applications, their use must be specifically evaluated.

Enumeration of 10 optional Control Vectors DMK5u6u of FIG. 12:

| | | | | | | | | | |
|---|---|---|---|---|---|---|---|---|---|
| K39 | K43 | K45 | K46 | K51 | K53 | K54 | K57 | K58 | K60 |

Figures 13, 14A:
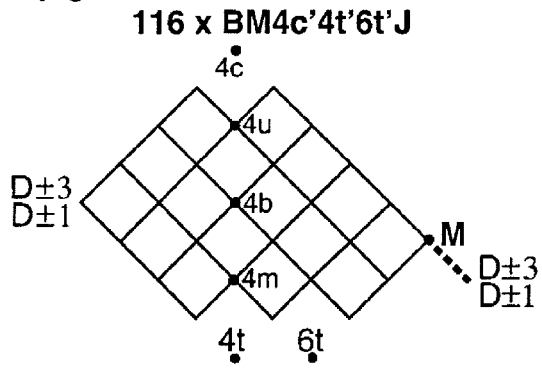

The table 1M of FIG. 6M includes another set of 7 control characters. There are no restrictions on the use of those 7 control characters, and the previously defined comma character C509. The control source vectors are chosen so there is no need to ever change any source bits for encoding except the J-bit of the 6 vectors listed in Table 2B of FIG. 14B at the bottom right side.

b) 116 Vectors with individual bit changes (FIG. 13)

FIG. 13 represents the subset of 116 balanced, disparity independent vectors of FIG. 2A.1 which end with one. The appended J-bit of FIG. 13 is marked with a fat dotted line to indicate complementation from the default value for encoding. All source vectors which require individual bit changes for encoding are assigned to this class of balanced, disparity independent vectors. This important feature allows bit-encoding and whole vector inversions to proceed independently of each other in parallel for both encoding and decoding, greatly reducing circuit delay. The 116 vectors of FIG. 13 are listed explicitly with their assigned source vectors in Table 2 of FIG. 14. The bit values in the encoded domain which are obtained by complementation of the respective source bit or the default value of bit J are shown in bold type. A value of 1 in the column S of Table 2 of FIG. 14 indicates that the source bits on the right side are the exact complements of the left side and there are also symmetries in the coded domain which can be exploited for a simplified circuit implementation.

c) Value of Control Bit K

For a majority of data vectors, the value of the K-bit can be ignored as indicated by x in the K column. It must be included for all classifications and logic equations which include vectors with common values ABCDEFCGHI for a data and a control vector.

9B10B LOGIC EQUATIONS FOR IMPLEMENTATION

A. Logic Equations for 9B10B Encoder

1) Equations for Individual Bit Encoding

Generally, the encoded bits retain the value of the uncoded bit (a=A, b=B, etc), but the source bit is complemented (a=A', b=B', etc) if the respective equation below is true.

Encoded Bit a

The 'a' column has bold entries in Table 2 of FIG. 14A/B for the 31 vectors listed in Table 3a of FIG. 15. The a-bit encoding equation of FIG. 15 is derived from the coding labels of Table 3a.

Encoded Bit b

The 'b' column has bold entries in Table 2 of FIG. 14A/B for the 15 vectors listed in Table 3b of FIG. 16. The b-bit encoding equation of FIG. 16 is derived from the coding labels of Table 3b.

Encoded Bit c

The 'c' column has bold entries Table 2 of FIG. 14A/B for the 31 vectors listed in Table 3c of FIG. 17. The c-bit encoding equation of FIG. 17 is derived from the coding labels of Table 3c.

Encoded Bit d

The 'd' column has bold entries in Table 2 of FIG. 14A/B for the 45 vector's listed in Table 3d of FIG. 19. The d-bit encoding equation of FIG. 18 is derived from the coding labels of Table 3d.

Encoded Bit e

The 'e' column has bold entries in Table 2 of FIG. 14A/B for the 45 vectors listed in Table 3e of FIG. 19. The e-bit encoding equation of FIG. 20 is derived from the coding labels of Table 3e.

Encoded Bit f

The 'f' column has bold entries in Table 2 of FIG. 14A/B for the 19 vectors listed in Table 3f of FIG. 21. The f-bit encoding equation of FIG. 21 is derived from the coding labels of Table 3f.

Encoded Bit g

The 'g' column has bold entries in Table 2 of FIG. 14A/B for the 22 vectors listed in Table 3g of FIG. 22. The g-bit encoding equation of FIG. 22 is derived from the coding labels of Table 3g.

Encoded Bit h

The 'h' column has bold entries in Table 2 of FIG. 14A/B for the 20 vectors listed in Table 3h of FIG. 23. The h-bit encoding equation of FIG. 23 is derived from the coding labels of Table 3h.

Encoded Bit i

The 'i' column has bold entries in Table 2 of FIG. 14A/B for the 32 vectors listed in Table 3i of FIG. 24. The i-bit encoding equation of FIG. 24 is derived from the coding labels of Table 3i.

Encoded Bit j

The 'j' column has bold entries for all 116 vectors of Table 2 of FIG. 14A/B listed and rearranged in Table 3j of FIG. 25A/B. The j-bit encoding equation of FIG. 26 is derived from the coding labels of Table 3j.

As illustrated at the end of Table 1M of FIG. 6M, all 12 control characters with a value of j=0 for the primary vector have a value of I=1 or GH=00 and all 6 control characters with j=1 have I=0 and (G+H)=1. With K=1 only the 18 valid control vectors must be presented at the input to the encoder. Therefore, the set of 6 control characters listed in Table 3j can be uniquely identified by the bit pattern $(G+H) \cdot I' \cdot K$.

2) Equations for the Required Disparity for Encoding DR a) Positive Required Disparity for Encoding PDR A total of 187 vectors listed in the Table 1 of FIG. 6 require a positive entry disparity (PDR) They are listed and sorted in Table 4 of FIGS. 27A/B/C. The validity of the expression $G' \cdot H' \cdot K$ in FIG. 27A can be derived from the last 18 rows of Table 1M of FIG. 6M where all control characters are listed. The Table 4B of FIG. 27B includes a block of 80 vectors with:

$$ABCDK = A \oplus B \cdot C' \cdot D' \cdot K' + C \oplus D \cdot A' \cdot B' \cdot K'$$

grouped into ten dual quartets (i.e., 10 double groups of four) with five complementary trailing bits EFGHI, which represent 20 of the 32 5-bit combinations. The 12 missing vectors are listed in Table 5 of FIG. 28. The trailing 5 bits of the vectors which are not members of the set can be described with the logic expression:

$$\{(G \oplus H' + H \oplus I) \cdot E \oplus F' \cdot F \oplus G'\} + (E \oplus F \cdot G \oplus H' \cdot H \oplus I') + (E \oplus F' \cdot F \oplus H' \cdot H \oplus I')$$

Thus, the trailing 5 bits of the members of the set can be described by the complement of the above expression:

$$(G \oplus H \cdot H \oplus I' + E \oplus F + F \oplus G) \cdot (E \oplus F' + G \oplus H + H \oplus I) \cdot (E \oplus F + F \oplus H + H \oplus I)$$

The trailing five bits of a block of 78 vectors in Table 4C of FIG. 27C with:

$$ABCD = A \oplus B \cdot B \oplus C \cdot C \oplus D' + A \oplus B \cdot C \oplus D$$

grouped into 13 sextets are listed in Table 6 of FIG. 28. The trailing 5 bits can be identified by the logic expression:

$$F \oplus G \cdot (H' + I') \cdot E' \cdot K' + E \oplus F \cdot G \cdot H' \cdot I' \cdot K' + H \oplus I \cdot E \cdot F' \cdot G' + (H+I) \cdot E' \cdot F' \cdot G'$$

The PDR equation of FIG. 28 is derived from the coding labels of the Tables 4A, 4B, and 4C of FIGS. 27A/B/C.

b) Negative Required Disparity for Encoding NDR

A total of 111 vectors listed in the Table 1 of FIG. 6 require a negative entry disparity (NDR.) They are listed and sorted in Tables 7A/B of FIGS. 29A/B. The expression $(A' \cdot B' \cdot C \cdot D \cdot E \cdot F \cdot G \cdot H \cdot I \cdot K')'$ in the leading coding label of Table 7A prevents the disparity independent vector D508 from activating NDR. It is a necessary appendix to $E \cdot F \cdot H \cdot I$ but is added as an inhibitor to the entire first group of 36 vectors of the Table 7A to reduce the number of required levels for the logic circuit implementation. The Table 7B of FIG. 29B represents a block of 64 vectors with the leading 4 bits as follows $$ABCD = A \oplus B \cdot C \cdot D + C \oplus D \cdot A \cdot B,$$

grouped into 16 quartets with five matching trailing bits EFGHI as listed in the Table 8 of FIG. 30 with one group (11011) listed redundantly twice. The trailing bits can be identified by the logic expression:

$$(EF + G \cdot E'F' + G') \cdot H \cdot I + E \oplus F \cdot H \oplus I \cdot G + (G'H' + I') \cdot E \cdot F$$

The NDR equation of FIG. 30 is derived from the coding labels of the Tables 7A, and 7B of FIG. 29A/B.

3) Equation for Complementation of the Primary Vector (CMPLP10)

The running disparity at the vector boundaries is constrained to the four values plus or minus one or three. If the required entry disparity PDR or NDR does not match the polarity of running disparity RD, the alternate vector must be used. The alternate vector is generated by complementation of the primary vector. The positive or negative running disparity in front of a byte is referred to as PRDF or NRDF, respectively.

$$CMPLP10=PDR \cdot NRDF+NDR \cdot PRDF$$

The signals PRDF and NRDF are applied preferably separately upstream to each logic cone, instead of to the complete PDR and NDR functions, to eliminate one level of gating. Note that the equality NRDF=PRDF' holds.

4) Equations for the Running Disparity RD (FIG. 31)

FIG. 31 is a state transition diagram for the running disparity RD based on the block disparities DB of the encoded vectors. The vector complementation circuit ensures that the block polarities of vectors conform to the constraints of FIG. 31. The running disparity can be represented by two flip-flops which pass the value along from vector to vector The trailing values become the front values of the next encoding cycle. The output of a first flip-flop FFP indicates a positive (PRDF) or negative (NRDF) polarity and the output of a second flip-flop FFA indicates an arithmetic value of one (RD1) or three (RD3).

The two flip-flops can assume arbitrary initial values and disparity violations may be generated initially. At least three unbalanced vectors must be transmitted before payload data transmission is allowed to start Additional requirements may have to be met before the receiver disparity monitor is in the ready state. The conditions for complementing these two flip-flops can be derived from FIG. 31.

$$CMPLFFP=DB2 \cdot RD1+DB4$$

$$CMPLFFA=DB2 \cdot RD3+DB4$$

The block disparity DB2 in the above equation can have a value of ±2 and DB4 can have a value of ±4. RD1 may be RD+1 or RD−1 and RD3 may be RD+3 or RD−3. The polarities of the above parameters can be ignored for purposes of the above two disparity equations because the complementation function CMPLP10 enforces compliance.

a) Block Disparity of Four for Encoding DB4

The Tables 4A/B/C of FIG. 27A/B/C and the Tables 7A/B of FIG. 29A/B include 70 and 29 vectors, respectively, with a block disparity of four. The Table 9A of FIG. 32 lists the trailing 5 bits of 10 quartets (groups of four) in the left column of Table 4B of FIG. 27B. The leading four bits of all these 10 quartets can be defined by:

$$A \oplus B \cdot C' \cdot D'+C \oplus D \cdot A' \cdot B'$$

The Table 9B of FIG. 32 lists the trailing 5 bits of 4 sextets (groups of six) of Table 4C of FIG. 27C and one sextet from Table 7A of FIG. 29A which includes one vector (C508) with K=1 The leading four bits of all these five sextets can be defined by:

$$A \oplus B' \cdot B \oplus C \cdot C \oplus D'+A \oplus B \cdot C \oplus D$$

The value of y in the K column is one for C508 and zero for D508. The data vector D508 has zero disparity and is excluded by the expression:

$$(A' \cdot B' \cdot C \cdot D \cdot E \cdot F \cdot G \cdot H \cdot I \cdot K')'.$$

The Table 9C of FIG. 32 lists the trailing 5 bits of 5 quartets of Table 7B of FIG. 29B The leading four bits of all these 4 quartets can be defined by:

$$A \oplus B \cdot C \cdot D+C \oplus +D \cdot A \cdot B$$

The 6 vectors of Table 4A of FIG. 27A with DB=4 are defined by the equation:

$$(F \oplus H \cdot G \oplus I+F+G \cdot H \oplus I) \cdot A' \cdot B' \cdot C' \cdot D \cdot E.$$

The vectors D367, D431, and D463 of Table 7A of FIG. 29A are defined by:

$$A \cdot B \cdot C \cdot D \cdot E' \cdot I \cdot (F \cdot G \cdot H'+F \cdot G' \cdot H+F' \cdot G \cdot H).$$

The DB4 equation of FIG. 32 is derived from the coding labels of the Tables 4A/B/C of FIG. 27A/B/C, the Tables 7A/B of FIG. 29A/B, and the Tables 9A, 9B, and 9C of FIG. 32.

b) Block Disparity of Two for Encoding DB2

A total of 116 vectors listed in the Table 4 of FIG. 27A/B/C and 74 vectors listed in Table 7 of FIG. 29A/B have a block disparity of two. The expression G'·H'K is taken directly from the top of Table 4A. It represents 10 optional control vectors fox 16B18B code, which are not valid for contiguous 9B10B vectors. The Table 10A of FIG. 33 lists the trailing 5 bits of 10 quartets of Table 4B and one quartet from Table 7A The leading four bits of these 11 quartets can be defined by:

$$A \oplus B \cdot C' \cdot D'+C \oplus D \cdot A' \cdot B'$$

The Table 10B of FIG. 33 lists the trailing five bits of 9 sextets from Table 4C and 5 sextets from Table 7A The leading foul bits of these 14 sextets can be defined by:

$$A \oplus B' \cdot B \oplus C \cdot C \oplus D'+A \oplus B \cdot C \oplus D$$

The Table 10C of FIG. 33 lists the trailing five bits of 3 quartets from Table 4A and 10 quartets from Table 7B. The leading four bits of all these 14 quartets can be defined by:

$$A \oplus B \cdot C \cdot D+C \oplus D \cdot A \cdot B$$

The DB2 equation of FIG. 33 is derived from the coding labels of the Tables 4, 7, 10A, 10B, and 10C B. Logic Equations for 10B9B Decoding It is a feature of this code that only balanced and disparity independent vectors are subject to individual bit changes and the complementation of entire vectors for disparity control is limited to primary vectors for which the source bits ABC-DEFGHI are identical to the encoded bits abcdefghi. Consequently, bit decoding and complementation can be executed independently of each other in parallel.

1) Individual Bit Decoding

The bit decoding tables can be developed from the bit encoding Tables 3a, 3b, 3c, 3d, 3f, 3g, 3h, and 3i of FIGS. 15 through 24 by substitution of the bits 'abcdefghi' for ABC-DEFGHI and a separate table for the control bit K. Some of the tables show both complementary bit sets and identical bit sets in the left and the right column; they are illustrated in italic and bold face type, respectively.

The j-bit has a value of one for all vectors which require individual bit modifications or full vector complementation for decoding and consequently, the j-position is eliminated from the Tables 11A through 11I of FIGS. 34 through 43. In the circuits, the j-bit value is added near the end of each logic cone which ostensibly adds one logic level, but this gating level is required for the complementation of entire vectors anyway and the two functions can be implemented with an AOI21 gate with a circuit delay and area which are comparable to typical primitive logic gates.

The logic equations for X1 are developed below. X1 is the command to complement an individual bit x where x stands for any one encoded bit. The respective decoded bits X are generated by a circuit implementation of the equation as shown on the right side of FIG. 56C.

$$X=(X1 \cdot j) \oplus x$$

Two circuit simplification methods are available but if two bit positions of a set of vectors are ignored, all four possible combinations must be examined for correct operation:

1. The decoding equations can be simplified if we allow arbitrary bit changes for the decoding of invalid vectors. Appropriate invalid vectors can be added to the vectors defining a logic expression. In the following, these redundant vectors are not shown, but the terms of logic expressions which can be eliminated by their inclusion are overlined. Vectors with a leading or trailing run of five are easily recognized as invalid.
2. The value of a bit position before decoding of that bit can be ignored because for this code, the same bit position of a vector which is complementary in that position and equal in all other positions is an alternate or an invalid vector. Alternate vectors are complemented for decoding, as an example, D16=1001100011 has the first bit complemented to 0, but the entire vector 0001100011 (D231A) is complemented for decoding. However, for decoding classes which are applicable to several bits, the redundant bit is usually included to enable circuit sharing but underlined in the logic equations to indicate that it could be left out, for example, to reduce delay in a critical path.

The table labels include all terms, but the equations do not include the terms which are not included in the circuits.

Decoded Bit A

The 'a' column has bold entries in the Tables 2A/B of FIGS. 14A/B for the 31 vectors listed in Table 11A of FIG. 34. The A-bit decoding equation of FIG. 34 is derived from the coding labels of Table 11A.

Decoded Bit B

The 'b' column has bold entries in the Tables 2A/B of FIGS. 14A/B for the 15 vectors listed in Table 11B of FIG. 35. The B-bit decoding equation of FIG. 35 is derived from the coding labels of Table 11B.

Decoded Bit C

The 'c' column has bold entries in the Tables 2A/B of FIGS. 14A/B for the 31 vectors listed in Table 11C of FIG. 36. The C-bit decoding equation of FIG. 36 is derived from the coding labels of Table 11C.

Decoded Bit D

The 'd' column has bold entries in the Tables 2A/B of FIGS. 14A/B for the 19 vectors listed in Table 11D of FIG. 37. The D-bit decoding equation of FIG. 37 is derived from the coding labels of Table 11D.

Decoded Bit E

The 'e' column has bold entries in the Tables 2A/B of FIGS. 14A/B for the 45 vectors listed in Table 11E of FIG. 38. The E-bit decoding equation of FIG. 39 is derived from the coding labels of Table 11E.

Decoded Bit F

The f column has bold entries in the Tables 2A/B of FIGS. 14A/B for the 19 vectors listed in Table 11F of FIG. 40. The F-bit decoding equation of FIG. 40 is derived from the coding labels of Table 11F.

Decoded Bit G

Figure 41:
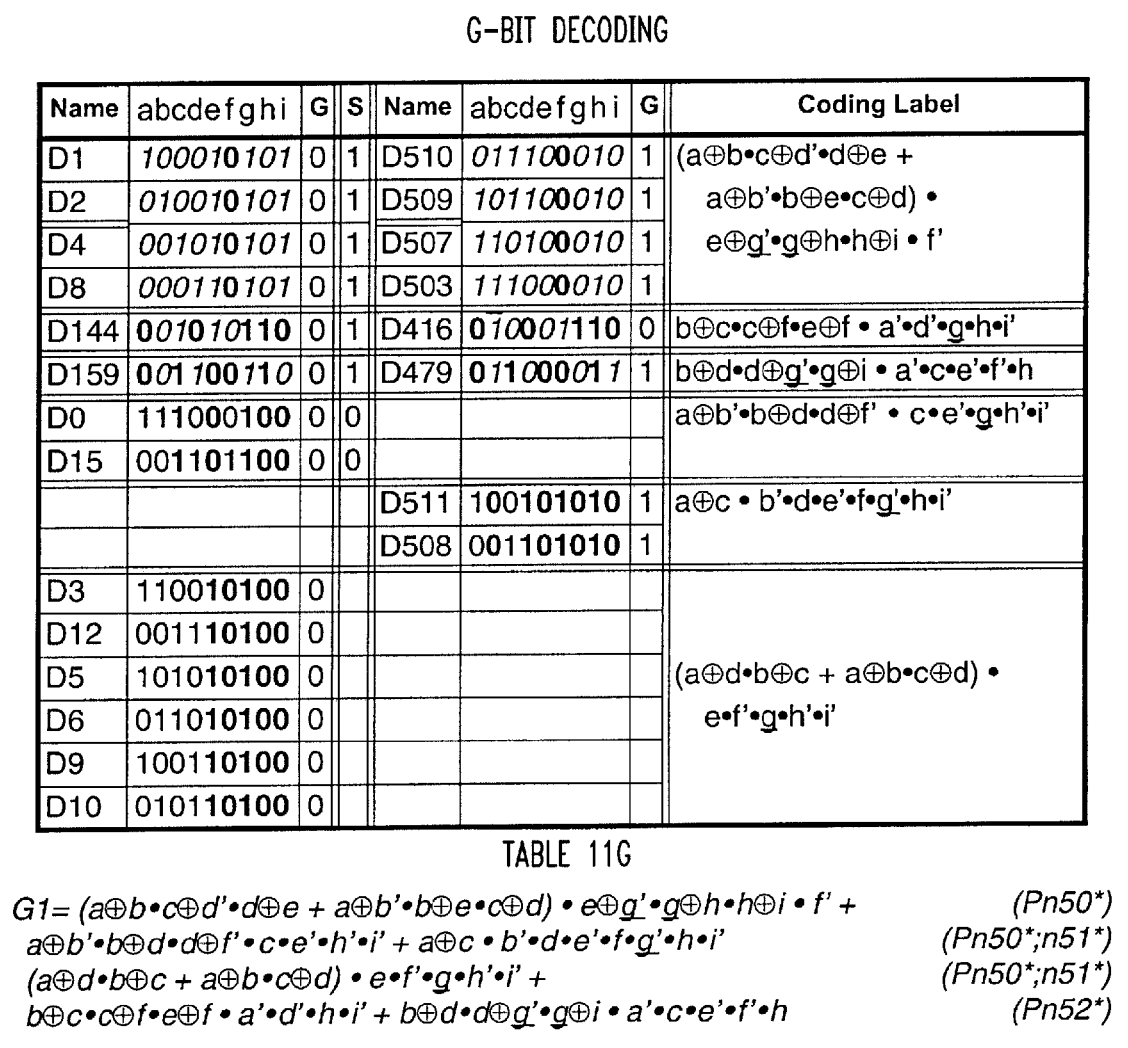

The 'g' column has bold entries in the Tables 2A/B of FIGS. 14A/B for the 22 vectors listed in Table 11G of FIG. 41. The G-bit decoding equation of FIG. 41 is derived from the coding labels of Table 11G.

Decoded Bit H

The 'h' column has bold entries in the Tables 2A/B of FIGS. 14A/B for the 20 vectors listed in Table 11H of FIG. 42. The H-bit decoding equation of FIG. 42 is derived from the coding labels of Table 11H.

Decoded Bit I

The 'i' column has bold entries in the Tables 2A/B of FIGS. 14A/B for the 32 vectors listed in Table 11I of FIG. 43. The I-bit decoding equation of FIG. 43 is derived from the coding labels of Table 11I.

Control Bit K

Figure 44:
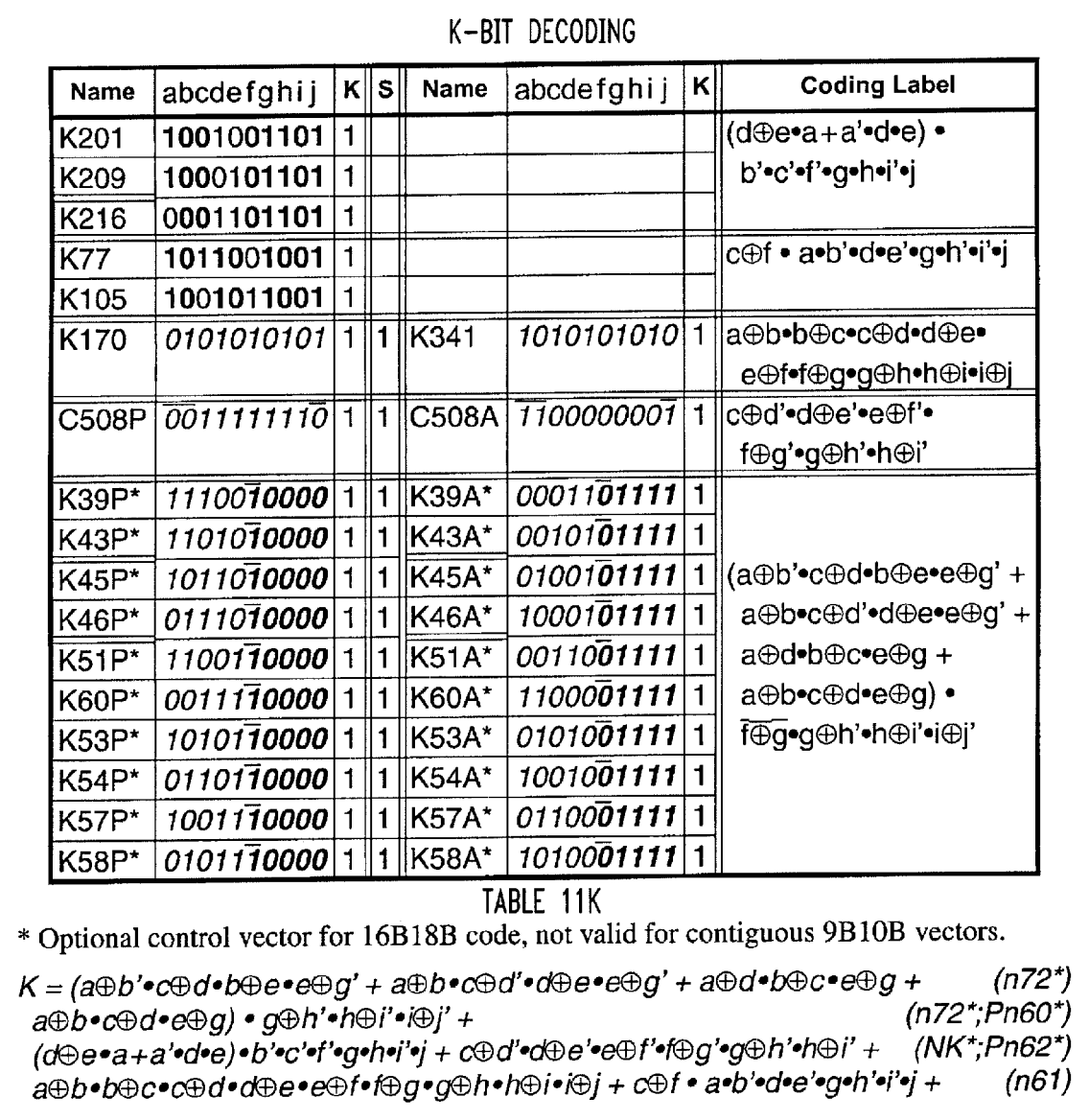

The primary and alternate versions of 18 control vectors at the trailing end of Table 1M of FIG. 6M are listed in Table 11K of FIG. 44. In the absence of errors, a 10-bit vector aligned with the vector boundaries can be identified as the control character C508 by a run length of 7 in bits c through i because of code constraints. For some applications it may be advisable to check all 10 bits for improved error immunity. The optional control characters for 16B18B code are marked with an asterisk "*" in the 'Name' column of the tables and are not valid for contiguous 9B10B vectors.

The K-bit decoding equation of FIG. 44 is derived from the coding labels of Table 11K.

2) Full Vector Complementation

The appended bit 'j' is dropped before complementation and only the 9 leading bits need to be complemented. It is helpful to remember that for this code all alternate vectors have a j-bit value of one and the only vectors with j=1 which are not alternate vectors are the 116 balanced, disparity independent vectors BM4c'4t'6t'J of FIG. 13 listed in Tables 2A and 2B of FIGS. 14A/B. The equation for the complementation of alternate vectors can thus be expressed by:

$$CMPL10 = j \cdot (BM4c'4t'6t')'$$

An expression in terms of bit values for BM4c'4t'6t' can be derived from the trellis of FIG. 13. The left side of Table 12 of FIG. 45 lists the bit patterns of FIG. 13 from node 0b to the nodes 4u, 4b, and 4m, and the right side lists the bit patterns from nodes 4u, 4b, and 4m to node M. The number of vectors represented is 4·5+6·10+4·9=116.

The CMPL10 of FIG. 45 is derived from the coding labels of Table 12

Figure 56A:
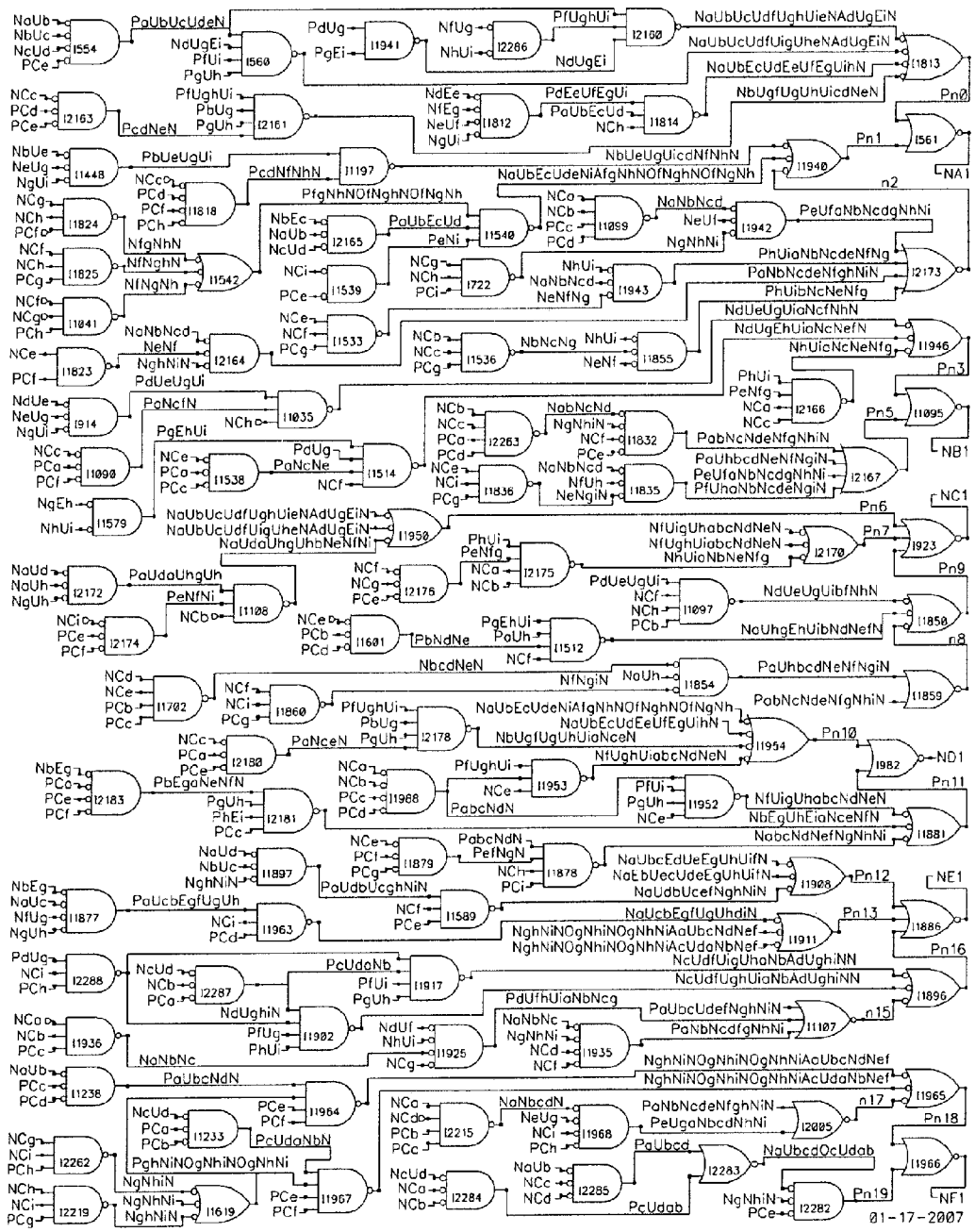
FIGS. 56A-56C show gate level circuit diagrams of the circuit of FIG. 55.
Figure 56B:
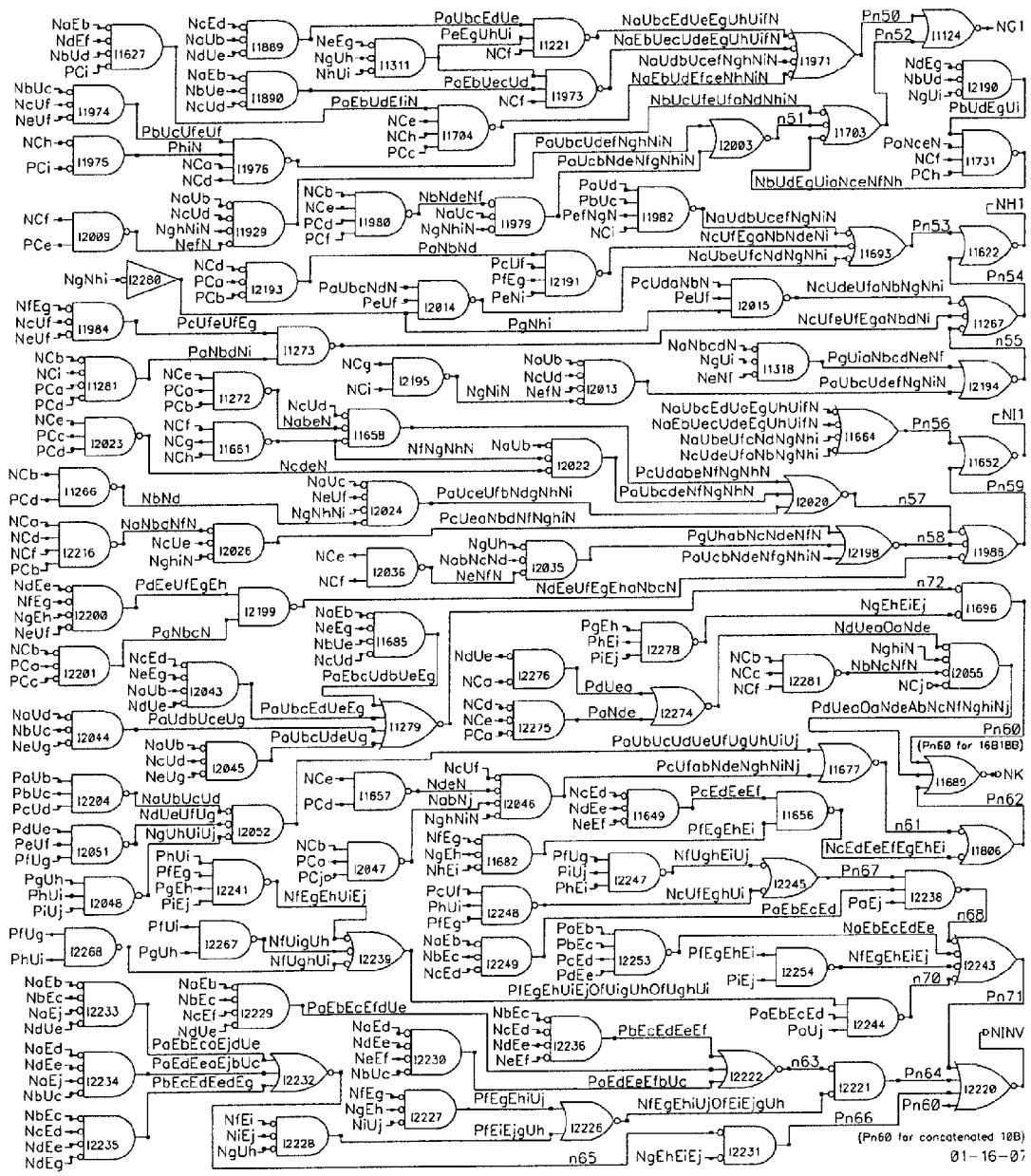
Figure 56C:
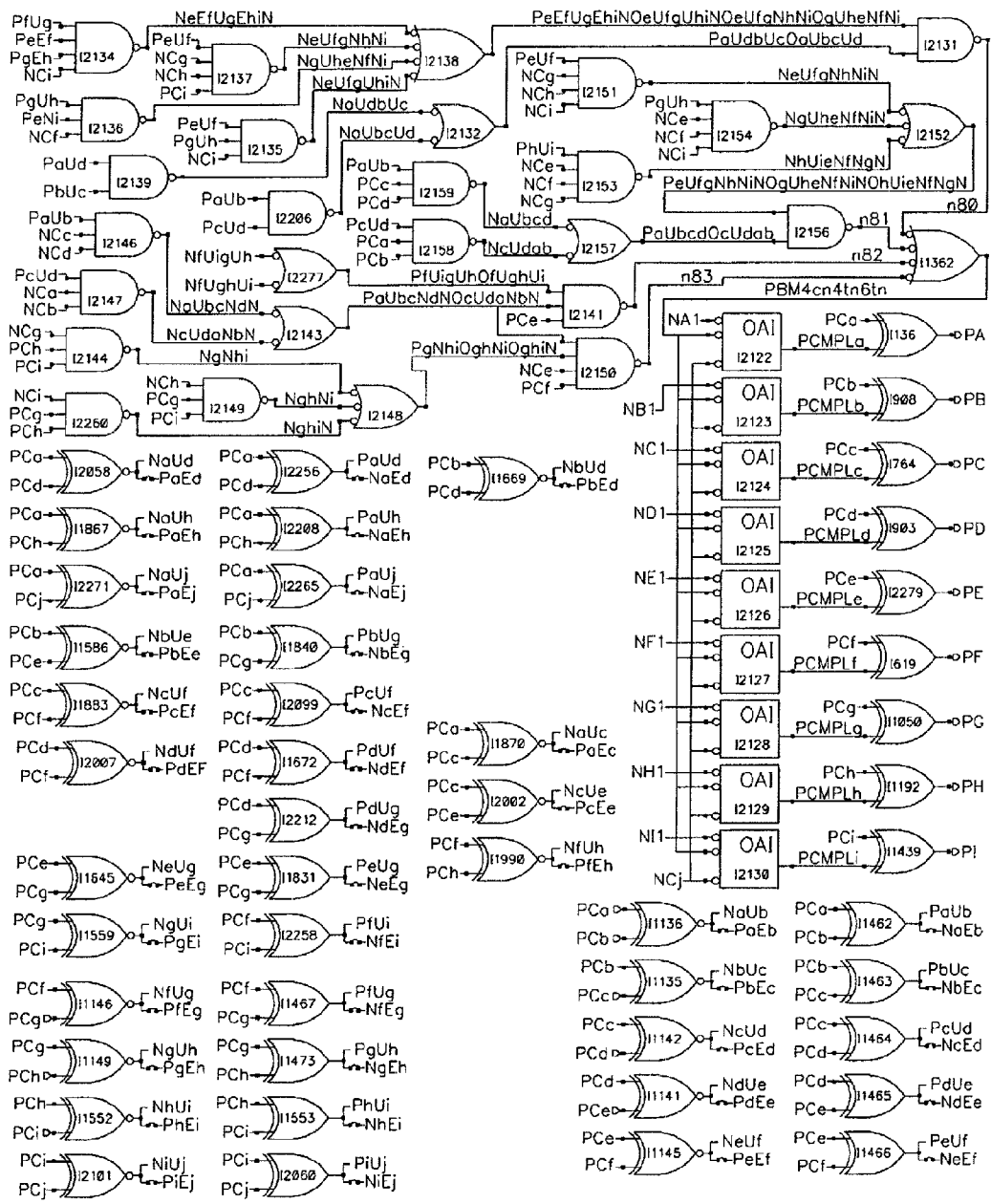

On the upper right side in the circuit diagram of FIG. 56C, the part of the equation for COMPL10 within the brackets{ } is referred to by the net name PBM4cn4tn6tn which references the trellis of FIG. 13 up to node M.

3) Invalid Characters

Since there are 828 valid vectors in the code (with all optional control vectors included), there are 196 invalid vectors. They are listed in Table 13 of FIG. 46. The first two rows represent 124 vectors with a leading or trailing run of five. The letter x indicates arbitrary values for the bit positions involved. Each of the top two rows represents 64 vectors but only 124 vectors together because of overlap The third row is a complementary vector pair with a disparity of four not included in FIG. 4C.1 or 4C.2. This is followed by 10 complementary vector pairs with a disparity of two and a leading run of four not included in FIG. 4B, and a complementary set of 25 vector pairs with disparity of six and not ending or starting with a run of five. The overlined bit positions are redundant because the opposite value would generate a leading or trailing run of five already captured by the top two rows. For concatenated 10B vectors, the optional control vectors identified by the expression INVK must also be included in the set of invalid vectors. The equations for INV and INVK of FIG. 47 are derived from the coding labels of Table 13 of FIG. 46 and Table 11K of FIG. 44, respectively.

4) Disparity Checks on Decoding

Disparity checks serve a variety of purposes with different implementations depending on the application. As an example, long distance, multi-hop carrier type applications require a simple in line quality monitoring system as described for the case of a 7B8B code in the aforementioned Sharland paper Computer links use such checks to help in the isolation of failing link components and to supplement higher level error checking schemes in the goal of weeding out all flawed frames or packets.

Some important applications of this code may not be helped much by disparity monitoring and thus may not implement it As an example, a computer bus as described in U.S. Pat. No. 6,978,416 requires separate extensive error checking and collection facilities with low latency. Disparity errors often show up with some delay after one or more disparity independent coding blocks have passed.

Some applications may implement simplified monitoring circuits which miss a small fraction of disparity violations, or they may tolerate some double counts, or they may want to deactivate monitoring until a reliable running disparity value is reestablished after an error indication. Some expressions which can be used as building blocks for any such monitoring process are defined below.

For some applications, the disparity circuits awe less latency sensitive than the rest of the decoding circuits because system performance is not affected by modest delay in the error detection and perhaps more than one clock cycle is acceptable for the execution of these functions. Therefore, they can be generated by logic synthesis programs rather than a hand-crafted design and no circuit design for disparity monitoring is shown in this report. Any implementation can share many logic expressions with those already implemented for decoding.

At a receiver; the vector sequences can be monitored to see whether they still conform to the rules imposed by the encoder. A single or odd number of errors in transmission will always cause a violation of the disparity rules without necessarily generating an invalid vector as described above. In a mixture of balanced vectors, and vectors with a block disparity of ±2 or ±4, the running disparity in the absence of errors is constrained to values of ±1 and ±3 at the vector boundaries A transmission error is not always immediately detectable by just adding and subtracting the cumulative block disparities to see whether the actual running disparity of the received vector sequence meets the above constraints. The following rules assume that the error, if any, occurred before the vector under consideration. If an error is present in the block itself, a duplicate error indication may occur later because the value of the original running disparity following an error is uncertain. The rules apply to any mixture of vectors in the sequence such as 6B, 8B, 10B, or other vectors with compatible disparity characteristics.

An error is flagged if the required polarity of the entry disparity of a received coded block does not match the polarity of the running disparity at the start of that block.

5) Equations for Required Disparity on Decoding (DR)

a) Positive Required Disparity PDR

Any valid or invalid vector in FIG. 1(L) ending in nodes 10*m*, 10*t*, 10*q*, 10*s*, or 10*n* and the 9 balanced vectors of FIG. 4A.2(R) require a positive entry disparity. These vectors can be grouped and defined as follows:

3 or more zeros in the 5 leading bit positions combined with 3 or more zeros in the 5 trailing positions.

4 or more zeros in the 5 leading bit positions combined with 2 or more zeros in the 5 trailing positions.

2 or more zeros in the 5 leading bit positions combined with 4 or more zeros in the 5 trailing positions 5 or more zeros in the 6 leading bit positions or 4 leading zeros.

The equation for PDR is shown in FIG. 48.

b) Negative Required Disparity NDR

The equation for the negative required disparity NDR is the same as for PDR but with complementary bit values The equation for NDR is shown in FIG. 48.

6) Equations for Running Disparity on Decoding (RD)

The running disparity is determined by the characteristics of the most recent one or two disparity dependent blocks. Quicker recovery of the running disparity is possible by looking at the three most recent disparity dependent vectors, but the added complexity may not be worthwhile for some applications. Disparity independent blocks are ignored From the state diagram of FIG. 31, it is evident that after a block disparity of 4 (DB4), the polarity (PRD/NRD) is known, but not the arithmetic value (RD1/RD3). It also shows that the arithmetic value is RD1 after any block with a disparity of 2 (DB2). The running disparity is at +1 after DB2 of either polarity followed by PDB2 with a positive disparity or after PDB2 followed by one of 9 disparity dependent balanced vectors PDB0 with a positive required entry disparity RD (D47A, D55A, D59A, D61A, D62A, D79A, D143A, D271A, D496). The running disparity is at −1 after DB2 of either polarity followed by NDB2 with a negative disparity or after NDB2 followed by one of 9 disparity dependent balanced vectors NDB0 with a negative required entry disparity (D47, D55, D59, D61, D62, D79, D143, D271, D496A). The primary version of these vectors is illustrated in the trellises of FIGS. 8A, 8B, and 8C.

The Table 14 of FIG. 49 illustrates how the running disparity can be initially established or reestablished after an error and is used to extract the equations below for the polarity and the arithmetic value of the running disparity. The following acronyms are used:

PRD=Positive Running Disparity NRD=Negative Running Disparity

PDB4=Positive Block Disparity of 4 NDB4=Negative Block Disparity of 4

PDB2=Positive Block Disparity of 2 NDB2 Negative Block Disparity of 2

RD1, RD3=Arithmetic value of the running disparity is equal 1 or 3, respectively

PDB0=D47A, D55A, D59A, D61A, D62A, D79A, D143A, D271A, D496

NDB0=D47, D55, D59, D61, D62, D79, D143, D271, D496A

The appended letter L(ast) refers to the next preceding disparity dependent block $$PRD=PDB4+PDB2\cdot(PDB2L+NDB2L)+PDB0\cdot PDB2L$$

$$NRD=NDB4+NADB2\cdot(PDB2L+NDB2T)+NDB0\cdot NDB2L$$

$$RD1=PDB2+NDB2+(PDB4+NDB4)\cdot RD3L$$

$$RD3=(PDB4+NDB4)\cdot RD1L$$

7) Equations for Block Disparity (DB)

Invalid vectors which simplify the equations are included and such vectors with more than seven ones or zeros are lumped together with vectors of a disparity of four.

a) Positive Block Disparity of Four PDB4

All vectors of this set contain at least seven ones and end with nodes 10*x*, 10*h*, 10*v*, or 10*c* in the trellis of FIG. 1(L). Invalid vectors with fewer than 3 ones in the leading or trailing 5 bit positions are not included. The vectors belong to one of the following two groups:

4 or 5 ones in the 5 leading bit positions combined with 3 or more ones in the 5 trailing 4 positions.

3 or more ones in the 5 leading bit positions combined with 4 or 5 ones in the 5 trailing positions.

The equation for PDB4 is shown in FIG. 50.
  b) Negative Block Disparity of Four NDB4

The equation for the negative block disparity NDB4 is the same as for PDB4 but with complementary bit values. The equation for NDB4 is shown in FIG. 50
  c) Positive Block Disparity of Two PDB2

This set includes all vectors with exactly 6 ones ending with node 10*u* in FIG. 1(L). Some invalid vectors with 5 leading or trailing ones are included with the assumption that they originated from valid vectors with only 4 ones in the respective 5 bit positions
  3 ones in the 5 leading bit positions combined with 3 ones in the 5 trailing bit positions
  2 ones in the 5 leading bit positions combined with 4 or 5 ones in the trailing 5 positions.
  4 or 5 ones in the 5 leading bit positions combined with 2 ones in the trailing 5 positions.
  The equation for PDB2 is shown in FIG. 51
  d) Negative Block Disparity of Two NDB2
  The equation for the negative block disparity NDB2 is the same as for PDB2 but with complemented bit values. The equation for NDB2 is shown in FIG. 51.
  e) Zero Block Disparity with a Positive Requited Front end Disparity PDB0
  This vector set can be derived from FIG. 4A.2(R). The equation for PDB0 is shown in FIG. 52.
  f) Zero Block Disparity with a Negative Required Front end Disparity NDB0
  This vector set can be derived from FIG. 4A.2(L) and is the same as for PDB0 but with complemented bit values. The equation for NDB0 is shown in FIG. 52.

9B10B CIRCUIT IMPLEMENTATION

For the circuit implementation, it is assumed that all inputs are available in complementary form, i.e. both the +L2 and −L2 outputs of the input register latches are made available. Nevertheless, the assumption is that the −L2 outputs are slightly delayed relative to the +L2 outputs. The circuit diagrams show only NAND, NOR, INV, XOR, XNOR, and AO121 gates and a single OR4 gate in a non-critical path in FIG. 56A (Pn5). The use of AND and OR gates has been avoided because of their increased delays. For the NAND and NOR gates, the upper inputs of the logic symbols usually have less delay than the lower ones. The presumed critical paths are therefore routed through the top inputs. The wire routing also assumes that XNOR delays are shorter than XOR delays. The gate representations use bubble notation. A bubble indicates a lower logic level. The functions indicated by the symbols are true if the inputs and outputs are at the levels indicated. Functions suggested by net names are true when at the level indicated by the first letter, P for the upper level and N or n for the lower level. An explanation of the conventions used for net names in the circuits is given above under 'Notation'. There is some leeway in the definition of the basic logic equations and in the partitioning of the longer expressions to match the fan-in limitations of the gates Variations in these choices leads to different ranges in circuit sharing and circuit counts In circuit areas which are suspected to be in the upper range of circuit delay, the circuit count has occasionally been increased to reduce delay primarily by reducing the fan-in of gates in the critical path. For delay considerations, both XOR and XNOR gates have been used at the input to generate both polarities and the skilled artisan will appreciate that some of those gates can be replaced by INV circuits upon generation of appropriate simulation results. Similarly, the circuit diagrams generally do not show complex gates to allow maximum circuit sharing; the logic processing programs will introduce complex gates automatically where appropriate.

Note that some of the logic variables of the equations are not present explicitly in the circuit diagrams. If so, they have been merged with other functions in a single gate to reduce overall circuit delay. An example is the variable PDR which is only present in the merged signal NRDFaPDR of FIG. 54C.

Figure 53:
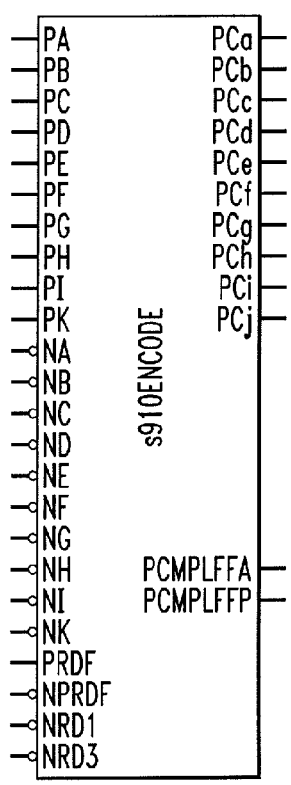
FIG. 53 shows a block diagram of a specific exemplary circuit for 9B10B encoding, according to an aspect of the invention.

A. Circuit for 9B10B Encoding
  1) Block Diagram (FIG. 53)
  FIG. 53 is the block diagram for the encoding circuit with all inputs and outputs shown.
  2) Gate Level Circuit Diagram (FIGS. 54A, 54B, 54C)
  A gate-level circuit diagram of the encoder of FIG. 53 is shown in FIGS. 54A, 54B, and 54C, which represent a single circuit with net sharing.
    a) Individual Bit Complementation
  FIG. 54A shows most of the encoding of the leading 5 bits (abcde), the encoding of the trailing 5 bits (fghij) is shown in FIG. 54B. The upper right side of FIG. 54C shows the last two gate levels for bit encoding. The center right side lists a number of EXCLUSIVE OR (XOR and XNOR) gates which are shared across the three encoding circuit diagrams. Some of these gates can be replaced by inverters driven from the gate of opposite polarity if they are not part of any critical timing path.
    b) Full Vector Complementation Circuit
  The signal CMPL10 which complements all 10 bits of a coded byte is orthogonal to the signals (Ca1, Cb1, Cc1, Cd1, Ce1, Cf1, Cg1, Ch1, Ci1) which cause complementation of individual bits In other words, both for encoding and decoding, no individual bits are changed when a full vector is complemented and vice-versa. This feature allows the merger of both types of signals in a single OR function as shown at the upper right side of FIG. 54C, greatly simplifying the circuitry preceding the output EXCLUSIVE OR function. The upper left part of FIG. 54C shows the implementation of the equations for the complementation of entire vectors. The CMPL10 signal is not explicitly present in the circuit version shown. It is dependent on the required entry disparity and the starting running disparity RDF which is equal to the ending disparity RDI of the preceding byte. Note that the value of RDF is not required immediately at the start of the encoding interval, because in the critical signal paths, it is typically an input to a gate at the third of fourth level, which facilitates pipelining of this logic path into the next cycle if required as described in U.S. Pat. No. 6,977,599 for an 8B10B code.
    c) Disparity Control
  The bottom part of FIG. 54C shows the equation for the determination whether the polarity and/or absolute value of the running disparity at the end of the new vector has to be changed (CMPLFFP, CMPLFFA). Because these two signals typically feed a flip-flop with a multiplexer input which has a longer setup time than a regular flip-flop, extra gates have been added to reduce the number of logic levels to 6.
  3) Gate Count, Circuit Delays and Pipelining for Encoding
  The encoder circuit shown comprises 352 gates and two flip-flops (not shown) to keep track of the disparity No logic path exceeds 7 gates; all gates are of the inverting type with shorter delay except some XOR gates which for most power and loading levels have comparable or only slightly mole delay than XNOR gates. It is estimated that the circuit area can be reduced by about 5% to 10% if 8 gating levels are acceptable.

If the circuit does not meet desired performance goals, the first step is to reduce the fin-in of gates in the critical paths by off loading the shorter sections of the logic cone with some additional gates Pipelining can result in larger delay reductions. To this end, the fan-in for the trailing 3 logic levels has been kept low to reduce the number of parameters which must be carried forward. Minor rearrangements may be useful depending on whether one, two, or three trailing logic levels awe moved into a second clock cycle which can reduce the first cycle to four logic levels.

Figure 55:
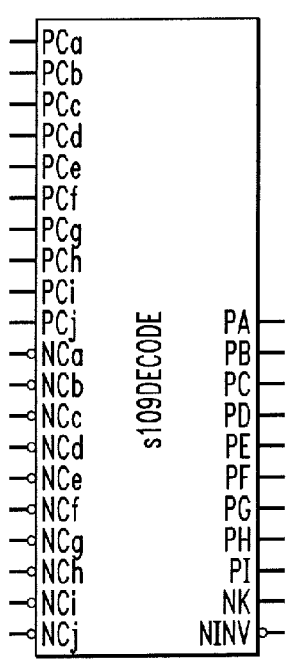
FIG. 55 shows a block diagram of a specific exemplary circuit for 9B10B decoding, according to an aspect of the invention.

A further delay reduction can be accomplished by itself or in combination with any of the above versions by minor circuit modifications and moving some of the leading EXCLUSIVE OR functions into the preceding clock cycle in the data source path B. 10B9B Decoding Circuit 1) Block Diagram (FIG. 55)

The block diagram for the decoding circuit with all inputs and outputs is shown in FIG. 55.

2) Gate Level Circuit Diagram (FIGS. 56A, 56B, 56C)

a) Individual Bit Complementation and Validity Check

A gate-level circuit diagram of the decoder of FIG. 55 is shown in FIGS. 56A, 56B, and 56C which represent a single circuit with net sharing FIG. 56A shows the implementation of the equations for the complementation of the first six individual bits (a, b, c, d, e, f) to restore the original values (A, B, C, D, E, F) FIG. 56B shows the decoding of the individual trailing three bits (g, h, i) to restore the original values (G, H, I) and the generation of the control bit K. The validity checks are shown at the bottom.

b) Full Vector (bit 'a' Through 'i') Complementation Circuit

The circuit which controls the complementation of entire 9-bit vectors at the top of the diagram of FIG. 56C generates the signal PBM4cn4tn6tn which complements at the lower level the entire vector to recover the primary version. The signal PBM4cn4tn6tn represents the 116 vectors of FIG. 13. The OAI21 gate, which is the negative polarity version of a circuit commonly referred in its positive version as AOI21, is counted as a single logic level because its typical delay and area is comparable to a NAND3 or a XNOR2 gate.

c) Error Monitoring Circuits

At the bottom of the diagram in FIG. 56B is the validity check A specific application may hold unused control vectors in reserve or declare them invalid at the circuit level. The control vectors represented by the signal Pn60 are invalid for concatenated 9B10B vectors and are then not part of the NK output but are added to the NINV output as shown. A disparity monitoring circuit has not been implemented because bus applications may not use it, and for other applications, the detection of disparity errors may be allowed to take two cycles. The circuits are less time sensitive and can be generated automatically from the equations by design tools The shared EXCLUSIVE OR functions of all 3 diagrams are shown in FIG. 56C. Again, inverters can be substituted for some of these gates depending on speed requirements.

3) Gate Count, Circuit Delays and Pipelining for Decoding

The decoder as shown without disparity monitoring comprises 298 gates, all of the inverting type except some XOR gates. No logic path exceeds seven levels. The paths for NK and for PINV are 5 and 6 logic levels, respectively. For fast operation, pipelining can be used analogous to the steps described above for the encoder. The fan-in to the third last gate of the NOR type in the bit decoding cones has been minimized at the cost of a few gates to reduce the number of latches required for pipelining at this point. Some of the 2-way and 3-way OR functions have been moved forward and merged with OR functions at the 4th level back from the end. This requires the duplication of some AND functions. It has been discovered that the circuit penalty is less than apparent, because a uniform design approach results in more matching signal polarities which enables more gate sharing. Similar modifications could be made to the encoding circuit if required.

DESCRIPTION OF EXEMPLARY 7B8B TRANSMISSION LINE CODE

A. 7B8B Code Definition

The 7B8B code comprises a total of 135 code points with 202 coded 8B vectors as illustrated by the trellis diagrams of FIG. 57. It should at this point be reiterated that FIGS. 2A, 2B, 3A and 3B illustrate the example apparatuses and methods of the 9B10B code but are equally applicable to the 7B8B code if the numbers 10 and 9 are replace by 8 and 7, respectively. Thus, an exemplary method of encoding 7B source vectors into 8B encoded vectors can the steps of obtaining a plurality of 7B source vectors, and encoding the 7B source vectors into a plurality of 8B encoded vectors according to an encoding scheme. The 8B encoded vectors can include at least 8B encoded data vectors ("at least" is included to signify that, e.g., control vectors could be included in addition to the data vectors) The encoding scheme maps at least a first portion of the 7B source vectors into 8B encoded data vectors comprising disparity independent encoded vectors, and the encoding scheme maps at least a second portion of the 7B source vectors into 8B encoded data vectors comprising disparity dependent encoded vectors having primary representations and alternate representations complementary to the primary representations. The 8B encoded data vectors have one binary symbol appended thereto by the encoding scheme.

A fraction of the 8B encoded data vectors have binary symbol changes, other than whole-vector complementation, compared to corresponding ones of the 7B source vectors, the fraction not including any of the disparity dependent encoded representations. None of the encoded data vectors comprise exclusively alternating ones and zeroes (it is to be understood that in other embodiments, vectors comprising exclusively alternating ones and zeroes could be used as data vectors; for example, decision feedback equalization (DFE) typically requires a run of at least two for error recovery, but where DFE is not employed this may not be a concern so that vectors comprising exclusively alternating ones and zeroes could be used as data vectors). Optionally, the fraction of the 8B encoded vectors includes the disparity independent encoded vectors, and the disparity independent encoded vectors are dc-balanced and have no alternate representations.

The 7B source vectors can include 7B source data vectors and at least one 7B source control vector The encoding scheme can further map the at least one 7B source control vector into at least one 8B encoded control vector, and at least some of the second portion of the 7B source vectors, that are mapped into 8B encoded data vectors comprising disparity dependent encoded vectors having primary representations and alternate representations complementary to the primary representations, are mapped to dc-balanced 8B encoded data vectors.

The first portion of the 7B source vectors is mapped into 8B encoded vectors comprising a set of 34 disparity independent encoded vectors which does not require any bit changes during encoding, and the first portion of the 7B source vectors includes source vectors having:

a disparity of +1,
a leading run-length no greater than 3, no more than 2 trailing zeros in the case of those of the source vectors having trailing zeroes, and no more than 4 trailing ones in the case of those of the source vectors having trailing ones.

The source vectors of the first portion are appended during encoding with a single binary symbol with a value of zero. 33 of the 34 disparity independent encoded vectors comprise the encoded data vectors, and a remaining one of the 34 disparity independent encoded vectors, comprising alternating ones and zeros, is defined as the encoded control vector. In other embodiments, such vector could instead be defined as an invalid vector; indeed, in general, any or all control vectors can instead be defined as invalid characters (invalid vectors) and synchronization can be acquired via techniques other than the comma character.

The first portion of the 7B source vectors can be mapped into 8B encoded vectors comprising a set of 34 disparity independent encoded vectors, a fraction of the 34 disparity independent encoded vectors requiring individual bit changes during encoding. The set of 34 encoded vectors comprises vectors having seven leading binary symbols with a disparity of −1, having:

a leading run-length no greater than 3, no more than 2 trailing ones in the case of those of the source vectors having trailing ones, and no more than 4 trailing zeros in the case of those of the source vectors having trailing zeroes.

The first portion of the 7B source vectors becomes a 7B set, the 7B set being appended with a single binary symbol with a value of one when being encoded to obtain the 34 encoded vectors. As noted above for the 9B10B example, the terminology "7B set" is employed to accommodate the fact that some of the source bits are changed before they become the first 7 bits of the encoded 33 of the 34 encoded vectors comprise the encoded data vectors and a remaining one of the 34 disparity independent encoded vectors, comprising alternating ones and zeros, is defined as the encoded control vector. In other embodiments, such vector could instead be defined as an invalid vector; indeed, in general, any or all control vectors can instead be defined as invalid characters (invalid vectors) and synchronization can be acquired via techniques other than the comma character.

As with the 9B10B example, complementary implementations are possible and are intended to be encompassed within the inventive scope For example, the first portion of the 7B source vectors could be mapped into 8B encoded vectors comprising a set of 34 disparity independent encoded vectors which does not require any bit changes during encoding, and the first portion of the 7B source vectors could comprise source vectors having:

a disparity of −1, a leading run-length no greater than 3, no more than 2 trailing ones in the case of those of the source vectors having trailing ones, and no more than 4 trailing zeroes in the case of those of the source vectors having trailing zeroes.

Further, the source vectors of the first portion could be appended during encoding with a single binary symbol with a value of one, 33 of the 34 disparity independent encoded vectors could comprise the encoded data vectors, and a remaining one of the 34 disparity independent encoded vectors, comprising alternating zeroes and ones, could be defined as the encoded control vector.

By way of further comment on a possible complementary implementation, the first portion of the 7B source vectors could be mapped into 8B encoded vectors comprising a set of 34 disparity independent encoded vectors, with a fraction of the 34 disparity independent encoded vectors requiring individual bit changes during encoding, and the set of 34 encoded vectors could comprise vectors having seven leading binary symbols with a disparity of +1, and having:

a leading run-length no greater than 3, no more than 2 trailing zeroes in the case of those of the source vectors having trailing zeroes, and no more than 4 trailing ones in the case of those of the source vectors having trailing ones.

The first portion of the 7B source vectors could become a 7B set, the 7B set (note discussion of "set" terminology above) being appended with a single binary symbol with a value of zero when being encoded to obtain the 34 encoded vectors, 33 of the 34 encoded vectors comprising the encoded data vectors and a remaining one of the 34 disparity independent encoded vectors, comprising alternating zeroes and ones, being defined as the encoded control vector. As noted above, in other embodiments, such vector could instead be defined as an invalid vector; indeed, in general, any or all control vectors can instead be defined as invalid characters (invalid vectors) and synchronization can be acquired via techniques other than the comma character.

As with the 9B10B example, variations from the source to encoded vector assignments are possible, for example:

(i) The appended binary symbol has a default value of 1 and some or all of the specifications for the primary approach are changed to complementary bit values and disparity polarities (ii) Some or all primary and alternate vector sets are swapped with the respective complementary sets, either in combination with (i) or independently.

An exemplary method of decoding 8B encoded vectors into decoded 7B source vectors can include the steps of obtaining a plurality of 8B encoded vectors that were encoded from a plurality of 7B source vectors according to an encoding scheme as described herein, and decoding the 8B encoded vectors into a plurality of 7B source vectors according to decoding rules of the encoding scheme. An additional optional step can include checking the plurality of 8B encoded vectors for selected ones of the encoded vectors that are not balanced and that end with a predetermined binary symbol, the predetermined binary symbol comprising a "one" in a primary implementation of the encoding scheme, and the predetermined binary symbol comprising a "zero" in a complementary implementation of the encoding scheme. In such case, the decoding comprises at least automatically complementing the selected ones of the encoded vectors As discussed with the 9B10B exemplary implementation, the 7B81B implementation is also specially designed to allow one to look for auto complementation, and there can be some other cases of auto complementation, such as, for example, dc balanced vectors ending with four ones (or, four zeroes in complementary form).

1) 68 Balanced 8B Vectors (FIG. 57A.1)

A set of 68 disparity independent, balanced vectors is illustrated in FIG. 57A.1. The subset (68) of all possible 8B vectors (256) chosen is the set of balanced vectors with a run length of no more than three at the leading and trailing boundaries.

2) One Disparity Dependent, Balanced Complementary Vector Pair

The code includes one disparity dependent, balanced, complementary vector pair as illustrated in FIG. 57A.2 with a leading and trailing run of four. It is assigned to the source vector D15=1111000.

3) 2×48 8B Vectors with Disparity +/−2 (FIG. 57B)

FIG. 57B shows a set of 48 8B vectors comprising all valid bit patterns with a disparity of 2, no more than three ones or two zeros at the front end and no more than two zeros or three ones at the trailing end. An exact complementary set of another 48 vectors has a disparity of 2.

4) 2×18 8B Vectors with Disparity +/−4 (FIG. 57C)

The set of twelve 8B vectors of FIG. 57C.1 comprises all bit patterns with a disparity of 4, no more than three ones or one zero at the front end and one to three ones at the trailing end. An exact complementary set of another 12 vectors has a disparity of 4. FIG. 57C.2 illustrates a set of six vectors with a disparity of +4 and no more than two ones or one zero at the front and exactly one zero or 4 ones at the end. An exact complementary set of another 6 vectors has a disparity of 4. The leading part of the comma character for concatenated 8B vectors belongs to FIG. 57C.2.

5) Comma Characters for Concatenated 7B8B Coding Blocks and for 16B18B Code

Figure 58:
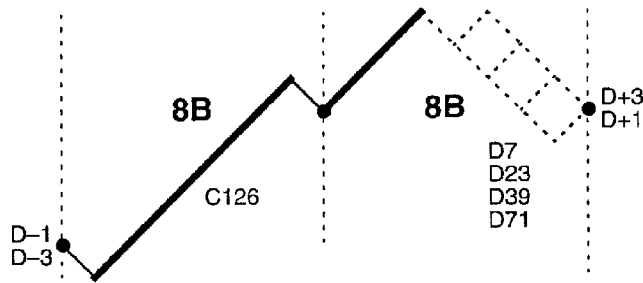
FIGS. 58-60 show trellis diagrams for comma sequences for an exemplary embodiment of 7B8B code, according to an aspect of the invention.

To generate a comma, two 8B blocks are required. For this purpose, the control character C126 with a run of six has been added. It is listed at the bottom of Table 15D of FIG. 68D. The control character C126 can be used to generate a singular comma consisting of a run length of six followed contiguously by a run of one and ending with a run of three of the same polarity as the leading run of six (0000001'000 or 1111110'111). Only the nine bold bits must be checked for synchronization The comma is embedded in two blocks of eight coded bits and is illustrated for one polarity in FIG. 58. The second byte is taken from the group of balanced vectors of FIG. 57A.1. These vectors must be made disparity dependent if they follow C126 of Table 15D to obtain a comma sequence regardless of the running disparity.

| D7 | + 11100001 − 00011110 | D120 |
| D23 | + 11101000 − 00010111 | D112 |
| D39 | + 11100100 − 00011011 | D95 |
| D71 | + 11100010 − 00011101 | D63 |

The trailing 8B patterns are identical to the trailing vector of the 16B18B comma of U.S. Pat. No. 6,198,413 where C126 is replaced by C508 (0011111110/1100000001) from the 10B alphabet.

Figure 59:
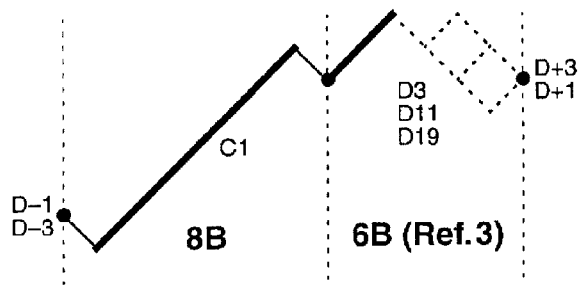

B. Other Applications 17B20B, 12B14B Code (FIG. 59)

Machine upgrades sometimes require serialization of parallel buses to deal with entry and exit congestion at the board level or other modular building blocks. These serial links are usually not based on neatly designed new serial architectures but must be based on existing bus structures which may not be modulo eight in width. To serve these requirements, it is useful to have a variety of code widths in the design arsenal and techniques to combine them into a wider structure. As an example, one application requires the efficient conversion of a 17-bit bus into serial form. This could be solved by two parallel 9B10B coders, which would provide one bit of spare capacity in a 20-bit coded block. Another, perhaps simpler and adequate solution combines one 7B8B coder with two 5B6B coders taken from U.S. Pat. No. 4,486,739 or 6,977,599 B2 to translate the 17 source bits into 20 coded bits suitable fox serial transmission.

The resulting 17B20B code has a maximum run length of 6 and a digital sum variation of 10. The synchronizing sequence or comma can be defined as a run of 6, contiguously followed by a run of one and ending with run of 2 of the same polarity as the leading run of six (111111011 or 000000100) as shown in FIG. 59. This sequence can be generated by C126 from the 8B alphabet followed by the balanced vectors D3, D11, or D19 from the 6B alphabet of the Widmer article on The ANSI Fibre Channel Transmission Code or U.S. Pat. No. 4,486,739 Again, the three balanced 6B vectors must be made disparity dependent if they follow C126. If the running disparity at the front of the 6B section is negative, they must be complemented as shown below

| D3 | 110001 − 001110 | D28 |
| D11 | 110100 − 001011 | D20 |
| D19 | 110010 − 001101 | D12 |

Given the teachings herein, the skilled artisan will appreciate that the same rules apply to a 12B14B code which would be partitioned into a 7B8B code followed by a single 5B6B code.

C. Properties of the 7B8B (Code FIG. 60)

Figure 60:
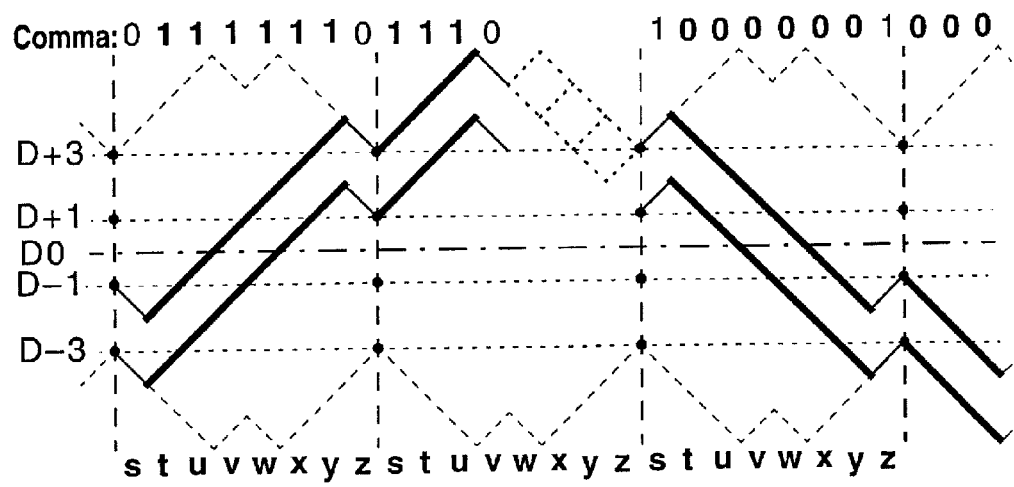

Significant characteristics of the code can be directly extracted from the trellis diagram of FIG. 60, which also shows four possible configurations for the comma sequence. Using FIG. 60 together with the trellis diagrams of FIG. 57, one can verify that the coma sequence is singular, i.e., it cannot be reproduced in any other position relative to the vector boundaries neither within two 8B blocks nor across the 8B block boundaries.

1) Low Frequency Characteristics

The code is DC balanced. The maximum digital sum variation is 12. The normalized DC offset, as defined in the Widmer article on the ANSI code, is 4.75. As a point of reference, the offset value of 8B10B code is 1.9. The low frequency cut-off point for high pass filters must be located about 2.5 times lower than for Fibre Channel 8B10B code for equal eye closure. The low frequency wander can be reduced on a statistical basis by scrambling the data before encoding. 8B10B coded data can operate with a 50% higher low frequency cut-off point than a coded worst case pattern For 7B8B code, the gain from scrambling before encoding is expected to be more because there are more and larger low frequency components to randomize.

2) Control Characters

The 7B5B code provides seven control characters which are recognizable as other than data. One of the control characters (C126) is used to generate the singular comma sequence for instantaneous vector boundary synchronization and other signaling purposes The comma sequence extends over 10 baud intervals and 9 of the coded bits must be monitored The sequence requires two contiguous 8B vectors and as shown in FIG. 60. The comma sequence is followed by one of four different 4-bit trailing sequences.

3) Clocking and Synchronization Parameters

The maximum run length of the code is seven and no more than two contiguous runs of seven are possible (0111-11110000-0001 or complement). The minimum transition density is two pet 8B block for an indefinite length (-11110000-11110000- or complement)

D. 7B8B Encoding Table

1) Design Principles 101 of the 135 encoded primary vectors are obtained by simply appending a bit with a default value of zero. An alternate, equivalent code can be constructed by choosing complementary values for the appended bit and the vector sets. All 34 vectors with individual bit changes other than full vector complementation are disparity independent with an appended bit value of one. Only 25 vectors require any changes in one to four individual source bits This arrangement has the advantage that full vector complementation and bit encoding and decoding can be executed independently of each other in parallel.

2) 7B8B Coding Table Construction

Table 15 of FIGS. 68A through 68D represents a specific coding assignment between uncoded and coded vectors in the 7B8B domain. In the column 'Bit Encoding Class,' K' within parentheses for the vectors D7, D23, D39, and D71 means that the K-bit value need not be considered for bit encoding since the encoded Dx vector and the primary KxP vector are identical; the K-bit value for these vectors is only significant for the required entry disparity DR.

a) 101 7B Primary Vectors Congruent with the First 7 Bits of the Coded 8B Vectors For 101 source vectors, represented by the trellis diagrams of FIGS. 61, 62, 63, 64, 65, and 66, the first 7 bits of the primary encoded vectors are identical to the corresponding source vectors and the appended bit assumes the default value (0). The set of vectors BU4c' of FIG. 61 uses up half the disparity independent balanced vectors of FIG. 57A.1

Figure 61:
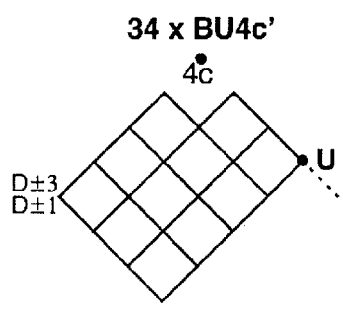
FIGS. 61-67 show trellis diagrams corresponding to FIG. 68.

Enumeration of 34 Vectors BU4c' of FIG. 61

| | | | | | | | | | |
|---|---|---|---|---|---|---|---|---|---|
| D23 | D27 | D29 | D30 | D39 | D43 | D45 | D46 | D51 | D53 |
| D54 | D57 | D58 | D60 | D71 | D75 | D77 | D78 | D83 | K85 |
| D86 | D89 | D90 | D92 | D99 | D101 | D102 | D105 | D106 | D108 |
| D113 | D114 | D116 | D120 | | | | | | |

Figure 62:
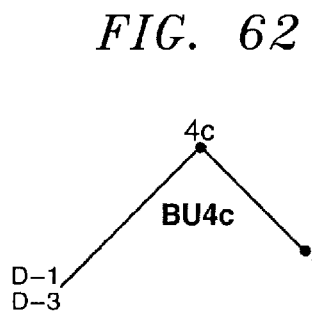

The primary vector BU4c of FIG. 62 and FIG. 57A.2(L) is balanced and disparity dependent with a negative required entry disparity It is assigned to the data vector D15.

Figure 63:
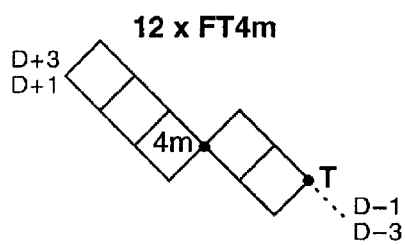

The primary vector set DC4c' of FIG. 63 has a disparity of +2 and uses 18 of the 48 vectors shown in FIG. 57B(L). The complementary alternate set is part of FIG. 57B(R).

Enumeration of 18 Vectors DC4c' of FIG. 63

| | | | | | | | | | |
|---|---|---|---|---|---|---|---|---|---|
| D55 | D59 | D61 | D62 | D87 | D91 | D93 | D94 | D103 | 107 |
| D109 | D110 | D115 | D117 | D118 | D121 | D122 | D124 | | |

Figure 64:
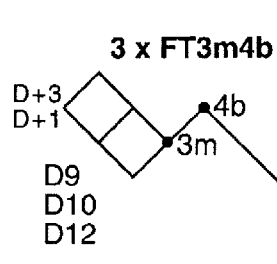

The primary vector set FI4m of FIG. 64 has a disparity of −4 and matches all 12 vectors shown in FIG. 57C.1(R). The complementary alternate set is shown in FIG. 57C.1(L).

Enumeration of 12 Vectors FT4m of FIG. 64

| | | | | | | | | | |
|---|---|---|---|---|---|---|---|---|---|
| D17 | D18 | D20 | D24 | D33 | D34 | D36 | D40 | D65 | D64 |
| D68 | D72 | | | | | | | | |

Figure 65:
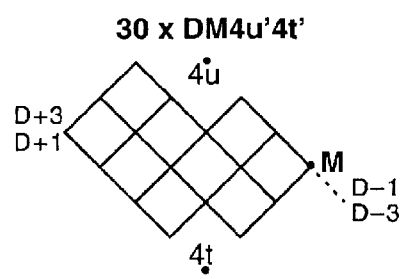

The set of 30 primary vectors DM4u'4t' of FIG. 65 has a disparity −2 and uses the remaining 30 of the 48 vectors shown in FIG. 57B(R). The complementary alternate set is part of FIG. 57B(L).

Enumeration of 30 Vectors DM4u'4t' of FIG. 65

| | | | | | | | | | |
|---|---|---|---|---|---|---|---|---|---|
| D19 | D21 | D22 | D25 | D26 | D28 | D35 | D37 | D38 | D41 |
| D42 | D44 | D49 | D50 | D52 | D56 | D67 | D69 | D70 | D73 |
| D74 | D76 | D81 | D82 | D84 | D88 | D97 | D98 | D100 | D104 |

Figure 66:
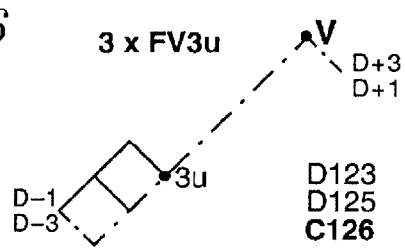

The 6 primary vectors shown in FIG. 66 are the vectors also illustrated in true and complement form in FIG. 57C.2. The vector C126 in dash-dot lines on the right side is used to generate a comma character for concatenated 7B8B sequences and for 17B20B code.

b) 34 Primary Vectors with modified Source Bits for Encoding

Figure 67:
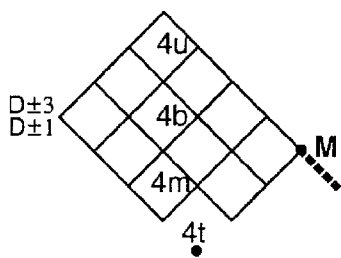

All the encoded vectors with individual bit changes belong to the set of balanced disparity independent vectors BM4t'Z of FIG. 67 and are identified in Table 16 of FIG. 69. The expression BM4t' refers to the leading 7 encoded bits only. This set of vectors uses up the remaining half of FIG. 57A.1. For this subset of disparity independent vectors, one or more bits STUVWXYZ of the augmented source vector have to be complemented to fit the respective coded vector.

The 34 encoded vectors together with their assigned uncoded vectors are listed in Table 16 of FIG. 69. The bit in the S column of Table 16 is one if there is some symmetry in the bit patterns between the left and light side. The encoded bits which are obtained by complementation of the respective uncoded bit are shown in bold type.

c) Value of Control Bit K

The vectors K7, K23, K39, and K71 of Table 15D of FIG. 68D are not true control characters because by themselves, they can not be distinguished from data. They have control functions only in combination with the preceding control character C126, or C508 in the context of the 16B18B code The K-bit value for these pseudo control characters can be either supplied externally or be supplanted by the leading comma part which is the preferred implementation because it simplifies the recovery of the K-bit for the true control characters at the cost of limiting the use of C126 and C508 to comma sequences and no other independent stand alone control functions. For the preferred implementation, the K-bit value of these 4 vectors can assume a zero value and the respective entries in the K-column of Table 15 could be changed to x. A value of 1 is shown as a reminder that these vectors are disparity dependent when following C126 or C508.

For a majority of data vectors, the value of the K-bit can be ignored. It must be considered for all true control characters and for all data classes for which the bit encoding for some source vectors is different for data and control. For the class of DM4u'4t' of FIG. 65, the vectors D19, D22, D42, D50, and D74 are encoded differently from K19, K22, K42, K50, and K74, respectively. The same is true for the vector K85 of FIG. 61 and D85 of Table 16 of FIG. 69 and the vector D126 of Table 16 and C126 of FIG. 66(R). In contrast, the coded primary vectors and the disparity DB for D/K7, D/K23, D/K39, and D/K71 are identical; the only difference is the required entry disparity DR.

LOGIC EQUATIONS FOR 7B8B IMPLEMENTATION

A. Logic Equations for 7B8B Encoder

1) Equations for Individual Bit Encoding

Generally, the encoded bits retain the value of the uncoded bit (s=S, t=T, etc), but the source bit is complemented (s=S', t=T', etc) if the respective equation below is true.

Encoded Bits

The 's' column has bold entries in Table 16 of FIG. 69 for the 15 vectors listed in Table 17s of FIG. 70. The s-bit encoding equation of FIG. 70 is derived from the coding labels of Table 17s.

Encoded Bit t

The 't' column has bold entries in Table 16 of FIG. 69 for the 9 vectors listed in Table 17$t$ of FIG. 71. The t-bit encoding equation of FIG. 71 is derived from the coding labels of Table 17$t$.

Encoded Bit u

The 'u' column has bold entries in Table 16 of FIG. 69 for the 4 vectors listed in Table 17$u$ of FIG. 72. The u-bit encoding equation of FIG. 72 is derived from the coding labels of Table 17$u$.

Encoded Bit v

The 'v' column has bold entries in Table 16 of FIG. 69 fox the 7 vectors listed in Table 17$v$ of FIG. 73. The v-bit encoding equation of FIG. 73 is derived from the coding labels of Table 17$v$.

Encoded Bit w

The 'w' column has bold entries in Table 16 of FIG. 69 for the 6 vectors listed in Table 17$w$ of FIG. 74. The w-bit encoding equation of FIG. 74 is derived from the coding labels of Table 17$w$.

Encoded Bit x

The 'x' column has bold entries in Table 16 of FIG. 69 for the 2 vectors listed in Table 17$x$ of FIG. 75. The x-bit encoding equation of FIG. 75 is derived from the coding labels of Table 17$x$.

Encoded Bit y

The 'y' column has bold entries in Table 16 of FIG. 69 for the 8 vectors listed in Table 17$y$ of FIG. 76. The y-bit encoding equation of FIG. 76 is derived from the coding labels of Table 17$y$.

Encoded Bit z

The default value for the z-bit is zero. The z-bit is changed to one for the vectors with bold entries in the 'z' column of Table 16 of FIG. 69. The respective 34 vectors are listed in Table 17$z$ of FIG. 77. The z-bit encoding equation of FIG. 77 is derived from the coding labels of Table 17$z$.

2) Equations for Required Disparity for Encoding DR a) Positive Required Disparity PDR, Table 18

A total of 49 vectors listed in Table 18 of FIGS. 78A/B require a positive entry disparity 30 belong to the class DM4u'4t' of FIG. 65, 12 to the class FT4m of FIGS. 64, and 3 to the class FI3m4b of FIG. 66(L). In addition, 4 primary pseudo-control vectors for the generation of commas also require a positive entry disparity (Table 15D of FIG. 68D: K7, K23, K39, K71) The equation for positive required disparity PDR can thus be written as shown in FIG. 78B.

The 4 pseudo-control characters may be governed by the higher level protocol which may set the respective K-value to 1, or it may be governed by an encoding circuit which automatically sets the K-value to 1 for vectors which follow the leading part of a comma. In the second case, 'K' in the last coding label of Table 18B is replaced by 'C126', which assumes a value of one if it is preceded by the C126 vector for concatenated 8B vectors, or K is replaced by 'C508' which likewise assumes a value of one if preceded by the C508 vector of the 9B10B code in the 16B18B application.

b) Negative Required Disparity for Encoding NDR, Table 19

A total of 22 vectors listed in Table 19 of FIG. 79 require a negative entry disparity 18 belong to the class DC4c' of FIG. 63, 3 to the class FV3u of FIG. 66(R), and the vector BU4c is shown in FIG. 62. The coding label for C126 can be verified by an examination of the bottom 11 rows of Table 15D of FIG. 68D. The equation for negative required disparity NDR can be written as shown in FIG. 79.

3) Equation for Complementation of the Primary Vector (CMPLP8)

The explanations given above for COMPL10 of the 9B10B code are applicable here as well.

$$CMPLP8 = PDR \cdot NRDF + NDR \cdot PRDF$$

4) Equations for Running Disparity RD (FIG. 31)

The explanations given above for the Running Disparity of the 9B10B code are applicable here as well.

$$CMPLFFP = DB2 \cdot RD1 + DB4$$

$$CMPLFFA = DB2 \cdot RD3 + DB4$$

a) DB4, Block Disparity of Four for Encoding

The set of three primary vectors FV3u with a positive block disparity of four is illustrated in FIG. 66(R) and the set of 15 primary vectors with a negative block disparity of four is illustrated in FIG. 64 and FIG. 66(L) and belongs to the coding class FI4m and FT3m4b, respectively. The 18 vectors are listed in Table 20 of FIG. 80 and grouped for easy implementation. The equation for DB4 in FIG. 80 is extracted from Table 20.

b) DB2, Block Disparity of Two for Encoding

A set of 18 primary vectors DC4c' illustrated in FIG. 63 has a positive block Disparity of two. A set of 30 primary vectors DM4u'4t' illustrated in FIG. 65 has a negative block disparity of two. The 48 vectors are listed and sorted for easy implementation in Table 21 of FIG. 81. The equation for DB2 in FIG. 82 is extracted from Table 21.

B. Logic Equations for 8B7B Decoder

Significant circuit simplifications are enabled if the outcome of the decoding process for invalid vectors is allowed to be arbitrary. This primarily refers to vectors with disparities other than ±4, ±2, or 0, and to vectors with violations of the leading or trailing run length limitations. The decoding process is also simplified because of the following features:

Full vector complementation to obtain the primary vector from an alternate vector can proceed in parallel with individual bit complementation because all 25 vectors which require individual bit changes are disparity independent and have no alternate version The code has been constructed so all 71 alternate vectors with the exception of K7 have a z-value of one. The only other vectors with a z-value of one are the 34 balanced, disparity independent vectors listed in Table 16 of FIG. 69 which have no alternate version.

All 25 vectors which require individual bit changes are balanced and have a z-value of one.

Decoding and validity checks are independent of each other and can proceed in parallel as illustrated in FIG. 3A.

Because of the simplicity of the decoding process, no decoding table is given. The skilled artisan, given the teachings herein, can readily refer to Table 15 of FIG. 68, Table 16 of FIG. 69, or Table 22 of FIG. 84 which list all 25 vectors which require individual bit changes Bits among the first seven encoded positions which must be complemented for decoding are marked in bold type.

1) Decoding Procedures

1. All vectors ending with z=0 are decoded by simply stripping bit z (except K7A; see item 4 below)

2. For all unbalanced vectors ending with z=1 and the vector 00001111 (D15A), the z-bit is dropped and the leading 7 bits are complemented to obtain the decoded vector.

3 For the 34 balanced vectors of Table 16 of FIG. 69 with z=1, the z-bit is dropped and 25 of these vectors, also listed in Table 22 of FIG. 84 require one to four individual bit changes in the leading 7 positions. For 7, 11, and 6 vectors 1, 2, and 3 bits are complemented, respectively A single vector requires 4 bit changes 4. The control bit K is recovered by special considerations and 4 alternate vectors associated with comma generation (K7A, K23A, K39A, K71A) follow a special rule for vector complementation.

2) Full Vector Complementation

A single image, the primary vector of each complementary pair of vectors is created by complementing the leading 7 bits of all alternate vectors. There are two categories of alternate vectors:

A first category of 67 alternate vectors is identified by a z-bit value of one and a bit pattern 'stuvwxy' other than associated with the 34 vectors illustrated in FIG. 67 and listed in Table 16 of FIG. 69. A set of equations for these vectors can be derived directly from FIG. 67. The first line in the equation CMPLA (Complement Alternate Vector) below represents the 18 vectors through node 4b, the second line represents the 12 vectors through node 4m, and the third line represents the 4 vectors through node 4u.

A second category of 4 alternate vectors listed above under "Comma Characters for concatenated 7B8B Coding Blocks and for 16B18B Code" is identified by its position contiguously following the vector C126, or C508 in the context of the 16B18B code, i.e. having one of the C126 or C508 vectors as a prefix, and having three leading zeros followed by a one and a single zero in the last four bit positions. This condition is identified in the equation for complementation below by the expression:

$$C126PREF \cdot (w \oplus x \cdot y \cdot z + y \oplus z \cdot w \cdot x) \cdot s' \cdot t' \cdot u' \cdot v.$$

The equation CMPLA for the complementation of alternate vectors can now be expressed by the equation of FIG. 83.

3) Individual Bit Complementation

Bit mapping from the primary coded vectors back to the source vectors is accomplished by dropping the z-bit and complementation of selected bits for a minority of 25 disparity independent vectors extracted from Table 16 of FIG. 69 and listed in Table 22 of FIG. 84. In Table 22 of FIG. 84, bit values in bold type must be complemented for decoding. Bit values in italic are either identical on several rows or complementary between the left and right side. Bit values in nonitalic type are equal on the left and right side if there is a 1 in the SY column. SY in this case stands for 'Symmetry', not the decoded bit values S and Y.

For the decoding of each bit, the vectors with a bold bit value for the bit column in question in Table 22 of FIG. 84 are extracted and arranged in groups with commonalities in new Tables 23S through 23Y of FIGS. 85 through 91. Explicit decoding equations are then derived from the set of coding labels. In the Tables 23S through 23Y, and 23K of FIG. 92, bit values in bold are complementary between the left and right side, and bit values in italic type are equal on the left and right side if there is a 1 in the SY column. The value of a bit position before decoding of that bit can be ignored because the same bit position of a vector which is complementary in that position and equal in all other positions is an alternate or invalid vector. Alternate vectors are complemented for decoding, as an example, D8=10010101 has the first bit complemented to 0, but the entire vector 00010101 (D87A) is complemented for decoding. However, for decoding classes which are applicable to several bits, the redundant bit is usually included to enable circuit sharing but underlined in the logic equations to indicate that it could be left out, e.g., to reduce delay in a critical path.

4) Logic Equations for 8B'7B Bit Mapping

Decoded Bit S

The 15 vectors which require complementation of the s-bit for decoding as indicated by a bold bit-value in the s-column of Table 22 of FIG. 84 are listed in Table 23S of FIG. 85. The S-bit decoding equation of FIG. 85 is derived from the coding labels of Table 23S.

Decoded Bit T

The 9 vectors which require complementation of the t-bit for decoding as indicated by a bold bit-value in the t-column of Table 22 of FIG. 84 are listed in Table 23T of FIG. 86. The T-bit decoding equation of FIG. 86 is derived from the coding labels of Table 23T. Because the value of bit t can be ignored, the expression $s \oplus t \cdot t \oplus u$ in the first row could be replaced by $s \oplus u'$, but the full expression is retained to allow circuit sharing with V-bit and W-bit decoding. The expression $s \oplus t' \cdot t \oplus x'$ in the second row could be replaced by $s \oplus x'$ and is also retained to allow circuit sharing with S-bit decoding.

Decoded Bit U

The 4 vectors which require complementation of the u-bit for decoding as indicated by a bold bit-value in the u-column of Table 22 of FIG. 84 are listed in Table 23U of FIG. 87. The U-bit decoding equation of FIG. 87 is derived from the coding labels of Table 23U of FIG. 87.

Decoded Bit V

The 7 vectors which require complementation of the v-bit for decoding as indicated by a bold bit-value in the v-column of Table 22 of FIG. 84 are listed in Table 23V of FIG. 88. The V-bit decoding equation of FIG. 88 is derived from the coding labels of Table 23V Because the value of bit v can be ignored, the expression $u \oplus \underline{v \cdot v} \oplus w'$ in the first row can be replaced by $u \oplus w$ but is retained to enable circuit sharing with w-bit decoding.

Decoded Bit W

The 6 vectors which require complementation of the w-bit for decoding as indicated by a bold bit-value in the w-column of Table 22 of FIG. 84 are listed in Table 23W of FIG. 89. The W-bit decoding equation of FIG. 89 is derived from the coding labels of Table 23W Because the value of bit w can be ignored, the expression $v \oplus w' \cdot w \oplus x$ in the first row could be replaced by $v \oplus x$ and the expression $v \oplus \underline{w \cdot w} \oplus x$ in the third row by $v \oplus x''$. The expression $v \oplus w' \cdot w \oplus x$ is retained to allow circuit sharing with bit v and $v \oplus \underline{w \cdot w} \oplus x$ is retained because $v \oplus x'$ would require an additional NOR gate.

Decoded Bit X

The 2 vectors which require complementation of the x-bit for decoding as indicated by a bold bit-value in the x-column of Table 22 of FIG. 84 are listed in Table 23X of FIG. 90. The W-bit decoding equation of FIG. 90 is derived from the coding labels of Table 23X.

Decoded Bit Y

The 8 vectors which require complementation of the y-bit for decoding as indicated by a bold bit-value in the y-column of Table 22 of FIG. 84 are listed in Table 23Y of FIG. 91. The Y-bit decoding equation of FIG. 91 is derived from the coding labels of Table 23Y.

Decoded Bit K

The 8 true control vectors with a decoded K-bit value of one are listed in Table 23K of FIG. 92. The first 7 bits of the vector C126A are complemented along with the unbalanced data vectors with a z-bit value of one The K-bit equation of FIG. 92 is derived from the coding labels of Table 23K.

C. Error Checking

1) Invalid 8B Vectors

The 8B alphabet of FIGS. 57A.1, 57A.2, 57B, 57C.1, and 57C.2 comprises 202 valid vector's, so there are a total of 54 invalid 8B vectors One invalid vector I255P ends with node 8*h* in FIG. 1(L), eight invalid vectors end with node 8*v*, ten with node 8*c*, and eight with node 8*u*. All complements of these 27 vectors are also invalid. All 54 invalid vectors are listed in Table 24 of FIG. 93 and the equation shown there for invalid 8B characters INVAL8 is derived from the coding labels listed in the table.

2) Disparity Checks on Decoding

The general comments given above for 10B disparity checks apply equally to 8B disparity checks.

3) Equations for Required Disparity on Decoding (DR)

a) Positive Required Disparity PDR

Any received vector with five or more zeros or a leading run of four zeros requires a positive entry disparity, regardless whether the vector is valid or not. The primary pseudo control characters K7P, K23P, K39P, and K71P with a C126 prefix (C126PREF) require also a positive entry disparity but this rule can be ignored for the general case because this vector position might at the user's choice be assigned to a data vector with the same bit pattern and no disparity dependence. The remaining vectors belong to one of the following three groups:

3 or 4 zeros in the leading 4 bit positions combined with 2 or more zeros in the last 4 positions.

2 or more zeros in the leading 4 bit positions combined with 3 or 4 zeros in the last 4 positions.

4 leading zeros

The equation for positive required disparity PDR can thus be written as shown in FIG. 94.

b) Negative Required Disparity NDR Any received vector with five or more ones or a leading run of four ones requires a negative entry disparity, regardless whether the vector is valid or not. The alternate pseudo control characters K7A, K23A, K39A, and K71A with a C126 prefix also require a negative entry disparity and can be ignored for the same reason given for PDR above The remaining vectors belong to one of the following three groups:

3 or 4 ones in the leading 4 bit positions combined with 2 or more ones in the last 4 positions 2 or more ones in the leading 4 bit positions combined with 3 or 4 ones in the last 4 positions.

4 leading ones

The equation for negative required disparity NDR can thus be written as shown in FIG. 94.

4) Equations for Running Disparity on Decoding (RD)

The equations for PRD, NRD, RD1, and RD3 expressed by the block disparities are the same as for the 9B10B code except that the 7B8B code has a single disparity dependent balanced vector pair D15. The primary version D15P has a required negative entry disparity and does not change the running disparity and the alternate version D15A requires a positive entry disparity.

5) Equations for Block Disparity (BD)

For the block disparity, invalid vectors are considered as well Vectors with more than six ones or zeros are lumped together with vectors of a disparity of four. Any vector other than D15P or D15A with four leading ones or zeros is invalid. If such a vector is received, it is assumed for classification purposes that originally there were only three ones or three zeros, respectively. Similarly, any vector with five trailing ones or zeros is invalid Therefore, for vectors with four trailing ones or zeros, it is assumed that the preceding bit 'v' has a complementary value.

a) Positive Block Disparity of Four PBD4

All vectors with six ore more bits with a value of one are part of this set. These vectors end with nodes 8*h*, 8*v*, or 8*c* in the trellis of FIG. 1(L). The vectors belong to one of the following two groups:

3 or 4 ones in the leading 4 bit positions combined with 3 or 4 ones in the trailing 4 positions 2 or more ones in the leading 4 bit positions combined with 4 ones in the trailing 4 positions.

Note that a vector with 4 leading ones followed by anything other than 4 trailing zeros is invalid.

b) Positive Block Disparity of Two PBD2

This set includes all vectors with exactly 5 ones ending with node 8*u* in FIG. 1. The vectors belong to one of the following three groups:

3 or 4 ones in the leading 4 bit positions combined with 2 ones and 2 zeros in the trailing 4 positions Four leading ones combined with the specified tail are assumed to have been generated by an error from 3 ones in the leading 4 positions 2 ones and 2 zeros in the leading 4 bit positions combined with 3 ones and 1 zero in the trailing 4 positions.

c) Negative Block Disparity of Two NBD2

This includes all vectors with exactly 5 zeros ending with node 8*m* in FIG. 1. The vectors belong to one of the following three groups:

3 or 4 zeros in the leading 4 bit positions combined with 2 ones and 2 zeros in the trailing 4 positions. Four leading zeros combined with the specified tail are assumed to have been generated by an error from 3 zeros in the leading 4 positions 2 ones and 2 zeros in the leading 4 bit positions combined with 1 one and 3 zeros in the trailing 4 positions.

d) Negative Block Disparity of Four NBD4

All vectors with six ore more bits with a value of zero are part of this set. These vectors end with nodes 8*s*, 8*q*, or 8*t* in the trellis of FIG. 1. The vectors belong to one of the following two groups:

3 or 4 zeros in the leading 4 bit positions combined with 3 or 4 zeros in the trailing 4 positions 2 or more zeros in the leading 4 bit positions combined with 4 zeros in the trailing 4 positions.

Note that a vector with 4 leading zeros followed by anything other than 4 trailing ones is invalid. The equations for the block disparities PBD4, PBD2, NPD2, and NBD4 are shown in FIG. 95. For some of the above equations, the number of logic levels can be reduced at the cost of extra gates by merging the vector sets used for the definition of the expressions, e.g. for (PBD2+NBD2), for (PBD2+D15A), and for (NBD2+D15P).

7B8B CIRCUIT IMPLEMENTATION

A. 7B8B Encoding

1) Block Diagram for Encoding

Figure 96:
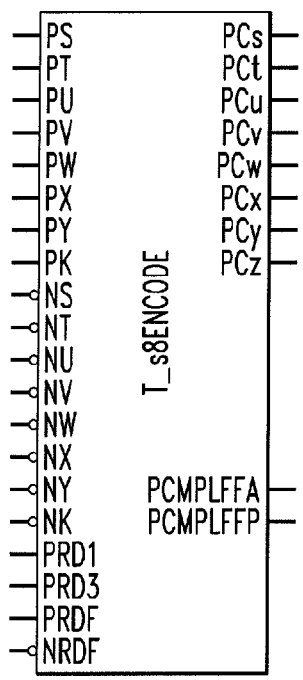
FIG. 96 shows a block diagram of a specific exemplary circuit for 7B8B encoding, according to an aspect of the invention.

The block diagram for the 7B8B encoding circuit with all inputs and outputs is shown in FIG. 96. The output PCM-PLFFA complements the arithmetic flip-flop described above under Disparity Control The outputs of flip-flop "A" are the PRD1 and PRD3 inputs for the next cycle. The output PCM-PLFFP complements the polarity flip-flop, the outputs of which are the inputs PRDF and NRDF for the next clock cycle.

2) Gate Level Circuit Diagram for Encoding

Figure 97A:
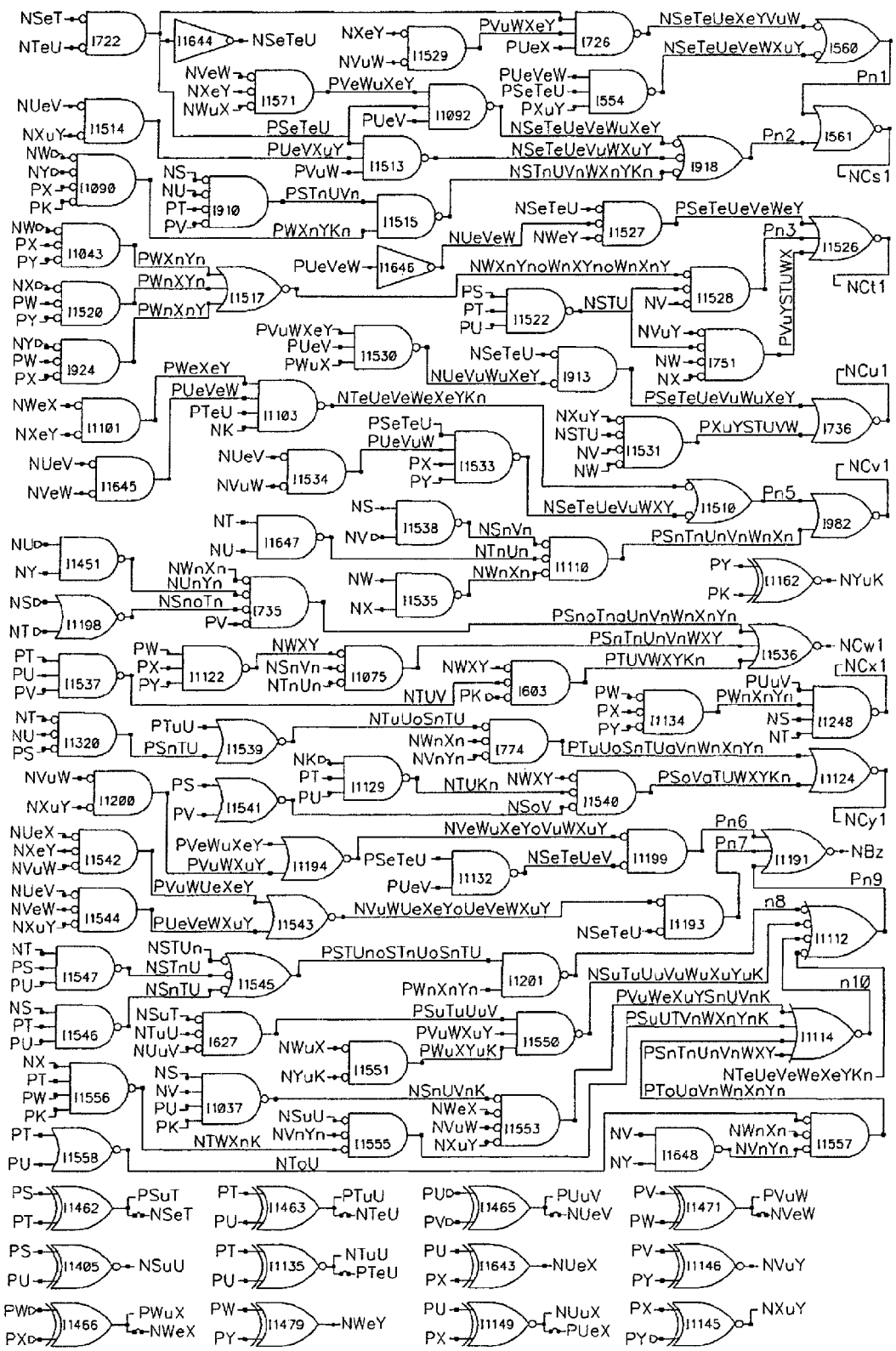
FIGS. 97A and 97B show gate level circuit diagrams of the circuit of FIG. 96.
Figure 97B:
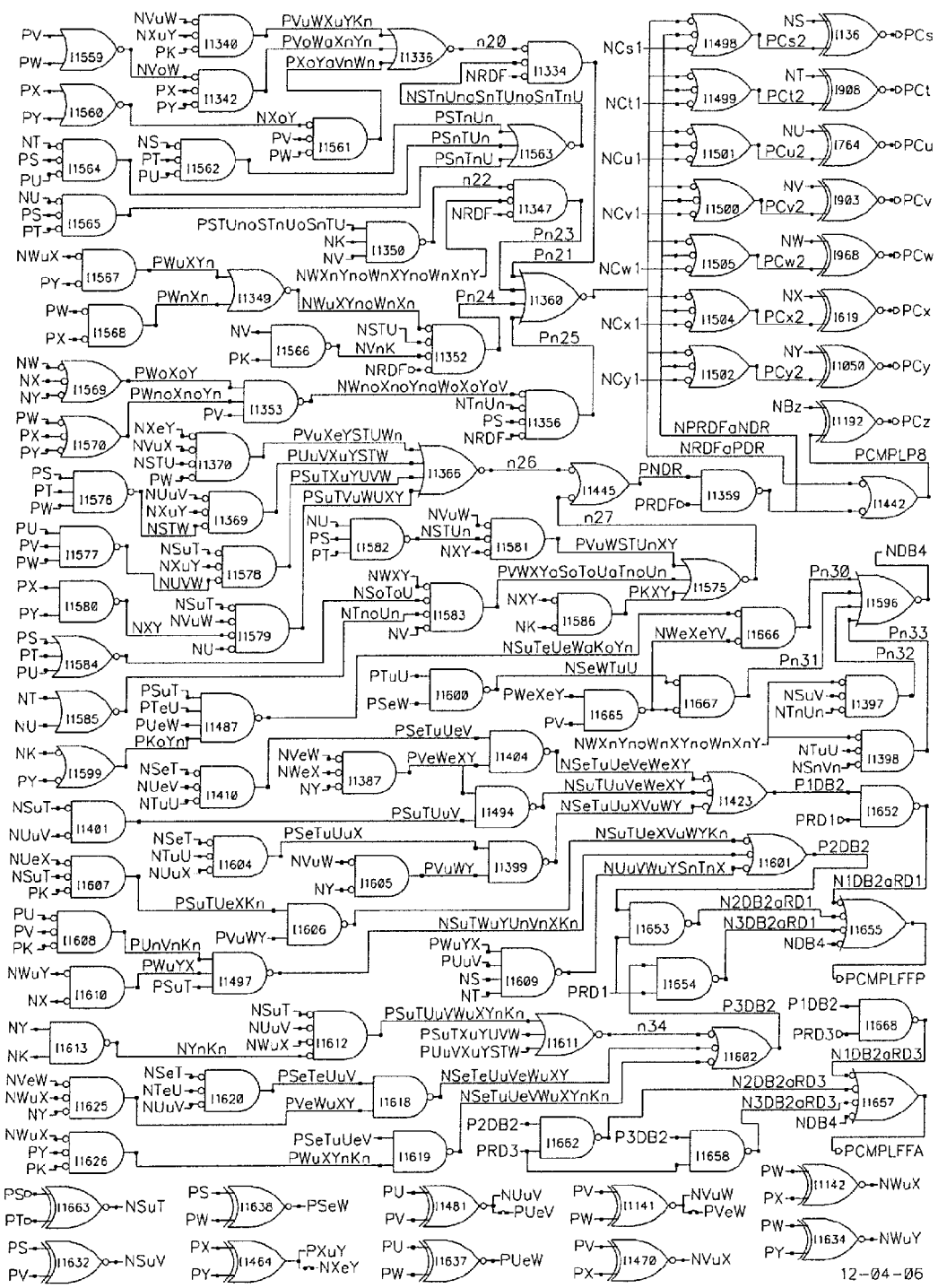

A gate-level circuit diagram of the encoder is shown in FIGS. 97A and 97B which represent a single circuit with net sharing FIG. 97A shows the circuit required for bit encoding and FIG. 97B shows the disparity control circuit without the two flip-flops which keep track of the running disparity. The upper right side of FIG. 97B shows the last two gate levels for bit encoding performing selective bit (NCx1, where x=s, t, u v, w, x, y, or z) or full vector NPRDFaNDR, NRDFaNDR) complementation. Selective bit and full vector complementation are orthogonal functions, i.e. no individual bits are changed when a full vector is complemented and vice-versa. This feature of the code allows the merger of both types of signals in a single OR function.

As pointed out above, a shorter delay was generally preferred over minor additions to area. As an example, in the logic paths for the signals PCMPLFFP and PCMPLFFA neat the lower right corner of FIG. 97B, three parallel NAND2 gates replace a single gate to eliminate one OR gating level in each path to reduce the logic depth to 6 levels. Shorter paths for these two signals are desirable because they each control a complementing flip-flop with a MUX input which adds to the setup time. As a result, the total delay conforms to the limit of 7 levels in all other parts of the codec.

3) Gate Count, Circuit Delays and Pipelining for Encoding

The encoder comprises 203 gates and two flip-flops (not shown) to keep track of the disparity. No logic path exceeds 7 gates. All gates are of the inverting type with shorter delay except some XOR gates which for most power and loading levels have comparable or only slightly more delay than XNOR gates.

The circuit presented has been structured for easy forward pipelining for fast operation at the cost of a few extra gates If a first encoding step is limited to six logic levels the 8 trailing EXCLUSIVE OR functions for the coded bits can be moved into a second cycle. The first encoding step can be reduced to five gating levels, if the OR functions immediately before the XOR and the last gate in the PCMPLFFP and PCMPLFFA path are also moved to a second step. A reduction to four gating levels in the first step requires additionally:

Minor modifications in the leading segments of the t, u, v, w, and PDB4 paths.

Moving the NOR gates driving NCs1 and NCT1 at the top right side of FIG. 97A into the second cycle.

Moving the trailing gates driving NPRDFaNDR, NRDFaPDR into the second step.

Moving the trailing two gating levels for PCMPLFFA and PCMPLFFP into the second step.

A further delay reduction can be accomplished by itself or in combination with any of the above versions by minor circuit modifications and moving the leading EXCLUSIVE OR functions into the preceding clock cycle in the data source path.

B. 8B7B Decoding

1) Block Diagram for 8B7B Decoding

Figure 98:
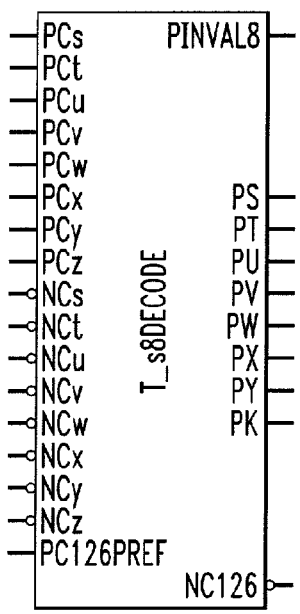
FIG. 98 shows a block diagram of a specific exemplary circuit for 7B8B decoding, according to an aspect of the invention.
Figure 99A:
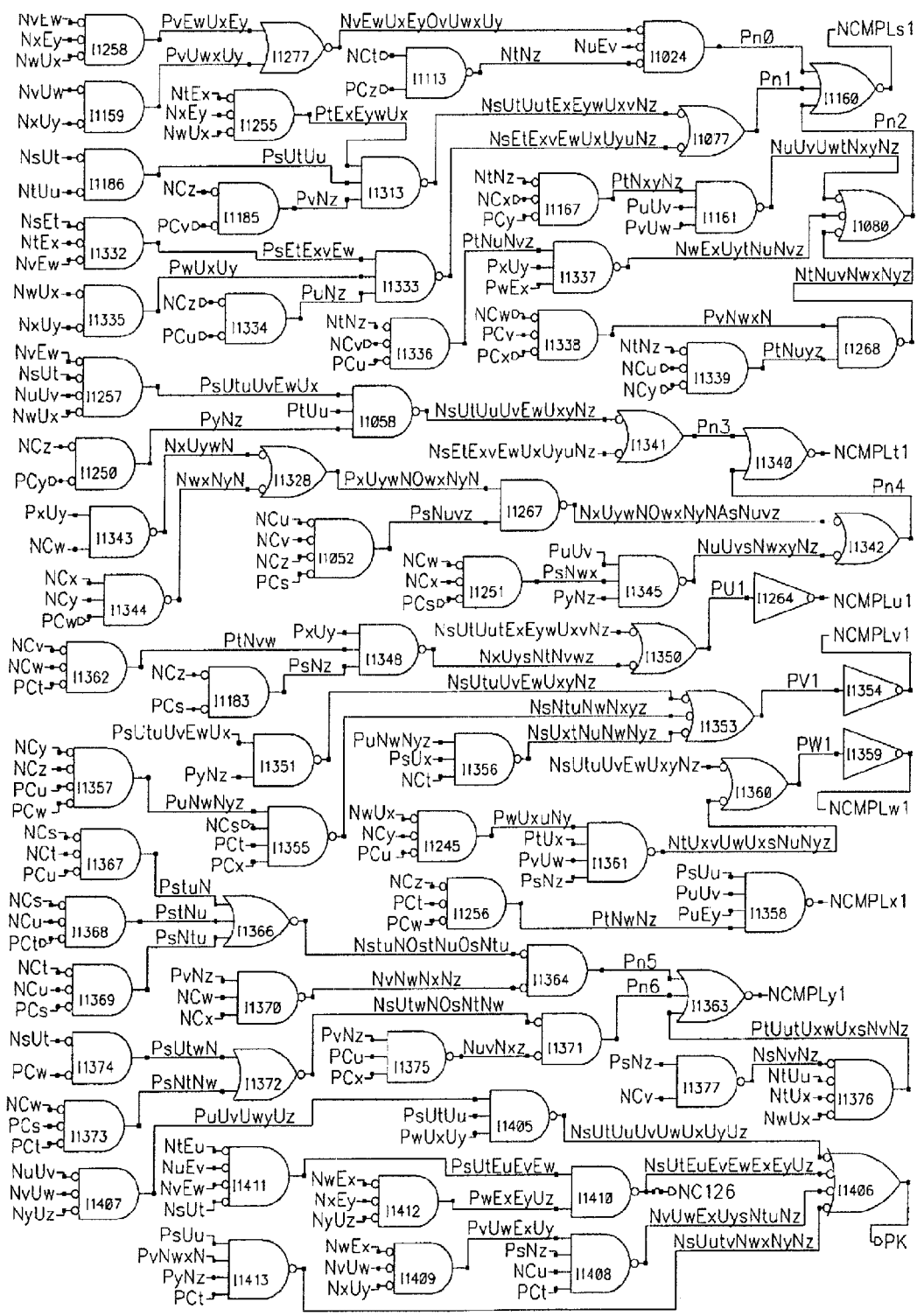
FIGS. 99A and 99B show gate level circuit diagrams of the circuit of FIG. 98.
Figure 99B:
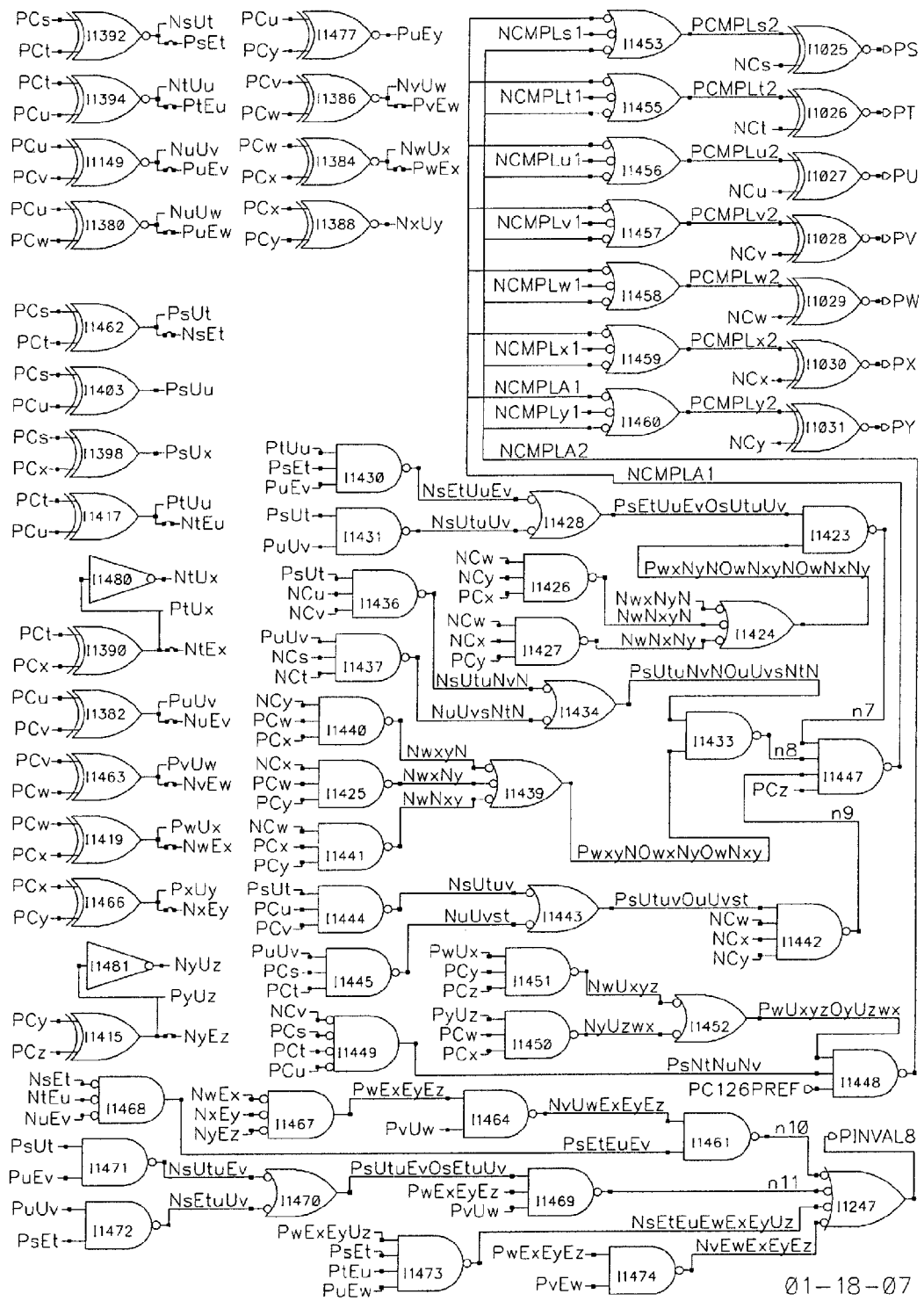

The block diagram for the 8B7B decoding circuit with all inputs and outputs is shown in FIG. 98. A gate-level circuit diagram of the decoder and the validity checks according to the equations derived above is shown in FIGS. 99A and 99B which represent a single circuit with net sharing. The comments given with respect to the encoding circuits generally are applicable for the decoding circuits as well.

2)_Gate Level Circuit Diagram for Decoding

FIG. 99A shows the leading sections of the circuits for individual bit decoding (STUVWXYK) FIG. 99B shows the last two gating levels for bit decoding at the top right side These circuits perform individual bit complementation (NCMPL*1, *=s, t, U, v, w, x, or y) or alternate vector complementation (NCMPLA1, NCMPLA2) which are all orthogonal as explained above under encoding. The bottom of FIG. 99B shows the vector validity check No circuits are shown for disparity monitoring. The shared EXCLUSIVE OR functions of both decoding diagrams are shown on the left side. Again, inverters can be substituted for some of these gates depending on speed requirements. The signal CMPLA8 is not present explicitly in the circuit diagram but is represented by the 2 signals NCMPL8$a$ and NCMPL8$b$ in the decoder circuit of FIG. 99B.

3) Gate Count, Circuit Delays and Pipelining for Decoding

The decoder comprises 145 gates. No logic path exceeds seven gates, all of the inverting type except some XOR gates. The INVAL8 path is five gating levels, and the PK path is four gating levels. For fast operation, the circuit presented has been structured for easy forward pipelining at the cost of a few extra gates similar to the encoding circuit

ADDITIONAL COMMENTS

It will appreciated that one or more embodiments of the invention may afford a hardware implementation using combinational logic for the encoding and decoding circuits and the validity check of dc-balanced 9B10B and 7B8B transmission line codes (such codes build on those described in U.S. Pat. No. 6,614,369). The exemplary encoder and decoder circuits for the 9B10B and 7B8B codes require seven logic levels and can operate at a late comparable to the best implementations of the well known and widely used partitioned 8B10B code. The number of required gates is far lower than one would expect. Normalized to the number of source bits encoded, the 7B8B code requires about twice and the 9B10B code about 3 times the number of gates for 8B10B code.

Both codes can be used as a stand alone code or as a component of the 16B18B code of U.S. Pat. No. 6,198,413. They are also compatible with the 8B10B code, its 5B6B and 3B4B components, and the 1B2B Manchester codes. For a better fit for these other applications, the codes of U.S. Pat. No. 6,198,413 and U.S. Pat. No. 6,614,369 have been modified, in accordance with certain techniques of the invention, with minimal added complexity to enable a more flexible set of control and comma sequences. In the exemplary embodiment, no encoded data vector consists of a string of all alternating ones and zeros which limits the recovery time from an error for systems using differential encoding with decision feedback equalization (DFE). These changes are also applicable for the 16B18B code, so a single set of 78B and 9B10B macros can be built for all applications.

The modifications allow also a much more efficient circuit implementation with less latency The new encoder and decoder circuits for the 9B10B and the 7B8B code can be built with a total of 655 (9B10B) and 348 (7B8B) inverting type primitive logic gates, arranged in logic paths at most seven deep. The circuits have been structured so pipelining can be used with modest overhead to reduce the logic depth to 6, 5, 4, or even 3 per stage. For some applications, especially in the very high speed transceiver domain, clock rate ratios which are a power of two are sometimes preferred and the 7B8B code is naturally compatible with such clock systems. A particular attractive application of the full code or the components is for very high speed busses to save lines, in combination with techniques of U.S. Pat. No. 6,496,540, which shows how to avoid an increase in the line baud rate due to coding and how to eliminate clock gear boxes and extra clock domains or limit them to integer ratios by adding extra lines to compensate for the loss of throughput resulting from the code redundancy.

The tables and equations herein have been manually checked. Should any programmed computer checks subsequently reveal any errors, it should be noted that the basic coding principles are sound and detail errors can be corrected by the skilled artisan with the teachings of the present specification at hand. A user may also want to make minor modifications for a better match for a specific application.

For both the 7B8B and the 9B10B code, different assignments of the source vectors to the same set of encoded vectors can be chosen with no material effect on performance and implementation complexity. One such alternate code would simply chose a value of one as the default value for the binary appended symbol and the complements of the source vectors chosen for the description above In addition, a mix of identical assignments and alternate complementary assignments is possible It is fully intended to encompass such variations within the inventive scope.

The techniques set forth herein can be carried out, for example, via circuits realized on an integrated circuit chip. The chip design can be created, e.g., in a graphical computer programming language, and stored in a computer storage medium (such as a disk, tape, physical hard drive, or virtual hard drive such as in a storage area network) If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design can then be converted into an appropriate format such as, for example, Graphic Design System II (GD-SII), for the fabrication of photolithographic masks, which typically include multiple copies of the chip design in question that are to be formed on a wafer. The photolithographic masks can be utilized to define areas of the wafer (and/or the layers thereon) to be etched or otherwise processed.

Resulting integrated circuit chips can be distributed by the fabricator in raw wafer form (that is, as a single wafer that has multiple unpackaged chips), as a bare die or in a packaged form. In the latter case, the chip can be mounted in a single chip package (such as a plastic carrier, with leads that are affixed to a mother board or other higher level carrier) or in a multi-chip package (such as a ceramic carrier that has either or both surface interconnections or buried interconnections). In any case, the chip may then be integrated with other chips, discrete circuit elements and/or other signal processing devices as part of either (a) an intermediate product, such as a mother board, or (b) an end product. The end product can be any product that employs coded communications.

Figure 100:
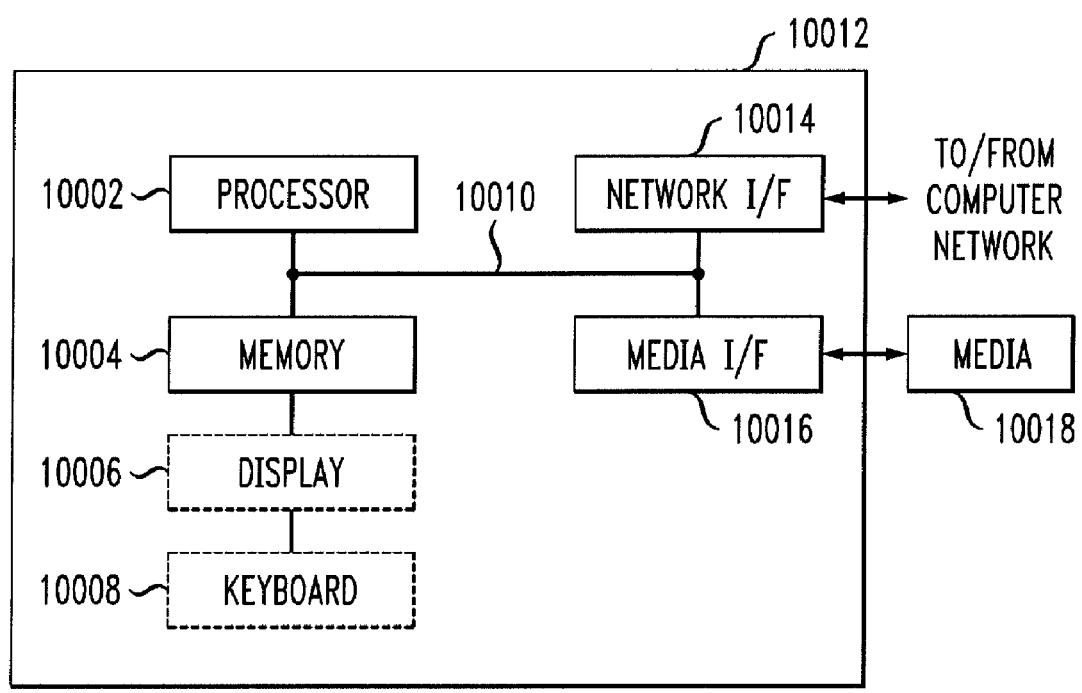
FIG. 100 is a system diagram of an exemplary computer system on which one or more embodiments of the present invention can be implemented.

A variety of techniques utilizing dedicated hardware, general purpose processors, firmware, software, or a combination of the foregoing may be employed to implement the present invention, in addition to the preferred implementation in hardware using logic gates. With reference to FIG. 100, such alternate implementations might employ, for example, a processor 10002, a memory 10004, and an input/output interface formed, for example, by a display 10006 and a keyboard 10008. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory), ROM (read only memory), a fixed memory device (e.g., hard drive), a removable memory device (e.g., diskette), a flash memory and the like In addition, the phrase "input/output interface" as used herein, is intended to include, for example, one or more mechanisms for inputting data to the processing unit (e.g., mouse), and one or more mechanisms for providing results associated with the processing unit (e.g., printer). The processor 10002, memory 10004, and input/output interface such as display 10006 and keyboard 10008 can be interconnected, for example, via bus 10010 as part of a data processing unit 10012. Suitable interconnections, for example via bus 10010, can also be provided to a network interface 10014, such as a network card, which can be provided to interface with a computer network, and to a media interface 10016, such as a diskette or CD-ROM drive, which can be provided to interface with medium 10018.

Accordingly, computer software including instructions or code for performing the methodologies of the invention, as described herein, may be stored in one or more of the associated memory devices (e.g., ROM, fixed or removable memory) and, when ready to be utilized, loaded in part or in whole (e.g., into RAM) and executed by a CPU Such software could include, but is not limited to, firmware, resident software, microcode, and the like Note that implementations of one or more embodiments of the present invention involving software may take advantage of the potential for parallelism described above to employ, for example, a vectorized or parallelized solution.

Furthermore, the invention can take the form of a computer program product accessible from a computer-usable or computer-readable medium (e.g., medium 10018) providing program code for use by or in connection with a computer or any instruction execution system For the purposes of this description, a computer usable or computer readable medium can be any apparatus for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid-state memory (e g memory 10004), magnetic tape, a removable computer diskette (e.g. medium 10018), a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor 10002 coupled directly or indirectly to memory elements 10004 through a system bus 10010. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards 10008, displays 10006, pointing devices, and the like) can be coupled to the system either directly (such as via bus 10010) or through intervening I/O controllers (omitted for clarity).

Network adapters such as network interface 10014 may also be coupled to the system to enable the data processing system to become coupled to other data processing systems or remote printers or storage devices through intervening private or public networks. Modems, cable modem and Ethernet cards are just a few of the currently available types of network adapters.

In any case, it should be understood that the components illustrated herein may be implemented in various forms of hardware, software, or combinations thereof, e.g., application specific integrated circuit(s) (ASICS), functional circuitry, one or more appropriately programmed general purpose digital computers with associated memory, one or more programmable logic arrays (PLAs), combinational logic as described herein, and the like. Given the teachings of the invention provided herein, one of ordinary skill in the related art will be able to contemplate other implementations of the components of the invention. It should of course be noted that an encoding scheme can be implemented via a look-up table.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. An encoder for encoding 9-binary symbol (9B) source vectors into 10-binary symbol (10B) encoded vectors, said encoder comprising circuitry configured to encode said 9B source vectors into a plurality of 10B encoded vectors according to an encoding scheme, said 10B encoded vectors comprising at least 10B encoded data vectors, said encoding scheme mapping at least a first portion of said 9B source vectors into 10B encoded data vectors comprising disparity independent encoded vectors, said encoding scheme mapping at least a second portion of said 9B source vectors into 10B encoded data vectors comprising disparity dependent encoded vectors having primary representations and alternate representations complementary to said primary representations, said 10B encoded data vectors having one binary symbol appended thereto by said encoding scheme;

wherein a fraction of said 10B encoded data vectors have binary symbol changes, other than whole-vector complementation, compared to corresponding ones of said 9B source vectors, said fraction not including any of said disparity dependent encoded representations.

2. The encoder of claim 1, wherein:

said fraction of said 10B encoded vectors comprises said disparity independent encoded vectors, said disparity independent encoded vectors being dc-balanced and having no alternate representations; and none of said encoded data vectors comprise exclusively alternating ones and zeroes.

3. The encoder of claim 2, wherein:

said 9B source vectors comprise 9B source data vectors and at least one 9B source control vector;

said encoding scheme further maps said at least one 9B source control vector into at least one 10B encoded control vector; and at least some of said second portion of said 9B source vectors that are mapped into 10B encoded data vectors comprising disparity dependent encoded vectors having primary representations and alternate representations complementary to said primary representations are mapped to dc-balanced 10B encoded data vectors.

4. The encoder of claim 3, wherein:

said first portion of said 9B source vectors is mapped into 10B encoded vectors comprising a set of 116 disparity independent encoded vectors which does not require any bit changes during encoding; and said first portion of said 9B source vectors comprises source vectors having:
a disparity of +1,
a leading run-length no greater than 3,
no more than 2 trailing zeros in the case of those of said source vectors having trailing zeroes, and
no more than 4 trailing ones in the case of those of said source vectors having trailing ones,
said source vectors of said first portion being appended during encoding with a single binary symbol with a value of zero, 115 of said 116 disparity independent encoded vectors comprising said encoded data vectors and a remaining one of said 116 disparity independent encoded vectors, comprising alternating ones and zeros, being defined as said encoded control vector.

5. The encoder of claim 3, wherein:

said first portion of said 9B source vectors is mapped into 10B encoded vectors comprising a set of 116 disparity independent encoded vectors, a fraction of said 116 disparity independent encoded vectors requiring individual bit changes during encoding; and said set of 116 encoded vectors comprises vectors having:
nine leading binary symbols with a disparity of −1,
a leading run-length no greater than 3,
no more than 2 trailing ones in the case of those of said source vectors having trailing ones,
no more than 4 trailing zeros in the case of those of said source vectors having trailing zeroes,
said first portion of said 9B source vectors becoming a 9B set, said 9B set being appended with a single binary symbol with a value of one when being encoded to obtain said 116 encoded vectors; 115 of said 116 disparity independent encoded vectors comprising said encoded data vectors and a remaining one of said 116 disparity independent encoded vectors, comprising alternating ones and zeros, being defined as said encoded control vector.

6. The encoder of claim 3, wherein:

said first portion of said 9B source vectors is mapped into 10B encoded vectors comprising a set of 116 disparity independent encoded vectors which does not require any bit changes during encoding; and said first portion of said 9B source vectors comprises source vectors having:
a disparity of −1,
a leading run-length no greater than 3,
no more than 2 trailing ones in the case of those of said source vectors having trailing ones, and
no more than 4 trailing zeroes in the case of those of said source vectors having trailing zeroes,
said source vectors of said first portion being appended during encoding with a single binary symbol with a value of one, 115 of said 116 disparity independent encoded vectors comprising said encoded data vectors and a remaining one of said 116 disparity independent encoded vectors, comprising alternating zeroes and ones, being defined as said encoded control vector.

7. The encoder of claim 3, wherein:

said first portion of said 9B source vectors is mapped into 10B encoded vectors comprising a set of 116 disparity independent encoded vectors, a fraction of said 116 disparity independent encoded vectors requiring individual bit changes during encoding; and said set of 116 encoded vectors comprises vectors having:
nine leading binary symbols with a disparity of +1,
a leading run-length no greater than 3,
no more than 2 trailing zeroes in the case of those of said source vectors having trailing zeroes,
no more than 4 trailing ones in the case of those of said source vectors having trailing ones,
said first portion of said 9B source vectors becoming a 9B set, said 9B set being appended with a single binary symbol with a value of zero when being encoded to obtain said 116 encoded vectors; 115 of said 116 disparity independent encoded vectors comprising said encoded data vectors and a remaining one of said 116 disparity independent encoded vectors, comprising alternating zeroes and ones, being defined as said encoded control vector.

8. A decoder for decoding 10-binary symbol (10B) encoded vectors into decoded 9-binary symbol (9B) source vectors, said decoder comprising circuitry configured to decode said 10B encoded vectors into 9B source vectors according to decoding rules of an encoding scheme, said 10B encoded vectors having been encoded from a plurality of 9B source vectors according to said encoding scheme, said 10B encoded vectors comprising at least 10B encoded data vectors, said encoding scheme mapping at least a first portion of said 9B source vectors into 10B encoded data vectors comprising disparity independent encoded vectors, said encoding scheme mapping at least a second portion of said 9B source vectors into 10B encoded data vectors comprising disparity dependent encoded vectors having primary representations and alternate representations complementary to said primary representations, said 10B encoded data vectors having one binary symbol appended thereto by said encoding scheme;

wherein a fraction of said 10B encoded data vectors have binary symbol changes, other than whole-vector complementation, compared to corresponding ones of said 9B source vectors, said fraction not including any of said disparity dependent encoded representations.

9. The decoder of claim 8, wherein:
said fraction of said 10B encoded vectors comprises said disparity independent encoded vectors, said disparity independent encoded vectors being dc-balanced and having no alternate representations; and
none of said encoded data vectors comprise exclusively alternating ones and zeroes.

10. The decoder of claim 9, further comprising circuitry configured to check said plurality of 10B encoded vectors for selected ones of said encoded vectors that are not balanced and that end with a predetermined binary symbol, said predetermined binary symbol comprising a "one" in a primary implementation of said encoding scheme, said predetermined binary symbol comprising a "zero" in a complementary implementation of said encoding scheme, wherein said decoding comprises at least automatically complementing said selected ones of said encoded vectors.

11. An encoder for encoding 7-binary symbol (7B) source vectors into 8-binary symbol (8B) encoded vectors, said encoder circuitry configured to encode said 7B source vectors into a plurality of 8B encoded vectors according to an encoding scheme, said 8B encoded vectors comprising at least 8B encoded data vectors, said encoding scheme mapping at least a first portion of said 7B source vectors into 8B encoded data vectors comprising disparity independent encoded vectors, said encoding scheme mapping at least a second portion of said 7B source vectors into 8B encoded data vectors comprising disparity dependent encoded vectors having primary representations and alternate representations complementary to said primary representations, said 8B encoded data vectors having one binary symbol appended thereto by said encoding scheme;

wherein a fraction of said 8B encoded data vectors have binary symbol changes, other than whole-vector complementation, compared to corresponding ones of said 7B source vectors, said fraction not including any of said disparity dependent encoded representations.

12. The encoder of claim 11, wherein:
said fraction of said 8B encoded vectors comprises said disparity independent encoded vectors, said disparity independent encoded vectors being dc-balanced and having no alternate representations; and
none of said encoded data vectors comprise exclusively alternating ones and zeroes.

13. The encoder of claim 12, wherein:
said 7B source vectors comprise 7B source data vectors and at least one 7B source control vector;
said encoding scheme further maps said at least one 7B source control vector into at least one 8B encoded control vector; and
at least some of said second portion of said 7B source vectors that are mapped into 8B encoded data vectors comprising disparity dependent encoded vectors having primary representations and alternate representations complementary to said primary representations are mapped to dc-balanced 8B encoded data vectors.

14. The encoder of claim 13, wherein:
said first portion of said 7B source vectors is mapped into 8B encoded vectors comprising a set of 34 disparity independent encoded vectors which does not require any bit changes during encoding; and
said first portion of said 7B source vectors comprises source vectors having:
a disparity of +1,
a leading run-length no greater than 3,
no more than 2 trailing zeros in the case of those of said source vectors having trailing zeroes, and
no more than 4 trailing ones in the case of those of said source vectors having trailing ones,
said source vectors of said first portion being appended during encoding with a single binary symbol with a value of zero, 33 of said 34 disparity independent encoded vectors comprising said encoded data vectors and a remaining one of said 34 disparity independent encoded vectors, comprising alternating ones and zeros, being defined as said encoded control vector.

15. The encoder of claim 13, wherein:
said first portion of said 7B source vectors is mapped into 8B encoded vectors comprising a set of 34 disparity independent encoded vectors, a fraction of said 34 disparity independent encoded vectors requiring individual bit changes during encoding; and
said set of 34 encoded vectors comprises vectors having seven leading binary symbols with a disparity of −1, having:
a leading run-length no greater than 3,
no more than 2 trailing ones in the case of those of said source vectors having trailing ones, and
no more than 4 trailing zeros in the case of those of said source vectors having trailing zeroes,
said first portion of said 7B source vectors becoming a 7B set, said 7B set being appended with a single binary symbol with a value of one when being encoded to obtain said 34 encoded vectors, 33 of said 34 encoded vectors comprising said encoded data vectors and a remaining one of said 34 disparity independent encoded vectors, comprising alternating ones and zeros, being defined as said encoded control vector.

16. The encoder of claim 13, wherein:
said first portion of said 7B source vectors is mapped into 8B encoded vectors comprising a set of 34 disparity independent encoded vectors which does not require any bit changes during encoding; and
said first portion of said 7B source vectors comprises source vectors having:
a disparity of −1,
a leading run-length no greater than 3, no more than 2 trailing ones in the case of those of said source vectors having trailing ones, and no more than 4 trailing zeroes in the case of those of said source vectors having trailing zeroes, said source vectors of said first portion being appended during encoding with a single binary symbol with a value of one, 33 of said 34 disparity independent encoded vectors comprising said encoded data vectors and a remaining one of said 34 disparity independent encoded vectors, comprising alternating zeroes and ones, being defined as said encoded control vector.

17. The encoder of claim 13, wherein:

said first portion of said 7B source vectors is mapped into 8B encoded vectors comprising a set of 34 disparity independent encoded vectors, a fraction of said 34 disparity independent encoded vectors requiring individual bit changes during encoding; and said set of 34 encoded vectors comprises vectors having seven leading binary symbols with a disparity of +1, having:

a leading run-length no greater than 3, no more than 2 trailing zeroes in the case of those of said source vectors having trailing zeroes, and no more than 4 trailing ones in the case of those of said source vectors having trailing ones, said first portion of said 7B source vectors becoming a 7B set, said 7B set being appended with a single binary symbol with a value of zero when being encoded to obtain said 34 encoded vectors, 33 of said 34 encoded vectors comprising said encoded data vectors and a remaining one of said 34 disparity independent encoded vectors, comprising alternating zeroes and ones, being defined as said encoded control vector.

18. A decoder for decoding 8-binary symbol (8B) encoded vectors into decoded 7-binary symbol (7B) source vectors, said decoder comprising circuitry configured to decode said 8B encoded vectors into 7B source vectors according to decoding rules of an encoding scheme, said 8B encoded vectors having been encoded from a plurality of 7B source vectors according to said encoding scheme, said 8B encoded vectors comprising at least 8B encoded data vectors, said encoding scheme mapping at least a first portion of said 7B source vectors into 8B encoded data vectors comprising disparity independent encoded vectors, said encoding scheme mapping at least a second portion of said 7B source vectors into 8B encoded data vectors comprising disparity dependent encoded vectors having primary representations and alternate representations complementary to said primary representations, said 8B encoded data vectors having one binary symbol appended thereto by said encoding scheme;

wherein a fraction of said 8B encoded data vectors have binary symbol changes, other than whole-vector complementation, compared to corresponding ones of said 7B source vectors, said fraction not including any of said disparity dependent encoded representations.

19. The decoder of claim 18, wherein:

said fraction of said 8B encoded vectors comprises said disparity independent encoded vectors, said disparity independent encoded vectors being dc-balanced and having no alternate representations; and none of said encoded data vectors comprise exclusively alternating ones and zeroes.

20. The decoder of claim 19, further comprising circuitry configured to check said plurality of 8B encoded vectors for selected ones of said encoded vectors that are not balanced and that end with a predetermined binary symbol, said predetermined binary symbol comprising a "one" in a primary implementation of said encoding scheme, said predetermined binary symbol comprising a "zero" in a complementary implementation of said encoding scheme, wherein said decoding comprises at least automatically complementing said selected ones of said encoded vectors.

21. A computer program product comprising a tangible computer readable recordable storage medium including computer usable program code for encoding 9-binary binary symbol (9B) source vectors into 10-binary symbol (10B) encoded vectors, said computer program product including:

computer usable program code, operable in connection with a network interface, for obtaining a plurality of 9B source vectors; and computer usable program code, executable by at least one hardware processor, for encoding said 9B source vectors into a plurality of 10B encoded vectors according to an encoding scheme, said 10B encoded vectors comprising at least 10B encoded data vectors, said encoding scheme mapping at least a first portion of said 9B source vectors into 10B encoded data vectors comprising disparity independent encoded vectors, said encoding scheme mapping at least a second portion of said 9B source vectors into 10B encoded data vectors comprising disparity dependent encoded vectors having primary representations and alternate representations complementary to said primary representations, said 10B encoded data vectors having one binary symbol appended thereto by said encoding scheme;

wherein a fraction of said 10B encoded data vectors have binary symbol changes, other than whole-vector complementation, compared to corresponding ones of said 9B source vectors, said fraction not including any of said disparity dependent encoded representations.

22. A computer program product comprising tangible computer readable recordable storage medium including computer usable program code for decoding 10-binary symbol (10B) encoded vectors into decoded 9-binary symbol (9B) source vectors, said computer program product including:

computer usable program code, operable in connection with a network interface, for obtaining a plurality of 10B encoded vectors that were encoded from a plurality of 9B source vectors according to an encoding scheme, said 10B encoded vectors comprising at least 10B encoded data vectors, said encoding scheme mapping at least a first portion of said 9B source vectors into 10B encoded data vectors comprising disparity independent encoded vectors, said encoding scheme mapping at least a second portion of said 9B source vectors into 10B encoded data vectors comprising disparity dependent encoded vectors having primary representations and alternate representations complementary to said primary representations, said 10B encoded data vectors having one binary symbol appended thereto by said encoding scheme;

wherein a fraction of said 10B encoded data vectors have binary symbol changes, other than whole-vector complementation, compared to corresponding ones of said 9B source vectors, said fraction not including any of said disparity dependent encoded representations; and computer usable program code, executable by at least one hardware processor, for decoding said 10B encoded vectors into a plurality of 9B source vectors according to decoding rules of said encoding scheme.

23. A computer program product comprising a tangible computer readable recordable storage medium including computer usable program code for encoding 7-binary symbol (7B) source vectors into 8-binary symbol (8B) encoded vectors, said computer program product including:
- computer usable program code, operable in connection with a network interface, for obtaining a plurality of 7B source vectors; and
- computer usable program code, executable by at least one hardware processor, for encoding said 7B source vectors into a plurality of 8B encoded vectors according to an encoding scheme, said 8B encoded vectors comprising at least 8B encoded data vectors, said encoding scheme mapping at least a first portion of said 7B source vectors into 8B encoded data vectors comprising disparity independent encoded vectors, said encoding scheme mapping at least a second portion of said 7B source vectors into 8B encoded data vectors comprising disparity dependent encoded vectors having primary representations and alternate representations complementary to said primary representations, said 8B encoded data vectors having one binary symbol appended thereto by said encoding scheme;
- wherein a fraction of said 8B encoded data vectors have binary symbol changes, other than whole-vector complementation, compared to corresponding ones of said 7B source vectors, said fraction not including any of said disparity dependent encoded representations.

24. A computer program product comprising a tangible computer readable recordable storage medium including computer usable program code for decoding 8-binary symbol (8B) encoded vectors into decoded 7-binary symbol (7B) source vectors, said computer program product including:
- computer usable program code, operable in connection with a network interface, for obtaining a plurality of 8B encoded vectors that were encoded from a plurality of 7B source vectors according to an encoding scheme, said 8B encoded vectors comprising at least 8B encoded data vectors, said encoding scheme mapping at least a first portion of said 7B source vectors into 8B encoded data vectors comprising disparity independent encoded vectors, said encoding scheme mapping at least a second portion of said 7B source vectors into 8B encoded data vectors comprising disparity dependent encoded vectors having primary representations and alternate representations complementary to said primary representations, said 8B encoded data vectors having one binary symbol appended thereto by said encoding scheme;
- wherein a fraction of said 8B encoded data vectors have binary symbol changes, other than whole-vector complementation, compared to corresponding ones of said 7B source vectors, said fraction not including any of said disparity dependent encoded representations; and
- computer usable program code, executable by at least one hardware processor, for decoding said 8B encoded vectors into a plurality of 7B source vectors according to decoding rules of said encoding scheme.

* * * * *